US011279062B2

(12) United States Patent
Das et al.

(10) Patent No.: US 11,279,062 B2
(45) Date of Patent: *Mar. 22, 2022

(54) SYSTEMS AND METHODS FOR FABRICATING THREE-DIMENSIONAL OBJECTS

(71) Applicant: Georgia Tech Research Corporation, Atlanta, GA (US)

(72) Inventors: Suman Das, Atlanta, GA (US); Dajun Yuan, San Diego, CA (US); Anirudh Rudraraju, Hillsboro, OR (US); Paul Cilino, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 535 days.

This patent is subject to a terminal disclaimer.

(21) Appl. No.: 16/113,338

(22) Filed: Aug. 27, 2018

(65) Prior Publication Data

US 2019/0091988 A1 Mar. 28, 2019

Related U.S. Application Data

(60) Division of application No. 15/419,600, filed on Jan. 30, 2017, now Pat. No. 10,336,055, which is a (Continued)

(51) Int. Cl.
*B29C 64/40* (2017.01)
*B29C 35/08* (2006.01)
(Continued)

(52) U.S. Cl.
CPC ............ *B29C 35/0805* (2013.01); *B22C 9/02* (2013.01); *B22C 9/10* (2013.01); *B22C 9/24* (2013.01);
(Continued)

(58) Field of Classification Search
CPC ...... B29C 64/129; B29C 64/135; B29C 64/40
See application file for complete search history.

(56) References Cited

U.S. PATENT DOCUMENTS

| 4,575,330 A | 3/1986 | Hull |
| 4,924,257 A | 5/1990 | Jain |

(Continued)

FOREIGN PATENT DOCUMENTS

| CN | 101204851 A | 6/2008 |
| EP | 2011631 A1 | 1/2009 |

(Continued)

OTHER PUBLICATIONS

Office Action and Translation Related to Chinese Application No. 2013800697531, dated Apr. 24, 2017, 15 pages.

(Continued)

*Primary Examiner* — James Sanders
(74) *Attorney, Agent, or Firm* — Troutman Pepper Hamilton Sanders LLP; Ryan A. Schneider

(57) ABSTRACT

A system including: a container for holding a photosensitive medium adapted to change states upon exposure to a light source; an optical imaging system, configured to move above the container holding the photosensitive medium, and having the light source; and a control system configured to: slice a digital model of a three-dimensional object into a slice having a cross section; generate a build cross section by filling a two-dimensional image with one or more copies of the cross section; add to the build cross section a conformal lattice to fill space in the build cross section around the one or more copies of the cross section; and control movement of the optical imaging system above the container to cure a portion of the photosensitive medium corresponding to the build cross section to produce a layer of a three-dimensional object.

10 Claims, 147 Drawing Sheets

(a)

Minimize volume of inter-part uncured liquid with lattice and conformal moats.

(b)

Uncured Liquid

Related U.S. Application Data continuation of application No. 14/076,161, filed on Nov. 8, 2013, now Pat. No. 9,561,622, which is a continuation-in-part of application No. 12/435,776, filed on May 5, 2009, now Pat. No. 8,636,496.

(60) Provisional application No. 61/723,991, filed on Nov. 8, 2012, provisional application No. 61/050,383, filed on May 5, 2008.

(51) Int. Cl.
| | |
|---|---|
| *B33Y 10/00* | (2015.01) |
| *B33Y 30/00* | (2015.01) |
| *B33Y 50/02* | (2015.01) |
| *G03F 7/20* | (2006.01) |
| *B22C 9/02* | (2006.01) |
| *B22C 9/10* | (2006.01) |
| *B22C 9/24* | (2006.01) |
| *B29C 64/135* | (2017.01) |
| *B29C 64/129* | (2017.01) |

(52) U.S. Cl.
CPC .......... *B29C 64/129* (2017.08); *B29C 64/135* (2017.08); *B29C 64/40* (2017.08); *B33Y 10/00* (2014.12); *B33Y 30/00* (2014.12); *B33Y 50/02* (2014.12); *G03F 7/70291* (2013.01); *G03F 7/70416* (2013.01); *B29C 2035/0827* (2013.01); *Y02P 10/25* (2015.11)

(56) References Cited

U.S. PATENT DOCUMENTS

| | | | |
|---|---|---|---|
| 5,253,177 A | 10/1993 | Saito et al. | |
| 5,263,130 A | 11/1993 | Pomerantz et al. | |
| 5,331,338 A | 7/1994 | Mager | |
| 5,351,617 A | 10/1994 | Williams et al. | |
| 5,496,682 A | 3/1996 | Quadir et al. | |
| 5,521,748 A | 5/1996 | Sarraf | |
| 5,691,541 A | 11/1997 | Ceglio et al. | |
| 5,870,176 A | 2/1999 | Sweatt et al. | |
| 5,897,825 A * | 4/1999 | Fruth ................ | B33Y 10/00 264/401 |
| 5,980,813 A | 11/1999 | Narang et al. | |
| 6,051,179 A | 4/2000 | Hagenau | |
| 6,060,224 A | 5/2000 | Sweatt et al. | |
| 6,117,672 A | 9/2000 | Breckenridge | |
| 6,133,986 A | 10/2000 | Johnson | |
| 6,153,142 A | 11/2000 | Chari et al. | |
| 6,177,980 B1 | 1/2001 | Johnson | |
| 6,180,050 B1 | 1/2001 | Arai et al. | |
| 6,251,550 B1 | 6/2001 | Ishikawa | |
| 6,270,335 B2 | 8/2001 | Leyden et al. | |
| 6,312,134 B1 | 11/2001 | Jain et al. | |
| 6,500,378 B1 | 12/2002 | Smith | |
| 6,567,205 B1 | 5/2003 | Eggers | |
| 6,768,505 B2 | 7/2004 | Zelenka | |
| 6,777,170 B1 | 8/2004 | Bloomslein et al. | |
| 6,844,920 B2 | 1/2005 | Luellau | |
| 6,914,708 B2 | 7/2005 | Mi | |
| 6,932,145 B2 | 8/2005 | Frasier et al. | |
| 7,006,887 B2 | 2/2006 | Nagano et al. | |
| 7,049,049 B2 | 5/2006 | Fries | |
| 7,052,263 B2 | 5/2006 | John | |
| 7,167,296 B2 | 1/2007 | Meisburger | |
| 7,195,472 B2 | 3/2007 | John | |
| 7,604,768 B2 | 10/2009 | Kritchman | |
| 2008/0038396 A1 | 2/2008 | John et al. | |
| 2008/0255003 A1 | 10/2008 | Piletsky et al. | |
| 2008/0315461 A1 | 12/2008 | Henningsen | |
| 2010/0003619 A1 | 11/2010 | Das et al. | |

FOREIGN PATENT DOCUMENTS

| | | |
|---|---|---|
| GB | 2315700 A | 2/1998 |
| WO | 2007138356 A1 | 12/2007 |

OTHER PUBLICATIONS

International Search Report and Written Opinion in related priority PCT Application No. PCT/US2013/69349, dated Dec. 9, 2014, 7 pages.
UV-Setter Series 5 Brochure, BasysPrint, Punch Graphix International NV, 2006, 8 pages.
Wang, L., et al. "Scanning Array Lens Lithography for Large Area Applications," Ultratech Stepper, Inc., Advanced Technology Group, Proceedings of SPIE, vol. 3048, Mar. 10, 1997, pp. 271-286.
Wang, L., et al. "New Array Lens Optical System for Large Area Micromachining Lithography," Ultratech Stepper, Inc., Advanced Technology Group, Proceedings of SPIE, vol. 2880, Oct. 14, 1996, pp. 210-223.

* cited by examiner

1200

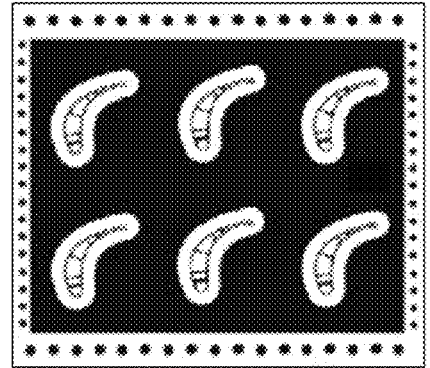
1700
For first 10-20 layers, the blade has removed too much slurry and formed crater shape in the slurry area around molds.
After 40-50 layers, a dome shape of slurry is formed surrounding the mold parts. The doming problem will get worse as more layers are built, which will cause the failure of the build.
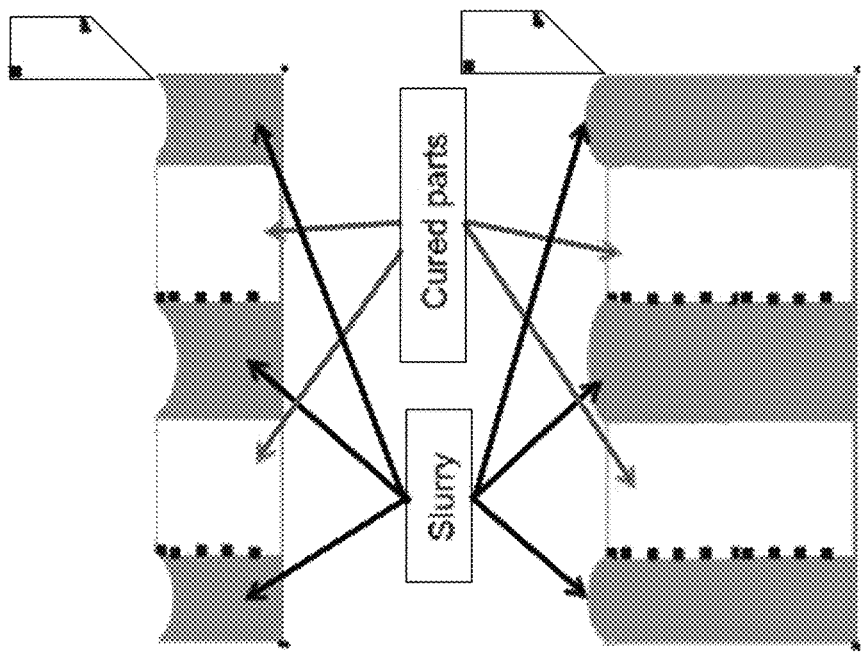
FIG. 17

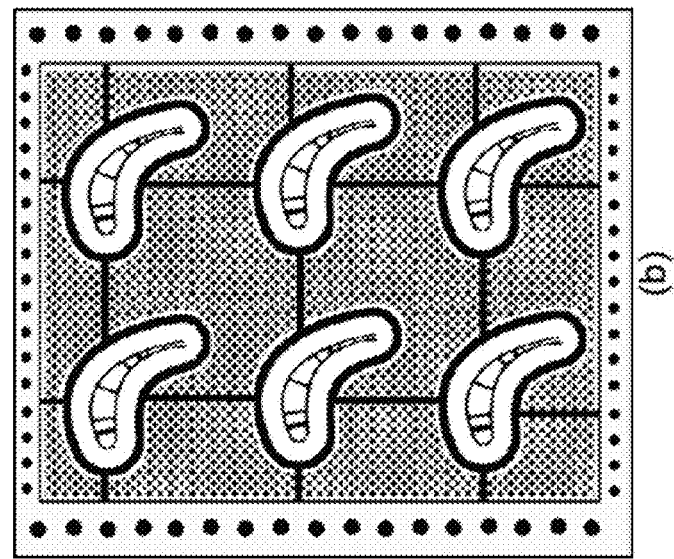
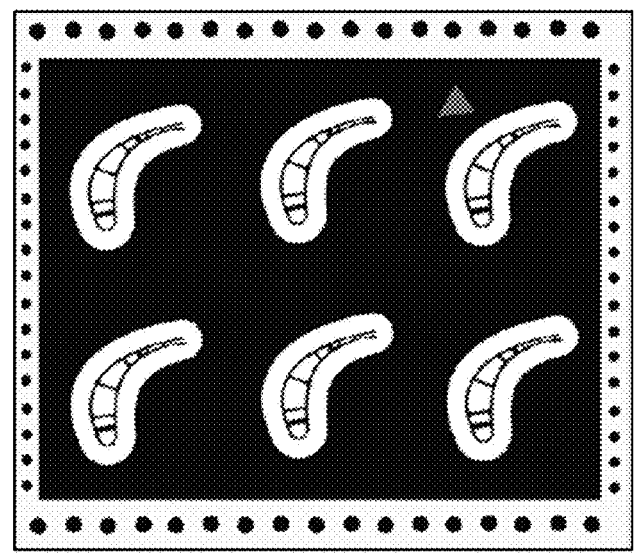
FIG. 21

2200a

2200b

2200c

2200d

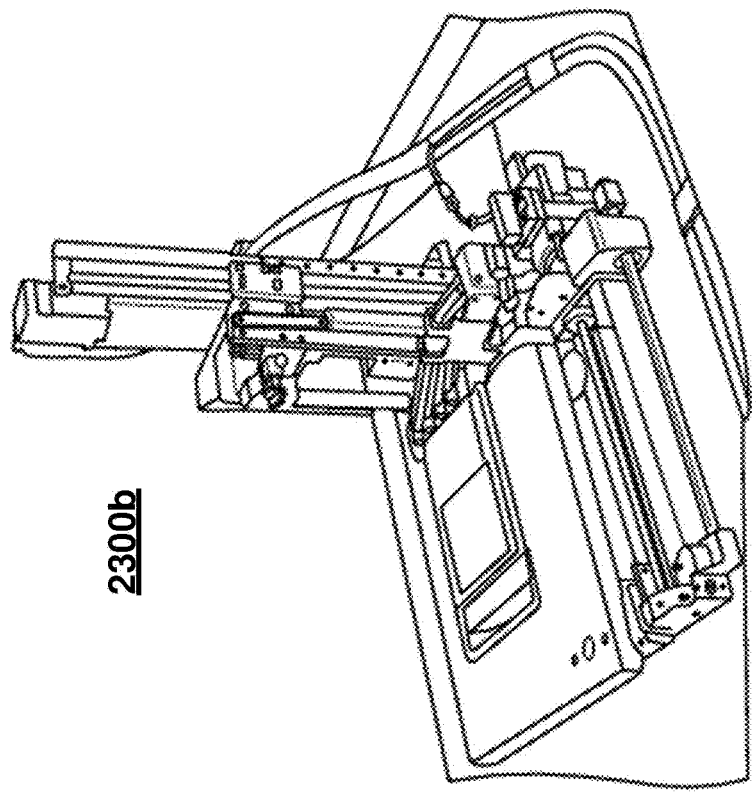
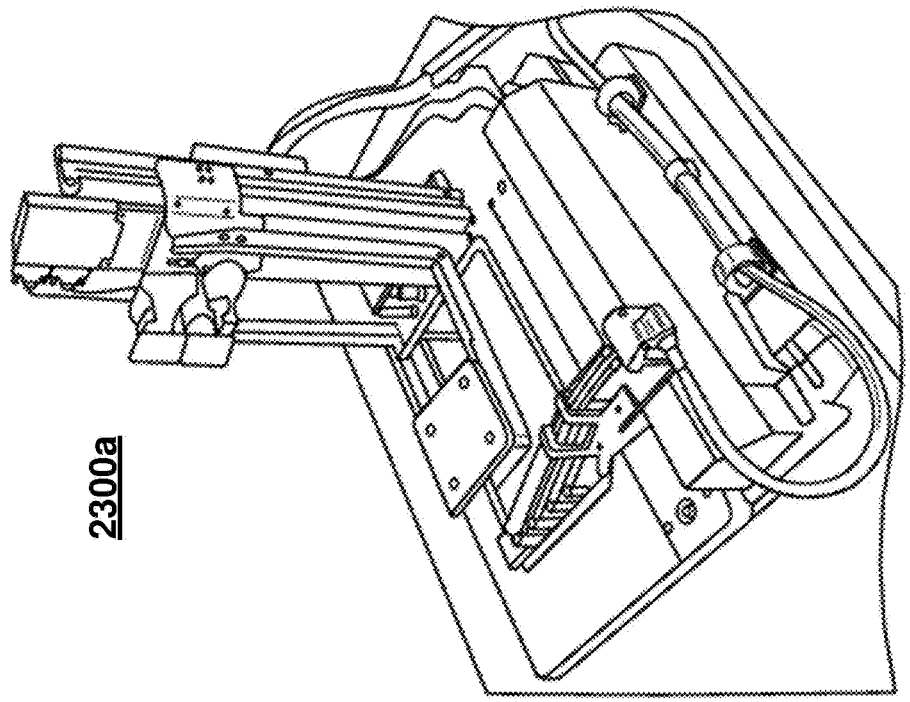
FIG. 23b
FIG. 23a

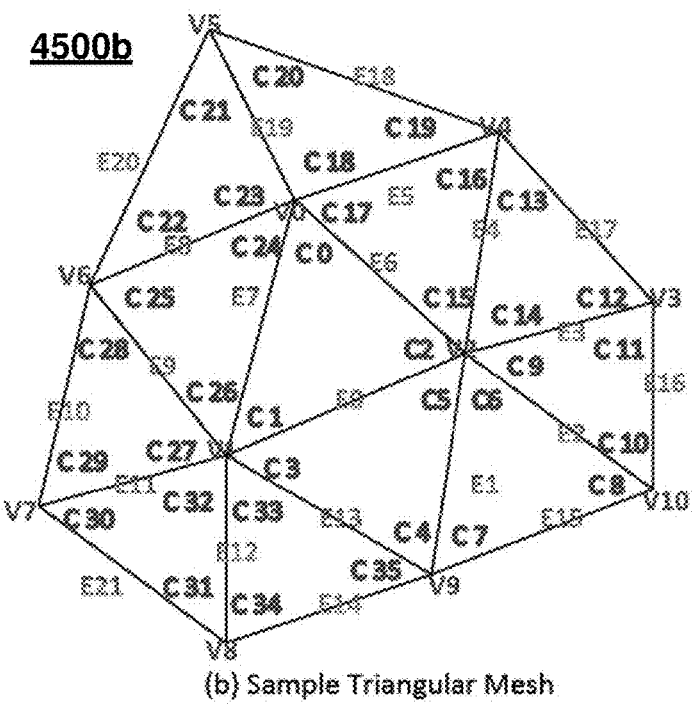
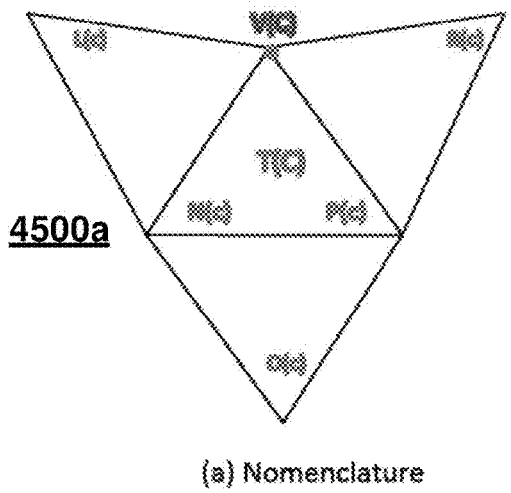
4500c
| c | V[c] | O[c] | E[c] |
|---|---|---|---|
| 0 | 0 | 4 | 0 |
| 1 | 1 | 16 | 6 |
| 2 | 2 | 25 | 7 |
| 3 | 1 | 8 | 1 |
| 4 | 9 | 0 | 0 |
| 5 | 2 | 34 | 13 |
| 6 | 2 | -- | 15 |
| 7 | 9 | 11 | 2 |
| 8 | 10 | 3 | 1 |
| 9 | 2 | -- | 16 |
| 10 | 10 | 13 | 3 |
| 11 | 3 | 7 | 2 |
| 12 | 3 | 17 | 4 |
| 13 | 4 | 10 | 3 |
| 14 | 2 | -- | 17 |
| 15 | 2 | 20 | 5 |
| 16 | 4 | 1 | 6 |
| 17 | 0 | 12 | 4 |
| 18 | 0 | -- | 18 |
| 19 | 4 | 22 | 19 |
| 20 | 5 | 15 | 5 |
| 21 | 5 | 26 | 8 |
| 22 | 6 | 19 | 19 |
| 23 | 0 | -- | 20 |
| 24 | 0 | 29 | 9 |
| 25 | 6 | 2 | 5 |
| 26 | 1 | 21 | 8 |
| 27 | 1 | -- | 10 |
| 28 | 6 | 31 | 11 |
| 29 | 7 | 24 | 9 |
| 30 | 7 | 35 | 12 |
| 31 | 8 | 28 | 11 |
| 32 | 1 | -- | 21 |
| 33 | 1 | -- | 14 |
| 34 | 8 | 5 | 13 |
| 35 | 9 | 30 | 12 |
(b) Sample Triangular Mesh
(a) Nomenclature
(c) V&O tables for sample triangular mesh
FIG. 45

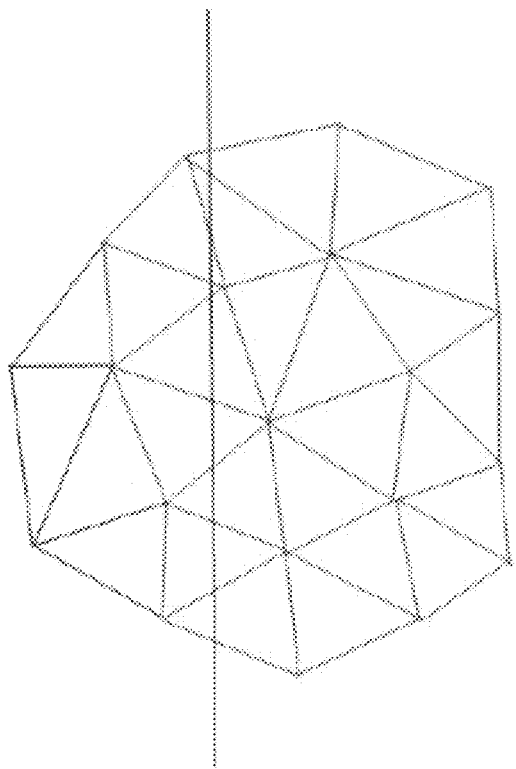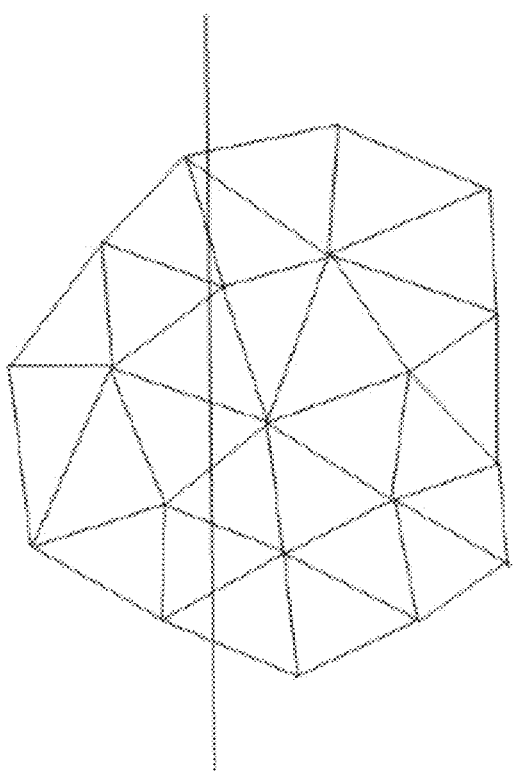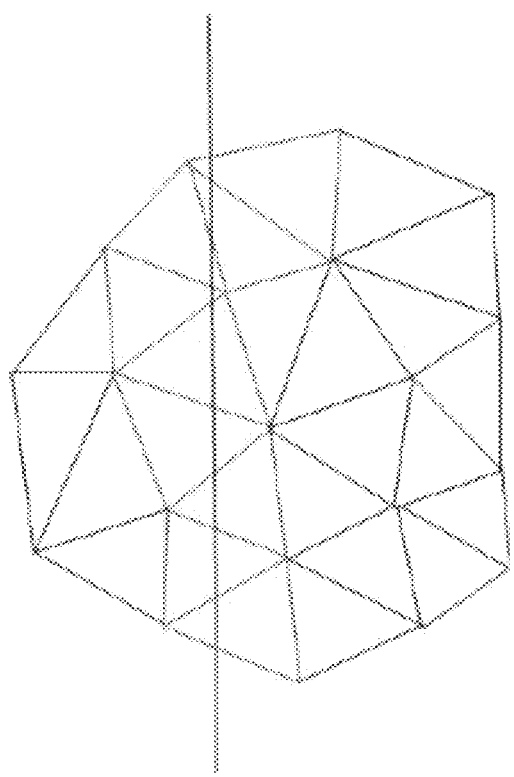
FIG. 49a

| Y Z | Row 1 | Row 2 | Row 3 | Row 4 | ..... |
|---|---|---|---|---|---|
| Slice 1 | Points(1,1) | Points(1,2) | Points(1,3) | Points(1,4) | ..... |
| Slice 2 | Points(2,1) | Points(2,2) | Points(2,3) | Points(2,4) | ..... |
| Slice 3 | Points(3,1) | Points(3,2) | Points(3,3) | Points(3,4) | ..... |
| Slice 4 | Points(4,1) | Points(4,2) | Points(4,3) | Points(4,4) | ..... |
| ..... | ..... | ..... | ..... | ..... | |

5200a
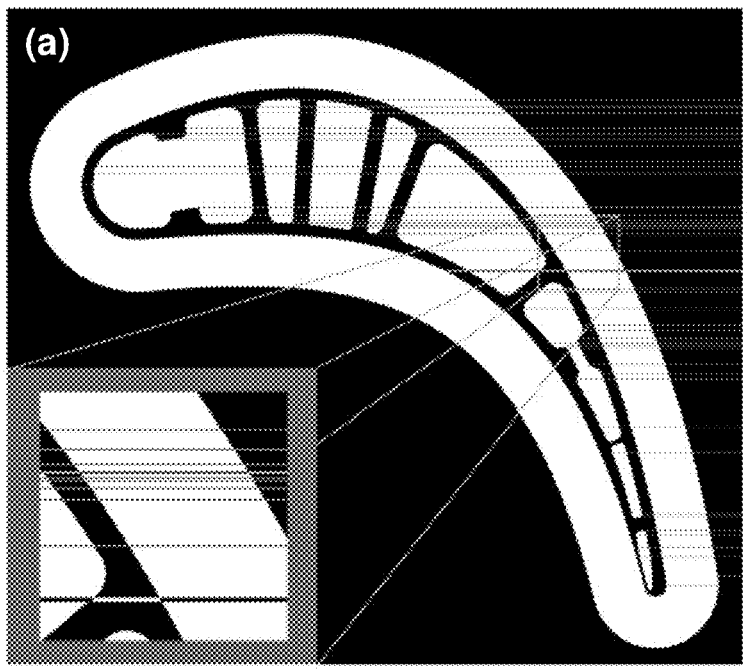
5200b
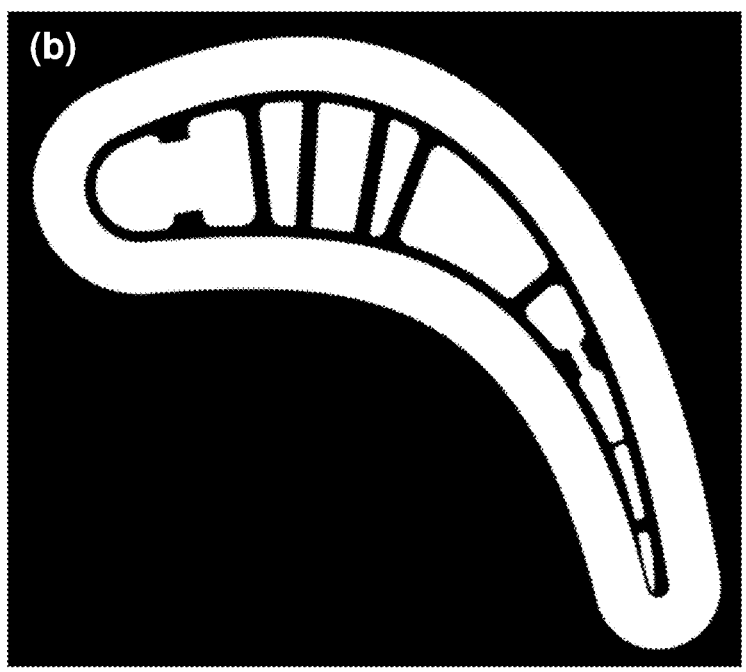
FIG. 52

5400a
(a) 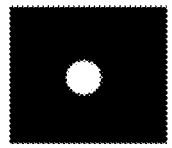
5400b
(b) 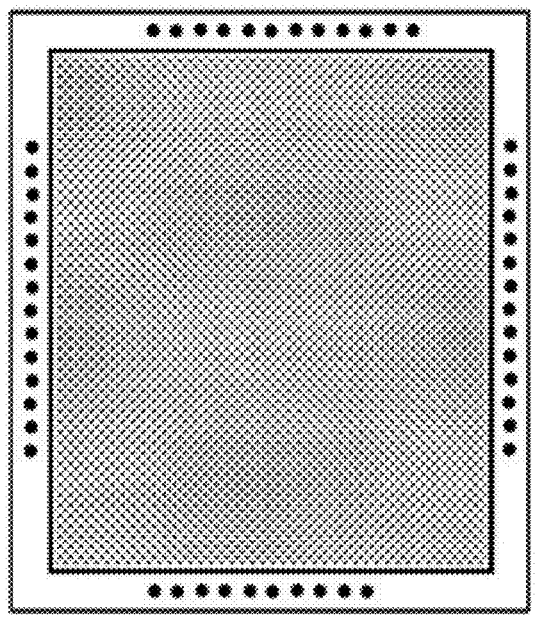
5400c
(c) 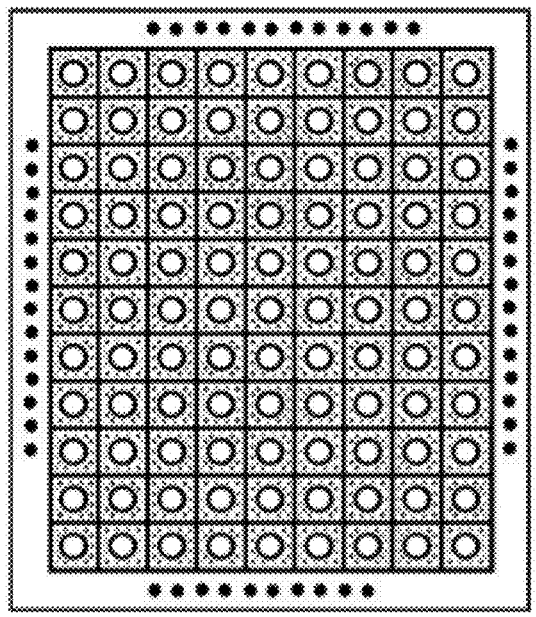
FIG. 54

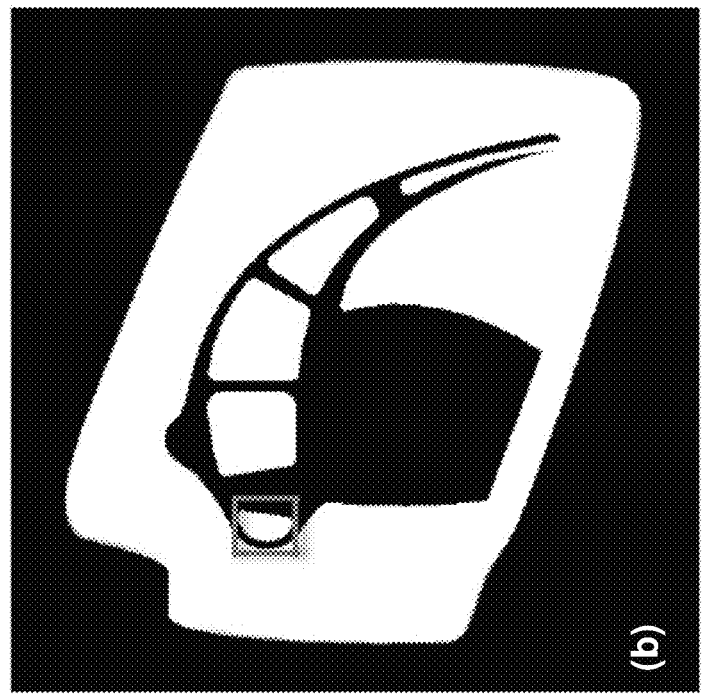
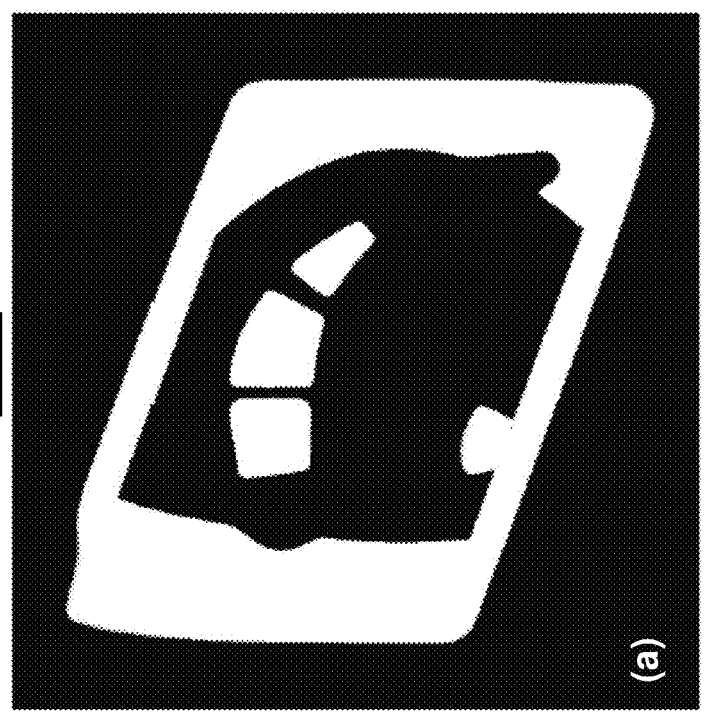
FIG. 71

9500a

9500b

9500c

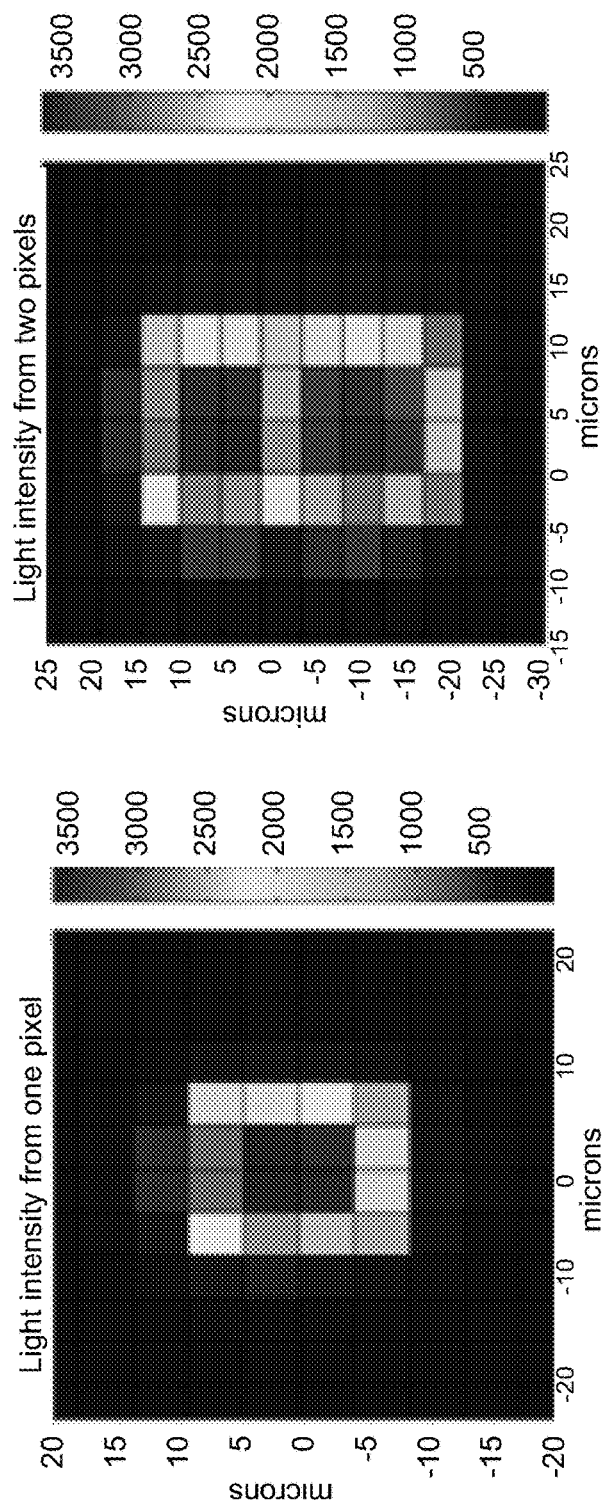
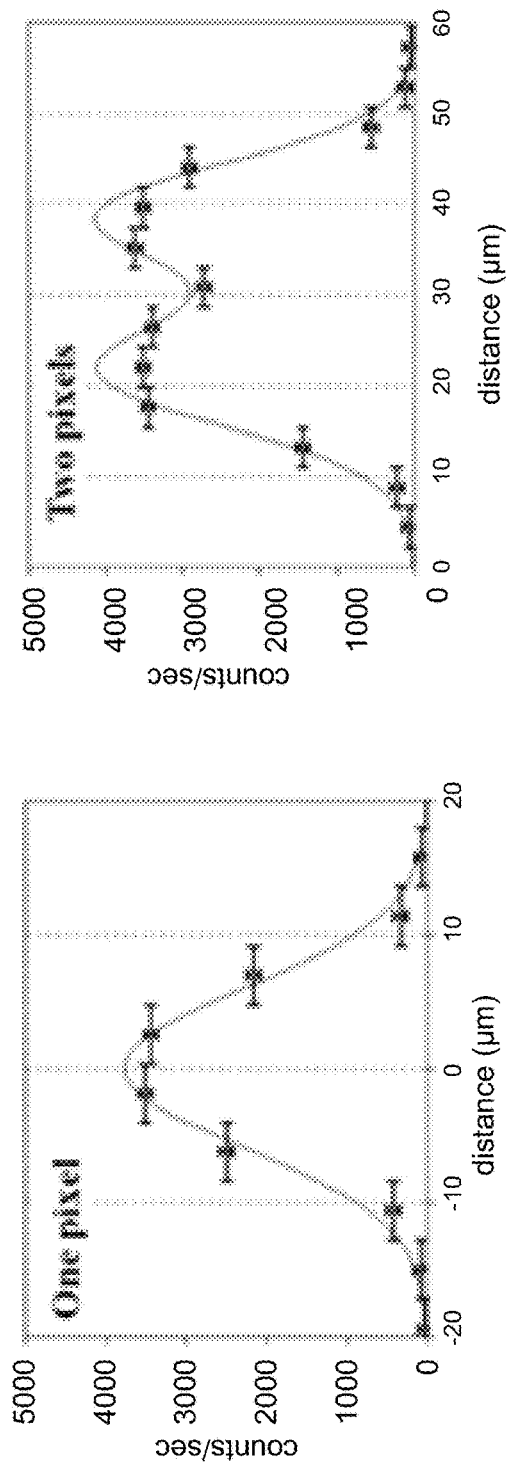
FIG. 99A
FIG. 99B

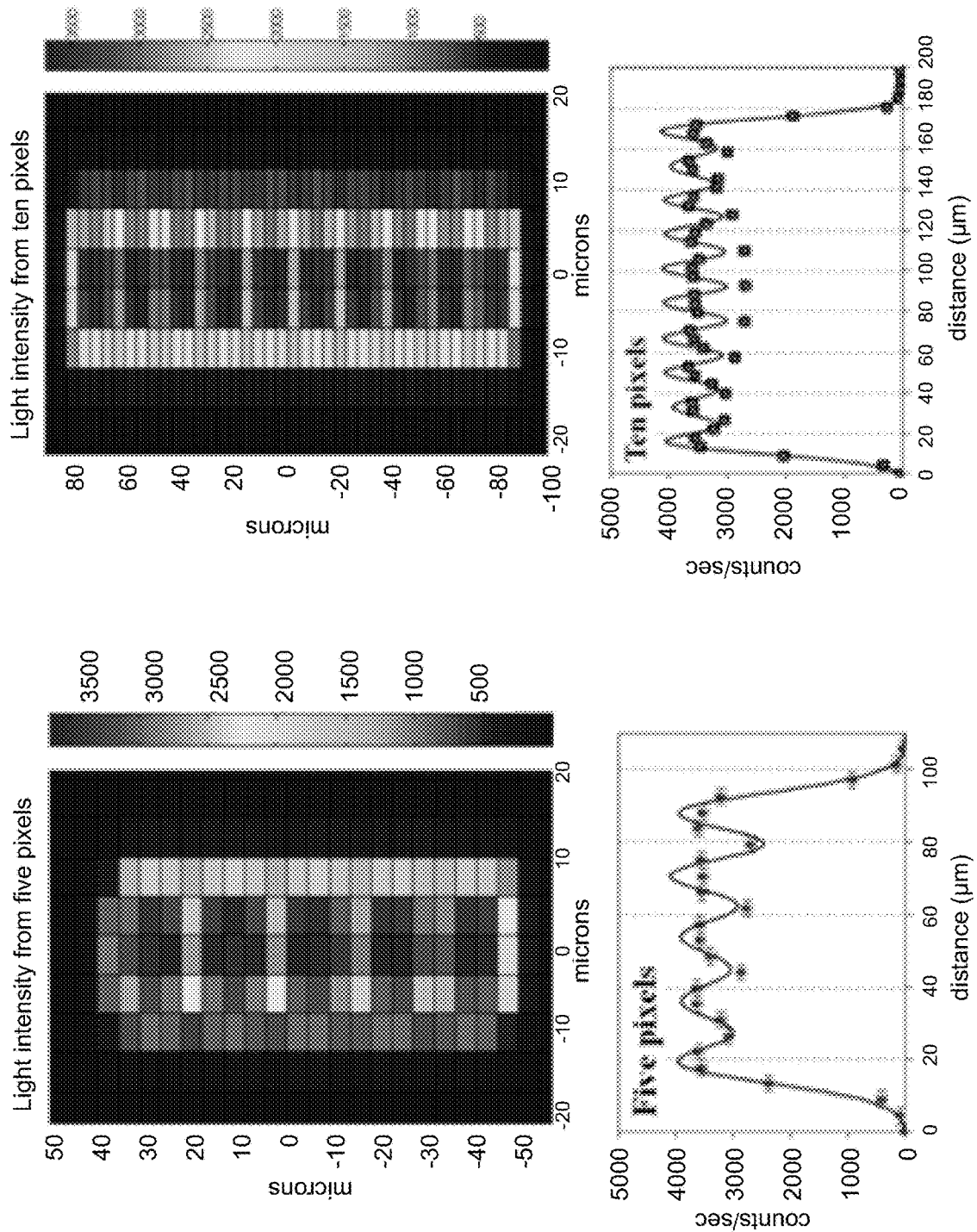

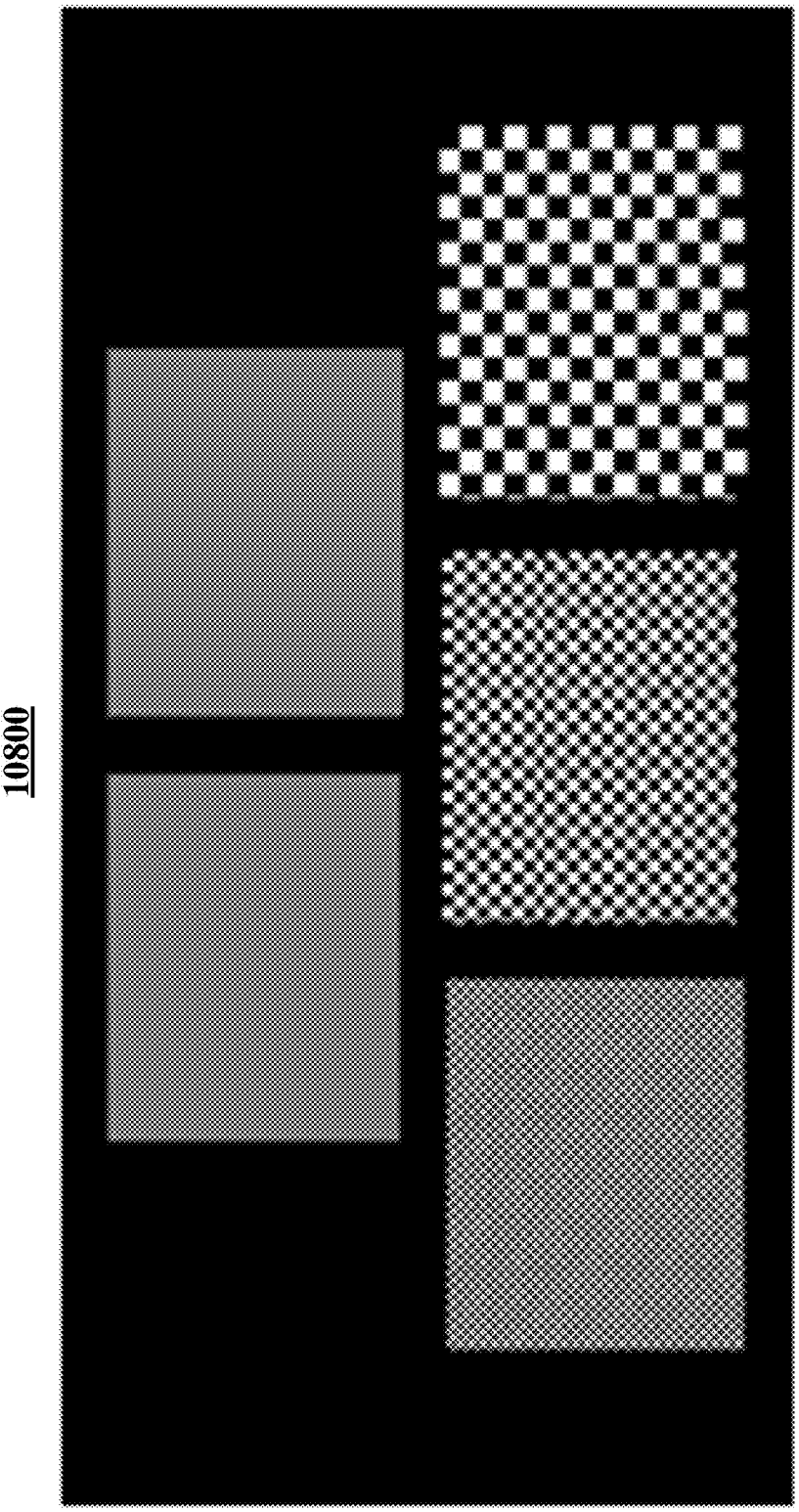

SYSTEMS AND METHODS FOR FABRICATING THREE-DIMENSIONAL OBJECTS

CROSS REFERENCE TO RELATED APPLICATIONS

This application is a divisional of U.S. patent application Ser. No. 15/419,600, filed 30 Jan. 2017, which is a continuation of U.S. patent application Ser. No. 14/076,161, filed 8 Nov. 2013, which claims benefit, under 35 U.S.C. § 119(e), of U.S. Provisional Application Ser. No. 61/723,991, filed 8 Nov. 2012 and is also a continuation-in-part of U.S. patent application Ser. No. 12/435,776, filed on 5 May 2009, which claims benefit, under 35 U.S.C. § 119(e), of U.S. Provisional Application Ser. No. 61/050,383, filed 5 May 2008. This application is also related to U.S. application Ser. No. 14/076,151, filed 8 Nov. 2013, U.S. application Ser. No. 14/132,835, filed 18 Dec. 2013, and International Patent Application No. PCT/US13/69349, filed 8 Nov. 2013. The entire contents and substance of the above applications are hereby incorporated by reference in their entireties.

STATEMENT REGARDING FEDERALLY SPONSORED RESEARCH OR DEVELOPMENT

This invention was made with government support under grants HR0011-07-1-0034 and HR0011-08-1-0075, awarded by the Defense Advanced Research Projects Agency (DARPA). The federal government has certain rights in the invention.

BACKGROUND

Rapid prototyping or solid free-form fabrication has become an increasingly important tool, and is a technology that has seen great advances since its initial application in the 1980s, evidenced in U.S. Pat. No. 4,575,330, which is incorporated by reference herein as if fully set forth below. In one common embodiment known as stereolithography, rapid prototyping manufacturing makes use of a bath of curable liquid, wherein some movable point within the bath is subjected to stimulation by a prescribed curing source. As the source is moved with respect to the bath or as the bath is moved with respect to the source, the point that undergoes solidification or curing is constantly made to move. The result is the construction of a solidified mass of cured material contained within the otherwise liquid bath. The region commonly solidified is positioned at or very near the surface of the bath in most practical applications. As the liquid is solidified, the solid structure is progressively lowered into the bath allowing the uncured liquid to flow over the surface, which is in turn subjected to the same process. By continuing to solidify these very thin layers, the solid object is built up into its final shape. Bonding of one layer to a previous layer is an inherent property of the process as is known in the art.

For example, photolithography systems that direct light beams onto a photosensitive surface covered by a mask, etching a desired pattern on the substrate corresponding to the void areas of the mask, are known in the art. In mask-based photolithography systems, the patterns generated are defined by physical masks placed in the path of light used for photo-activation. While effective, the use of physical masks in photolithography has numerous drawbacks, including the cost of fabricating masks, the time required to produce the sets of masks needed to fabricate semiconductors, the diffraction effects resulting from light from a light source being diffracted from opaque portions of the mask, registration errors during mask alignment for multilevel patterns, color centers formed in the mask substrate, defects in the mask, the necessity for periodic cleaning, and the deterioration of the mask as a consequence of continuous cleaning.

Maskless photolithography systems are also known in the art and often use an off-axis light source coupled with a digital micromirror array to fabricate chips containing probes for genes or other solid phase combinatorial chemistry to be performed in high-density microarrays.

While maskless photolithography systems address several of the problems associated with mask-based photolithography systems, such as distortion and uniformity of images, problems still arise. Notably, in environments requiring rapid prototyping and limited production quantities, the advantages of maskless systems as a result of efficiencies derived from quantities of scale are not realized. Further, while maskless photolithography systems are directed to semiconductor manufacturing, these prior art systems and methods notably lack reference to other applications lending themselves to maskless photolithography techniques.

A commonly-used curable medium includes photopolymers, which are polymerizable when exposed to light. Photopolymers may be applied to a substrate or objects in a liquid or semi-liquid form and then exposed to light, such as ultraviolet light, to polymerize the polymer and create solid coatings or castings. In addition, conductive photopolymers are known that exhibit electrically conductive properties, allowing creation of electric circuits by polymerizing the polymers in circuit layout patterns. Conventional methods of photopolymerization, however, use physical masks to define areas of polymerization. This mask-based photopolymer process suffers from the disadvantages of mask-based photolithography methods, including the requisite need for many different masks, long lead time for mask creation, inability to modify masks, and the degradation of masks used in the manufacturing process.

As one may imagine, there are many advantages of rapid prototyping. For example, the rapid prototyping process has the ability to drastically reduce the time between product conception and final design, and to create complex shapes. More traditional modeling or prototyping is obtained from an iterative generation of a series of drawings which are analyzed by the design team, manufacturing, the consumer, and perhaps others, until a tentative final design results which is considered viable. This agreed upon design is then created by casting and/or machining processes. If molds are needed, these must be fabricated as well, which may take considerable and valuable time. The finished prototype is then tested to determine whether it meets the criteria for which the part was designed. The design and review process is often tedious and tooling for the creation of the prototype is laborious and expensive. If the part is complex, then a number of interim components must first be assembled. The prototype itself is then constructed from the individual components.

Use of rapid prototyping significantly reduces the expense and time needed between conception and completion of the prototype. Commonly, the concept is rendered in CAD (computer aided design). As this process is fully electronic, drawings are not required for fabrication. The CAD system is used to generate a compatible output data file that contains information on the part's geometry. This file is typically converted into a "sliced" data file that contains information on the part's cross-section at predetermined layer depths.

The rapid prototype control system then regenerates each cross-section sequentially at the surface of the curable resin. The fabricated part may be analyzed by the team or used for various form, fit, and functional tests. Due to the rapid speed and low cost of the process, several designs may be fabricated and evaluated in a fraction of the time and for significantly less than it would take to machine each concept. Because the rapid prototyping process creates the structure by the creation of very thin layers, complex components with internal complexities may be easily rendered without requiring the assembly of a plurality of individual components.

On the other hand, one conventional and significant disadvantage of rapid prototyping, other than initial costs to implement technology, is that the time associated with the creation of each part may still be longer than desired. Because creation of the part occurs in a point-by-point, layer-by-layer process, the time necessary to produce a single part may become excessive. Reduction in fabrication times continues to be a desirable goal. Though the above description pertains to the process of stereolithography; the process, as well as the general advantages and disadvantages are similar for other rapid prototyping technologies.

SUMMARY

Embodiments of the present invention relate to optical modeling methods and systems and, more particularly, to optical modeling methods and systems in which a three-dimensional object is created by a continuously moving optical imaging source using a plurality of light beams to illuminate portions of a photo-curable medium. Furthermore, embodiments of the present invention relate to systems and processes for large area maskless photopolymerization (LAMP) using spatial light modulators (SLMs).

For example, a process/system of the present invention involves using SLMs that scan at least a portion of the surface of a photopolymer. In scanning a surface of the photopolymer, the SLMs project a two-dimensional image (e.g., from a CAD file) thereon. The two-dimensional image comprises a cross-section of a three-dimensional object to be formed within the various layers of the photopolymer, once cured.

The process/system involves continuous movement of the SLMs, instead of so-called "step and expose" or "step and repeat" movements. In providing continuous movement, the two-dimensional image projected by the SLMs is a dynamic image. That is, rather than projecting a fixed, single image on a portion of the photopolymer surface, followed by movement of the SLMs to a new location, changing the SLMs to a new image that corresponds to the desired image over the new location, and projection of the new image on the portion of the photopolymer surface at the new location, embodiments of the present invention involve projecting an image that continuously changes as the SLMs scan over the surface of the photopolymer.

Embodiments of the present invention also provide optional features that may overcome some of the limitations of conventional systems and methods, such as polymerization shrinkage, liquid polymer movement prior to being cured, and the like. Further, a combination of increased resolution and speed of fabrication may be achieved. Examples of improvements in the LAMP systems that result in such properties may be found at least in the polymer container design, light modulation process, and light patterns.

The systems and processes above are not limited to photopolymers alone. For example, composite materials (e.g., those that contain a filler material for the polymer), may be employed as well. Alternatively, if a ceramic body is desired, a polymer-ceramic matrix may be used in the LAMP systems and processes, followed by removal of the polymeric component, thereby leaving behind a ceramic body that may be subjected to additional processing.

These and other objects, features, and advantages of the present invention will become more apparent upon reading the following specification in conjunction with the accompanying drawings.

BRIEF DESCRIPTION OF THE DRAWINGS

FIG. 17 illustrates a loss of build precision using a material recoating system having a single-edge recoater.

FIG. 21 illustrates one embodiment of a method of constructing a conformal lattice in an inter-part space using break lines in accordance with various aspects as described herein.

FIGS. 23a-23f illustrate one embodiment of a LAMP machine in accordance with various aspects as described herein.

FIG. 45 illustrates a corner table data structure in accordance with various aspects described herein.

FIG. 49a illustrates a method for identifying the intersecting facets at an arbitrary Z-height in accordance with various aspects as described herein.

FIG. 50 illustrates a data structure used to store these intersection points in accordance with various aspects as described herein.

FIG. 52 illustrates a particularly bad instance of stray line errors.

FIG. 54 illustrates a method of tiling in accordance with various aspects as described herein.

FIG. 71 illustrates 3D slices of successive layers at the location corresponding to the floating island shown in FIG. 70.

FIGS. 99A-99F illustrate intensity distributions and profiles for 1 pixel, 2 pixel, 3 pixel, 4 pixel, 5 pixel, and 10 pixel line projections from the SLM.

FIG. 108 illustrates a checkerboard pattern that can be used to extract dimensional information.

Figure 117A:
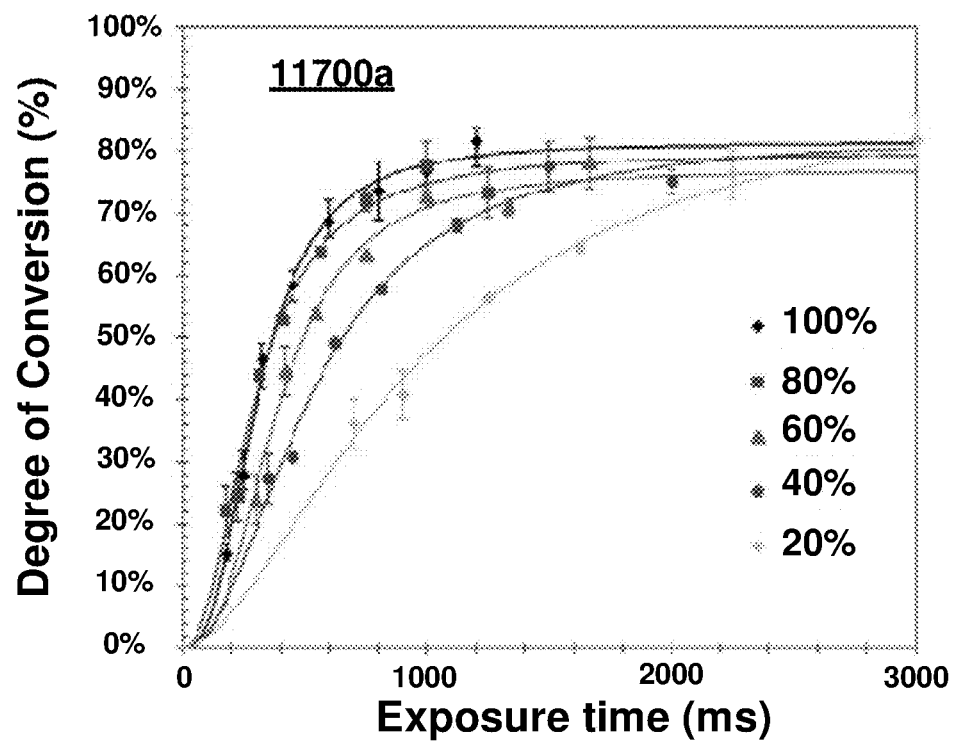
Figure 117B:
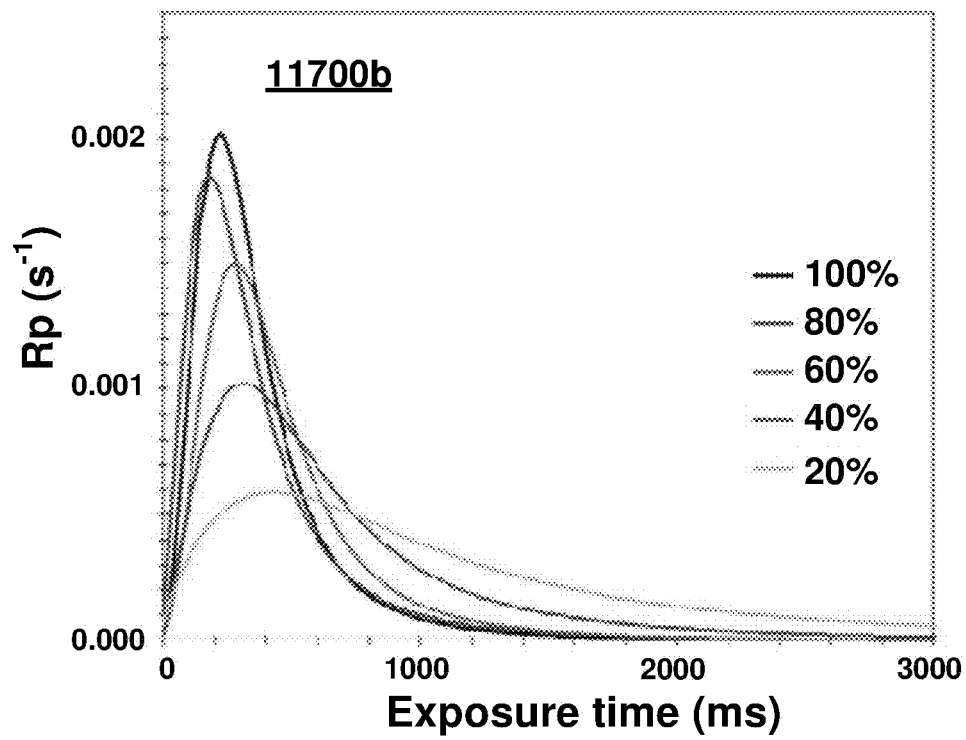

FIGS. 117a and 117b provide a chart showing the degree of conversion and rate of polymerization for the PCMS at selected grayscale intensities of 100%.

Figure 118:
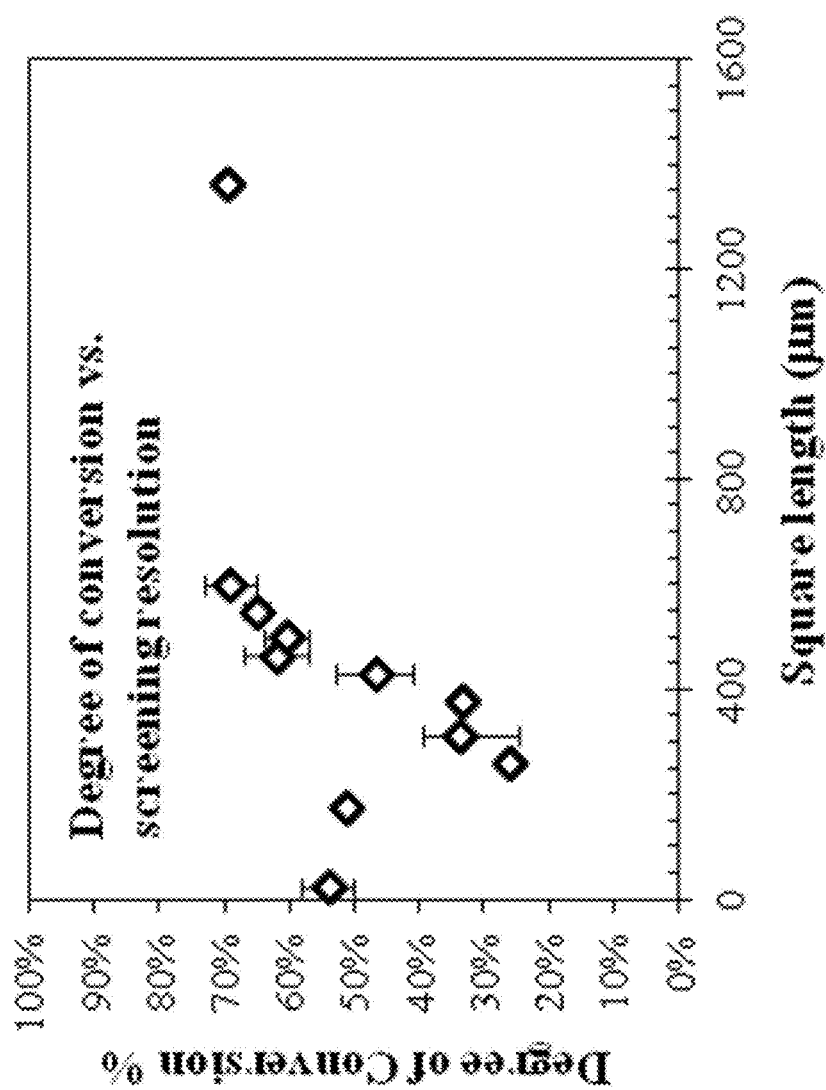

FIG. 118 provides a chart characterizing the influence of screening resolution on the degree of conversion.

Figure 119:
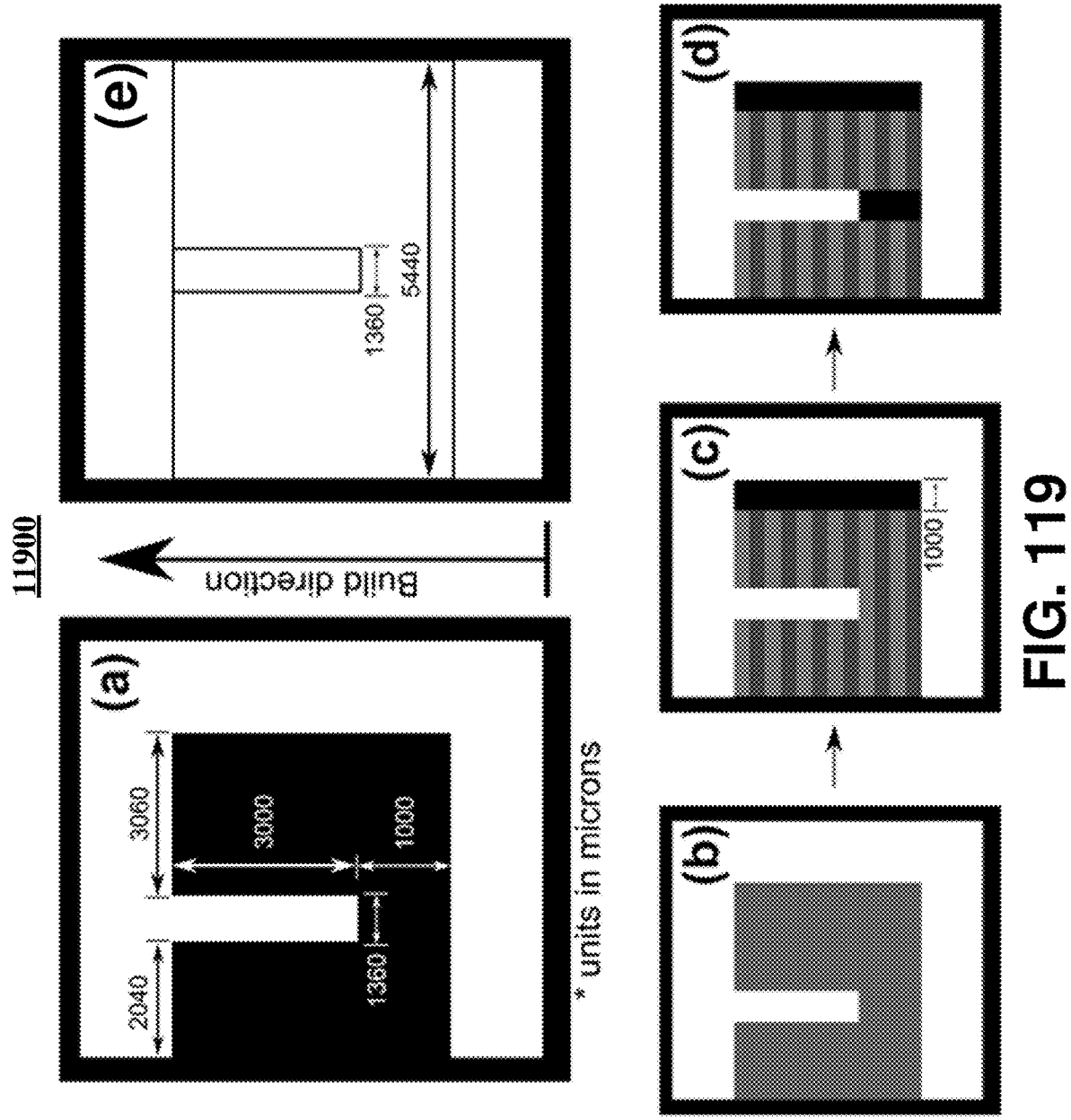

FIG. 119 shows iteration steps in the development of grayscale support structures.

Figure 120:
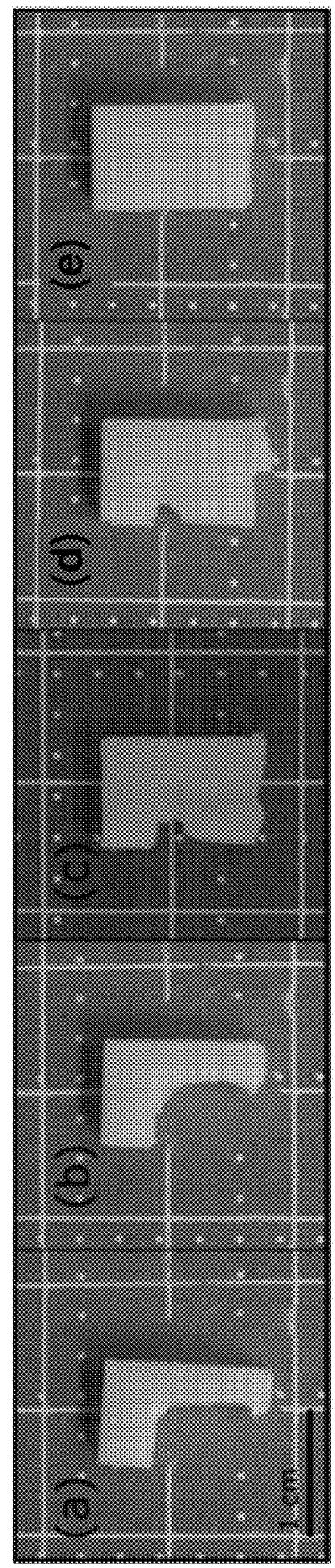

FIG. 120 shows the results of a trial of fabricating unsupported geometries using grayscale support structures with various grayscale values.

Figure 121:
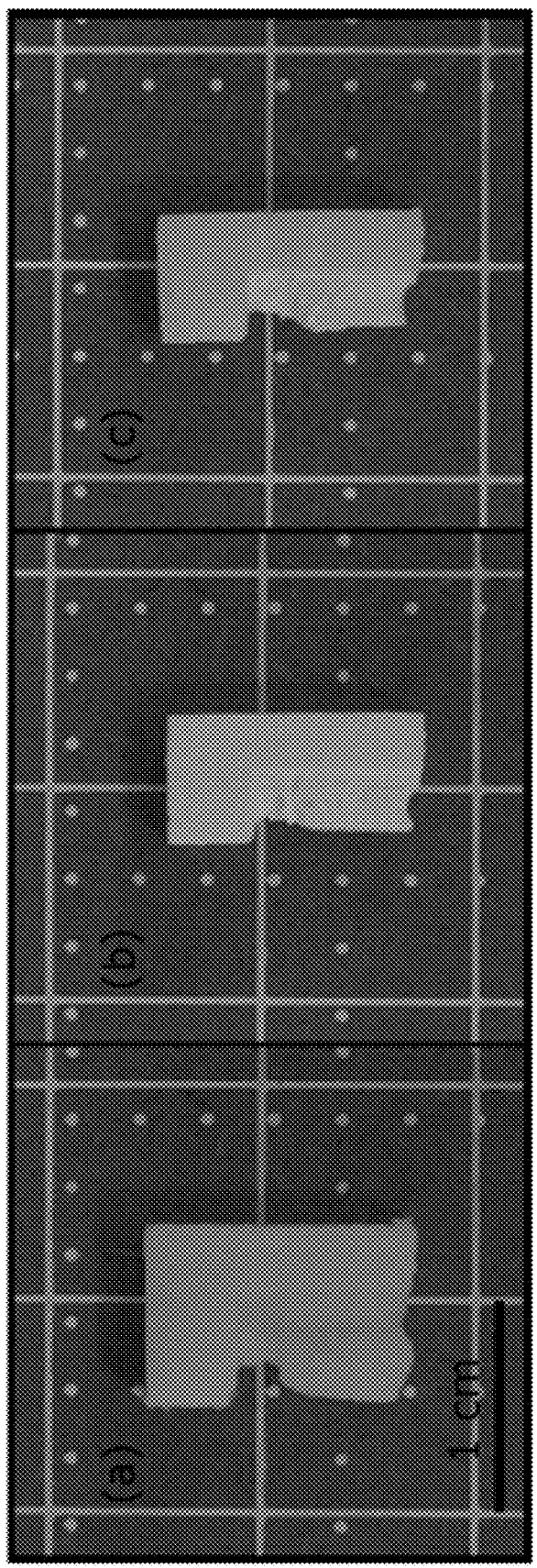

FIG. 121 shows images for a test of selective etching for a challenge component.

Figure 122:
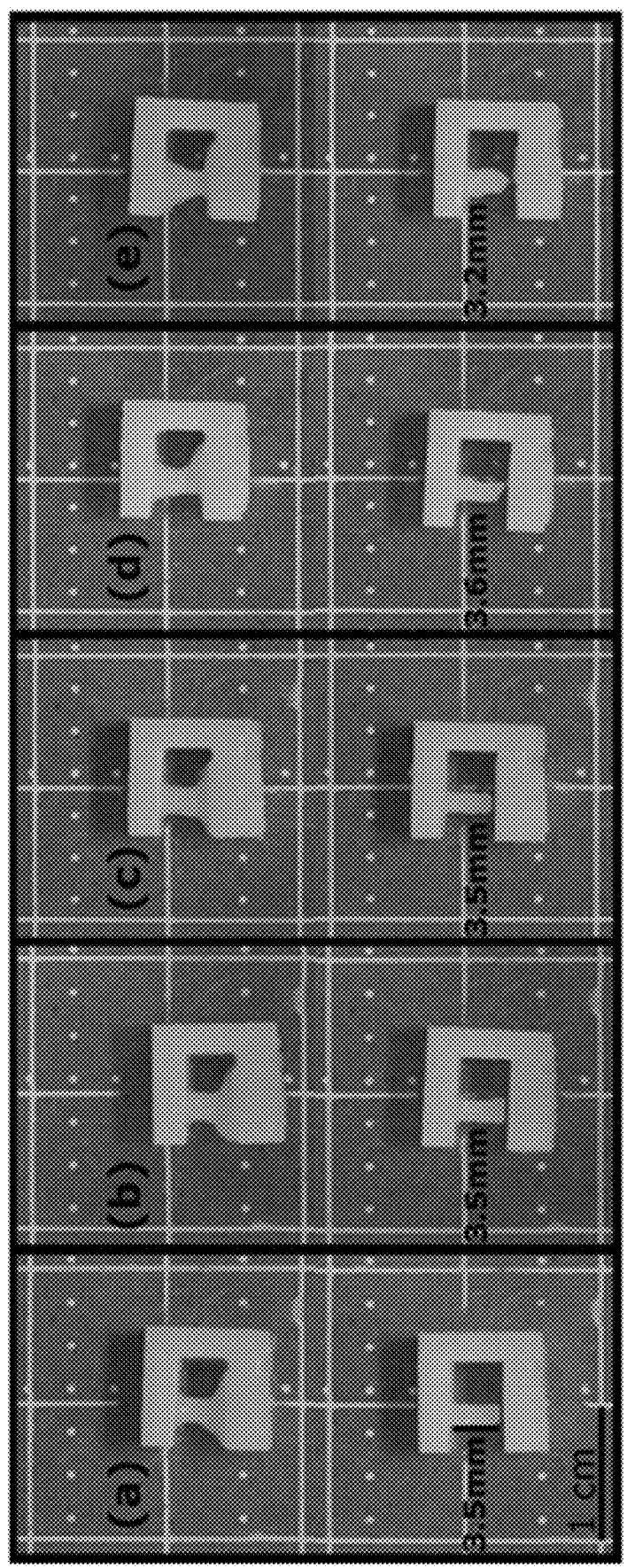

FIG. 122 shows images of fabrication of a test component using various grayscale values.

Figure 123:
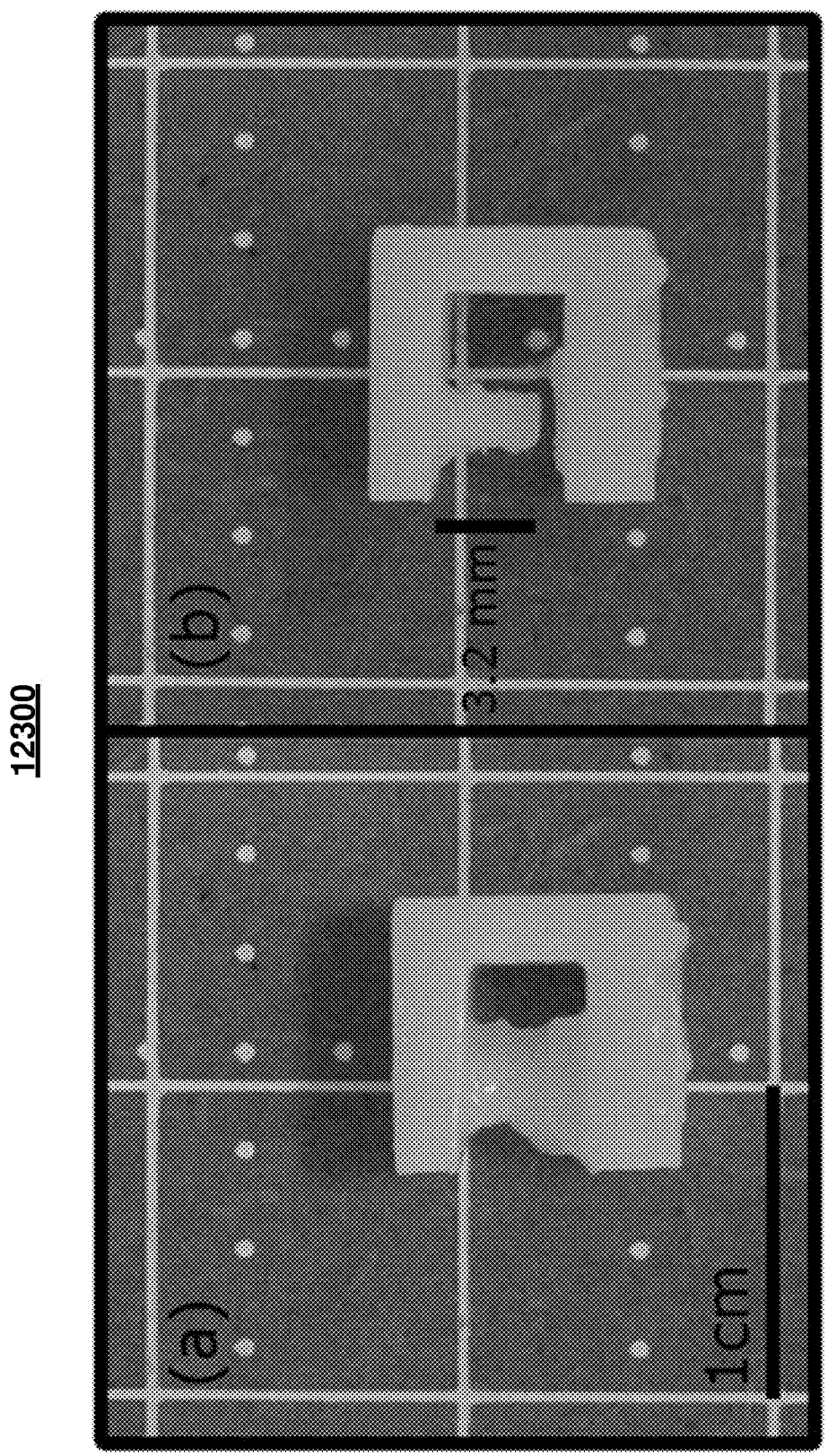

FIG. 123 shows images of results from print-through mediated alternating GSS.

Figure 124:
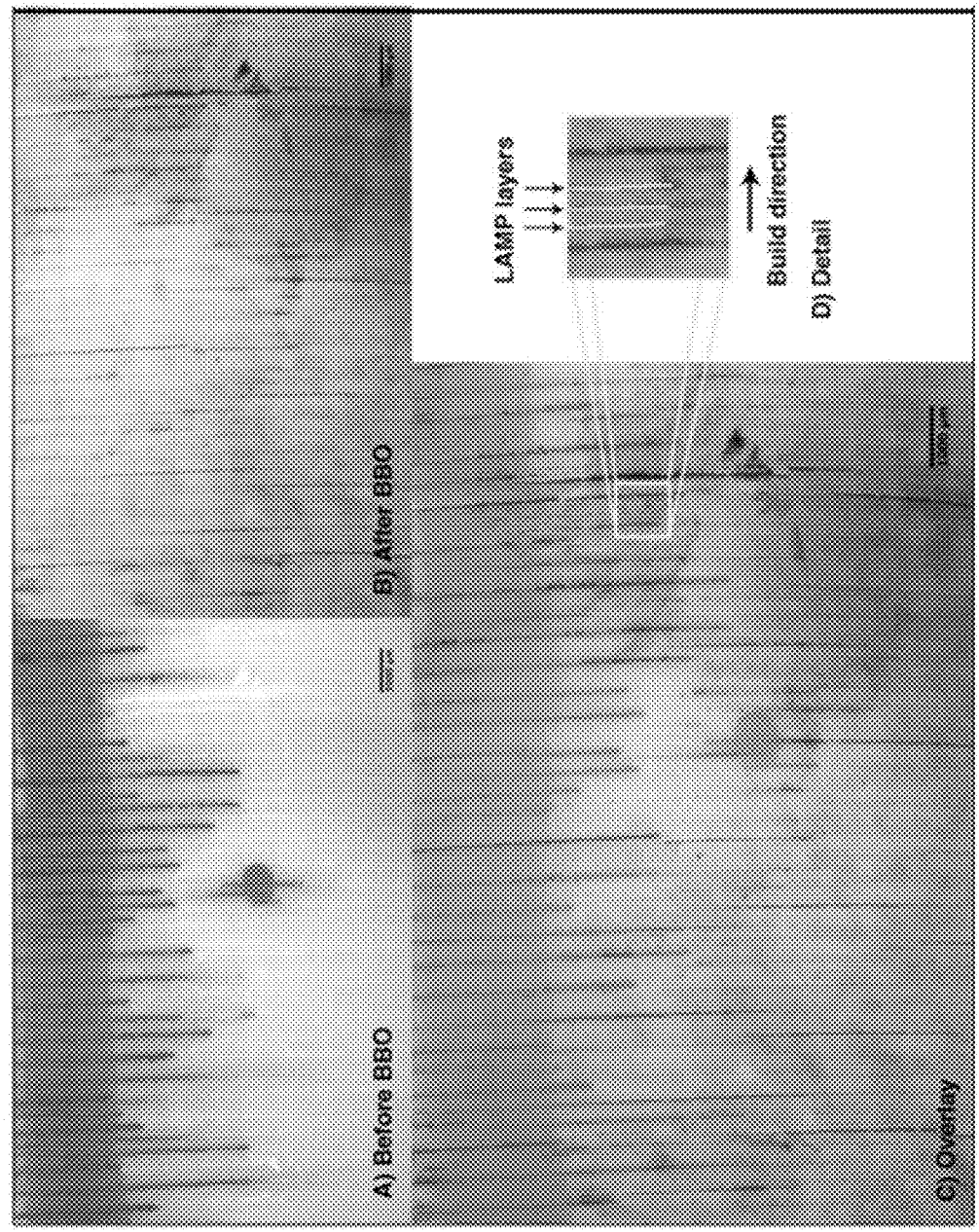

FIG. 124 shows stereomicroscope images of an airfoil mold with "fissures."

Figure 125:
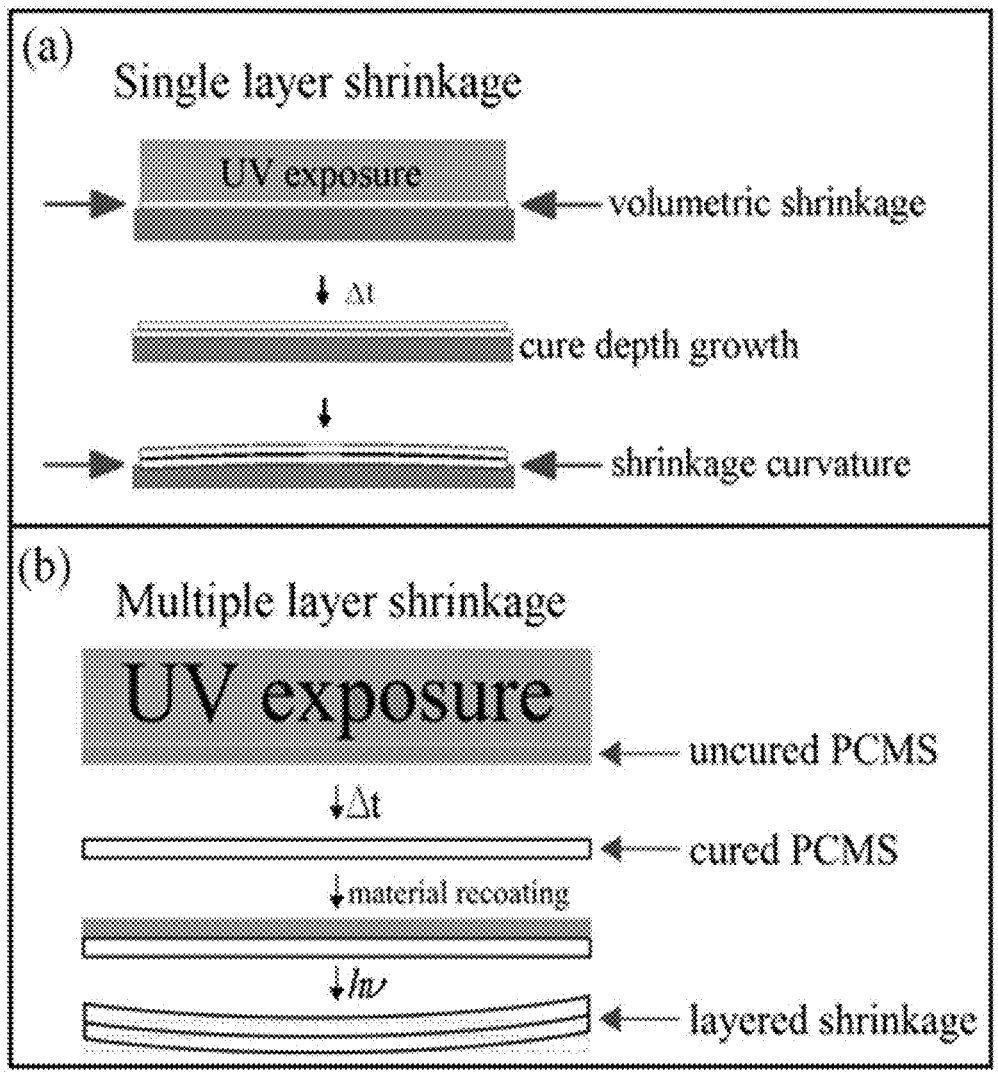

FIG. 125 provides a schematic of the shrinkage mechanisms occurring for one embodiment of a LAMP system.

Figure 126:
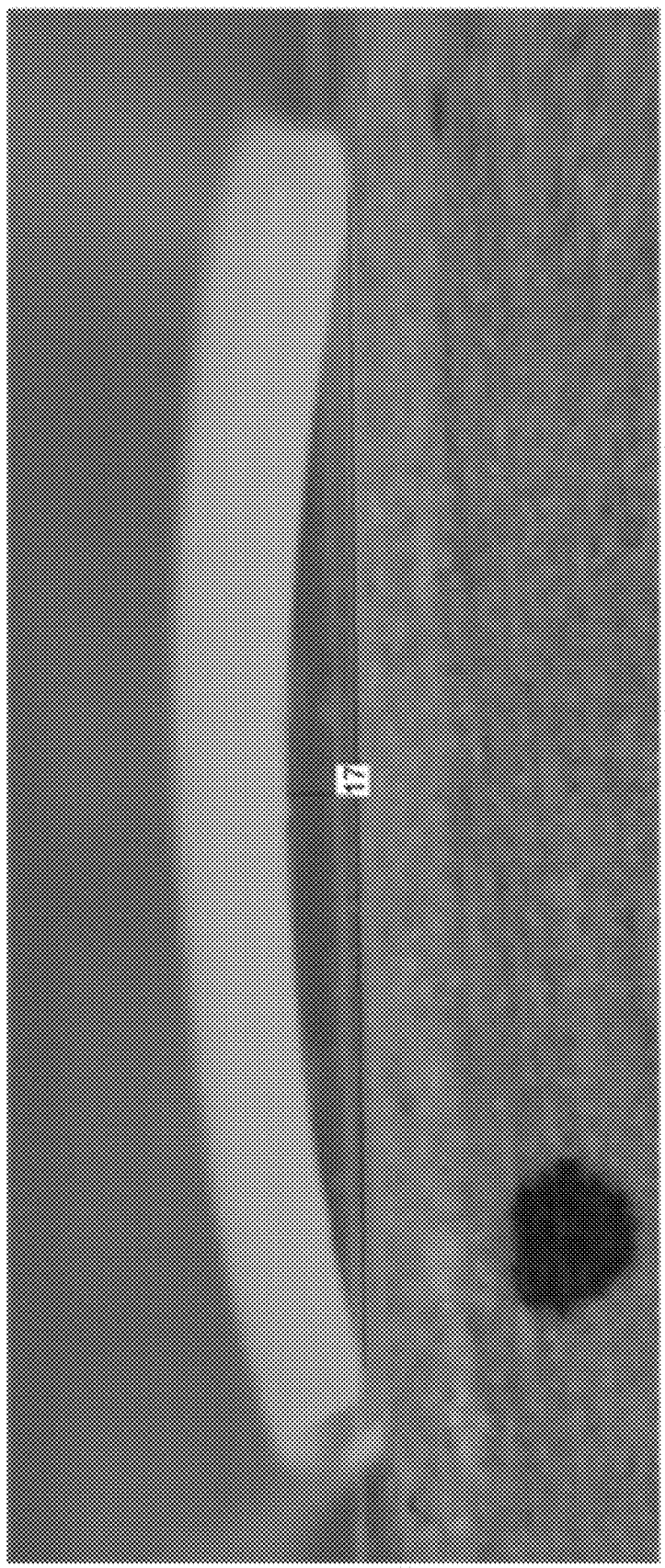

FIG. 126 shows an image of curvature induced by UV illumination within a single layer exposure.

Figure 127:
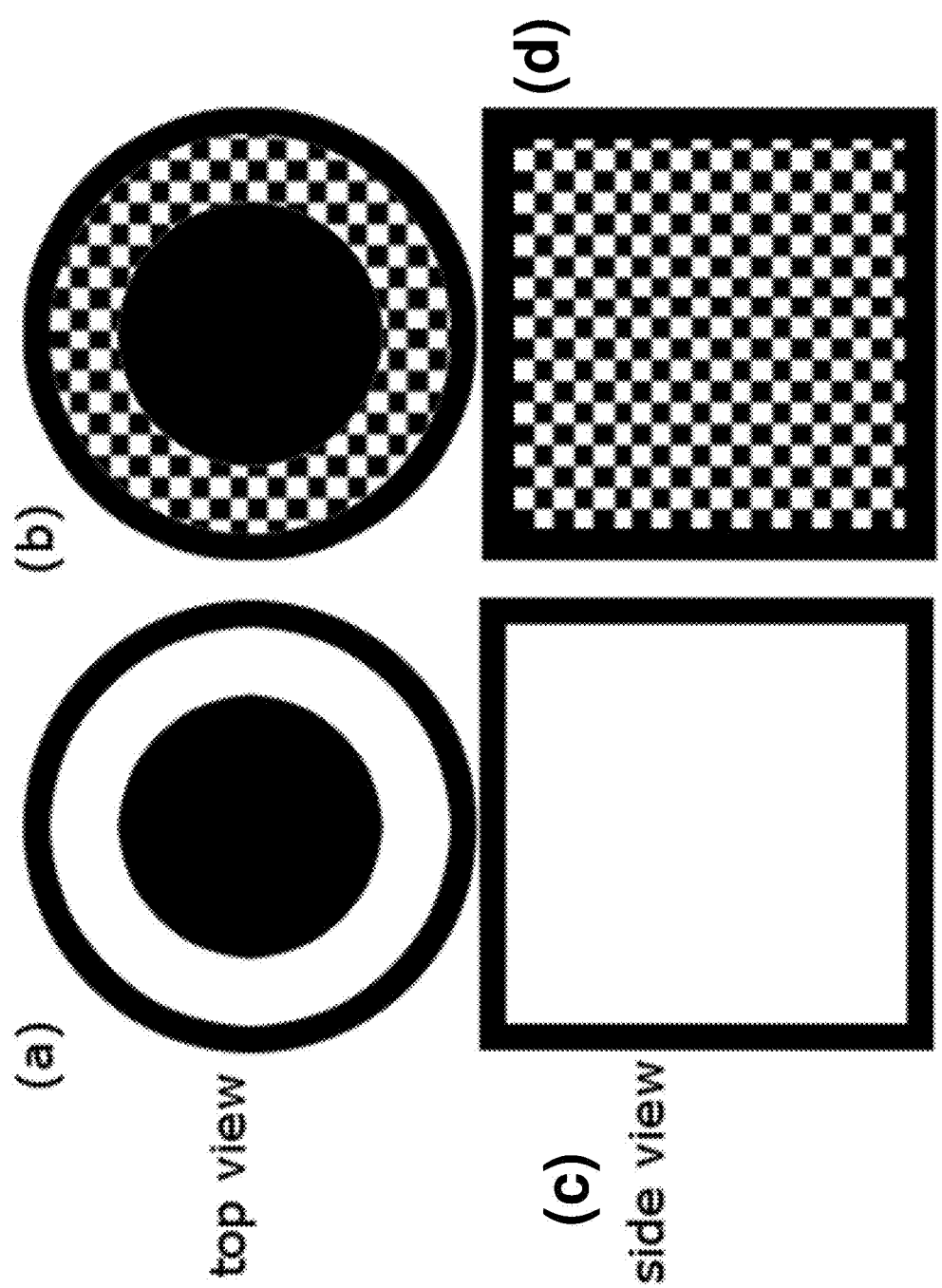

FIG. 127 provides a schematic of a hollow cylinder design used to investigate methods to reduce defects in LAMP components.

Figure 128:
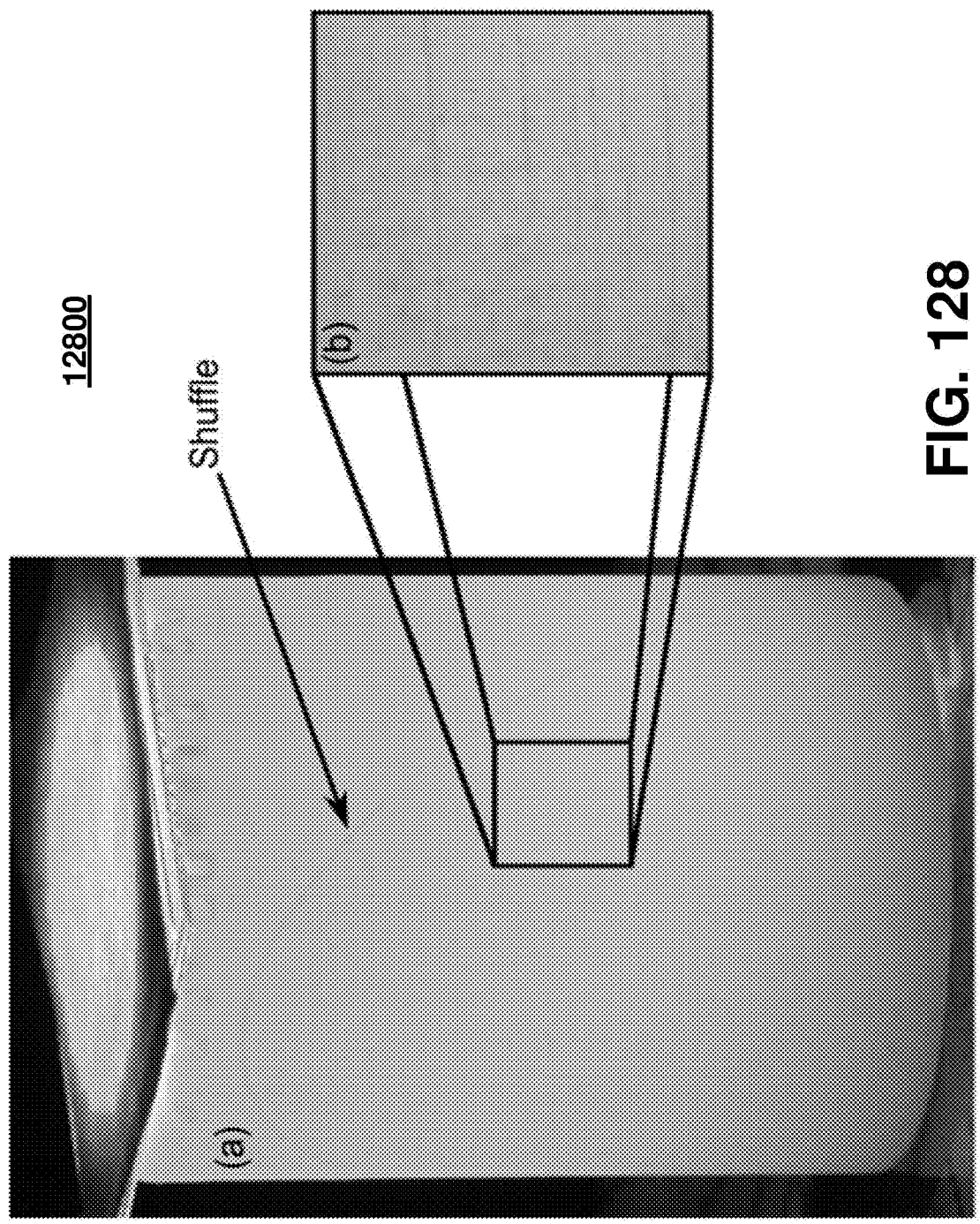

FIG. 128 shows the result from fabrication of a test cylinder with all white exposure for one embodiment of a LAMP system.

Figure 129:
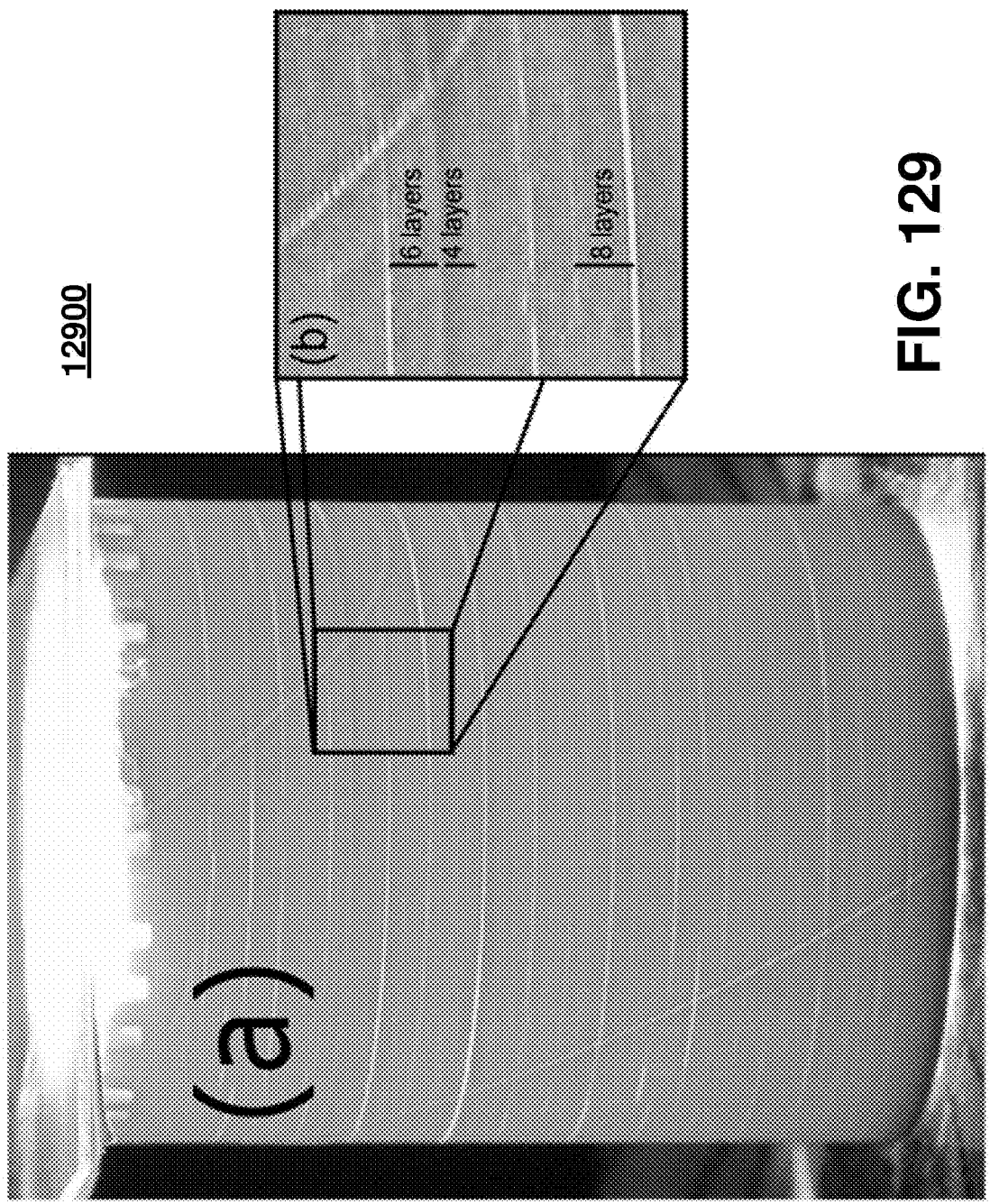

FIG. 129 shows the result from fabrication of a test cylinder with all white exposure after BBO and sintering for one embodiment of a LAMP system.

Figure 130:
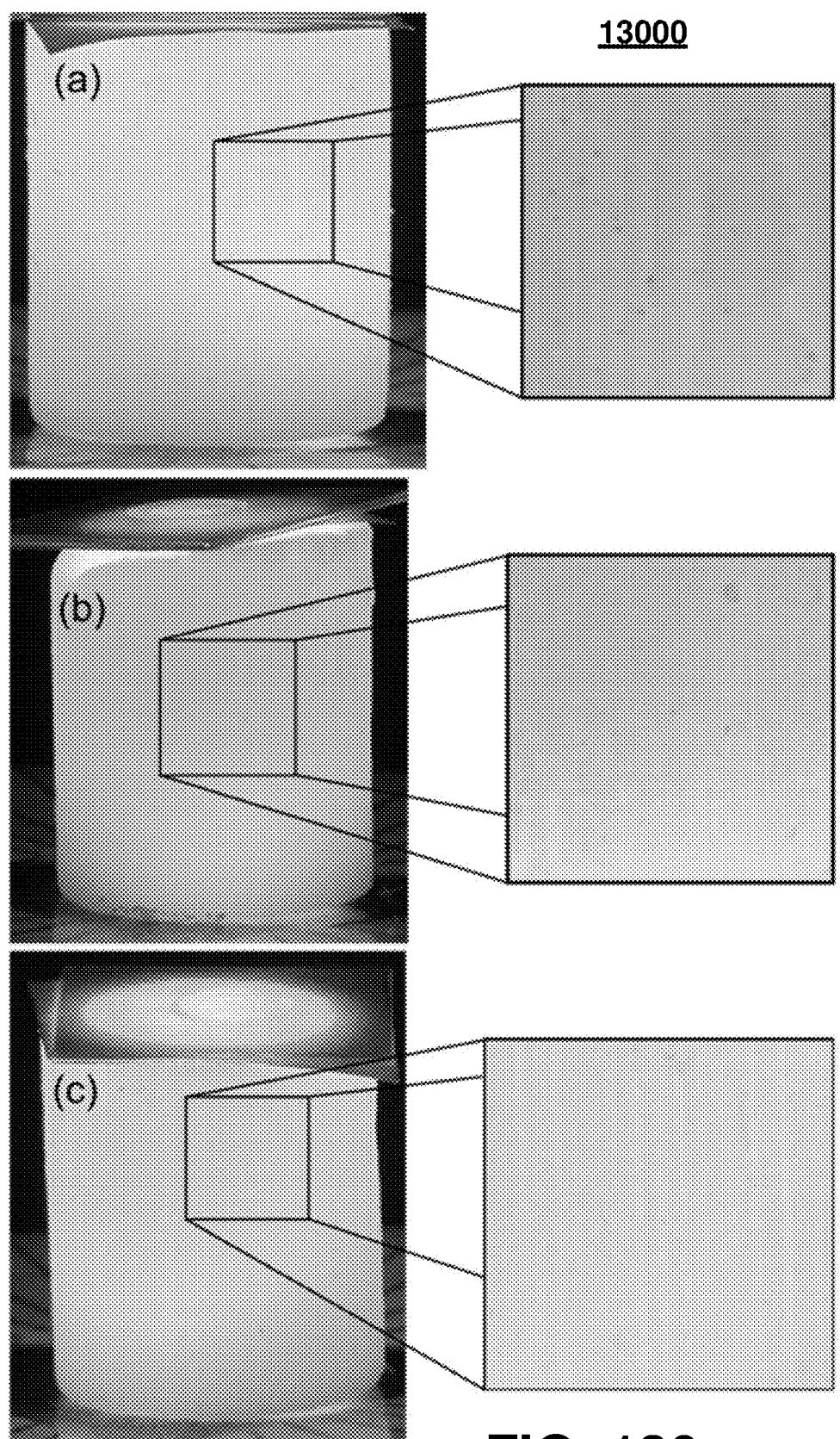

FIG. 130 shows green body molds for cylinders fabricated with checkerboard exposure at selected square lengths for one embodiment of a LAMP system.

Figure 131:
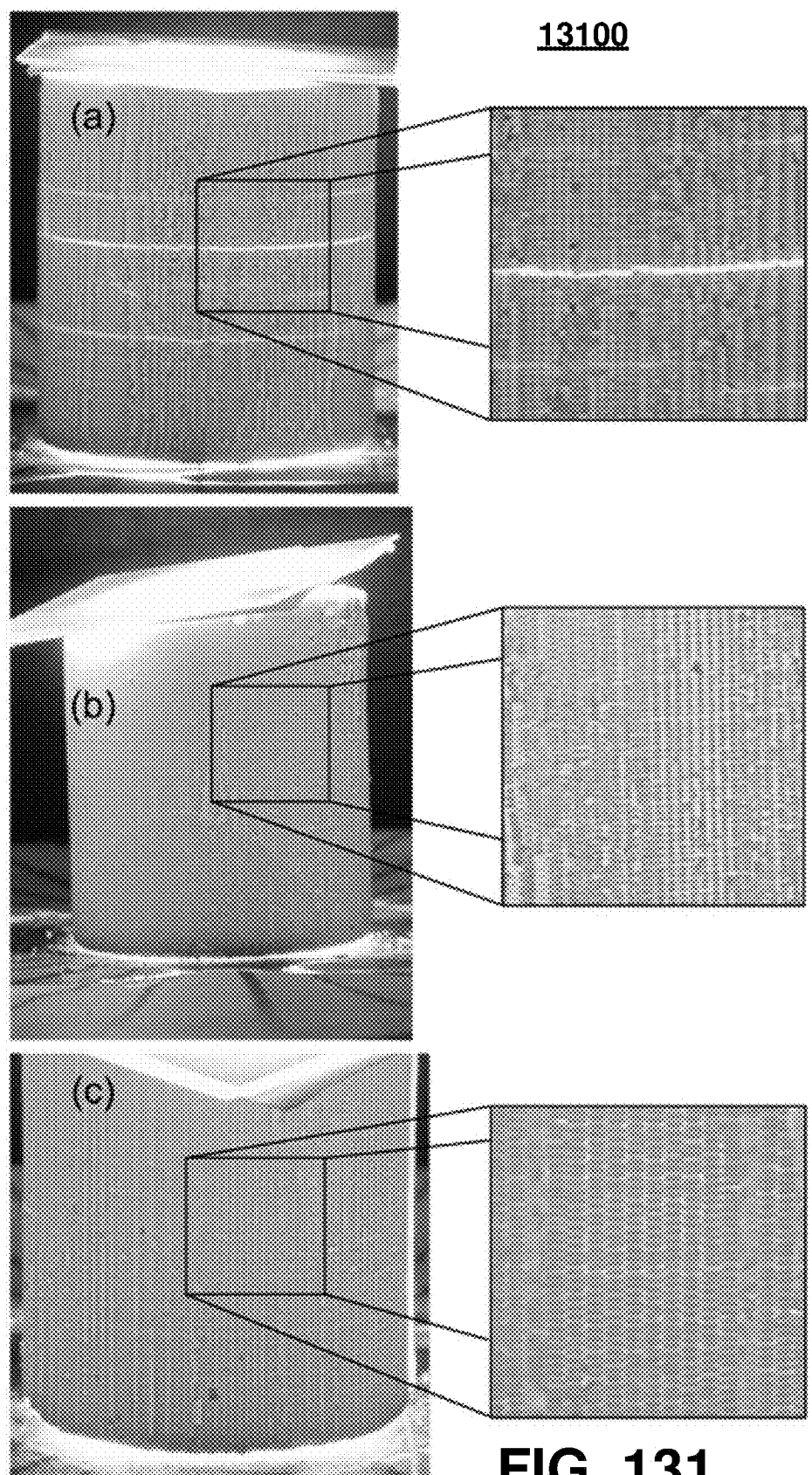

FIG. 131 shows the effects of BBO and sintering on the test cylinders fabricated using a staggered checkerboard exposure with square length after BBO and sintering for one embodiment of a LAMP system.

Figure 132:
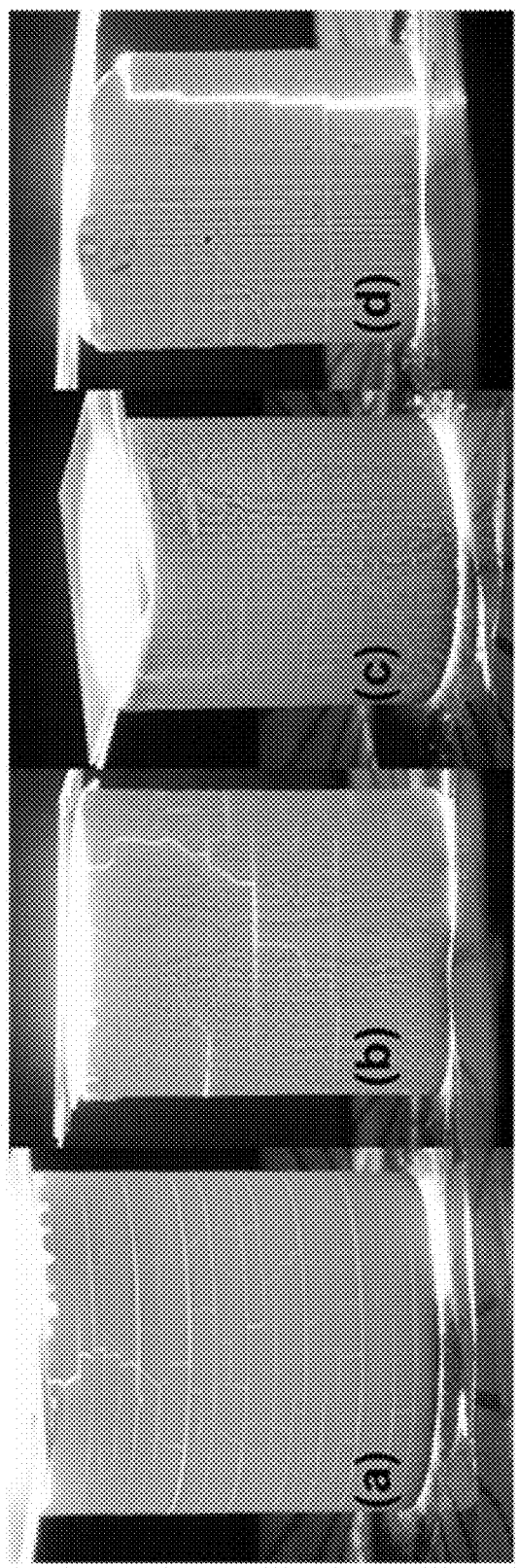

FIG. 132 shows test cylinders exhibiting vertical cracks for one embodiment of a LAMP system.

DETAILED DESCRIPTION

To facilitate an understanding of embodiments, principles, and features of the present invention, they are explained hereinafter with reference to implementation in illustrative embodiments. In particular, they are described in the context of being a continuously moving rapid prototyping system and method.

Embodiments of the present invention, however, are not limited to use in the described systems. Rather, embodiments of the present invention may be used when a three-dimensional prototype object, e.g., a casting, is desired or necessary. Thus, the system described hereinafter as a continuously moving rapid prototyping system and method may also find utility as a system for many applications and for many sized objects.

The components described hereinafter as making up the various embodiments are intended to be illustrative and not restrictive. Many suitable components that would perform the same or a similar function as the materials described herein are intended to be embraced within the scope of embodiments of the present invention.

Figure 1:
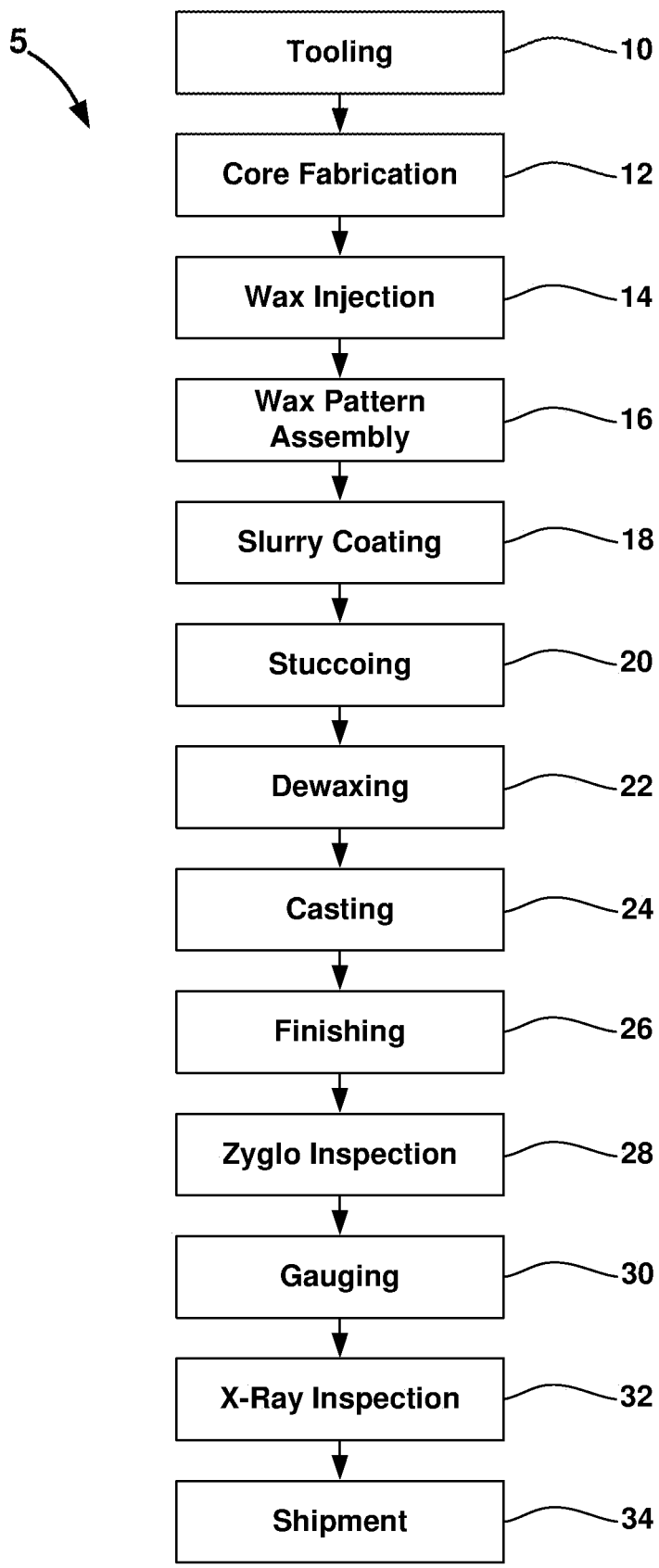
FIG. 1 is a flow chart of a conventional foundry for investment casting of three-dimensional objects.

FIG. 1 illustrates a conventional foundry flow chart for investment casting of three-dimensional objects. For example, the flow chart illustrated in FIG. 1 could be utilized to create turbine airfoils; turbine airfoils with extremely complex interior cooling passages are often produced by investment casting. The exterior airfoil shape is defined by injection molded wax patterns that are removed or "lost" after shelling. The interior passages of the airfoil are defined by injection molded ceramic cores that are removed or "lost" after casting. The core and wax molding operations require sophisticated tooling, leading to excessive initial and maintenance costs, very slow fabrication cycles, and low casting yields.

The process 5 of FIG. 1 begins with the creation of all the tooling 10 necessary to fabricate the cores, patterns, mold, and setters for casting the items, typically involving over a thousand tools for each item. The next step involves fabrication 12 of ceramic cores by injection molding. Molten wax may also be injection molded 14 to define the patterns for the object's shape. Several such wax patterns are then assembled 16 into a wax pattern assembly or tree. The pattern assembly is then subjected to multiple rounds of slurry coating 18 and stuccoing 20 to form the completed mold assembly. The mold assembly is then placed in an autoclave for dewaxing 22. The result is a hollow ceramic shell mold into which molten metal in poured to form the castings 24. Upon solidification, the ceramic mold is broken away and the individual metal castings are separated therefrom. The castings are next finished 26, 28, 30 and inspected 32 prior to shipment 34.

As a result of the embodiments of the present invention, conventional casting steps 10, 12, 14, 16, 18, 20, 22 are obsolete, resulting in the elimination of over 1,000 tools and five major process steps of three-dimensional item prototyping.

As mentioned, there are major obstacles for conventional rapid prototyping. For example, despite the maturity of current investment casting practices, particularly in the aerospace industry, a major challenge exists in the affordable, high-yield, production of cooled, single crystal nickel-superalloy turbine airfoils for jet engines. While many improvements in the performance of designs have been made, no known, significant improvements have been made to lower the cost of manufacturing turbine airfoils. Improvements in turbine airfoil designs have vastly outpaced commensurate improvements in investment casting capability.

In gas turbine engines, for example, it is well established that the turbine engines may achieve higher performance, such as greater power density and lower Specific Fuel Consumption (SFC) by operating at higher temperatures. Turbine airfoils lay at the heart of gas turbine engines, operating at the highest temperatures—even in excess of their melting point. Because turbine airfoils are subjected to very high heat, there has been a continuing effort to identify improvements to the design, materials, and coatings for turbine airfoils to achieve even higher temperature capability and thus higher performance—typically at the sacrifice of affordability. Over the past four decades, materials have improved from wrought alloys to fourth generation single crystal superalloys; designs have improved from uncooled solid airfoils to highly convectively effective and highly film effective, impingement cooled airfoils; and coatings have been developed to environmentally and thermally protect airfoils. Although commensurate manufacturing methods have been developed to make more sophisticated alloys, designs, and coatings producible, very little has been done to reduce the costs of these manufacturing processes, particularly investment castings, or rapid prototyping.

Figure 2:
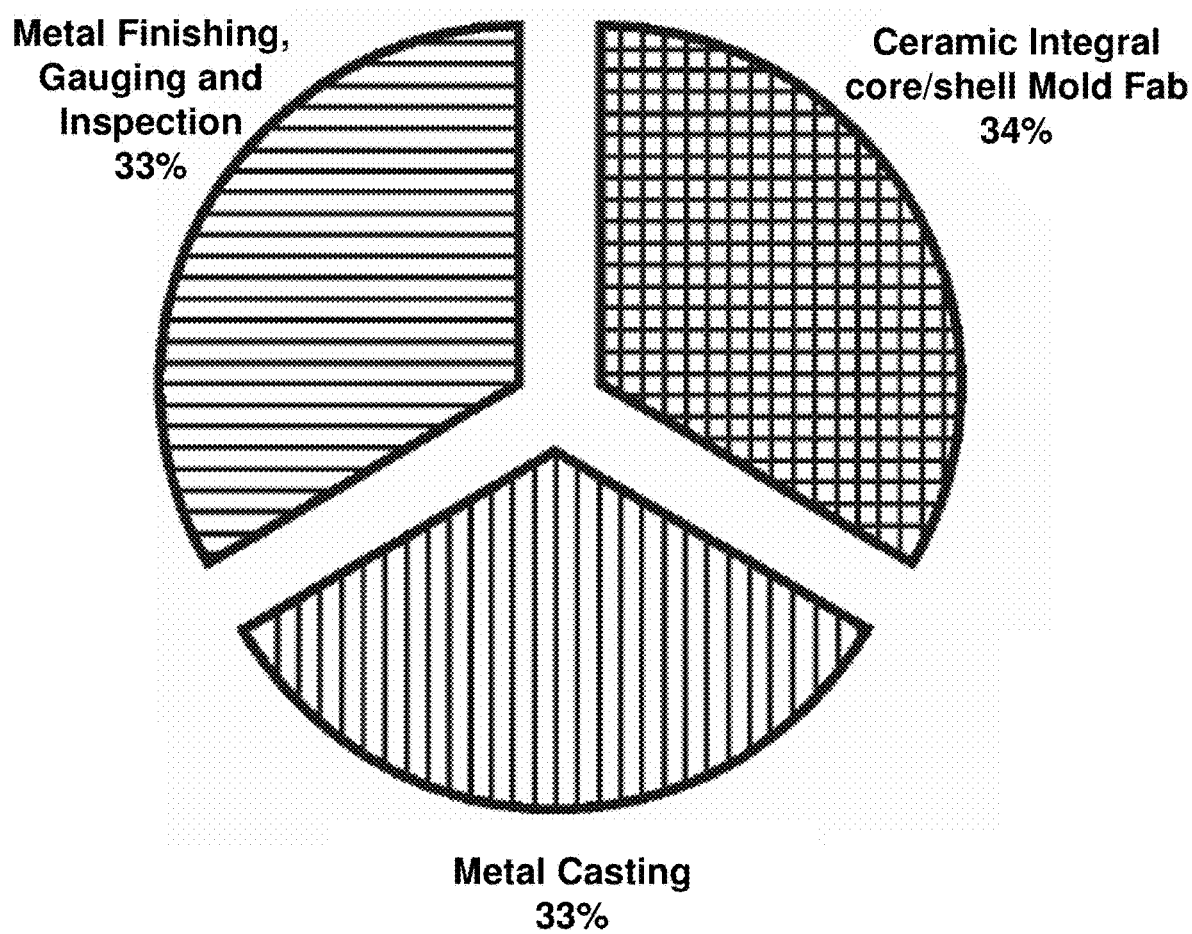
FIG. 2 is a pie chart of a conventional perfectly yielded investment cast object.

The cost of investment casting an object, e.g., a turbine airfoil, is established by material usage, and handling and finishing costs, but the final "sell" price is primarily driven by casting yield (cost of poor quality). To dramatically lower the sell price of manufacturing of objects, improvements of embodiments of the present invention may be made in casting yield and secondarily through a reduction in handling, which also impacts casting yield. As shown in FIG. 2, for a perfectly yielded investment cast object, typically a third of the cost is comprised of manufacturing the integral core/shell "lost" mold (steps 10-22 of FIG. 1); a third of the cost is metal pouring; and a third of the cost is finishing, gauging, and inspecting the finished metal casting. Where casting yield is low, however, the cost of making integral core/shell molds dominates more of the overall costs, sometimes commanding up to half of the cost of an investment casting. In sum, for a yielded object casting, cost is evenly divided among manufacturing the mold, casting, and finishing, as illustrated in FIG. 2.

The cost of manufacturing the "lost" integral core/shell is a large part of the cost of an investment cast object because approximately 60-90% percent of the causes for low casting yield occur in fabrication and handling of the cores 12, wax injection 14 and dewaxing 22; whereas relatively less scrap is typically caused by metal pouring and finishing, steps 24, 26, 28, 30, 32, 34. Causes are typically due to the enormous amount of handling and handling-induced variation and damage that occurs in the fabrication of cores, injection of wax around the cores, and subsequent high stresses placed on the cores during dewaxing. Core fracture and breakage, hand finishing breakage, wax injection-induced core fracture, breakage and shift, and core shift and shell defects caused during dewaxing typically lead to downstream yield problems such as kiss-out, miss-run, recrystallized grains, surface defects, inclusions, and other defects detected after casting. Unfortunately, early causes for low casting yield are not discovered until after the metal has been cast, the shell and core removed, and the metal component is inspected. Although some incremental productivity improvements have been made, such as semi-automated finishing and handling, none have dramatically lowered the cost of investment casting turbine airfoils. Elimination of the "lost" processes and accompanying tooling and handling by directly digitally manufacturing the investment casting mold may dramatically increase production yields, reduce costs and lead-times.

Embodiments of the present invention relate to systems and methods that develop a disruptive manufacturing technology for the direct digital manufacturing (DDM) of three-dimensional items or objects, such as airfoils. Embodiments of the present invention are based on large area maskless photopolymerization (LAMP) of photocurable materials (e.g., photopolymers alone, composites comprising a photopolymer, ceramic- or ceramic-precursor-filled photopolymers, metals, and the like).

As mentioned, referring to FIG. 1, LAMP may be used, in some embodiments, to produce integral ceramic cored molds ready for step 24, i.e., the casting step. As such, DDM of items using LAMP will replace and thus eliminate steps 10-22, amounting to the elimination of over 1,000 tools and five major processes with a single step corresponding to direct digital mold production. Accordingly, LAMP will fundamentally eliminate at least approximately 95% percent or more of tooling and tooling costs, at least approximately 20-30% of the overall part cost, and at least approximately 60-90% of the causes for low casting yield. LAMP may enable in situ casting of more sophisticated features, such as film cooling holes, that are otherwise difficult or physically impossible to cast with conventional investment casting processes, further improving casting yield and dramatically improving downstream machining yields and costs.

Exemplary embodiments of the present invention relate to both a system and a method for fabricating a three-dimensional object.

In an exemplary embodiment, the system for fabricating a three-dimensional object includes an optical imaging system for providing a light source, a photosensitive medium that is adapted to change states, and a control system for continuously moving the optical imaging system above the medium. The optical imaging system may use a spatial light modulator (SLM) to scan a portion of the surface of the medium housed in a container. In an exemplary embodiment, the medium is a photopolymer. As the optical imaging system scans the medium, when the light source illuminates a portion of the surface of the medium, the characteristics of the medium change, e.g., from a liquid or aqueous state to the solid state.

In an exemplary embodiment, the optical imaging system or radiation system includes a light source, a reflector system, an optical lens system, a mirror, the SLM comprising a digital mirror device (DMD), and a projection lens. In operation, the light source may illuminate an ultraviolet light source, e.g., having a particular, predetermined wavelength in the UV spectrum. Various embodiments of the present invention may include light sources comprising any one of an ultraviolet light, violet light, blue light, green light, actinic light, and the like. The light emitting from the light source may be directed upon a portion of the reflector system, and thus reflects from the reflector system, which may comprise a concave-shaped reflector. The reflector of the reflector system directs the light through a lens of the optical lens system before it reaches a mirror. The mirror then reflects the light towards the digital mirror device (DMD). The DMD is a microelectromechanical device comprising a plurality of tiny mirrored surfaces that each may be independently pivoted from a first to a second position. The mirrors are formed into the surface of a semiconductor chip and through the application of an appropriate voltage to the circuitry built under each mirror, that mirror may be made to tilt to one side or another with respect to a plane normal to the semiconductor chip. With respect to some fixed frame of reference, pivoting in one direction causes the mirror to reflect light whereas pivoting in the opposite direction causes the light to be deflected from the fixed frame of reference. The light from the DMD is next directed towards a projection lens. The light then is projected onto the surface of the medium in the container. Other types of SLMs, such as liquid crystal displays, grating light valves, and the like, may also be implemented.

For example, one process/system involves using SLMs that scan at least a portion of the surface of a photopolymer. In scanning a surface of the photopolymer, the SLMs project a two-dimensional image (e.g., from a CAD file) thereon. The two-dimensional image comprises a cross-section of a three-dimensional object to be formed within the various layers of the photopolymer, once cured.

The process/system involves continuous movement of the SLMs, instead of so-called "step and expose" or "step and repeat" movements. In providing continuous movement, the two-dimensional image projected by the SLMs is a dynamic image. That is, rather than projecting a fixed, single image on a portion of the photopolymer surface, followed by movement of the SLMs to a new location, changing the SLMs to a new image that corresponds to the desired image over the new location, and projection of the new image on the portion of the photopolymer surface at the new location, embodiments of the present invention involve projecting an image that continuously changes as the SLMs scan over the surface of the photopolymer.

As alluded to above, the systems and processes above are not limited to use of photopolymers as the photosensitive medium alone. For example, composite materials (e.g., those that contain a filler material for a photopolymer, or those that combine the photopolymer with another polymer), may be employed as well. For example, if a ceramic body is desired, a polymer-ceramic matrix or a polymer-ceramic precursor matrix may be used in the LAMP systems and processes, followed by removal of the polymeric component, thereby leaving behind a ceramic green body that may be subjected to additional processing.

The well-known approach of exposing a photosensitive medium with a focused, raster scanning laser beam is used in conventional stereolithography systems, as well as in microelectronics manufacturing systems for mask writing, prototyping, customization of chips, and repair of defects. Such systems expose all the pixels one at a time on the substrate. The most widely used direct-write systems use an ultraviolet (UV) laser source. The laser source is focused to the desired spot size on the surface of the polymer to be cross-linked or the ceramic suspension to be photo-formed in stereolithography, or on a substrate coated with a photosensitive material in the platesetting print industry, or on a substrate coated with photoresist in microelectronics manufacturing. The focused spot may be modulated as the beam is raster scanned across the substrate. In principle, these are maskless systems. Because transfer of the pattern information by such tools takes place in a slow, bit-by-bit serial mode, typical substrate exposure times may range from several minutes to several hours per square foot. Some raster-writing tools use multiple rastering beams to overcome the low-throughput problem, while only partially achieving the objective. Other raster-writing tool concepts have been developed in the last few decades, but due to their low throughputs, all such systems are suitable only for low-volume or one-of-a-kind applications such as prototyping or mask fabrication, and are unattractive for cost-effective manufacturing in high or even moderate volumes.

In an exemplary embodiment, the SLM is a two-dimensional array of approximately one million micro-pixels, each of which may be individually turned ON or OFF. In the ON position, illumination that is incident on the pixel is directed toward a high-resolution projection lens and imaged onto the photosensitive medium. In the OFF position, the illumination incident on the pixel is deflected away from the entrance numerical aperture (NA) of the projection lens and not permitted to reach the substrate. The SLM is controlled by the control system, which may include a computer. The computer accesses CAD files containing the ON/OFF states for all of the pixels in an entire frame, e.g., a bitmap frame.

Figure 3A:
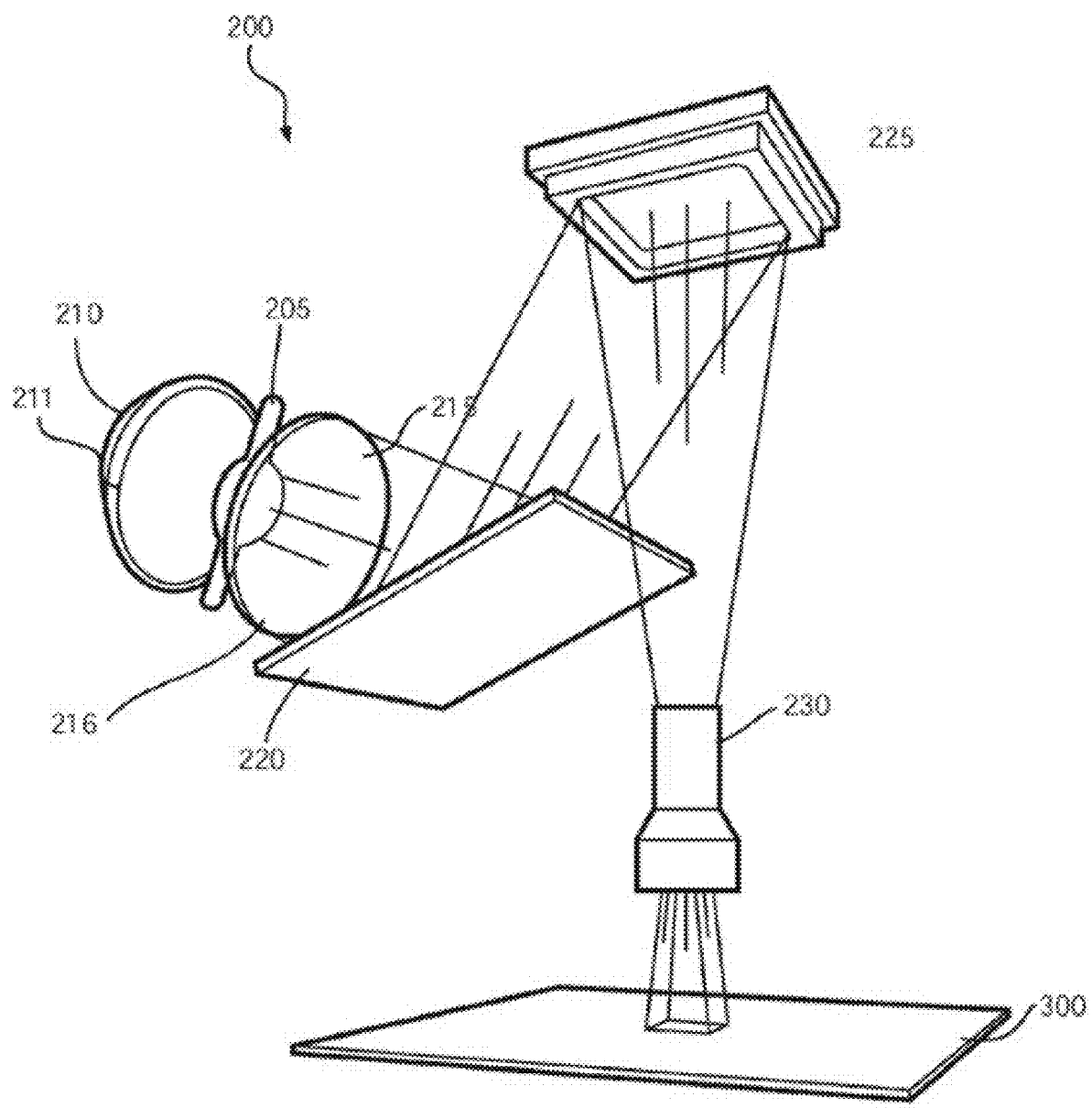
FIGS. 3a and 3b are perspective views of a large area maskless photopolymerization (LAMP) system, in accordance with an exemplary embodiment of the present invention.
Figure 3B:
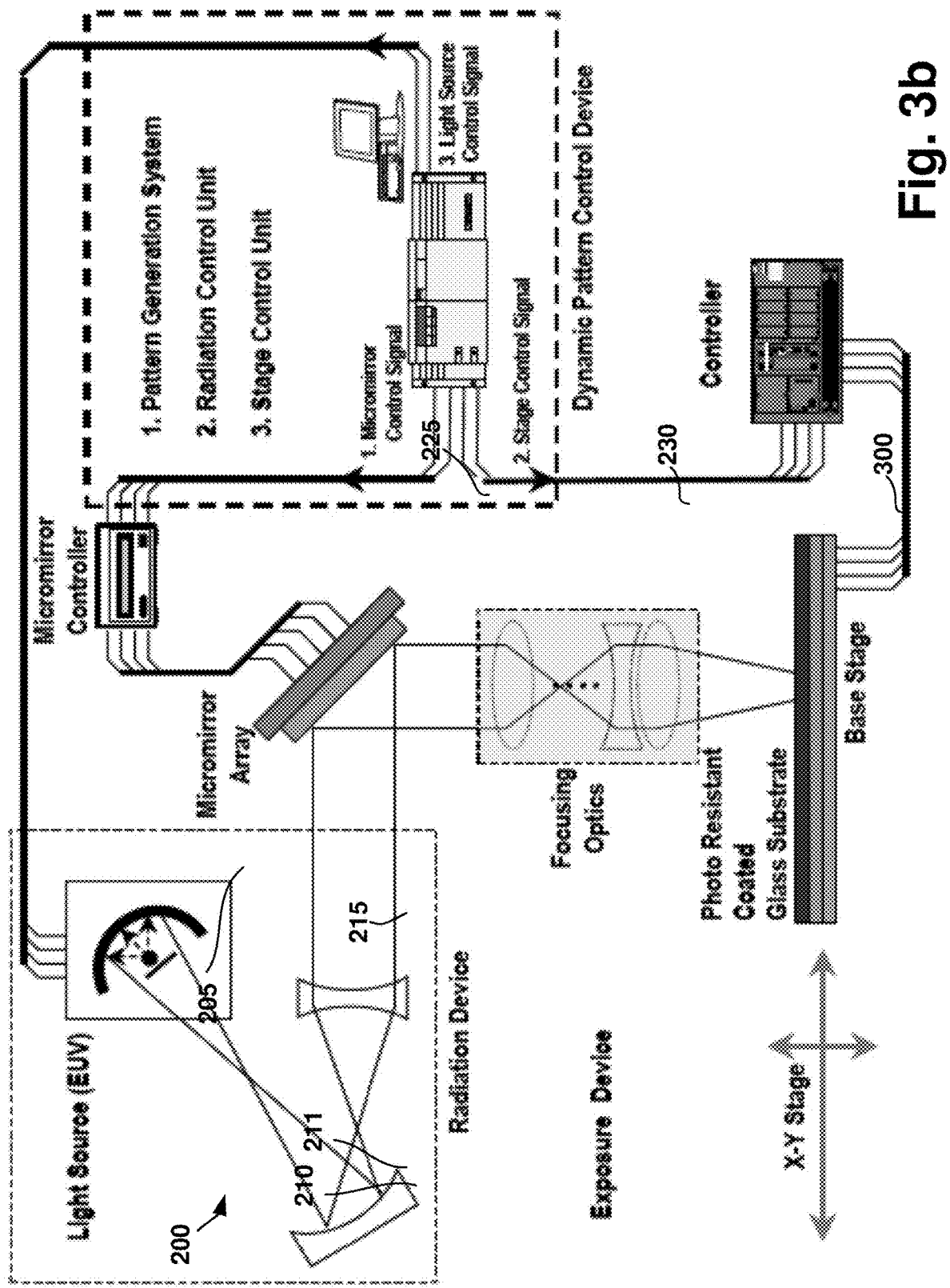

Computer-to-conventional plate (CtCP) lithography technology may utilize SLMs as programmable, massively parallel write-heads, as illustrated in FIGS. 3a and 3b. In an exemplary embodiment, the CtCP system may be manufactured by BasysPrint's UV Series 57F machine equipped with a single DMD-based scanning head, which was commercialized in the early 2000s. The success of this technology led to the 700 series UV platesetters with two DMD-based scanning heads working in tandem to achieve process throughput that was orders of magnitude higher than single laser beam writing techniques.

FIGS. 3a and 3b illustrate a perspective view of an optical imaging system providing a light source to a given surface, in accordance with an exemplary embodiment of the present invention. The LAMP system 100 for fabricating a three-dimensional object includes the optical imaging system 200. The optical imaging system 200 or radiation system includes a light source 205, a reflector system 210, an optical lens system 215, a mirror 220, at least one SLM 225, e.g., a DMD, and a projection lens 230.

The light source 205 may illuminate, and thus provide a light. Various embodiments of the present invention may include light sources comprising any one of an ultraviolet light, violet light, blue light, green light, actinic light, and the like. In an exemplary embodiment, the light source has a particular, predetermined wavelength in the UV spectrum. Embodiments of the present invention may be described herein as a UV light source, but embodiments of the present invention are not limited to such a light source, and other light sources, including the examples disclosed may be implemented.

The light emitting from the light source 205 may be projected upon a portion of the reflector system 210, and reflects from the reflector system 210, which may comprise a concave-shaped reflector 211. The reflector 211 of the reflector system 210 directs the light through a lens 216 of the optical lens system 215 before it reaches the mirror 220. The mirror 220 then reflects the light towards the DMD 225. The light from the DMD 225 is next directed towards the projection lens 230. The light from the projection lens 230 is then projected onto the surface 300 of the photosensitive medium.

In an exemplary embodiment, the BasysPrint device may incorporate the optical imaging system. In such an embodiment, BasysPrint's massively parallel scanning device may include a single DMD-based SLM. If desired and/or necessary, the BasysPrint device may be extended to multiple DMDs working in parallel.

Figure 4:
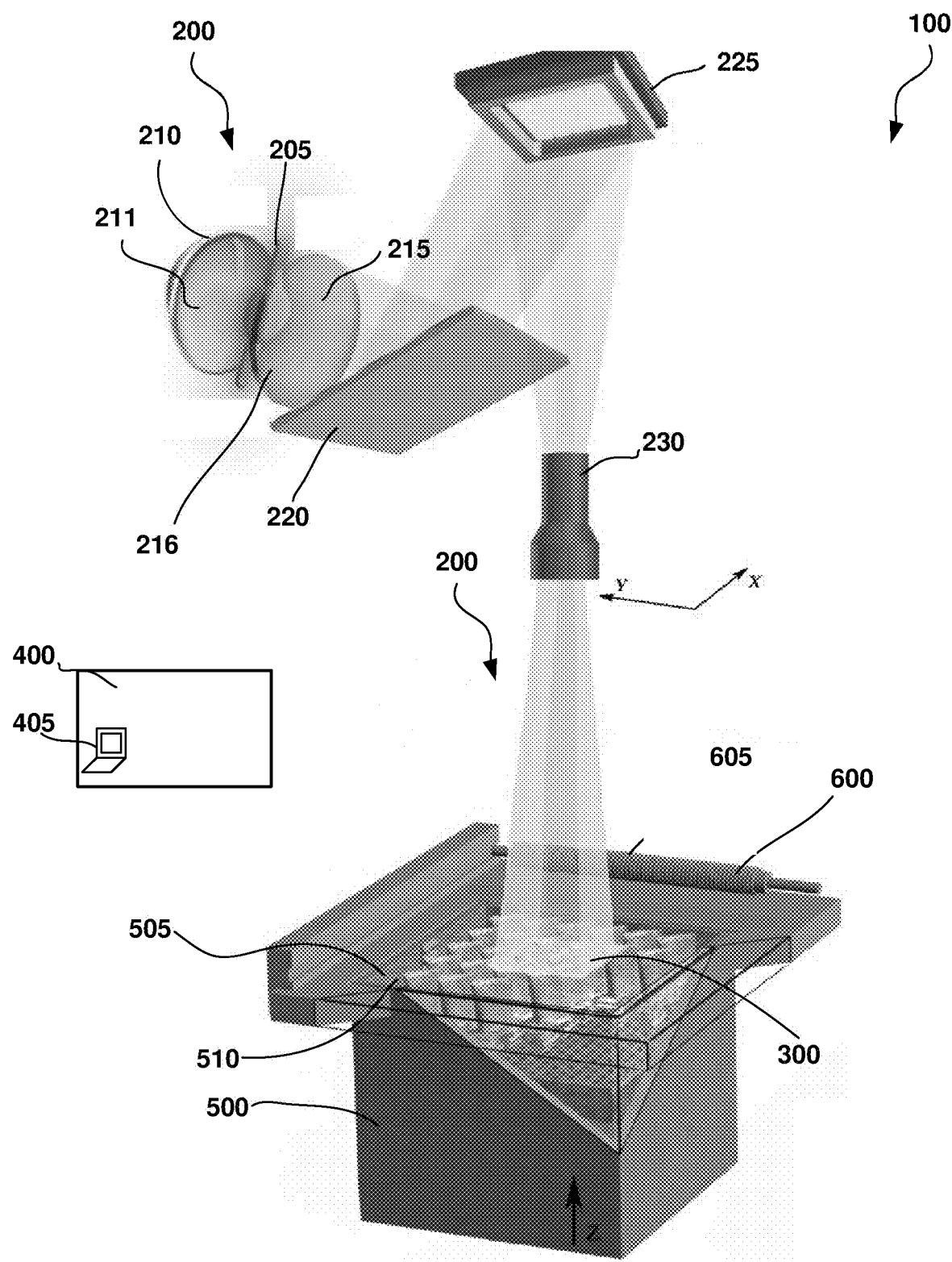
FIG. 4 is another perspective view of the LAMP system, in accordance with an exemplary embodiment of the present invention.

FIG. 4 illustrates a perspective view of an exemplary embodiment of the optical imaging system 200 emitting a light source onto a given surface 300 of the photosensitive medium. In essence, FIG. 4 illustrates a schematic of an SLM-based CtCP scanning maskless imaging system.

In an exemplary embodiment, the UV light source 205 may be a mercury vapor lamp, xenon lamp, violet laser diode, diode pumped solid state laser, frequency-tripled Nd:YAG laser, XeF excimer laser, or the like. The UV light source 205 may illuminate an SLM or an array of SLMs, e.g., one by two, such that the beams reflected from the ON pixels of the SLM array are coupled into the projection lens while the beams from the OFF pixels are directed away from the lens. The elements of the SLM, e.g., a DMD, 225, nominally approximately 15 micrometers (μm) square in size, are individually controllable by the CAD data from the computer, enabling rapid, programmable selection of a large number of sites for laser irradiation. The DMD 225 may modulate the illumination by means of its bi-stable mirror configuration, which, in the ON state, directs reflected illumination toward a projection lens, and in the OFF state, directs illumination away from the lens.

The entire optical imaging system 200 may be mounted on an XY scanning stage with a large area of travel spanning several hundred millimeters. As the optical imaging system 200 is scanned over different areas of the medium, e.g., the substrate 300, the projection lens 230, with the appropriate magnification or reduction, images the ON pixels of the SLM array directly onto the substrate 300. The projection lens 230 reduction ratio may be between approximately 1 and approximately 50, which may result in a minimum feature size between approximately 15 microns and approximately 0.3 microns. Each pixel in the array is digitally controlled to be either ON or OFF. A desired pattern corresponding to an input bitmap image (e.g., BMP, TIFF, and the like files) may be generated by the SLM by loading the array with bitmap data that configures each pixel. When a different pattern is needed, a different bitmap data set may be loaded. In effect, the SLM may be a rapidly programmable structured light pattern generator that may reproduce an entire bitmap image with high fidelity across a large area substrate.

Comparing SLMs to serial exposure via laser direct-write techniques, SLMs enable massively parallel processing by exposing an entire image field in a single shot. The digital signal processing electronics integrated into commercial SLMs may support a high frame rate (several kHz) allowing the exposure image data to be refreshed continuously such that large areas of a substrate (photosensitive medium) may be continuously scrolled and dynamically exposed by scanning at high speeds.

Figure 5:
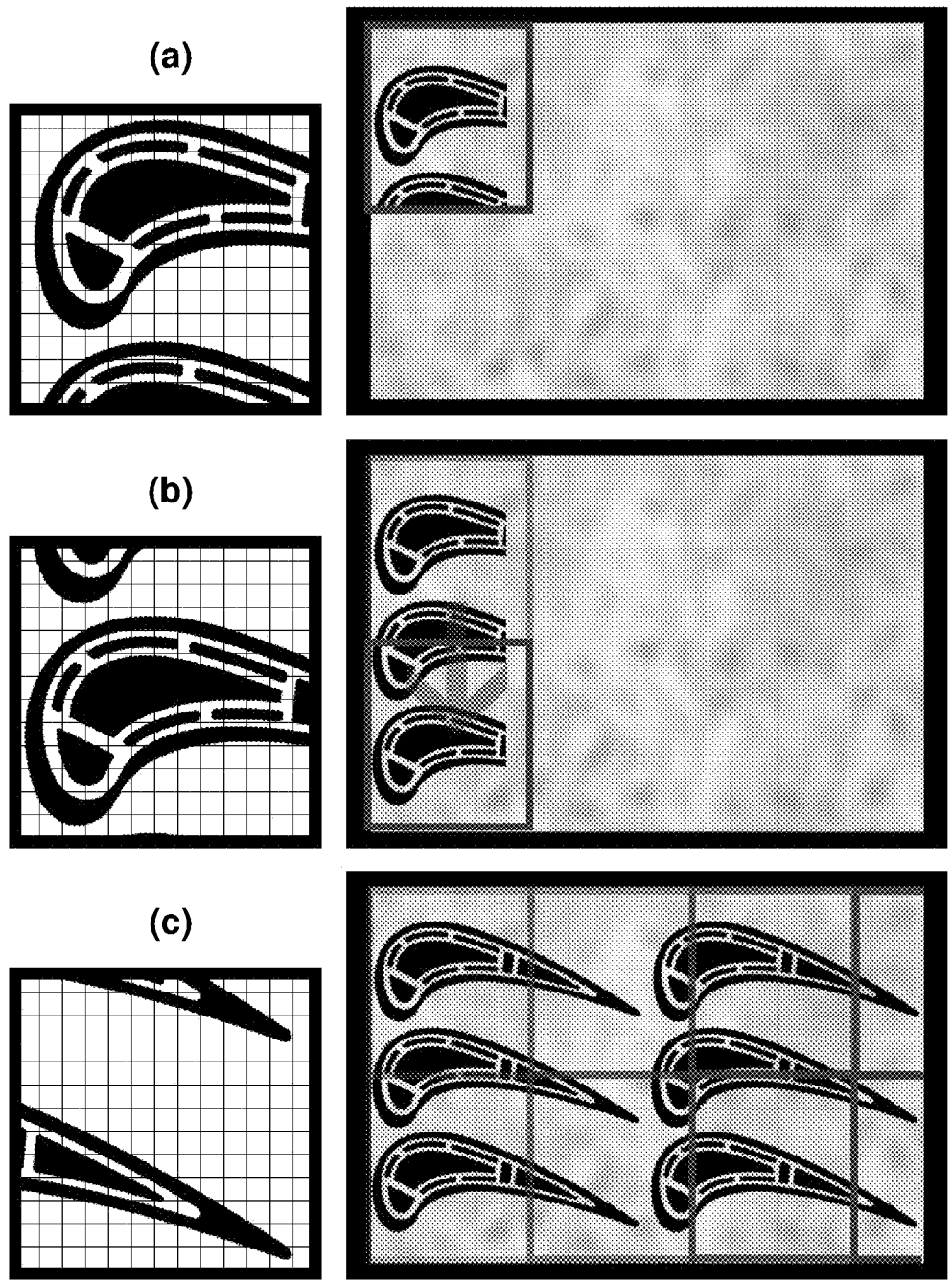
FIG. 5 illustrates an exemplary computer aided design slice pattern, in accordance with an exemplary embodiment of the present invention.

FIG. 5 illustrates and exemplary computer aided design slice patterns of a turbine airfoil mold, in accordance with an exemplary embodiment of the present invention. In other words, the seamless scanning configuration of a maskless imaging system for projecting CAD slice patterns of multiple airfoil molds on a large area is illustrated in FIG. 5.

As described, the optical imaging system 200 may be mounted on an X-Y stage, and is scanned while the SLM sends a sequence of frames. Each frame, e.g., see exemplary frames in (a)-(c) of FIG. 5, represents a portion of a full pattern, mimicking a mask scanning synchronously with the substrate. The SLM is illuminated by a pulsed UV light source 205 while the pulses are synchronized to the data stream that configures the SLM. As the optical imaging system 200 scans over the substrate 300, the data sent to the SLM is continuously and synchronously updated, line-by-line, and frame-by-frame, delivering the entire pattern information to the substrate 300 during its scanning motion. The SLM operates such that the entire array is reconfigured for each pulse to properly form the correct image on the substrate. The desired image on the substrate 200 may be digitized and fed to the SLM as a stream of data in a similar fashion as used in raster-writing systems. The difference between the SLM-based imaging system and conventional raster-writing methods is that the massively parallel processing power of the SLM is utilized to increase the data throughput by many orders of magnitude.

Exemplary embodiments integrate layered manufacturing of complex three-dimensional objects by solid freeform fabrication (SFF) using photocurable resins with the fine-feature resolution and high throughput of direct digital computer-to-plate (CtP) lithography techniques from the printing industry. These techniques have recently advanced to dramatically increased throughput by using SLMs to pattern large-area photosensitive plates directly from computer-processed bitmap images for making print masters. This integration of technologies achieves a disruptive breakthrough in part build speed, size, and feature definition over current SFF methods. Exemplary embodiments may provide an ability to rapidly manufacture parts or objects that have macro-scale exterior dimensions (approximately a few centimeters) and micro-scale interior features (approximately microns to approximately tens of microns). Furthermore, exemplary embodiments may be well-suited for mass production of state-of-the-art integral ceramic cored molds for casting turbine airfoils directly from digital information.

Referring back to FIG. 4, it illustrates a perspective view of a system and method for fabricating three-dimensional objects, in accordance with an exemplary embodiment of the present invention. That is, a LAMP system 100 is illustrated in FIG. 4, and illustrates layer-by-layer simultaneous fabrication of several objects—in an exemplary embodiment airfoil mold structures—over a large area.

In operation, light from UV light sources 205 of the optical imaging system 200 is conditioned and conveyed through optics. The UV light sources 205 are conditioned and conveyed through transmissive and reflective optics onto an array of SLMs 225.

The SLM array may receive a real-time video stream of CAD data-slice bitmap images from the control system 400. A process control computer 405 of the control system 400 may turn the corresponding pixels in the array ON or OFF. As described, the light from the ON pixels may be reflected downwards and transmitted into the projection lens system 230. The projection lens 230 may convey highly focused images at the rate of several kilohertz (kHz) corresponding to the ON pixels onto the surface 300 of a photosensitive medium in the material build platform 500. The optical imaging system 200, including the light source 205, optics 215, SLM array 225, and projection lens 230, may be scanned along the X and Y axes at high speeds to continuously expose new areas of the resin 300 synchronously with images that are continuously refreshed on the SLM array. When the entire surface area of the resin 300 has been scanned and exposed, the surface of material build platform 500 may be moved downward along the negative Z-axis by a slice layer thickness, and a new layer of photocurable material may be swept by a material recoating system 600.

The material recoating system 600—which for illustration purposes is shown as a wire-wound draw-down bar—sweeps uniform thickness layers of the photosensitive medium at high speeds across the interior of the material build platform 500, without disturbing the previously built layers. Once a new layer of the photosensitive medium has been formed, focusing and alignment optics may ensure that the surface of the medium is at the focal plane of the projection lens, making fine adjustments in the Z-direction if necessary. Upon completion of this step, the LAMP process repeats the cycle of building the next layer and delivering new resin until the entire build is completed.

Figure 6:
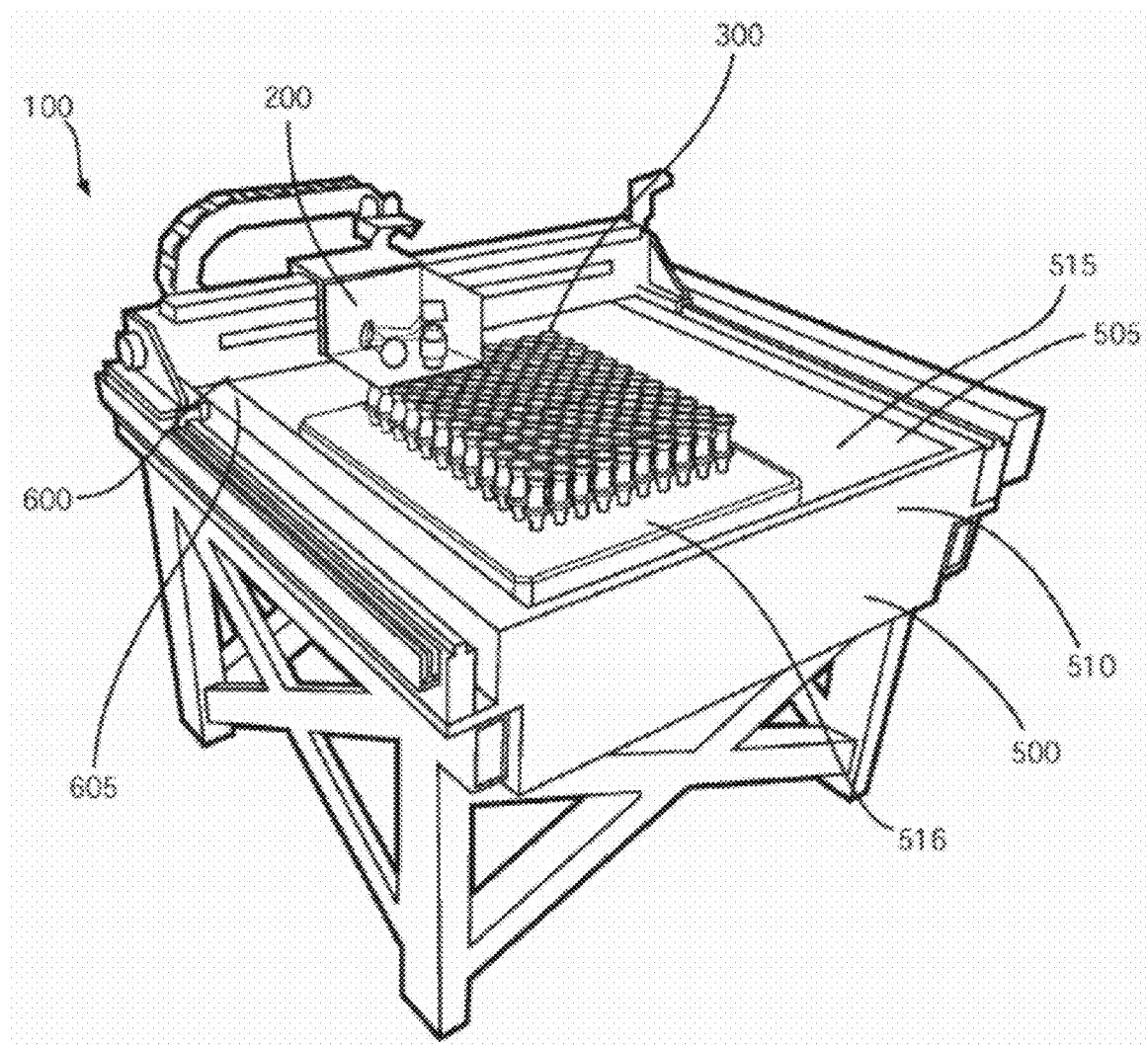
FIGS. 6-7 are perspective view of the LAMP system for fabricating the three-dimensional objects using a maskless optical imaging system, a material build platform, a material recoating system, and a control system, in accordance with an exemplary embodiment of the present invention.
Figure 7:
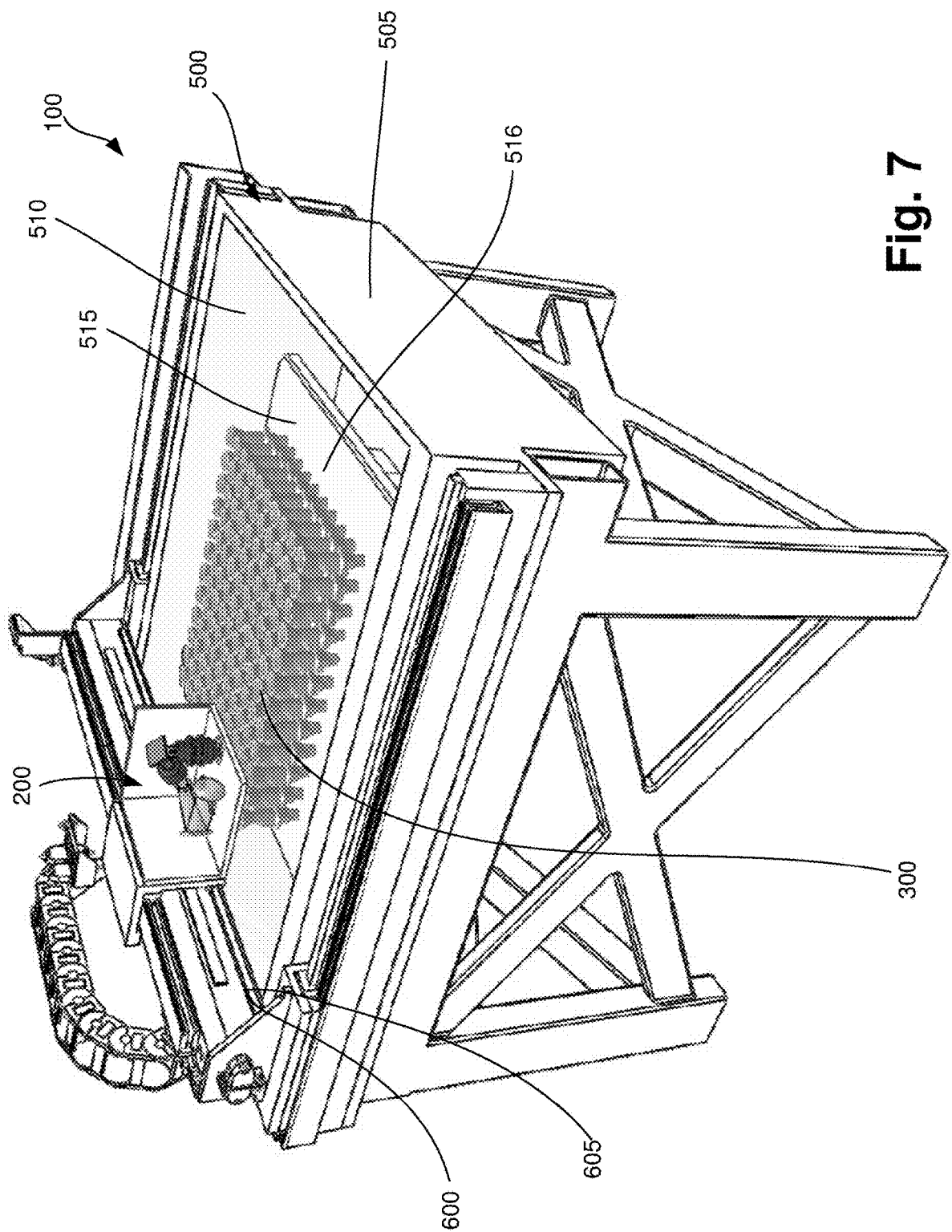
Figure 8:
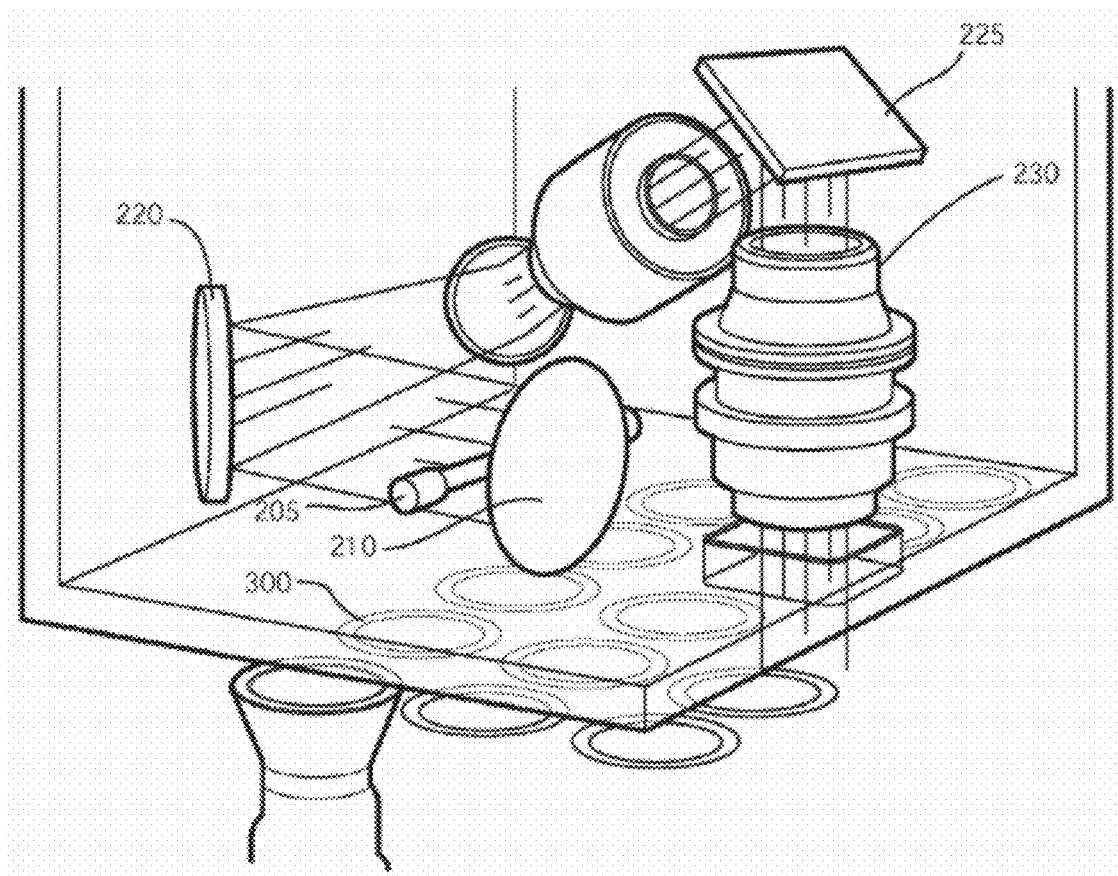
FIG. 8 is a perspective view of an optical imaging system for the LAMP system, in accordance with an exemplary embodiment of the present invention.

As shown in FIGS. 4 and 6-7, the system and method for fabricating the three-dimensional object includes a maskless optical imaging system 200, a container 500 for holding the medium, material recoating system 600, and the control system 400. In an exemplary embodiment, the LAMP system 100 may include: (1) a maskless optical imaging system (MOIS) for exposing the patterns into a photosensitive medium; (2) the material build platform (MBP) for layer-by-layer UV curing and freeform fabrication of a three-dimensional object; (3) the material recoating system (MRS) for rapidly coating approximately 25-100 μm uniform thickness layers of the photosensitive medium onto the MBP; and (4) the control system comprising hardware and software interfaces with the MOIS, the MBP, the MRS, and with 3-D CAD data bitmap slices in order to enable a completely automated and synchronized LAMP system.

When the optical imaging system is a maskless optical imaging system or MOIS 200, MOIS 200 may comprise the UV light source, beam homogenization optics, mirrors, condenser optics, illumination optics, an array of SLMs, and the projection lens system. In addition, the MOIS 200 may comprise a UV light source, transmission and condenser optics, array of spatial light modulators (SLMs) (e.g., DMDs), projection lens system, and high-precision XY scanning stage. MOIS 200 may utilize scanning exposure with the SLM array having well in excess of a million modulator elements. The MOIS 200 exploits state-of-the-art SLM 225, such as DMD chips (e.g., from Texas Instruments) with 1024×768 pixels and with an approximate 10 kHz frame rate. In addition, MOIS 200 exploits extensive software algorithms to coordinate and synchronize the SLM data frames and the position information of the scanning optical imaging system over the MBP.

MOIS 200 may be mounted on an overhead gantry style precision XY motion stage with sub-micron position resolution for achieving a minimum in-plane feature resolution of at least approximately 15 μm with an error of approximately ±1.5 μm. The XY motion stage may scan over the entire MBP 500 at high speeds (e.g., approximately several hundred mm/s) to expose different areas of the top surface of the MBP 500 that has a new unexposed layer of the photosensitive medium.

In an exemplary embodiment, the MBP 500 may comprise a container 505 that serves as the build volume 510. The MBP 500 may incorporate a build substrate mounted on a high-accuracy z-translation stage for building an object in layers e.g., 25 micrometer (and larger) thicknesses using the photosensitive medium. Thinner layers of the photosensitive medium may be created when the dimensions of a feature of the three-dimensional object require so. Similarly, when the dimensions of a feature of the three-dimensional object are large, thicker layers of the photosensitive medium may be used. In an exemplary embodiment, the overall dimensions of the overall build volume 510 may be approximately 24 inches (X) by 24 inches (Y) by 16 inches (Z) (24"×24"×16"). A build surface 515 made of a precision machined plate 516 may be located within the build volume 510 (i.e., in the MBP's interior) and may be mounted on a precision linear motion stage for motion in the Z-direction. During the fabrication of a part, the build surface 515 may be moved incrementally downwards by a distance equal to the layer thickness with which the part is being built. The control system 400 may control this downward movement.

In an exemplary embodiment, the MBP 500 may be constructed using a precision linear positioning system with sub-micron resolution for achieving a minimum build layer thickness of approximately 25 μm with an error of approximately ±2.5 μm. When the entire surface area of the MBP 500 has been scanned by the MOIS 200 and the exposure has been completed, the build surface 515 may move down via its downwardly moving plate 516, and the MRS 600 may apply a new layer of the photocurable ceramic material.

The MRS 600 may comprise a coating device 605, which may be, without limitation, a wire-wound Mayer draw-down bar, a comma bar, or a knife edge or a slurry dispensing system. The MRS 600 may incorporate a coating device capable of applying coatings as thin as approximately 2.5 microns with 0.25 micron variation. The MRS 600 may be designed to successively deposit the layers of the photosensitive medium. During a part build, upon the completion of a layer exposure, the MRS 600 may quickly sweep the medium across the build area under computer 405 control. The MRS 600 may implement principles from the web-coating industry, where extremely thin and uniform coatings (on the order of a few micrometers) of various particulate-loaded formulations are deposited on fixed, flat, or flexible substrates.

In an exemplary embodiment, the photosensitive medium may comprise a concentrated dispersion of refractory ceramic particles in a photopolymerizable matrix. The ceramic particles can, after firing, produce a high quality ceramic object. In an exemplary embodiment, the photopolymerizable matrix may be a mixture of camphor with an acrylic monomer, formulated so that it is solid at room temperature, but liquid when warm (above about 60° C.). Camphene may be selected due to of its convenient melting point, and because solid camphene has a high vapor pressure, making it easy to remove by sublimation. Liquefied resin may be supplied warm to the recoating system, and applied on the material build platform as a thin liquid layer. It may quickly freeze, providing a smooth solid surface. Exposure to the UV may cross-link the monomer, rendering the exposed areas infusible. After building all the layers, heating the block of build material above about 60° C. may melt away the unexposed material, which drains as a liquid. After draining, the solid camphene c removed from the green body by sublimation at or slightly above room temperature. Next, after sublimation the LAMP-fabricated mold may be a dry body containing enough polyacrylate for high green strength, but not so much that special binder-burnout is required before firing.

The solid build material may further provide sharper curing profiles, and may improve resolution. A solid build material may not require a liquid vat with associated issues of flow-related disturbance of the previously-exposed layers. Consequently, recoating may be done much faster and with thinner layers, because the higher shear forces from the recoating device may not disrupt underlying solid layers.

In addition, eliminating liquid flow in a vat enables the build platform to be rapidly translated in the X-Y directions. Consequently, the mechanics of the exposure and optical system design are greatly simplified, improving precision and repeatability.

The solid build material that the support structures are inside may not be needed. Support structures are endemic to 3-D free-forming from liquid materials. A layer that has overhangs (such as a curved part) cannot float in space, so the build software produces a temporary scaffold to support it, i.e., a support structure. After doing a conventional SLA build, the support structures need to be removed. But if the object is a metal casting mold, the cavity on the inside of the mold is the relevant surface, and an interior support structure cannot be simply removed. Careful consideration of the design is required to find optimal build directions where support structures are not needed. Solid build materials do not require support structures, because the overhangs are supported by the solid (but uncured) material below.

Silica is an exemplary ceramic material, whereas the LAMP process may be applied to a wide range of ceramic materials. Alumina- or yttria-containing photosensitive media may be produced, for example, to cast more reactive superalloys (for making turbine airfoils) that require alumina or yttria molds. Adjusting exposures for the alumina-based or yttria-based resin causes a different sensitivity for photopolymerization. Sensitivity in ceramic-containing resins is mostly limited by light scattering, which depends upon the refractive index of the ceramic and also on the particle size distribution and suspension structure affecting photon transport. The refractive index of silica is close to the monomer, so silica resins are very sensitive. Alumina and yttria have higher refractive indices and so they require a higher exposure dose.

A new photosensitive medium may be developed taking into account the rheological behavior of the medium material in the liquid state, the photocuring behavior of the medium, the clean draining of the uncured medium, cured polymer removal, firing, and the refractory properties of the final fired ceramic object.

Development of a solid medium may adopt the successful terpenoid-based vehicles, such as camphor, which may be removed after forming by sublimation. This eliminates nearly all drying and binder burnout issues. The rheology of ceramic powders in warm liquid terpenoids is well understood, and effective colloidal dispersants are commercially available. Detailed information is available on solidification of camphor and camphene at room temperature, as these have been a preferred model system for solidification research. The solidification of concentrated ceramic suspensions is also well understood. Preliminary results of the photopolymerization behavior of solid photosensitive medium based on terpenoid-acrylate monomers are encouraging. Solid polymers are routinely used in pre-press plate-setting print industry, as well as in photolithography.

The photocuring characteristics of the ceramic-containing resins as a function of composition and properties may be tailored to develop an optimized PCMS composition. Examples of ceramic-containing resins for use as the photosensitive medium and of their manipulability may be found in U.S. Pat. No. 6,117,612, which is incorporated by reference herein as if fully set forth below.

The control system 400 may comprise the PCS 405 for the LAMP system 100. In essence, the PCS 405 forms the brains of the LAMP system 400 and is the central processing unit of the system, responsible for automation functions. The PCS 405 may include the software algorithms to conduct adaptive slicing of the integral cored mold CAD files for optimized layer thickness, part surface finish, avoidance of stairstepping, and minimum build time as a function of critical features and feature sizes present in the mold design. The PCS 405 further may include the algorithms and signal communication logic for coordinating the motion of the MBP, the MRS, and the MOIS for automated layer-by-layer material delivery, scanning, and photoexposure to build 3D parts in the shortest possible time with the least possible idle time in the LAMP machine. Software algorithms may process the CAD data slices into the stacks of images (e.g., see FIG. 10a) necessary to be flashed to the SLMs at the high rates necessary for seamless and maskless exposure of the photosensitive medium as the MOIS moves at high speeds over the MBP. Software algorithms may also adaptively adjust the exposure dose in real-time as a function of slice layer thickness to achieve the necessary full cure depth through the layer thickness regardless of the layer thickness.

Figure 9:
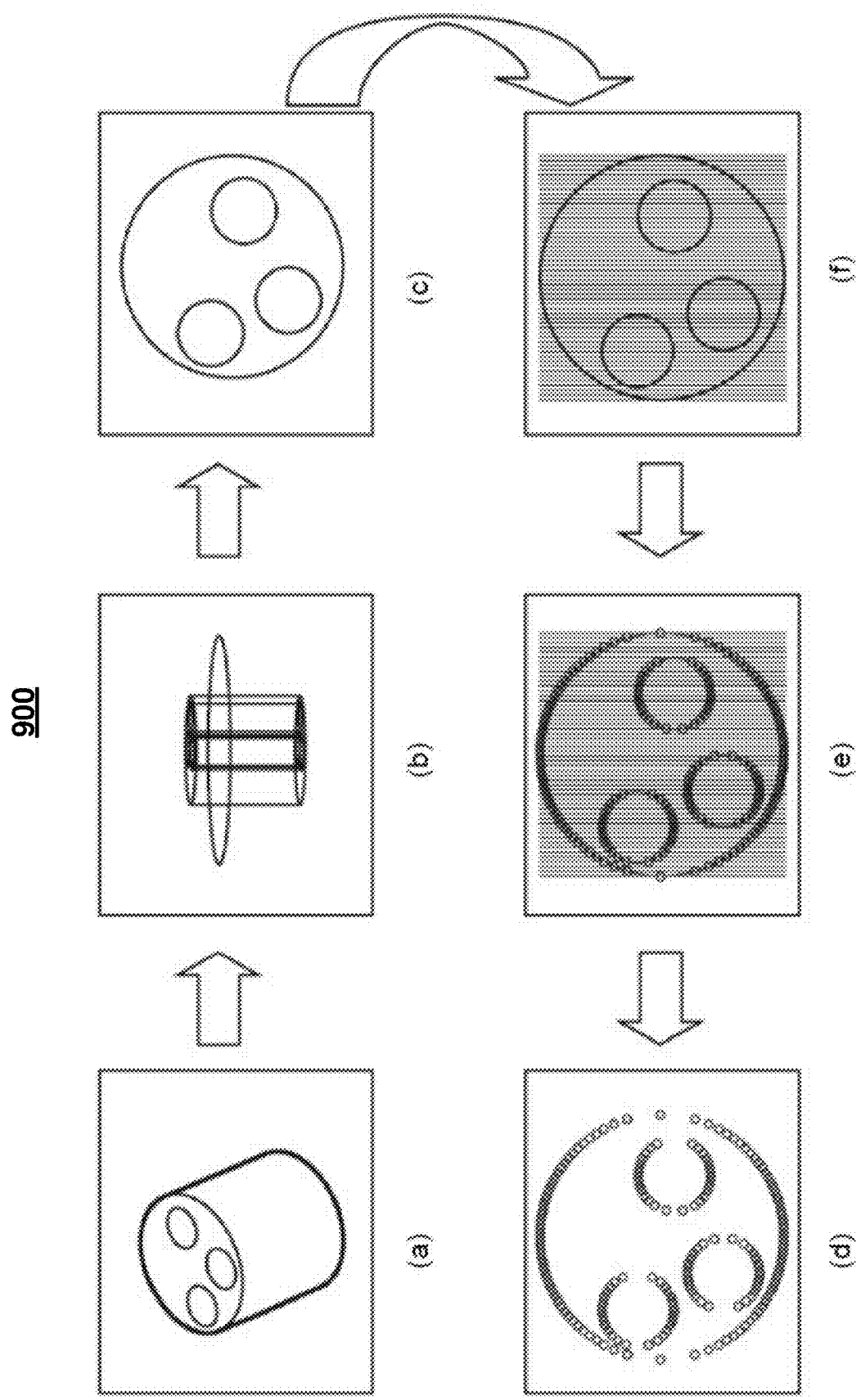
FIG. 9 illustrates a plurality of cross-sectional views of a three-dimensional computer aided design drawing, in accordance with an exemplary embodiment of the present invention.
Figure 10B:
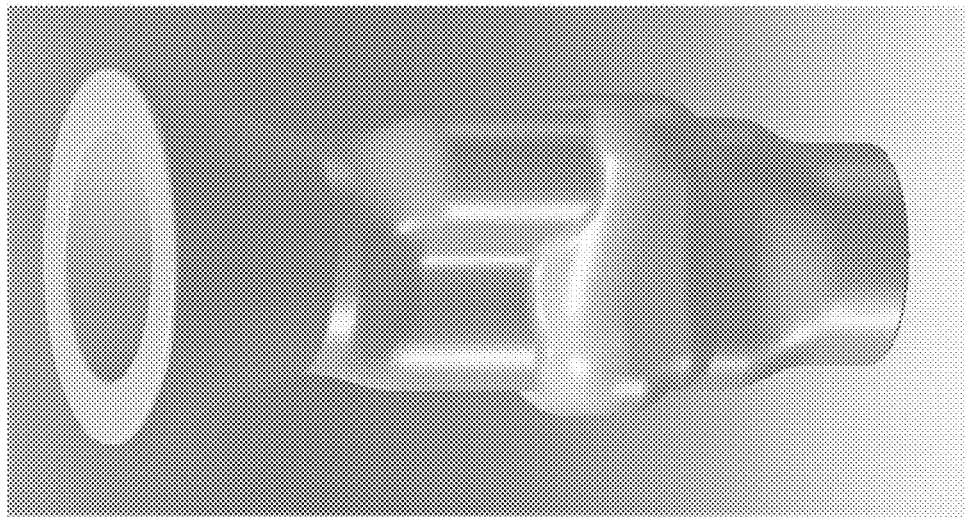
FIG. 10b illustrates a perspective view of a three-dimensional object from the stacked cross-sectional views of the two-dimensional computer aided design drawings of FIG. 10a, in accordance with an exemplary embodiment of the present invention.
Figure 10A:
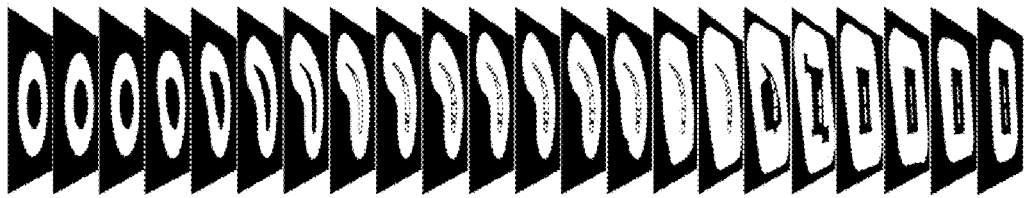
FIG. 10a illustrates a plurality of stacked cross-sectional views of the two dimensional computer aided design drawings, in accordance with an exemplary embodiment of the present invention.

The overall PCS and user interface for the LAMP system that may integrate the software algorithms and signal communication logic. The PCS may include all the necessary CAD data interfaces, machine automation and control hardware and software interfaces, and fault detection and recovery in order for the LAMP machine to function as a fully automated, operator-free solid freeform fabrication (SFF) machine. For example and not limitation, FIG. 9 illustrates a plurality of cross-sectional views (a)-(f) of a 3D CAD drawing, and FIG. 10a illustrates a plurality of stacked cross-sectional views of the 3D image that results in the turbine airfoil mold 3D casting of FIG. 10b.

Intelligent adaptive slicing algorithms optimize build speed and throughput while at the same time carefully accounting for necessary feature resolution and/or surface finish embedded in each slice layer thickness. For example, sections of the integral cored mold containing critical features may be sliced at approximately 25 micron layer thickness, while other regions corresponding to the platform and pour cup with non-critical features or mostly vertical walls may be sliced at approximately 100 microns or larger layer thickness. Data transfer and file format protocols transmit the CAD slice data to the SLM array. Intelligent software and hardware algorithms convert the CAD data slices to the stack of image frames necessary to be flashed at a high refresh rate to the array of SLMs in the MOIS.

FIGS. 6-7 illustrate an exemplary LAMP device illustrating the optical imaging system, the material recoating system, and the material build platform. In other words, FIGS. 6-7 are conceptual schematics of the LAMP system showing the MOIS, the high-precision XY scanning stage, the MRS, and the MBP.

The MOIS 200 is shown in greater detail in FIG. 7. The MOIS 200 may transform the non-uniform output from the UV light source 205 into a rectangular beam of uniform intensity that illuminates the SLM array after being redirected by two mirrors and after passing through condenser optics. The SLM array or DMD 225 may be illuminated at an angle with respect to the normal of the pixel plane, because the ON mirrors tilt to direct the light into the projection lens. The projection lens 230 magnifies or reduces the image with the appropriate ratio and projects the image onto the surface of the medium in the MBP 500, which is located at the focal plane of the projection lens. The MOIS 200 is mounted overhead gantry style on an XY scanning stage and is traversed preferably over the MBP 500, while the SLM sends a sequence of frames. Each frame represents a portion of a full continuously scrolling pattern that covers the entire exposable area of the MBP 500. The SLM may be illuminated by a pulsed UV light source that is synchronized to the SLM data stream. As the substrate moves, the data sent to the SLM is continuously updated, row-by-row, and frame-by-frame of the micromirror array, delivering the entire pattern information to the substrate during its scanning motion. Considering that there may be between approximately 780,000 and 1,300,000 micromirrors on the DMD device, the massively parallel processing power of the SLM is utilized to increase the photopolymerization throughput by at least six orders of magnitude over that of a single point laser light source, as is the case in stereolithography.

Calculations indicate that the exposure time required to photopolymerize through the thickness for each slice of a part is on the order about five milliseconds. Commercial high-speed scanning stages may move the optical imaging system at speeds of 400-600 mm/s, so 200 parts may be exposed in a 24 inches by 24 inches build area within approximately one second. A time budget of one second for exposure means that recoating a layer should take no more than four seconds. This means that the recoating device may move at relatively high speeds, upwards of approximately 100 mm/s to traverse the 24 inch (610 mm) length of the build platform in less than four seconds. The recoating device may successfully coat a new layer of the photosensitive medium at speeds of approximately 300 mm/s to approximately 1500 mm/s (approximately 1-5 ft/s). These types of coating speeds, commercially in use in the converting and web coating industry enables the system to meet the critical time budget per layer, while achieving the high throughout necessary to make LAMP a cost-effective process. Calculations further reveal that by implementing adaptive slicing to use thinner layers (e.g., approximately 25-75 micrometers) in regions of the part containing critical features and thicker layers (e.g., approximately 250 micrometers) elsewhere, the part build rate may be increased to at least approximately 90 parts per hour, resulting in a cost savings of approximately 25-30% per part.

Superalloy objects, e.g., airfoils, are currently cast using silica-based shell molds and cores. The photosensitive medium for the integral cored molds to be produced through the LAMP process may be designed and developed based on a silica formulation. A formulation may be modeled on the same composition used for conventional cores and shell molds. Using a substantially identical mold composition is helpful for acceptance of superalloy airfoils made by LAMP, because mold chemistry cannot be changed without significant work to re-qualify a component. Silica may be the refractory material because it is relatively easy to remove by leaching after casting. In accordance with an exemplary embodiment, at least two photocurable ceramic media or materials may be used: 1) a liquid ceramic resin, and 2) a solid ceramic resin.

In a first embodiment, the photocurable ceramic material may be a liquid ceramic resin, based on existing stereolithography resins. Such resins contain approximately 50-60 vol % suspensions of ceramic particles in a low viscosity fluid monomer (non-aqueous acrylate or aqueous methacrylate). Such formulations are understood and have been well characterized in the art. The liquid ceramic resin is locally solidified by photopolymerization where it is exposed to UV light. After the build is complete, the integral cored mold is a solid ceramic-filled photopolymer in a vat of liquid resin. The excess resin drains away after the mold is removed from the vat. The as-cured mold must undergo a binder burnout process (approximately 200-500° C.) to remove the polymer without damaging the mold. Liquid resins, however, have many disadvantages, including: (1) they cure to a "green" build state that is composed of a ceramic in a polymer in the case of acrylate, requiring careful binder pyrolysis, or a wet ceramic in wet hydrogel (aqueous methacrylate) which requires careful drying. Both of these are controllable for the thin sections relevant for the molds, but place a constraint on the process; and (2) they require support structures to be built along with the part for some designs.

In a second embodiment, the photocurable ceramic material may be a solid ceramic resin including a solid, sublimable monomer solution. This may include a build material that may be applied as a liquid, but one that freezes upon application to form a photopolymerizable solid. For example, this may be accomplished using a monomer in a molecular solid solvent. The solid solvent may be a low-melting vehicle that melts above about approximately 50° C. (e.g., a camphor-camphene alloy). In the molten state, it is a fluid suspension of approximately 50-60 vol % ceramic powder in a low viscosity monomer-vehicle solution. A fresh layer of material may be applied as a warm liquid, which freezes after application creating a solid build material. The frozen solid ceramic resin is locally cross-linked by photopolymerization where it is exposed to UV light. After the build is complete, the integral cored mold is a solid ceramic-filled cross-linked photopolymer in a block of frozen solid resin. The block is simply heated above the melting point of the vehicle, so that the uncured excess resin drains away. The remaining camphor in the as-cured mold is removed by sublimation after building (ambient temperature freeze drying). After sublimation, only a small amount of cured monomer remains, so binder burnout is much easier.

Camphene is a non-toxic material derived from pine trees (a terpenoid), and melts just above room temperature (50° C.), but is a solid at room temperature. Camphor is a similar material, with a higher melting point. These terpenoids may be used for freeze casting of ceramic suspensions. The solid camphene (or camphor) is easily sublimed, so that after forming it may be removed by sublimation. This eliminates difficulties associated with binder polymer pyrolysis (as with polyacrylates) and liquid drying of hydrogels (as with aqueous methacrylates). The sublimation is a gentle solid-vapor transformation that results in no dimensional change, and hence there is little or no warping or cracking.

Post-processing and firing development efforts may be necessary to achieve functional ceramic devices. The LAMP process may build "green" ceramic devices, including ceramic powder in a photopolymerized binder. Draining the devices of uncured ceramic resin may be necessary, and effective procedures for draining, flushing, and removal of all loose materials may further be necessary. After draining is complete, the as-built "green" ceramic devices may be successfully fired for polymer removal and sintering to create strong objects with the correct mineralogy and functionality.

While reference was made herein to turbine airfoil molds, the embodiments of the present invention have wide-ranging applications beyond turbine airfoils. The embodiments disclosed herein allow for the design and manufacture of components that would otherwise be difficult or impossible to manufacture conventionally. With respect to ceramic-containing LAMP products, the disclosed embodiments may radically change how the casting of nearly any component that employs temporary cores and molds is done worldwide.

The various embodiments of the present invention are further illustrated by the following non-limiting example. LAMP was used to build complex 3D products by photo patterning many thin layers of a UV-curable resin. An exemplary UV-curable resin contains approximately 76 weight percent silica powder prepared by grinding fused silica to an average particle size of 7 microns, 19.17 weight percent SR238 monomer (Sartomer, Warrington Pa.) and 2.34 weight percent SR494 monomer (Sartomer, Warrington Pa.), 1.58 weight percent Variquat CC55 dispersant (Degussa), and a photointiator, such as 0.86 weight percent Irgacure 819 (Ciba-Giegy). Other photoinitiators, absorbers, or dyes may be added to modify the UV-curing characteristics as desired. A maskless optical imaging system scanned the UV-curable resin with a high resolution bitmap pattern to cure individual layers. Fresh layers were applied, and the process was repeated to generate complex objects on the order of 10 centimeters in size, with internal and external features on the size scale of about 50 micrometers. Refractory ceramic molds were produced using as the resin UV-curable suspensions of silica powders in acrylate monomers.

In one aspect of the present invention, there is a system for fabricating a three-dimensional object. The system includes an optical imaging system, a photocurable medium, and a control system. The optical imaging system provides a light source. The photocurable medium changes states upon exposure to a portion of the light source from the optical imaging system. The control system controls movement of the optical imaging system, wherein the optical imaging system moves continuously above the photocurable medium.

In addition, the optical imaging system comprises a reflector receiving a portion of the light source; an optical lens system comprising a lens that receives a portion of the reflected light source; a spatial light modulator for receiving the reflected light source from the optical lens system; and a projection lens for focusing the light source received from the spatial light modulator onto a surface of the photocurable medium. Alternatively, the optical imaging system includes a maskless light system for providing the light source and comprising a spatial light modulator scanning a portion of the medium. In an exemplary embodiment, the light source continuously changes as the optical light system moves over the surface of the photocurable medium.

The photocurable medium may include a photopolymer. The control system may receive a computer aided design drawing.

The optical imaging system projects a two-dimensional image comprising a cross-section of a three-dimensional object to be formed, the two-dimensional image received from the control system, onto a surface of the medium. The projected two-dimensional image may be a dynamic image that continuously changes as the optical imaging system scans over the medium.

The system further comprises a container for housing the photocurable medium. The container includes a lower platform that may move downwardly for lowering away from the optical imaging system, wherein the container includes an inlet for introducing more of the photocurable medium therein.

The system further comprises a recoating system for rapidly coating a uniform thickness of the photocurable medium.

In another exemplary aspect, an optical modeling method in which a photocurable medium is exposed with a light beam to form a three-dimensional model includes a number of steps. The method comprises moving a maskless optical imaging system providing the light beam in a continuous sequence; presenting the light beam on a portion of the photocurable medium; lowering a plate upon which the photocurable medium resides; and applying a new layer of photocurable media.

The method may further include analyzing a plurality of two-dimensional computer aided designs; the light beam presented on the portion of the photocurable medium having the shape from one of the plurality of two-dimensional computer aided designs. In addition, the method may further include projecting the light beam that continuously changes as the light beam scans a surface of the photocurable medium. Further, the method may include providing a material build platform for housing the photocurable medium and the plate upon which the photocurable medium resides. The method may include directing the light beam to reflect off a reflector, through at least one lens system, and to a spatial light modulator.

The lowering of the plate upon which the photocurable medium resides occurs after the light beam is presented to the portion of the photocurable medium.

In another aspect, a method for fabricating a three-dimensional object comprises moving a maskless optical imaging system providing a light source in a continuous sequence; directing the light source to reflect off a reflector, through at least one lens system, and into a spatial light modulator; analyzing a plurality of two-dimensional computer aided designs; presenting the light source on a portion of a photocurable medium contained in a material build platform, the light source presented on the portion of the photocurable medium having a pattern corresponding to one of the plurality of two-dimensional computer aided designs; projecting the light source to continuously change as the light source scans a surface of the photocurable medium; lowering a plate disposed within the material build platform upon which the photocurable medium resides, the lowering of the plate upon which the photocurable medium resides occurring after the light source is presented to the portion of the photocurable medium; and applying a new layer of photocurable media to the material build platform.

This disclosure describes Large Area Maskless Photopolymerization (LAMP) technology, which is a layer-based manufacturing technology. LAMP technology may be used for the fabrication of integrally-cored ceramic molds, with complex internal geometries, such as in the investment casting of high-pressure turbine blades. Unlike most layer-based manufacturing technologies that produce prototype parts in plastic, LAMP may be applied to produce functional ceramic components that may withstand the rigors of, for instance, high temperature processes involved in the single-crystal casting of turbine blades. In some instances, the complex internal geometries and the stringent requirements on the physical properties of the parts to be produced may pose multiple challenges.

This disclosure also describes several data processing schemes for use with the LAMP technology. STL files, which are meshed approximations of the part geometry, are typically used in the additive manufacturing (AM) industry. However, owing to the complex part geometries in LAMP, such an approximation of the geometry may not be cost effective. Therefore, an error-tolerant, direct slicing approach using ACIS kernel may be used to slice the native CAD geometry and may output high resolution (1500 dpi) bitmap images of the slice contour. STL file slicing algorithms may be used with the LAMP technology. Furthermore, a suite of post processing algorithms such as error-checking, part placement, tiling and the like that work on the slice image data may be used with the LAMP technology.

In addition to the data processing schemes that enable basic functionality of the LAMP technology, this disclosure also describes several computational schemes to further improve part quality using the LAMP technology, such as a volume deviation-based method for adaptively slicing CAD models to alleviate "stairstepping" effects on parts produced using the LAMP technology and other AM processes in general and a gray-scaling and dithering method applied to the slice images to alleviate the stair-stepping effect, which takes into account the effects of gray scale factor on the curing characteristics of the material system when computing gray scale intensities unlike previous approaches. This disclosure also describes a method for supporting geometries that result in unsupported features or "floating islands" during part builds. This method may work on native CAD geometry. Moreover, prior approaches may not be applied to the LAMP technology due to, for instance, the inability to remove support structures after build completion.

Figure 11:
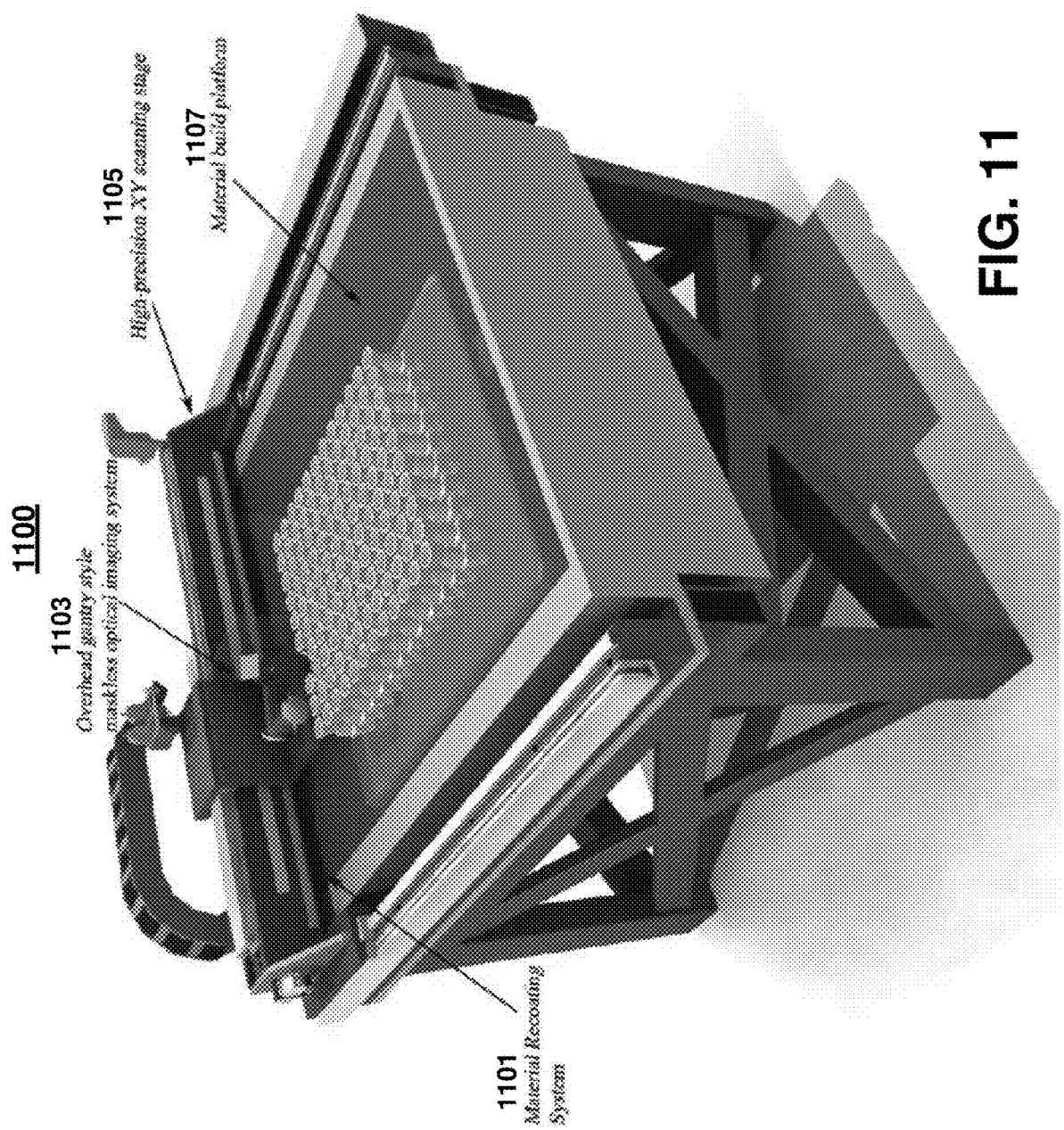
FIG. 11 illustrates one embodiment of a LAMP machine having a gantry-style scanning maskless optical imaging system in accordance with various aspects described herein.

FIG. 11 illustrates one embodiment of a LAMP machine 1100 having a gantry-style scanning maskless optical imaging system in accordance with various aspects described herein. The LAMP machine 1100 may be configured as described by FIG. 11. Further, the LAMP machine 1100 may be configured to include a material recoating system 1101, an overhead gantry style maskless optical imaging system 1103, a high-precision XY scanning stage 1105, and a material build platform 1107.

Figure 12:
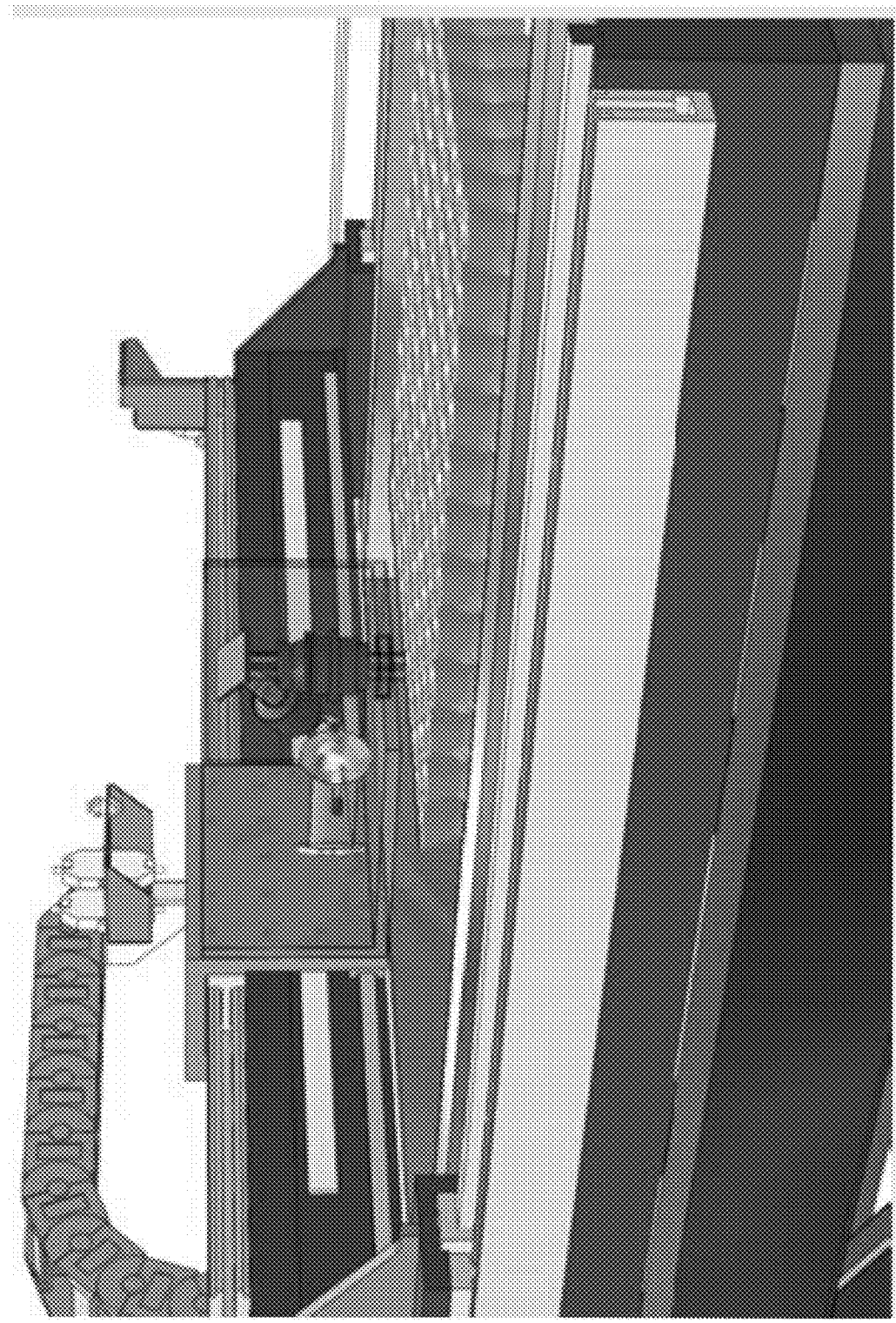
FIG. 12 illustrates one embodiment of a scanning maskless optical imaging system in accordance with various aspects described herein.

FIG. 12 illustrates one embodiment of a scanning maskless optical imaging system 1200 in accordance with various aspects described herein. The system 1200 may be configured as described by FIG. 12.

Figure 13:
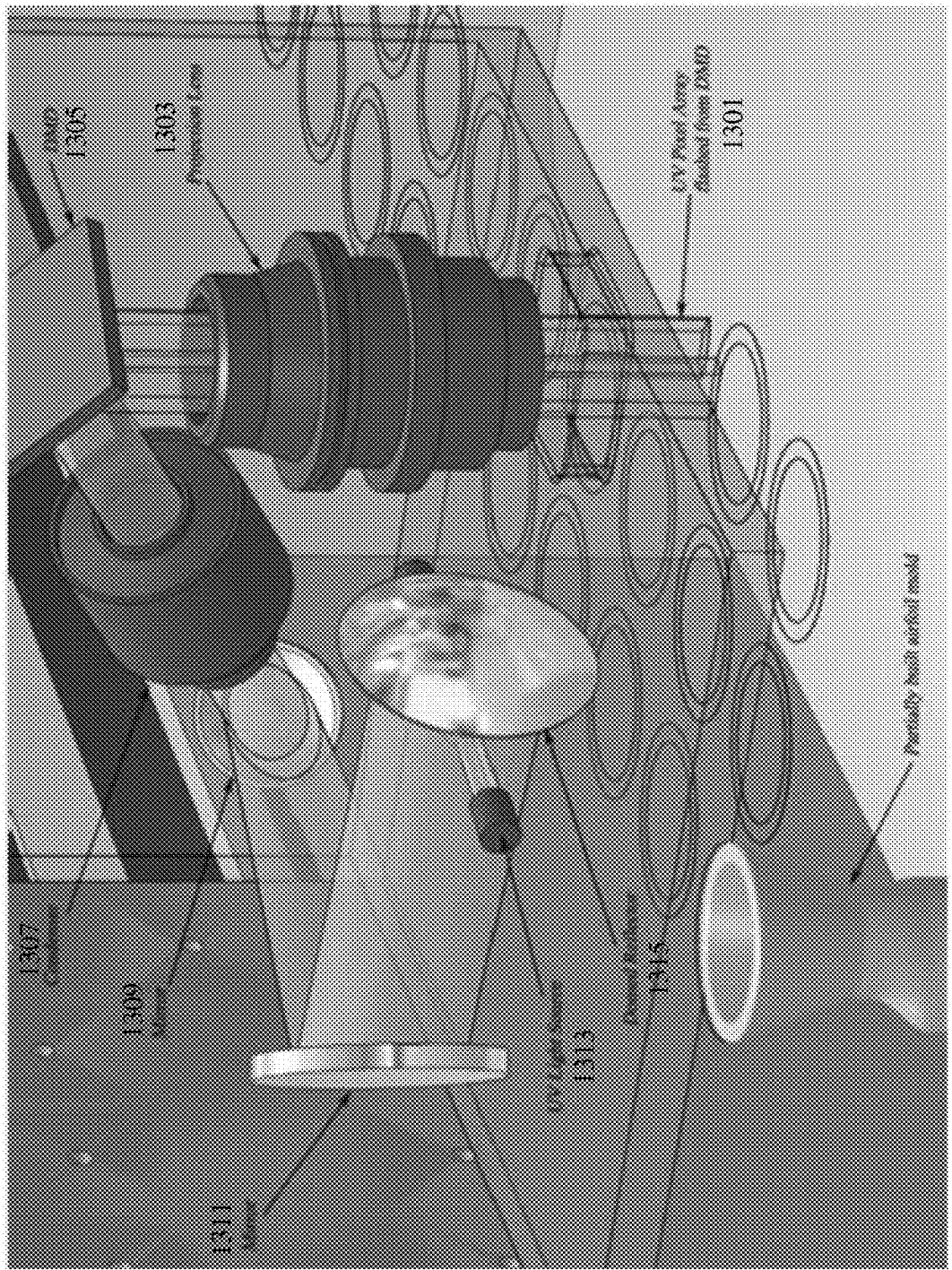
FIG. 13 illustrates one embodiment of a scanning maskless optical imaging system in accordance with various aspects described herein.

FIG. 13 illustrates one embodiment of a scanning maskless optical imaging system 1300 in accordance with various aspects described herein. The scanning maskless optical imaging system 1300 may be configured as described in FIG. 13. Further, the scanning maskless optical imaging system 1300 may be configured to include a UV pixel array flashed from DMD 1301, a projection lens 1303, a DMD 1305, a condenser 1307, a first mirror 1309, a second mirror 1311, a UV light source 1313, and a domed reflector 1315.

Figure 14:
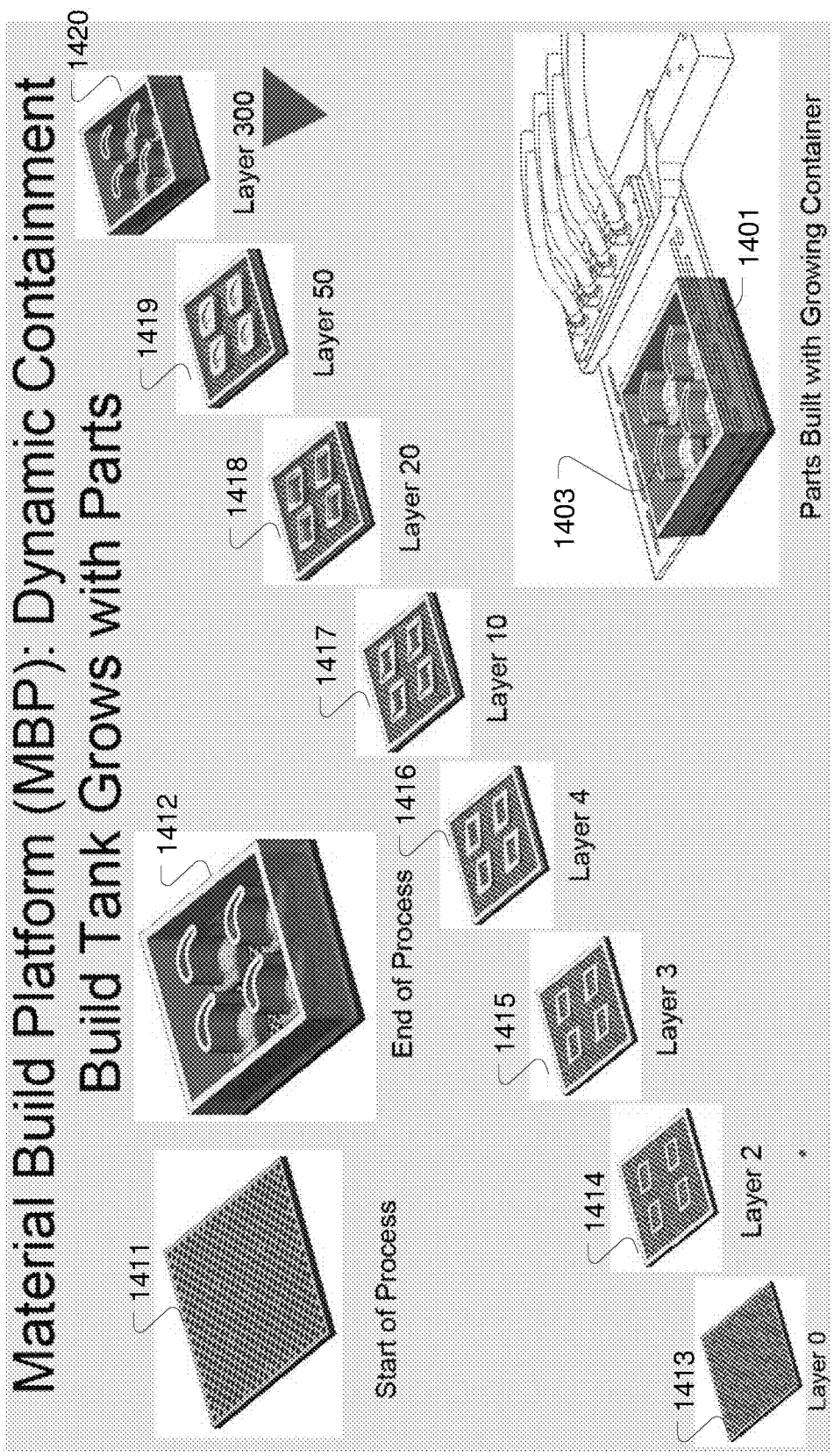
FIG. 14 illustrates one embodiment of a material build platform (MBP) in accordance with various aspects described herein.

FIG. 14 illustrates one embodiment of a material build platform (MBP) 1400 in accordance with various aspects described herein. The material build platform 1400 may be configured as described in FIG. 14. Further, the material build platform 1400 may be configured to include a dynamic containment build tank 1401. In one example, at the start of the process, the dynamic containment build tank 1401 may be empty, as described by reference number 1411. At the end of the process, the dynamic containment build tank 1401 may have a part 1403 that is completed, as described by reference number 1412. During the process, the build tank 1401 may incrementally grows as each layer is added to the part 1403, as described by reference numbers 1413 to 1420. In one example, each side of the dynamic containment build tank may grow as each layer is added to the part 1403.

Figure 15:
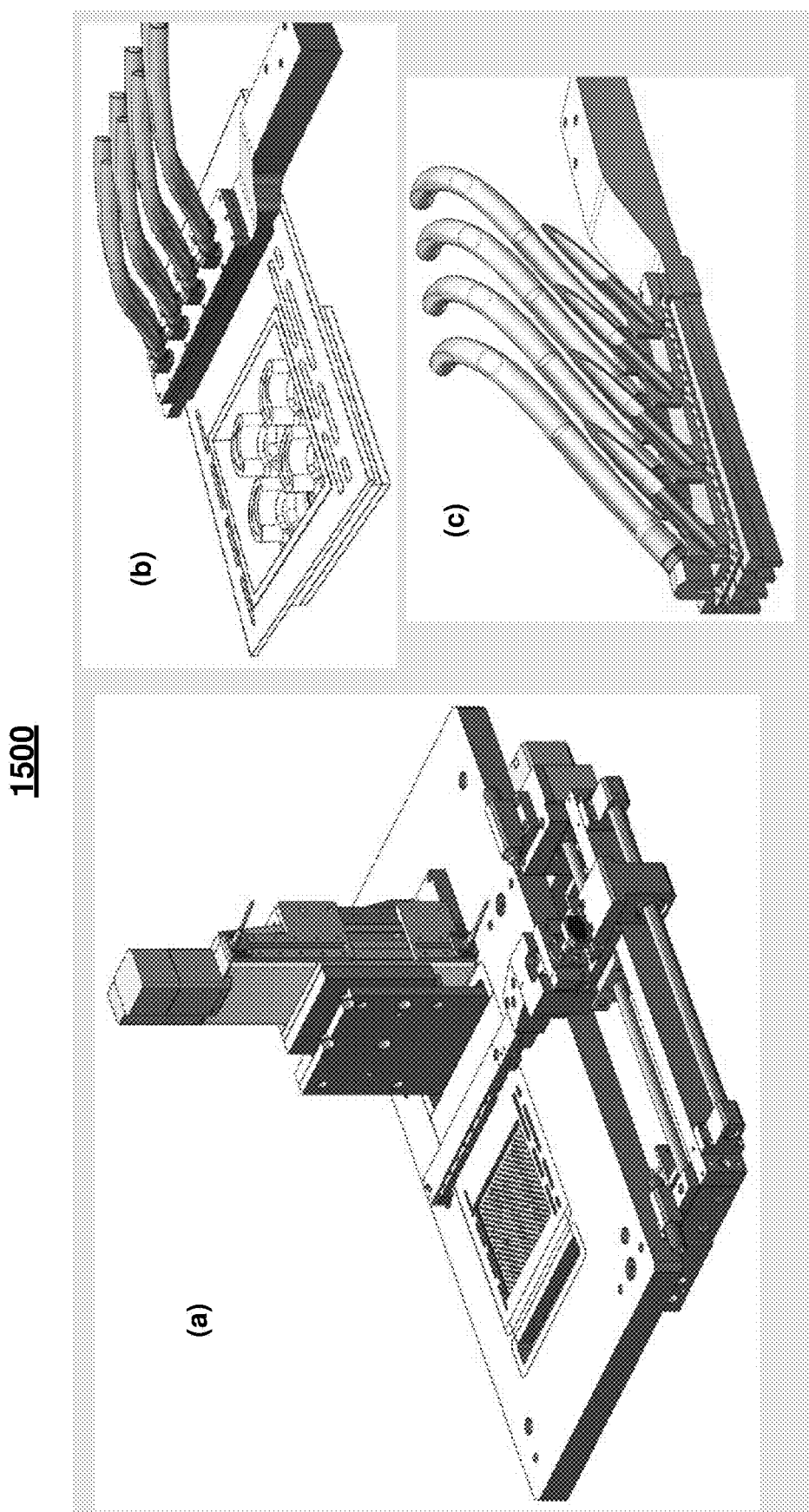
FIG. 15 illustrates one embodiment of a material recoating system (MRS) in accordance with various aspects described herein.

FIG. 15 illustrates one embodiment of a material recoating system (MRS) 1500 in accordance with various aspects described herein. The system 1500 may be configured as described in (a)-(c) of FIG. 15. The system 1500 may be configured to use dispense-on-demand to address, for instance, in-tank and intra-layer sedimentation.

Figure 16:
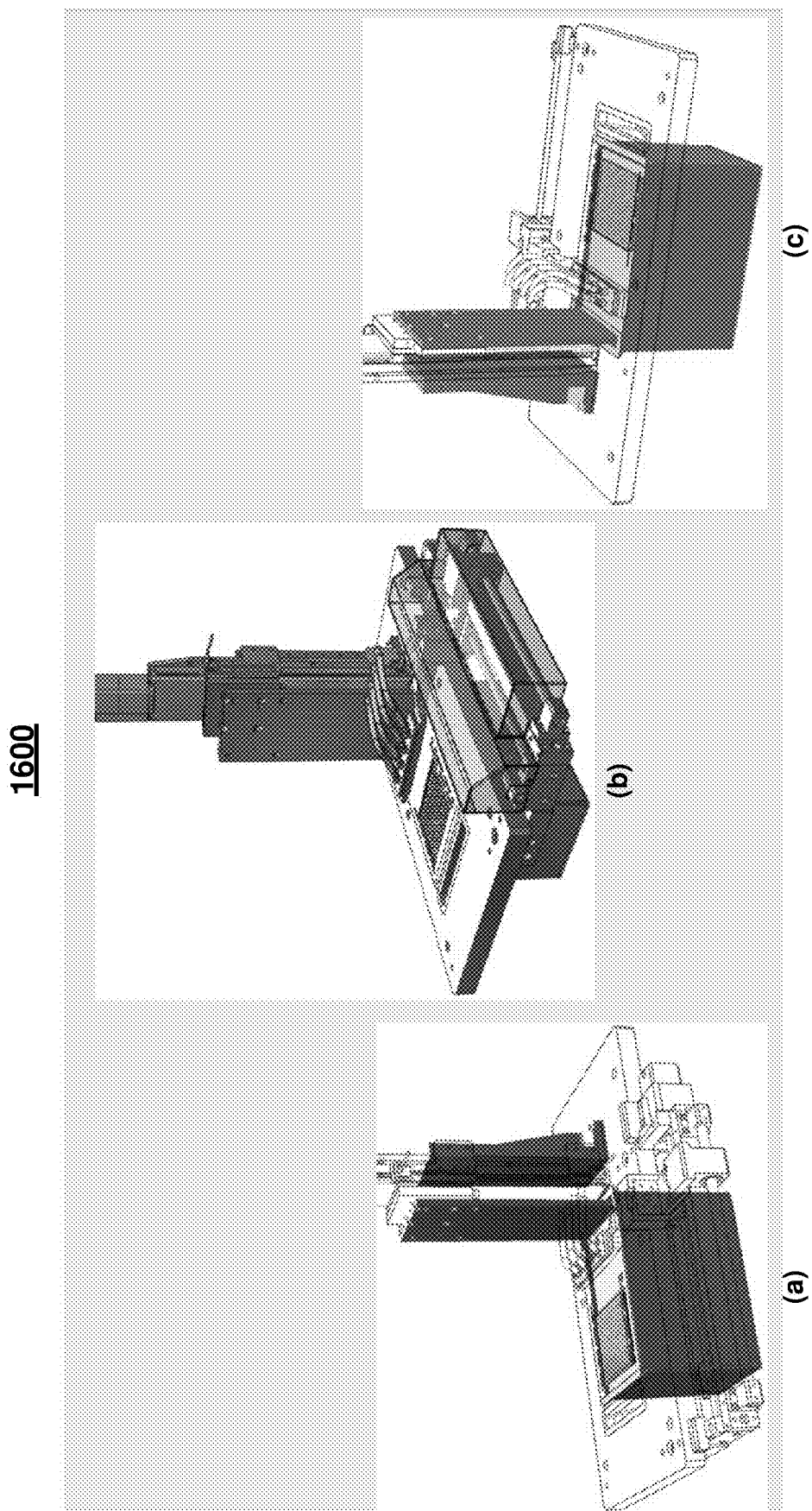
FIG. 16 illustrates another embodiment of a material recoating system (MRS) in accordance with various aspects described herein.

FIG. 16 illustrates another embodiment of a material recoating system (MRS) 1600 in accordance with various aspects described herein. The system 1600 may be configured as described in (a)-(c) of FIG. 16. Further, the system 1600 may be configured to use dispense-on-demand to address, for instance, in-tank and intra-layer sedimentation.

FIG. 17 illustrates a loss of build precision using a material recoating system having a single-edge recoater. In FIG. 17, the material recoating system having a single-edge recoater may cause starvation or doming, which may result in loss of build precision. In one example, for the first about ten (10) to about twenty (2) layers, a blade may have removed too much slurry and may form a crater shape in the slurry area around a mold. Further, after about forty (40) to about fifty (50) layers, a dome shape of slurry may be formed surrounding the mold parts. This doming problem may get worse as, for instance, more layers are added, which may cause a build of a part to fail.

Figure 18:
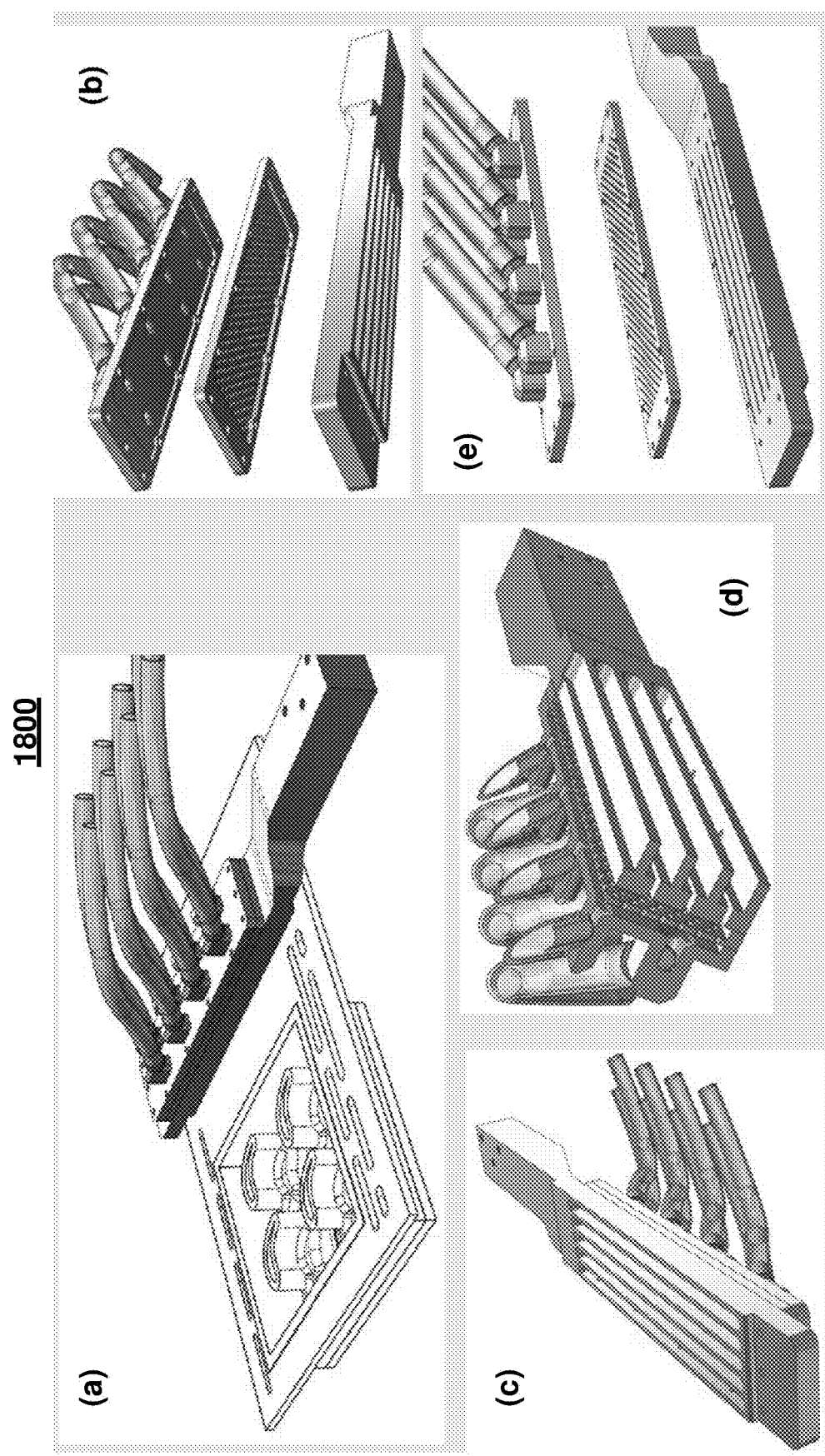
FIG. 18 illustrates one embodiment of a material recoating system having a multiblade recoater in accordance with various aspects described herein.

FIG. 18 illustrates one embodiment of a material recoating system 1800 having a multiblade recoater in accordance with various aspects described herein. The system 1800 may be configured as described in (a)-(e) of FIG. 18. Further, the system 1800 may be configured to address the starvation and doming issues described in FIG. 17, which may increase build precision of a part.

Figure 19:
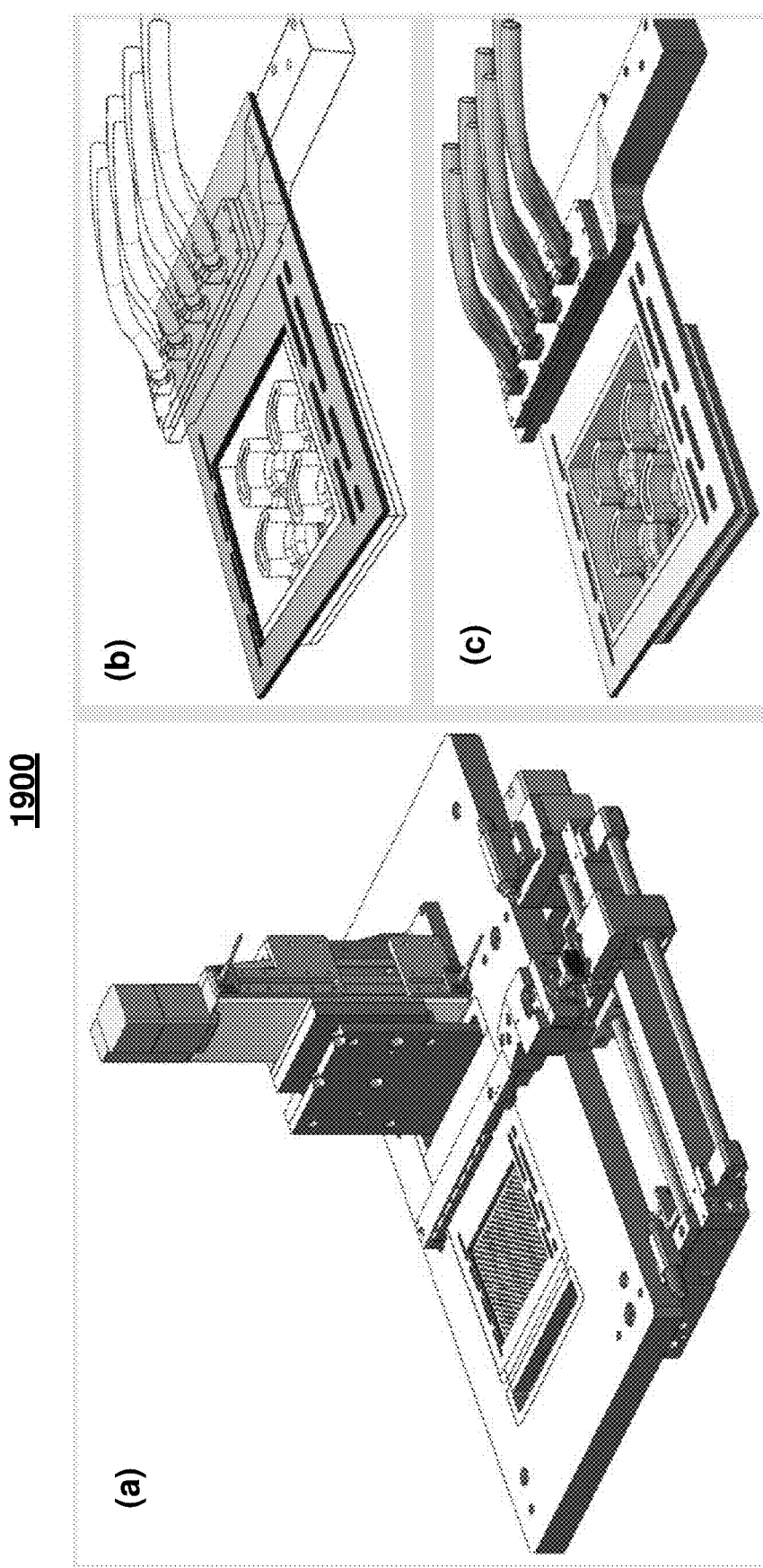
FIG. 19 illustrates one embodiment of a screen printing-style inking window pane in accordance with various aspects described herein.

FIG. 19 illustrates one embodiment of a screen printing-style inking window pane in accordance with various aspects described herein. The screen printing-style inking window pane 1900 may be configured as described in (a)-(c) of FIG. 19.

Figure 20:
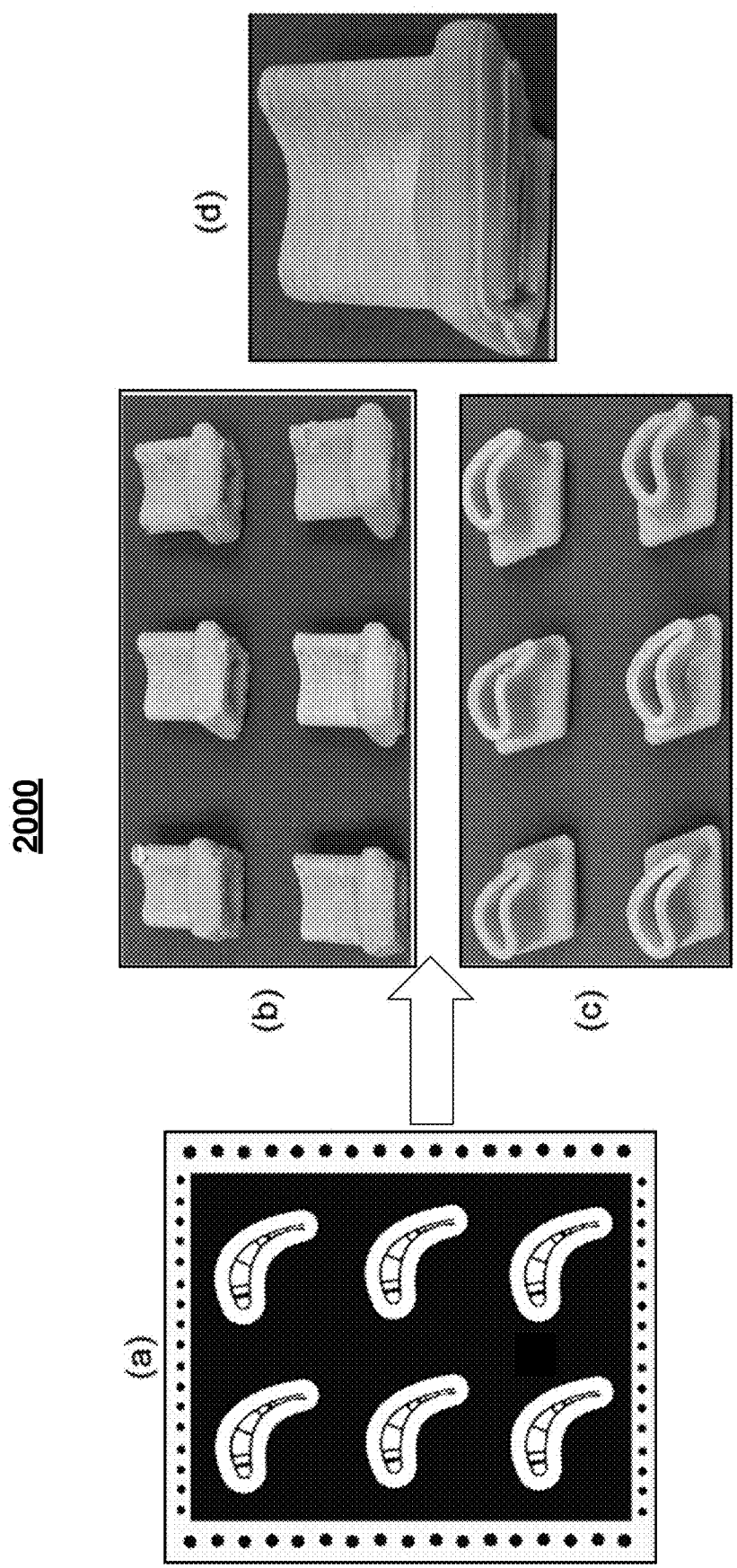
FIG. 20 illustrates a loss of build precision using a material recoating system.
Figure 22A:
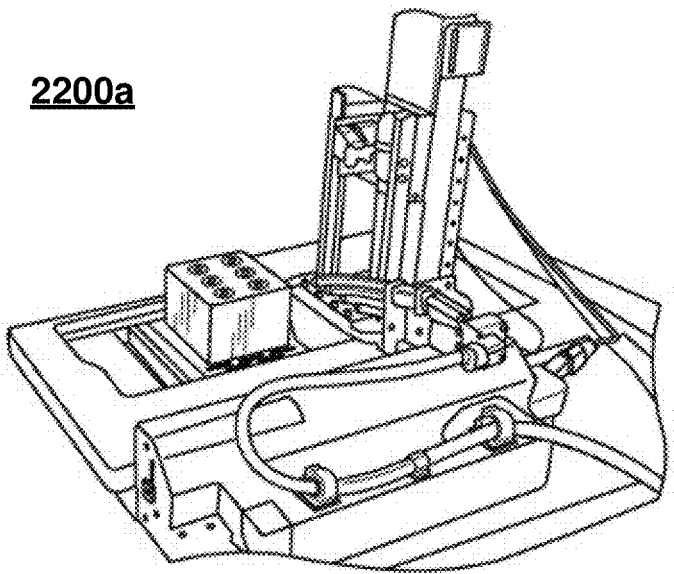
FIGS. 22a-22h illustrate another embodiment of a method of constructing a conformal lattice in inter-part space using break lines in accordance with various aspects as described herein.
Figure 22B:
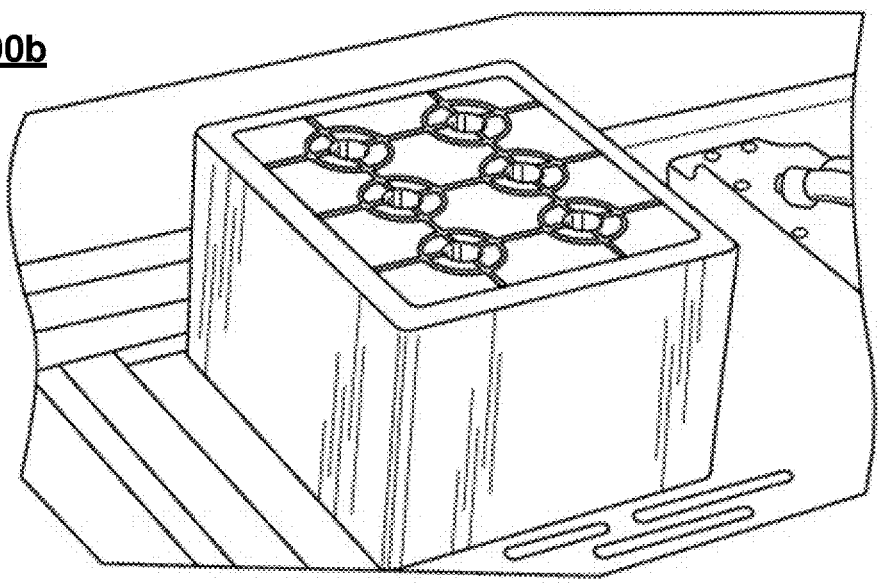
Figure 22C:
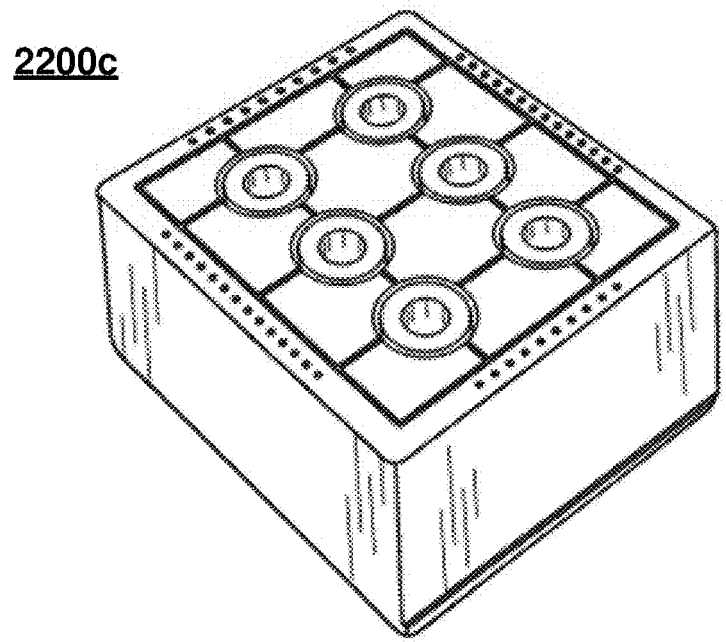
Figure 22D:
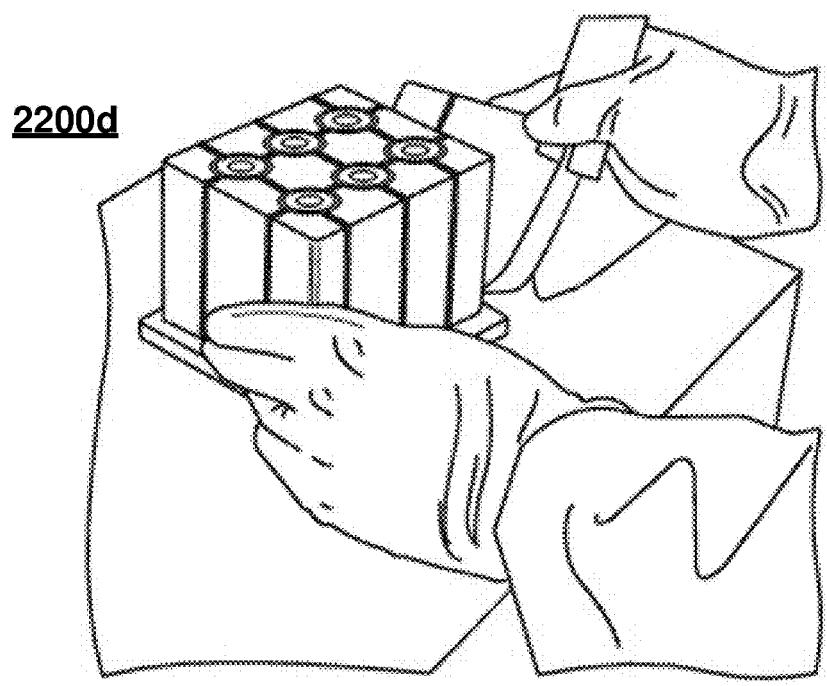
Figure 22F:
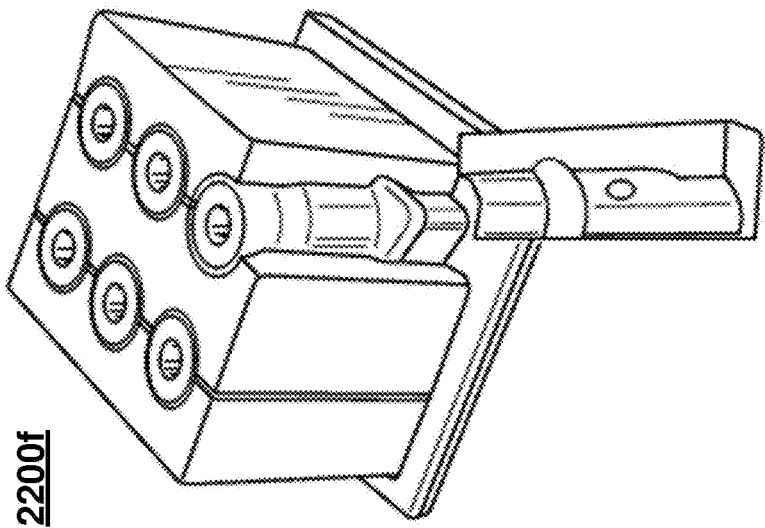
Figure 22E:
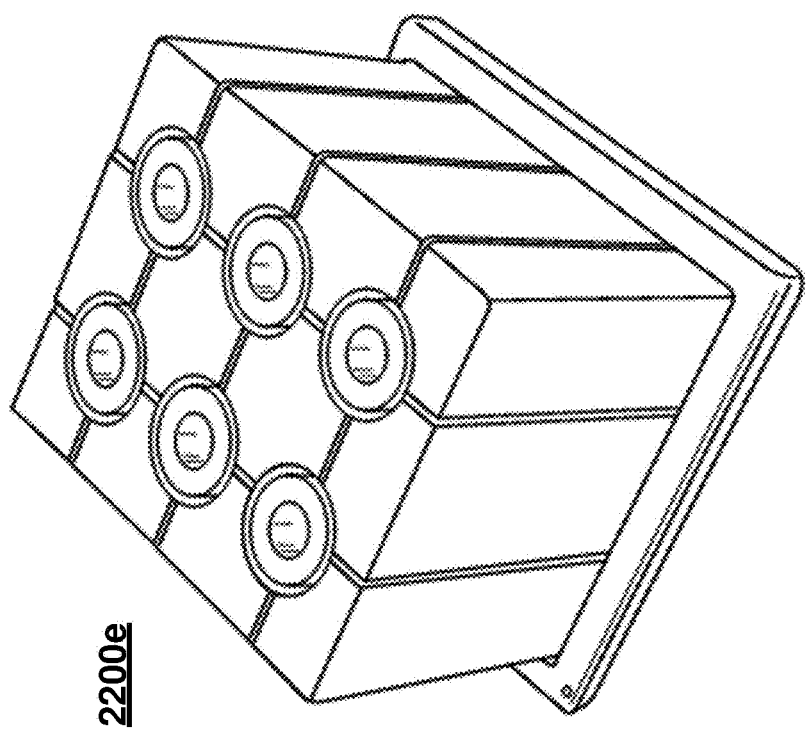
Figure 22G:
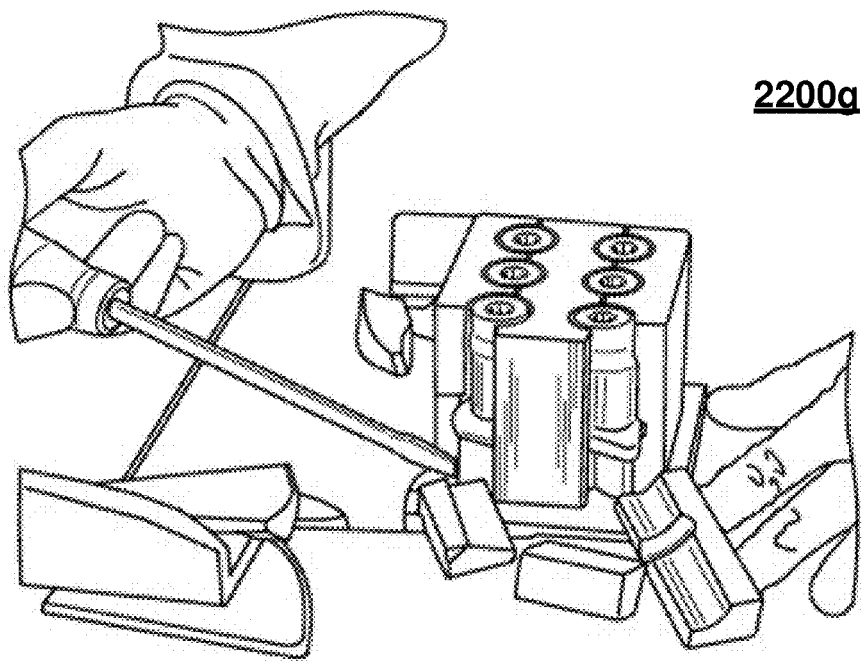
Figure 22H:
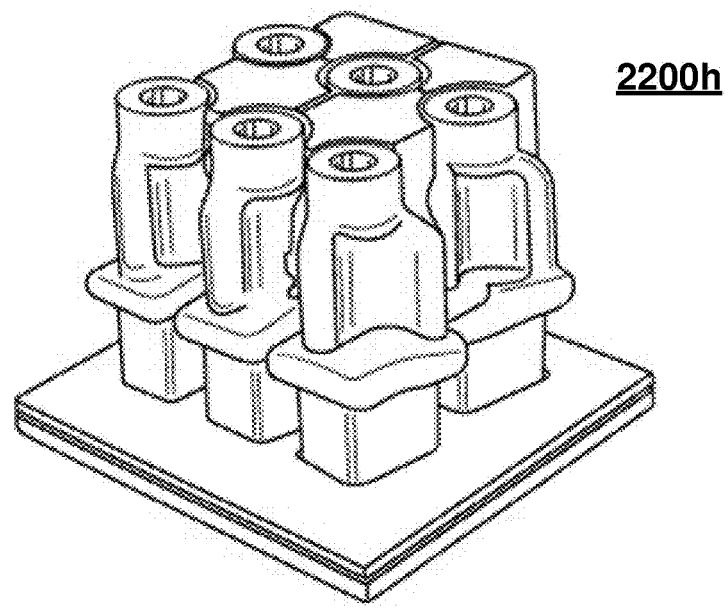
Figure 23D:
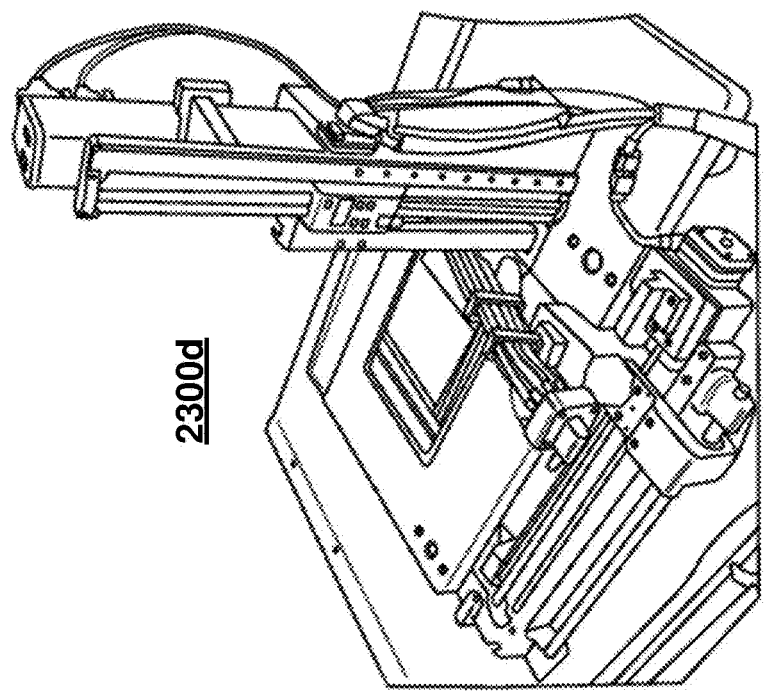
Figure 23C:
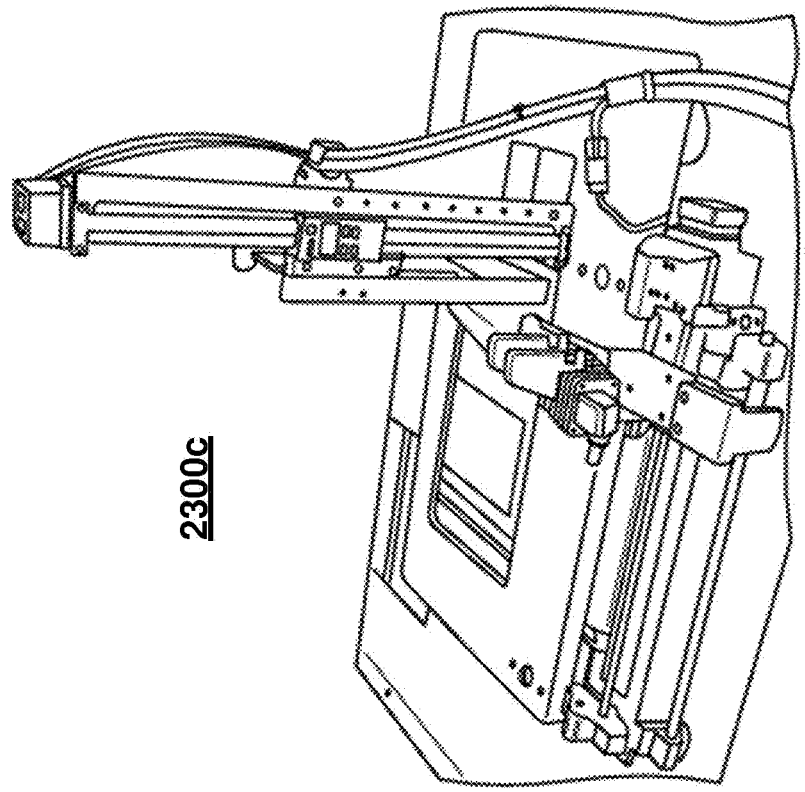
Figure 23E:
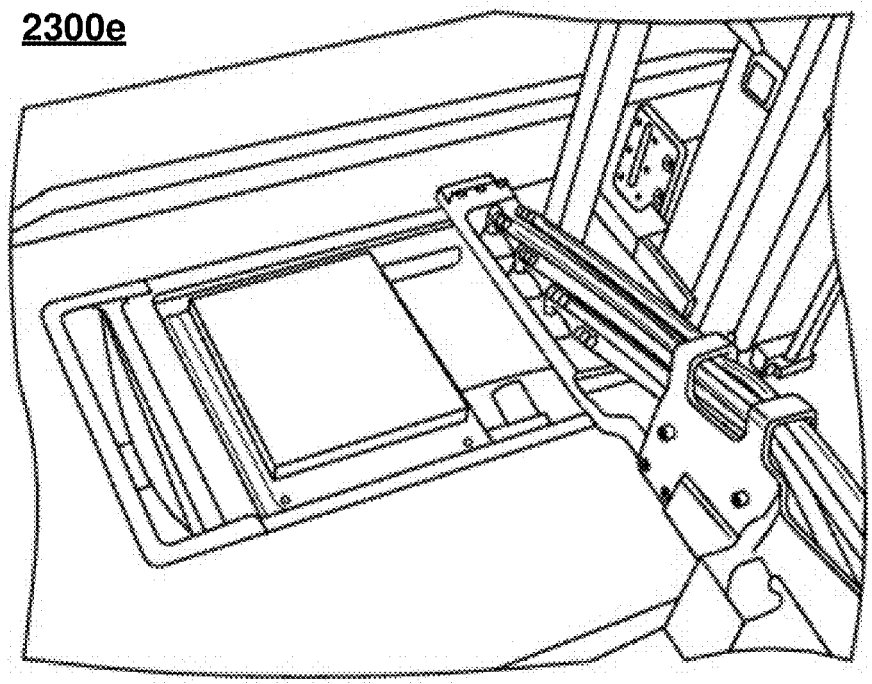
Figure 23F:
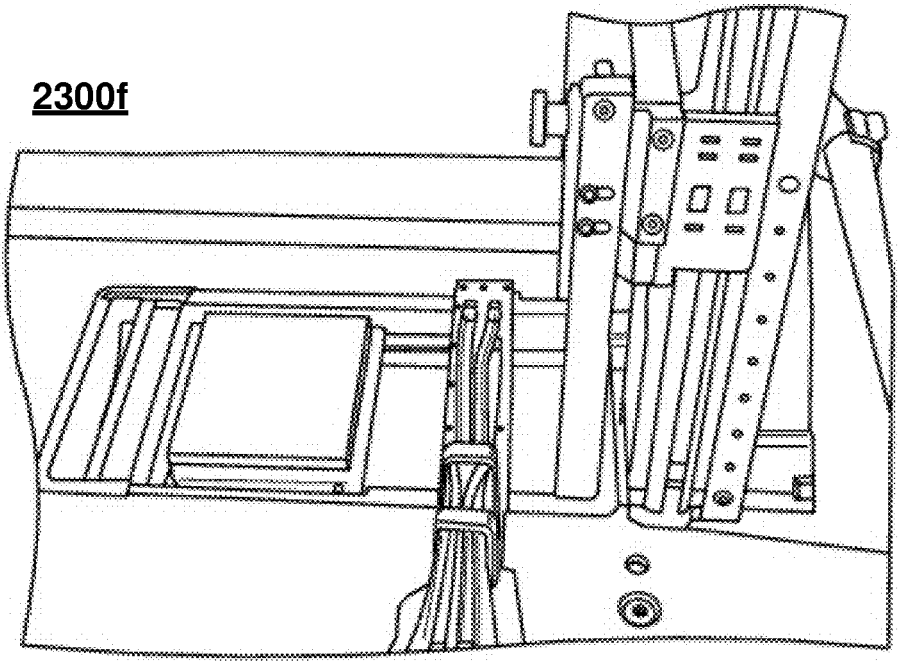

FIG. 20 illustrates a loss of build precision using a material recoating system. In (a)-(d) of FIG. 20, the material recoating system may cause erosion of a surface of a part due to, for instance, a large volume of uncured liquid. Further, as the material recoating system sweeps new layers at a high speed, a large trapped volume of uncured monomer may erode a surface of a part.

FIG. 21 illustrates one embodiment of a method 2100 of constructing a conformal lattice in an inter-part space using break lines in accordance with various aspects as described herein. In (a) and (b) of FIG. 21, the method 2100 may include collectively building a build block including tank walls, a part, and a conformal lattice. Further, the method 2100 may include reducing a trapped volume of uncured monomer, reducing or eliminating part erosion, reducing starvation or doming, or the like, resulting in increased build precision of a part.

FIGS. 22a-22h illustrate another embodiment of a method 2200 of constructing a conformal lattice in inter-part space using break lines in accordance with various aspects as described herein. In FIGS. 22a-22h, the method 2200 may include collectively building a build block including tank walls, a part, and a conformal lattice. Further, the method 2100 may include performing a post-build part break-out, which may include deconstructing the tank walls or the conformal lattice from the build block along the break lines. The method 2100 may include retrieving the part.

FIGS. 23a-23f illustrate one embodiment of a LAMP machine 2300 in accordance with various aspects as described herein. The LAMP machine 2300 may be configured as described in FIGS. 23a-23f.

Figure 24:
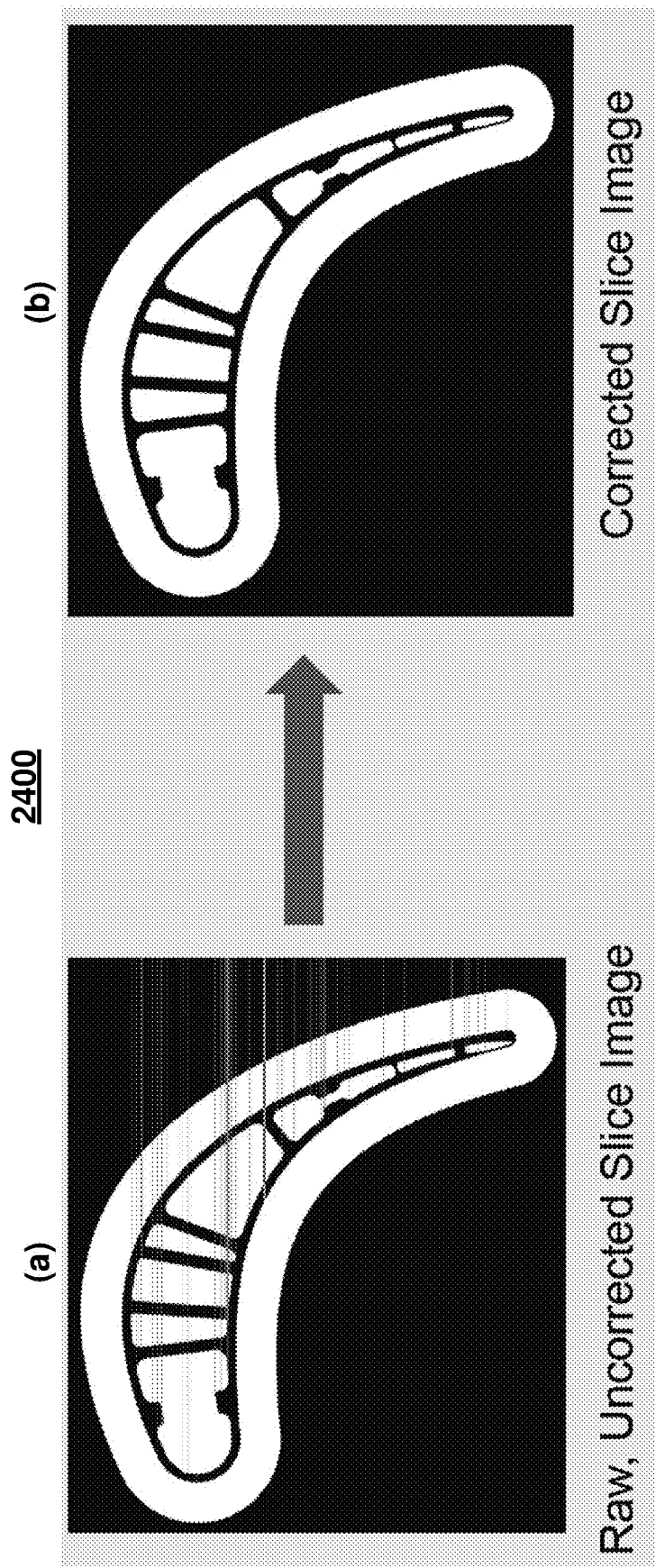
FIG. 24 illustrates one embodiment of a method for correcting a gap error in accordance with various aspects described herein.

FIG. 24 illustrates one embodiment of a method 2400 for correcting a gap error in accordance with various aspects described herein.

Figure 25:
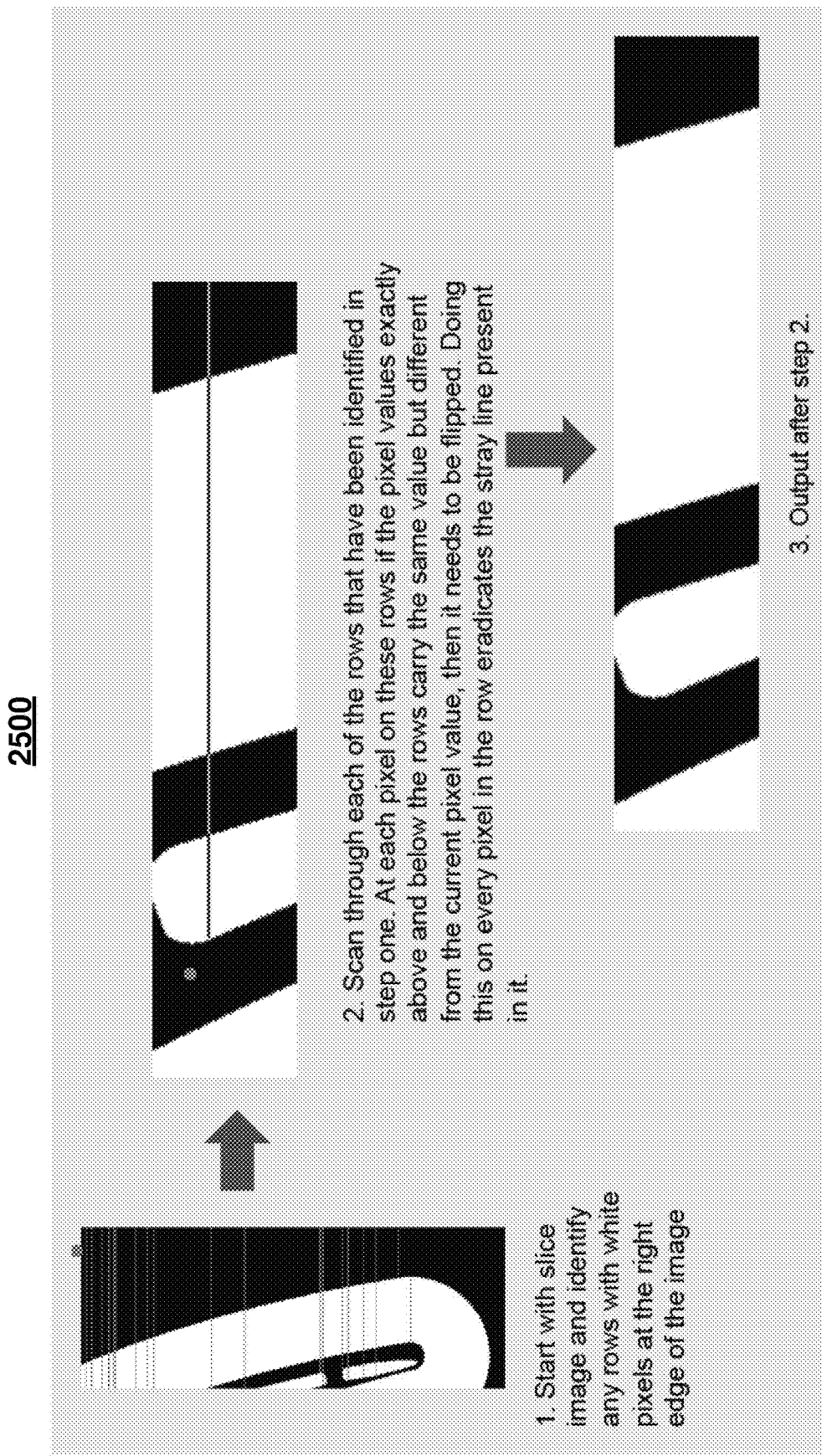
FIG. 25 illustrates another embodiment of a method for correcting a gap error in accordance with various aspects described herein.

FIG. 25 illustrates another embodiment of a method 2500 for correcting a gap error in accordance with various aspects described herein.

Figure 26:
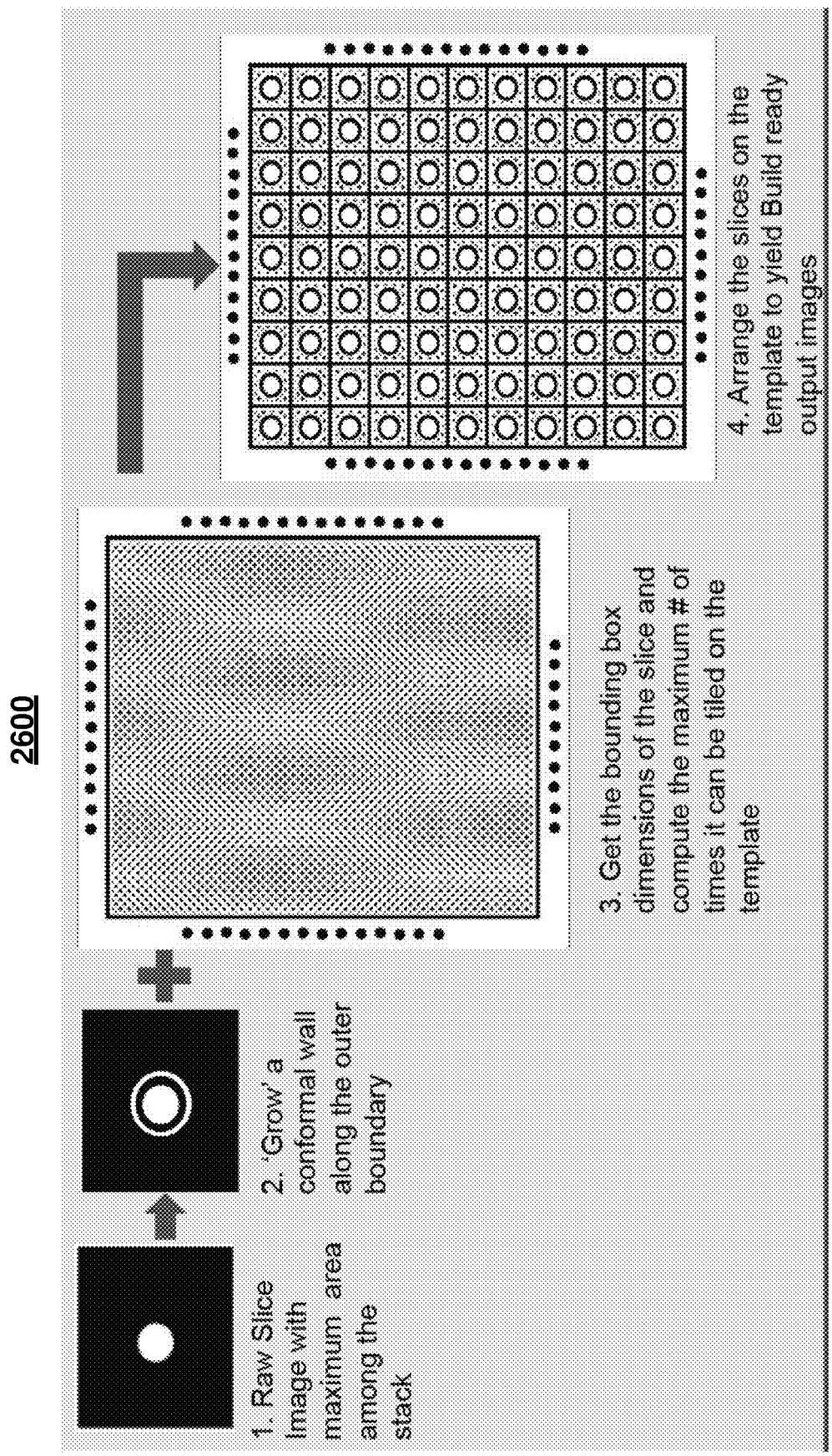
FIG. 26 illustrates one embodiment of a method of automated part layout and scaffolding in accordance with various aspects described herein.

FIG. 26 illustrates one embodiment of a method 2600 of automated part layout and scaffolding in accordance with various aspects described herein.

Figure 27:
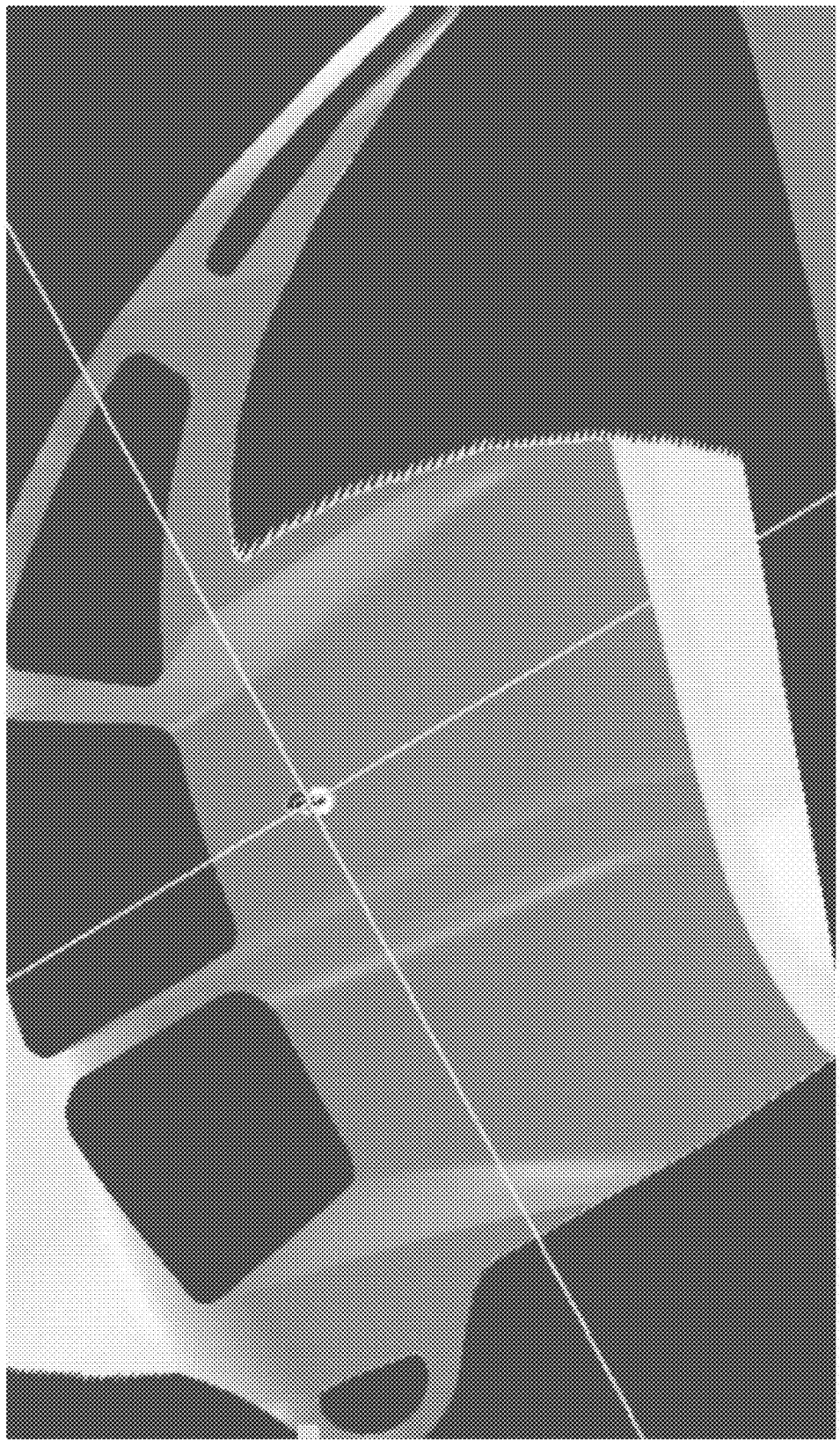
FIG. 27 illustrates one embodiment of a method of identifying a floating island in accordance with various aspects as described herein.

FIG. 27 illustrates one embodiment of a method 2700 of identifying a floating island in accordance with various aspects as described herein.

Figure 28:
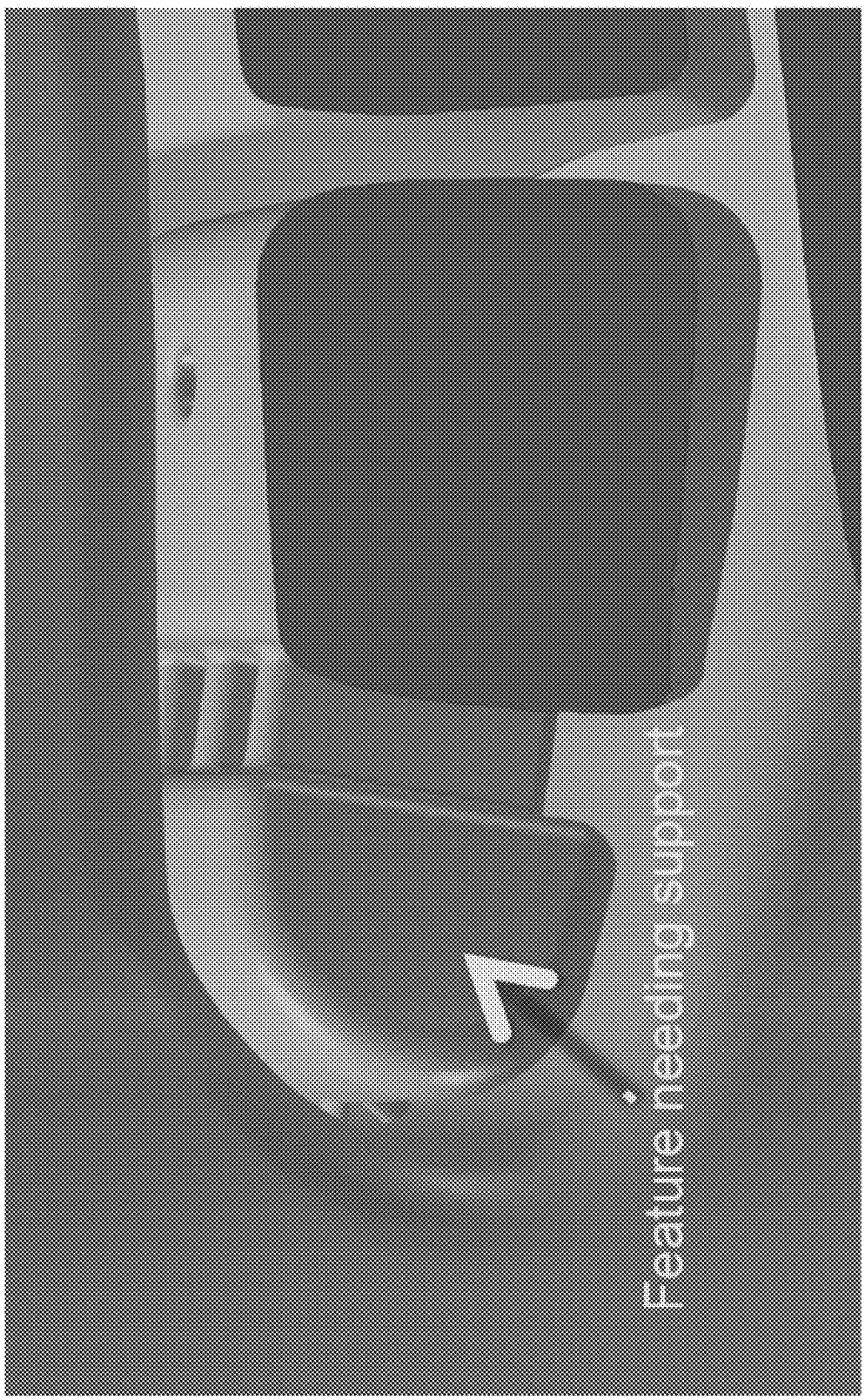
FIG. 28 illustrates one embodiment of a method of identifying a multifunctional support structure in accordance with various aspects as described herein.

FIG. 28 illustrates one embodiment of a method 2800 of identifying a multifunctional support structure in accordance with various aspects as described herein.

Figure 29:
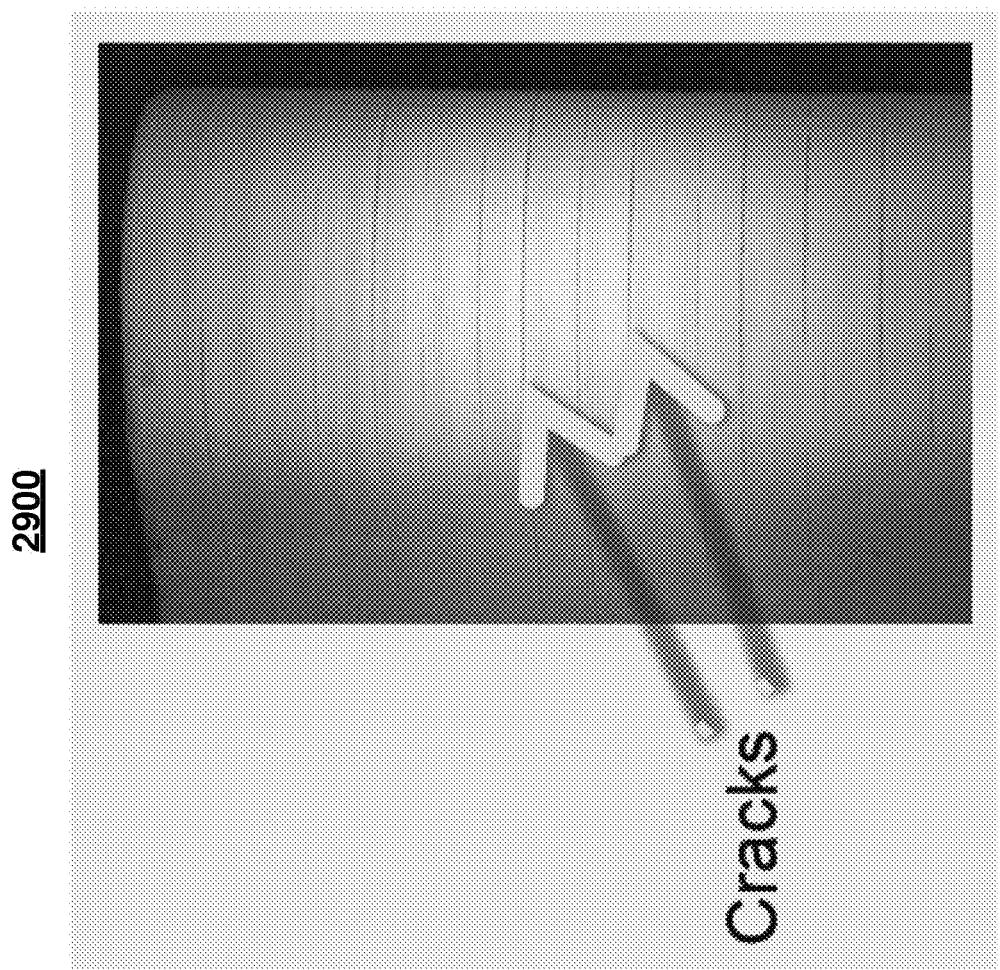
FIG. 29 illustrates one embodiment of a method for screening for shrinkage relief and support structures in accordance with various aspects as described herein.

FIG. 29 illustrates one embodiment of a method 2900 for screening for shrinkage relief and support structures in accordance with various aspects as described herein.

Figure 30:
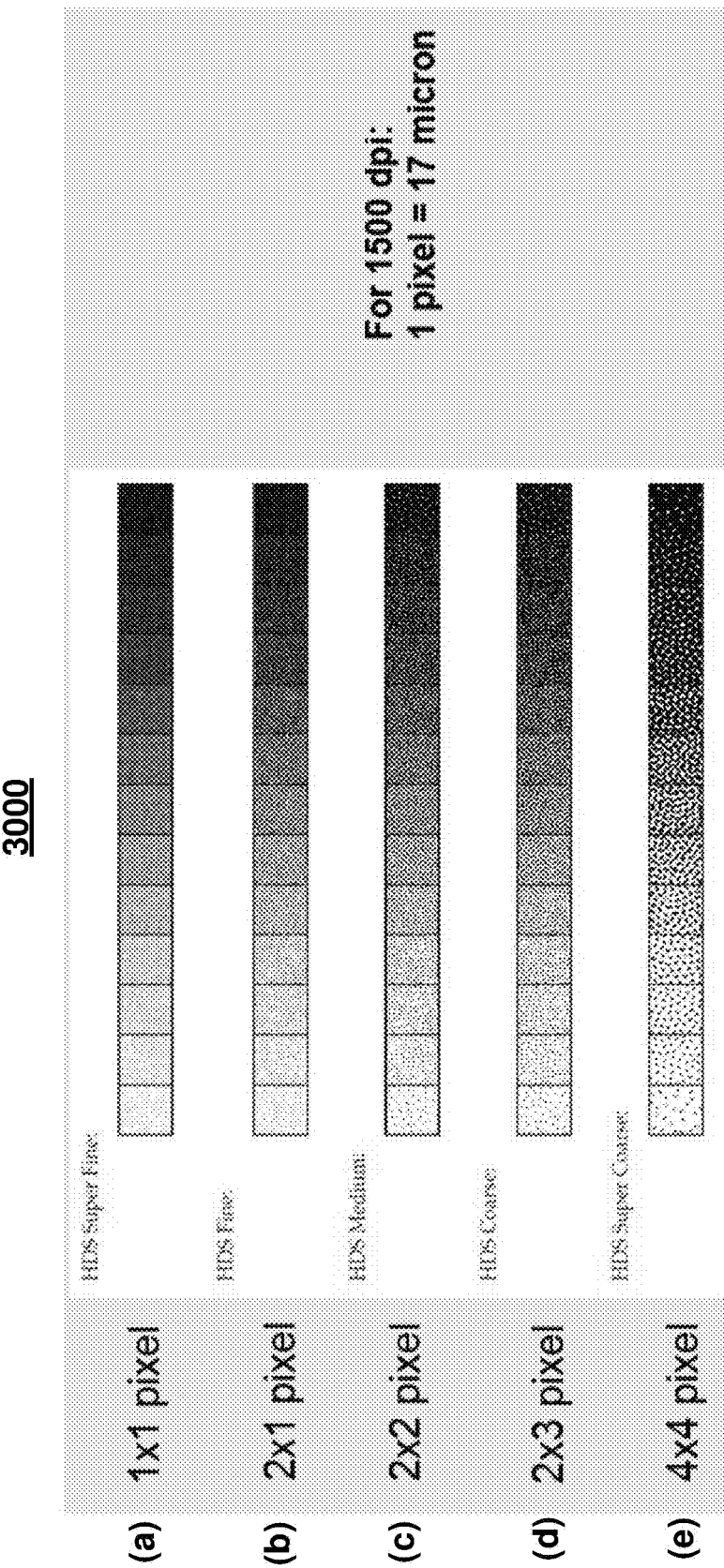
FIG. 30 illustrates another embodiment of a method for screening for shrinkage relief and support structures in accordance with various aspects as described herein.

FIG. 30 illustrates another embodiment of a method 3000 for screening for shrinkage relief and support structures in accordance with various aspects as described herein.

Figure 31:
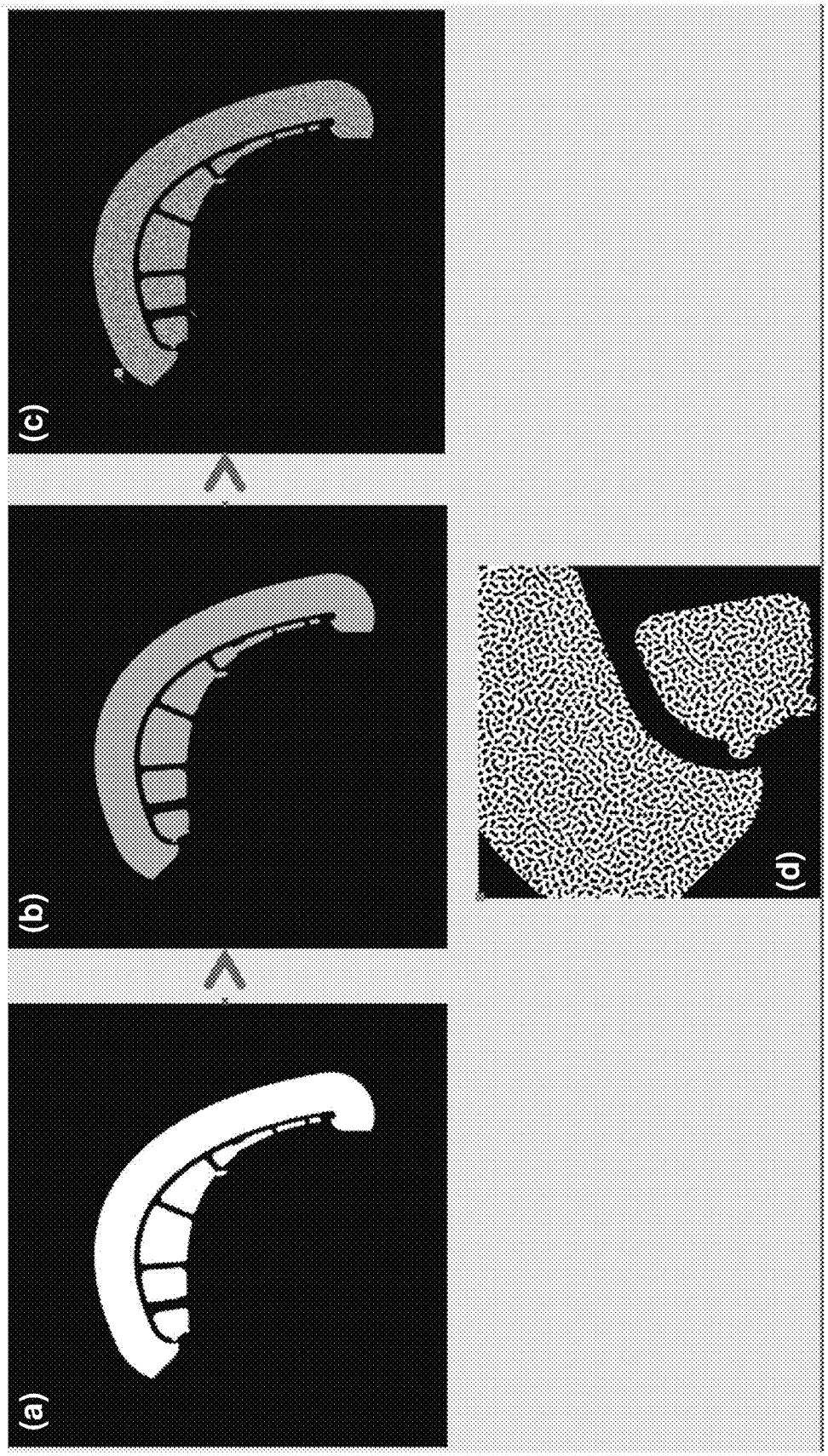
FIG. 31 illustrates another embodiment of a method for screening for shrinkage relief and support structures in accordance with various aspects as described herein.

FIG. 31 illustrates another embodiment of a method 3100 for screening for shrinkage relief and support structures in accordance with various aspects as described herein.

Figure 32:
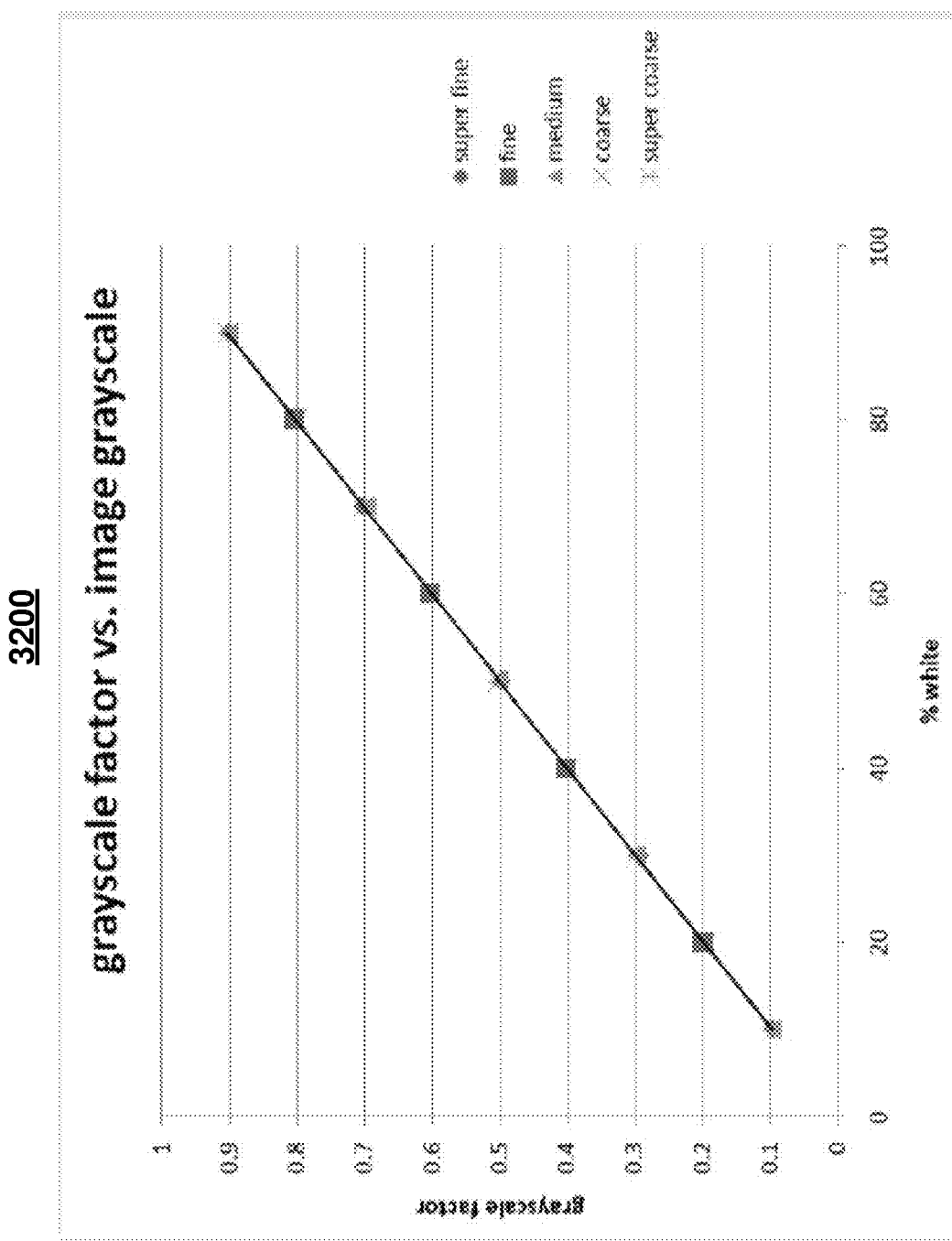
FIG. 32 provides a chart of screening-based grayscale working curves for one embodiment of a LAMP system.

FIG. 32 provides a chart 3200 of screening-based gray-scale working curves for one embodiment of a LAMP system.

Figure 33:
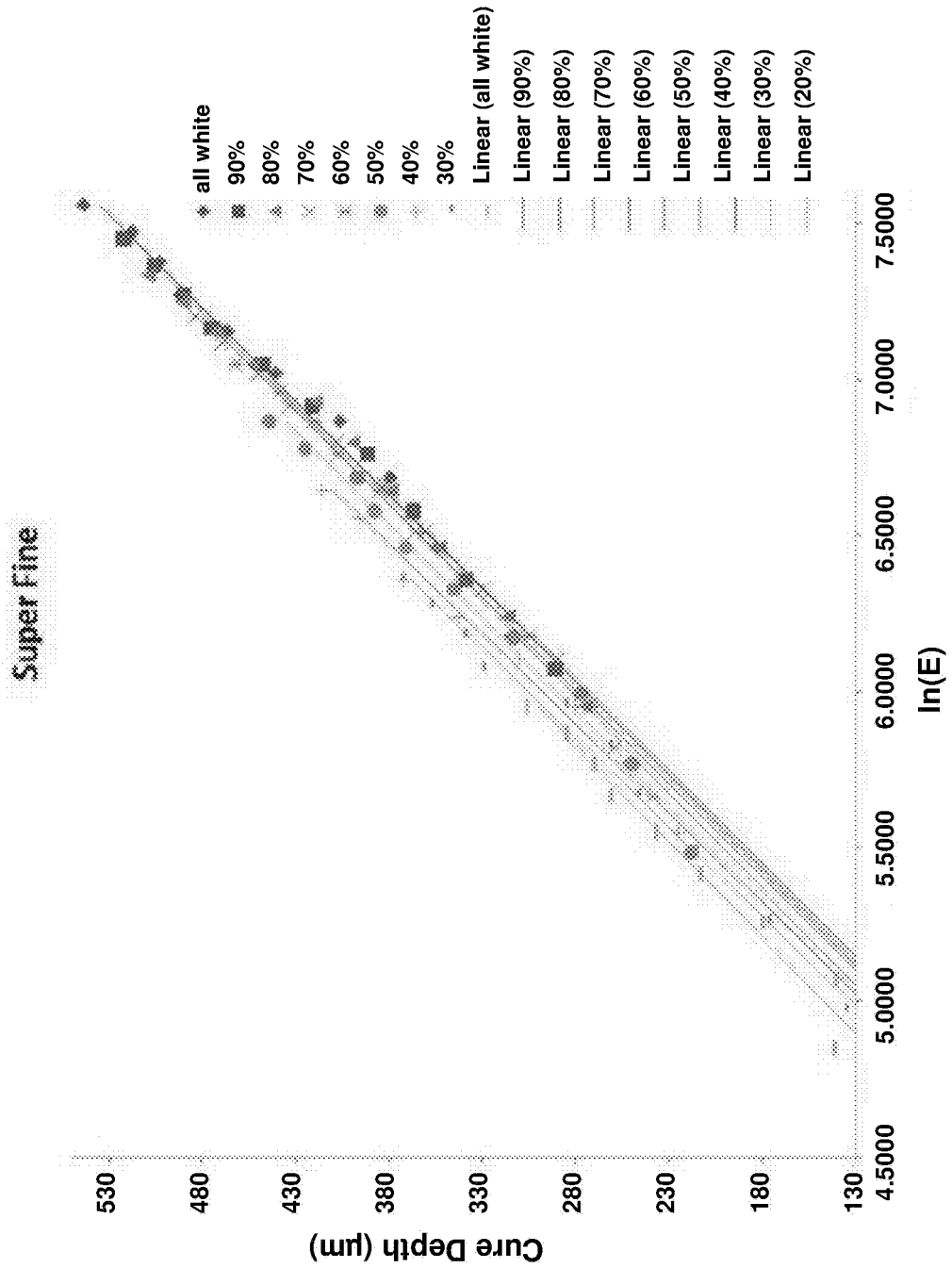
FIG. 33 provides a chart of screening-based grayscale working curves for one embodiment of a LAMP system.

FIG. 33 provides a chart 3300 of screening-based gray-scale working curves for one embodiment of a LAMP system.

Figure 34:
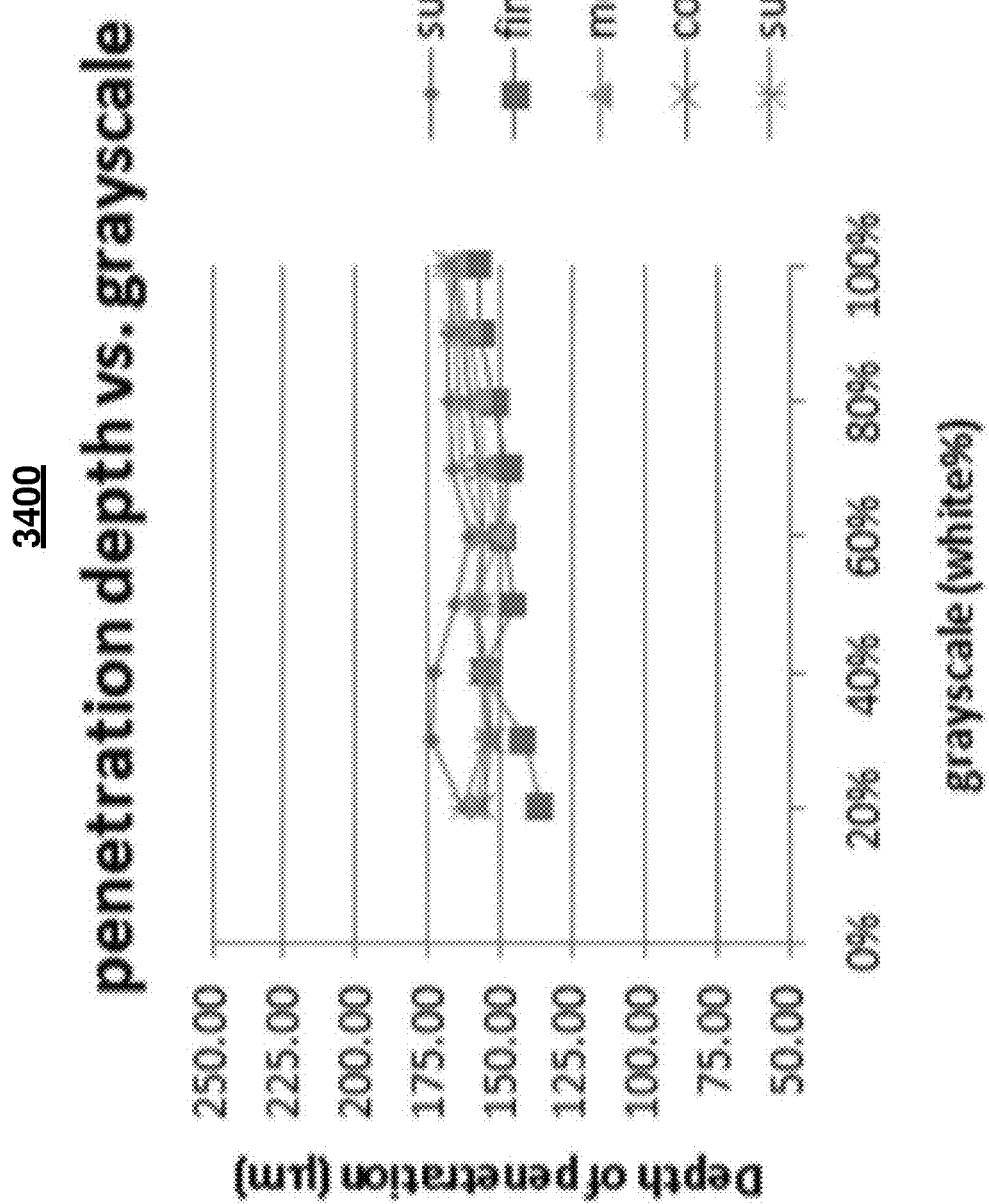
FIG. 34 provides a chart of screening-based grayscale working curves for one embodiment of a LAMP system.

FIG. 34 provides a chart 3400 of screening-based gray-scale working curves for one embodiment of a LAMP system.

Figure 35:
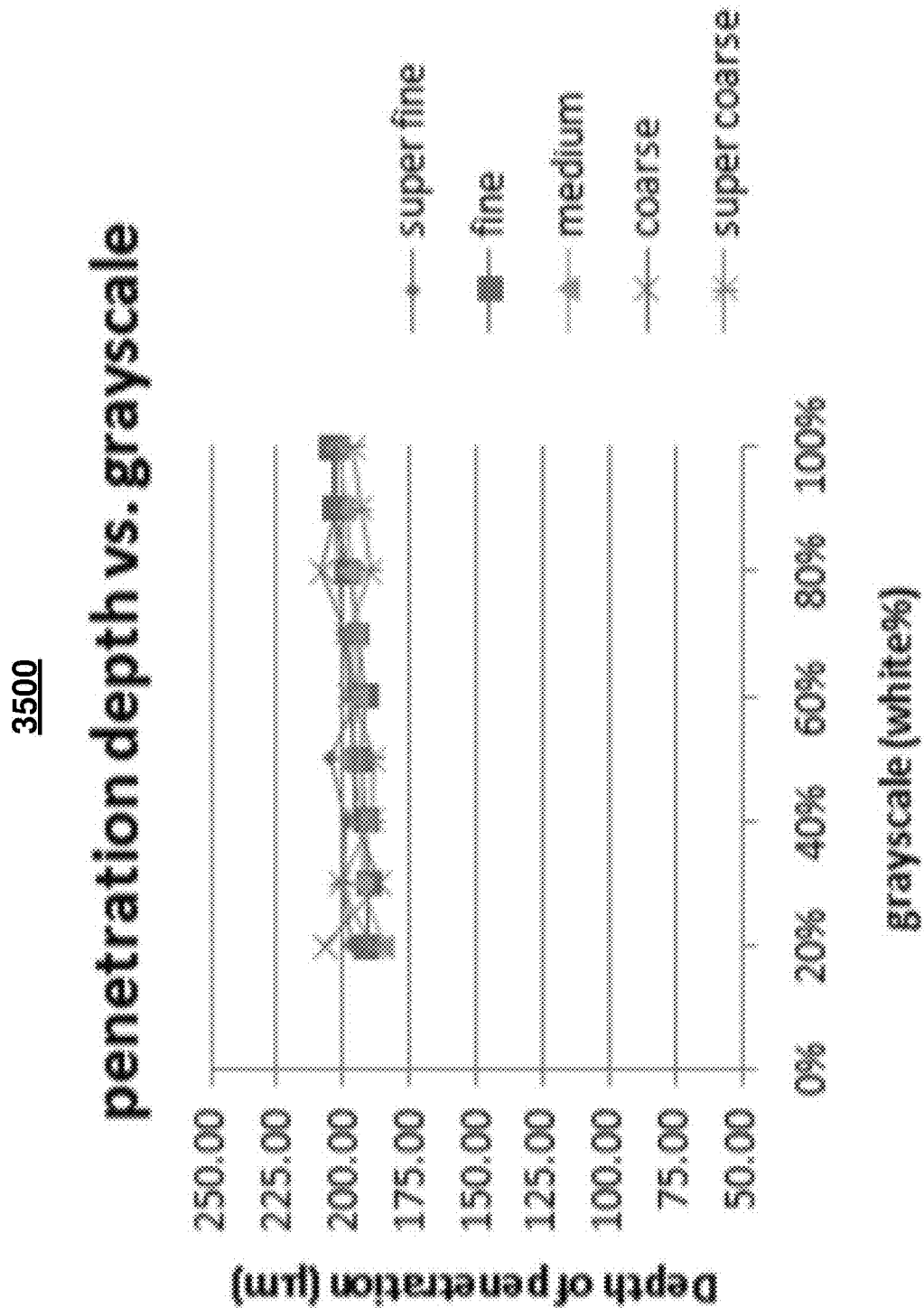
FIG. 35 provides a chart of screening-based grayscale working curves for one embodiment of a LAMP system.

FIG. 35 provides a chart 3500 of screening-based gray-scale working curves for one embodiment of a LAMP system.

Figure 36:
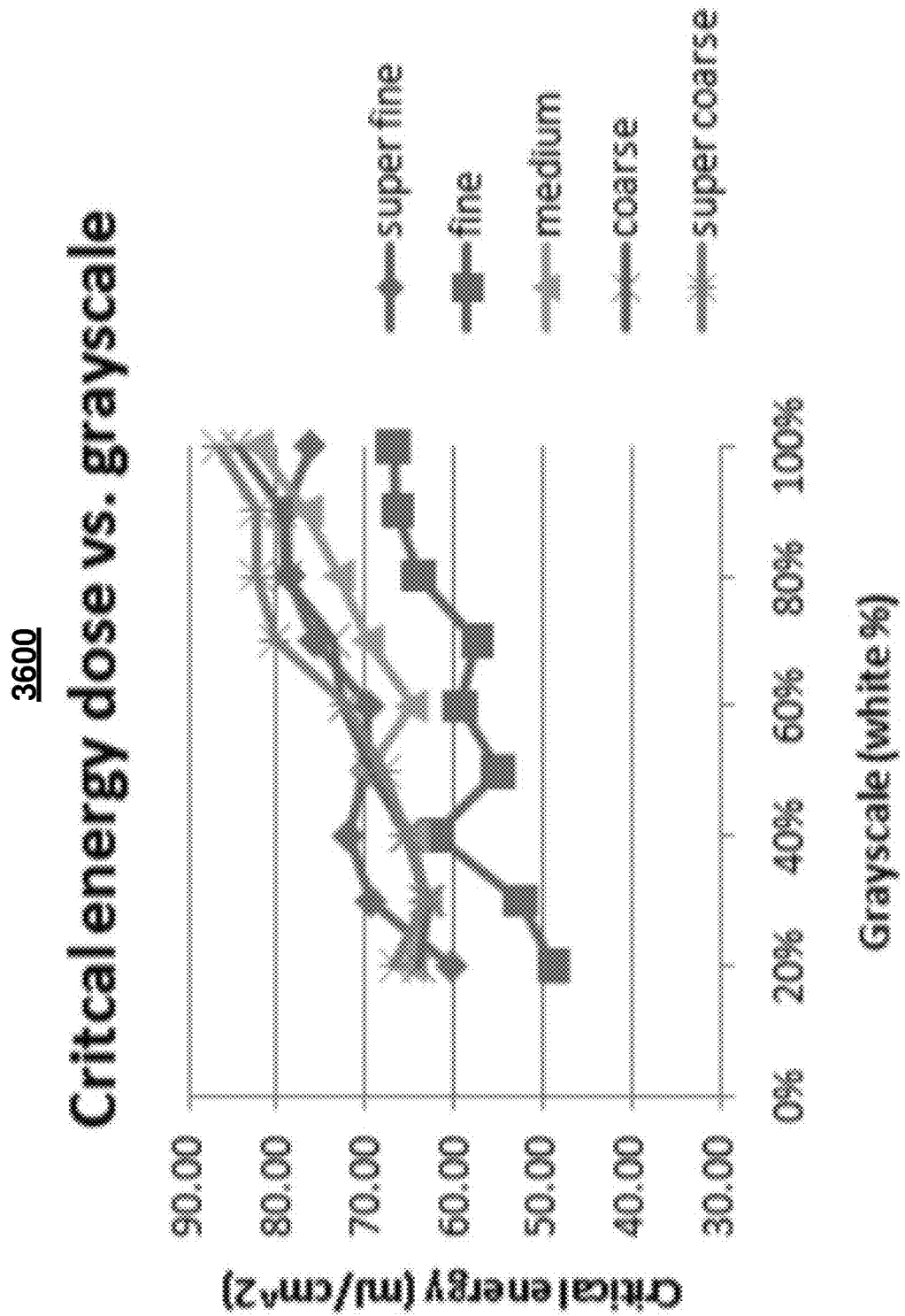
FIG. 36 provides a chart of screening-based grayscale working curves for one embodiment of a LAMP system.

FIG. 36 provides a chart 3600 of screening-based gray-scale working curves for one embodiment of a LAMP system.

Figure 37:
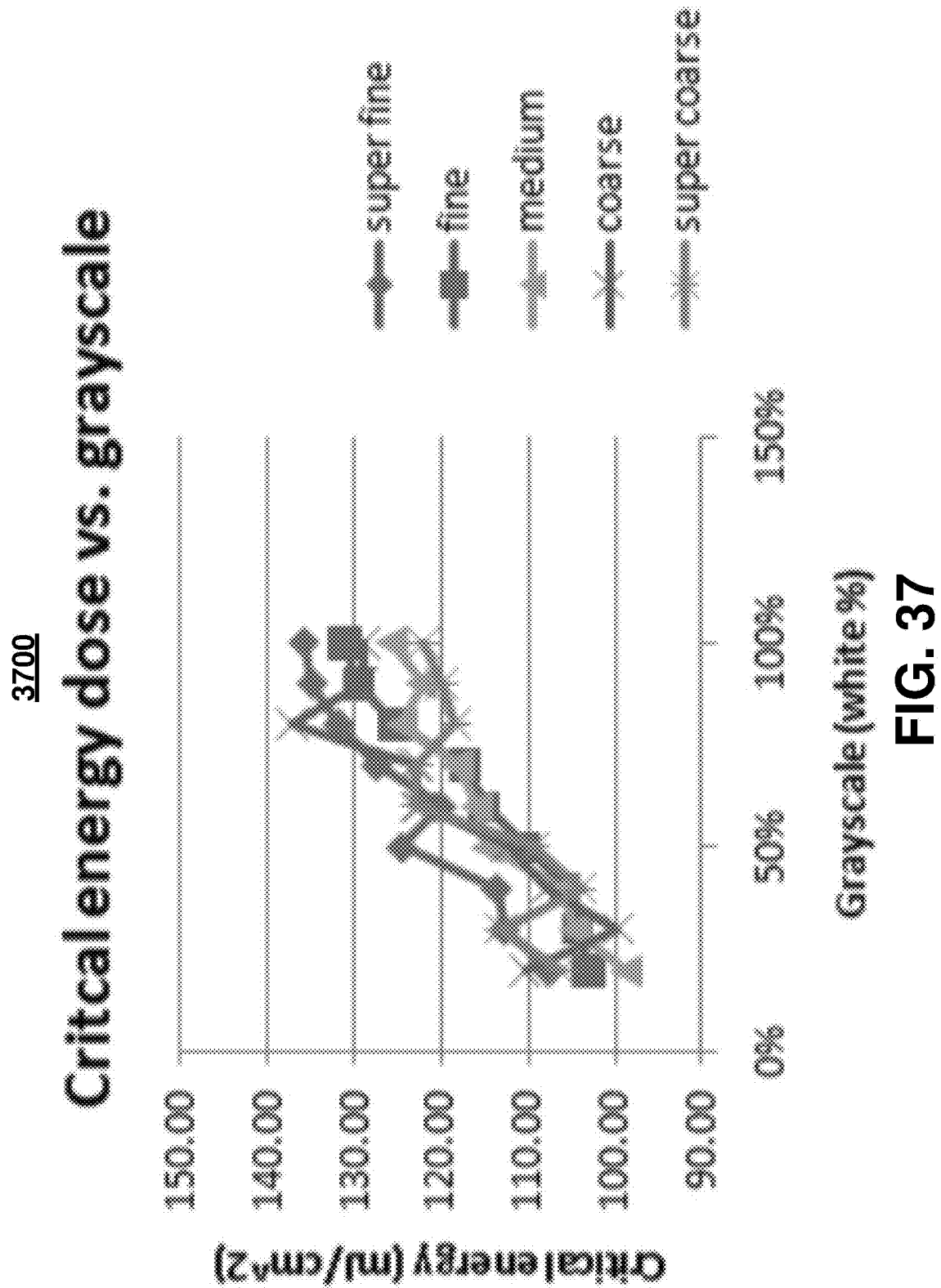
FIG. 37 provides a chart of screening-based grayscale working curves for one embodiment of a LAMP system.

FIG. 37 provides a chart 3700 of screening-based gray-scale working curves for one embodiment of a LAMP system.

The LAMP process may be intended to fabricate high-precision internally cooled turbine blades and hence may not afford the coarse tessellated geometry approximation of STL files. The native CAD geometry may need to be processed to output the slice data used for building these components. A direct slicing algorithm for accomplishing this may be implemented using a geometric kernel such as ACIS.

Figure 38:
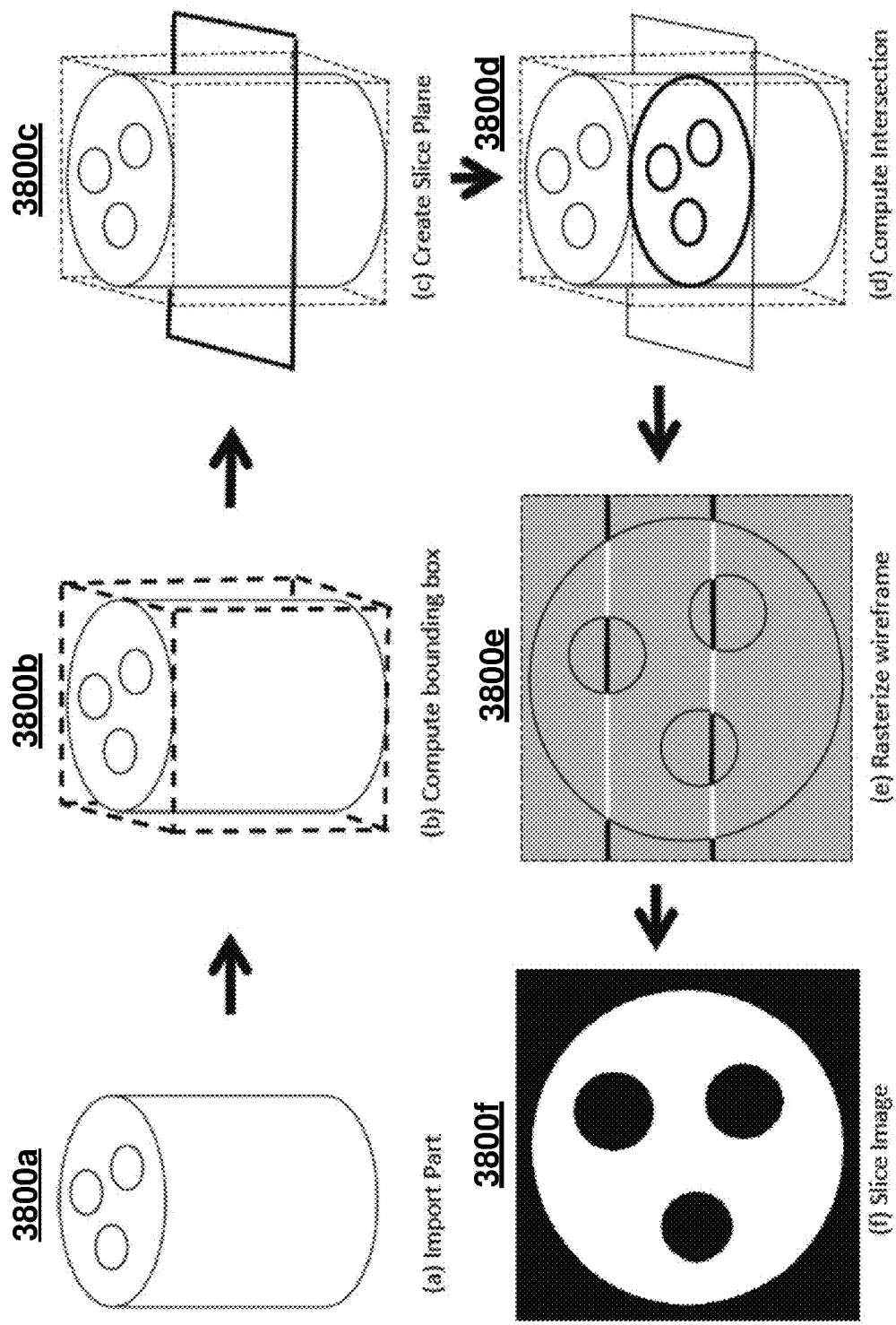
FIG. 38 illustrates one embodiment of a method of performing direct slicing in accordance with various aspects as described herein.

FIG. 38 illustrates one embodiment of a method 3800 of performing direct slicing in accordance with various aspects as described herein. In (a)-(f) of FIG. 38, the method 3800 may include loading an original CAD part into a program, as referenced at 3800a. The method 3800 may include computing a bounding box, as referenced at 3800b. The method 3800 may include creating a slice plane, as referenced at 3800c. The method 3800 may include computing an intersection between the part and the slicing plane, as referenced at 3800d. The method 3800 may include rasterizing an intersection wire to create a bitmap image, as referenced at 3800e. The method 3800 may include obtaining or compressing slice bitmaps using, for instance, CCITT FAX4, as referenced at 3800f. The ACIS kernel is a commercially available C++ CAD library marketed by Spatial Corp, a subsidiary of Dassault Systems. It offers robust APIs (Application Programming Interface) and function calls for most of the basic CAD operations. These APIs have been integrated into the slicing software to produce CAD slices. The resulting CAD slices are then rasterized to obtain the bitmaps used for exposure.

The original CAD mold that needs to be sliced may be first loaded into the algorithm using ACIS's load functions, as referenced at 3800a. ACIS libraries may work with the SAT file format and hence CAD files in other formats may need to be converted first into the SAT format either by using commercial CAD software or by using ACIS's inbuilt file format translation functions. During the translation, numerical or topological inaccuracies may creep into the part. In severe cases, error checking and correction schemes may need to be implemented. Once the part has been loaded, its bounding box may be computed to obtain an estimate of the size of the bitmaps that would be generated, as referenced at 3800b. A slicing plane may then be created and intersected with the part using, for instance, ACIS's Boolean APIs to get an intersection wire, as referenced at 3800c. Once the intersection wire is obtained, it may be rasterized to obtain the bitmaps, as referenced at 3800d. This may involve shooting rays for each row of pixels in the image and computing the intersection points with the intersection wire. Pixel values may then be filled with alternating white and black segments in between each of these intersection points, as referenced at 3800e. The bitmap images obtained may then be compressed using CCITT fax4 lossless compression scheme that compresses the data by three orders of magnitude without any loss, as referenced at 3800f. CCITT fax4 is an industry standard lossless compression scheme for efficiently compressing 1-bit TIFF images. These bitmaps may then be fed to the post processing algorithms.

In order to accomplish the tasks discussed in the basic algorithm outline shown in (a)-(f) of FIG. 38, several different steps may need to be completed. An example of these steps is shown in the pseudocode for direct slicing, referred to as Algorithm 1.

Algorithm 1:

```
1:  set ACIS parameters like native resolution
2:  set build parameters like layer thickness and slice image resolution
3:  import CAD File to SAT format using ACIS Interops module
4:  perform error checking on part
5:  if part free of errors then
6:      get bounding box of the part, i.e., (Xmin; Ymin;Zmin) & (Xmax; Ymax;Zmax)
7:      adjust bounding box dimensions
8:      compute the height and width of slice image in pixels
9:      create and allocate memory for a 'characterBuffer' array
10:     for each 'Z' location along the build direction do
11:         create a plane at the specic 'Z' location
12:         for each body in the CAD slice do
13:             intersect body with the plane created to get a wire graph of the cross-section
14:             store the cross-section wire graph to a 'crossSectionList'
15:         end for
16:         for each cross-section wire graph in the 'crossSectionList' do
17:             extract all the edges and store in an 'edgeList'
18:         end for
19:         for each row of pixels in the image do
20:             create a ray
21:             for each edge in the 'edgeList' do
22:                 compute intersection of the edge with the ray
23:                 if ray is not tangent to the edge then
24:                     store the intersection point in an 'intersectionList'
25:                 end if
26:                 sort points in 'intersectionList' w.r.t their 'X' coordinates
27:                 for each intersection point in the 'intersectionList' do
28:                     compute the corresponding pixel number in the image
29:                     store the pixel number to a 'pixelNumberList'
30:                 end for
31:                 create temporary 'integerBuffer' array
32:                 for each pixel in the current row of pixels do
33:                     create a boolean variable 'color' and initiate to '0'
34:                     fill 'integerBuffer' array with the value of 'color'
35:                     toggle 'color' value when you hit a number in 'pixelNumberList'
36:                 end for
37:                 for every 8 values in 'integerBuffer' array do
38:                     compute the decimal sum
```

| Algorithm 1: |
|---|
| 39:                                   identify the corresponding ASCII character |
| 40:                                     store it in the corresponding row of 'characterBuffer' array |
| 41:                            end for |
| 42:                    end for |
| 43:             end for |
| 44:     end for |
| 45:     use 'characterBuffer' array information to create the slice image |
| 46:     save the slice image to a multipage tiff |
| 47: else |
| 48:     display error message to user |
| 49:     exit slicer program |
| 50: end if |

After importing the CAD file and performing error checking on the part, it's bounding box may be computed to yield the minimum and maximum extents of the part, i.e., (Xmin; Ymin;Zmin) and (Xmax; Ymax;Zmax). The size of the slice image (in pixels) may be determined by these extents and the resolution (dpi) required. It is a convention in the image processing field to round up the image width to a value that is an integer multiple of 32 bits (4 bytes) and hence, these bounding box extents may need to be adjusted. Assuming (without loss of generality) that the build direction is along 'Z' axis, the image size may be computed from these adjusted extents as follows:

$$\text{Image Width} = \frac{X_{max} - X_{min}}{\text{Resolution}}, \quad \text{Equation (1)}.$$

$$\text{Image Height} = \frac{Y_{max} - Y_{min}}{\text{Resolution}}, \quad \text{Equation (2)}.$$

Once the image size is determined, an ASCII character array denoted by 'characterBuffer' may be created and dynamically allocated in order to store the necessary information for each slice. In binary (black and white) bitmap images, each pixel may require 1-bit of memory. There may be no provision in C++ to access each bit of memory individually. So, sets of values ('0's and '1's; '0' denoting black and '1' denoting white) of eight pixels may be read at a time and the ASCII character corresponding to their decimal sum may be stored in the appropriate location of the 'characterBuffer' array. After memory has been allocated for the image, the part may then be sliced at the corresponding 'Z' height location by calling the 'api_planar_slice' API to produce an intersection contour. Details of the various ACIS APIs may be found at their documentation portal, as described in ACIS Documentation Portal found at http://doc.spatial.com/index2.php. If the part file has multiple bodies, each of these bodies may be sliced as well and the resulting cross section contours may be stored in a list denoted by 'crossSectionList'. Having computed all of the planar intersections, all the edges from each of these contours may be extracted and stored in an 'edgeList'. Once the 'edgeList' is populated, it may then be time for computing the necessary color information for creating the bitmap image. The "exterior" of the part may be denoted by black whereas the "interior" of the part may be denoted by white.

In order to determine if a point is in the interior or exterior of the part, its membership with respect to the part may need to be established, for example, as discussed by Robert B. Tilove, *Set membership classification: A unified approach to geometric intersection problems*, Computers, IEEE Transactions on, 100(10):874-883, 1980. A point's membership with respect to the interior may be established by originating a non "osculating" (touch without crossing) curve from the desired point and letting it propagate to infinity (with the assumption that a point infinitely far away is exterior to the part) while counting the number of times it intersects with the part. If the number of intersections is odd (even), then the point may be interior (exterior) to the part.

Figure 39:
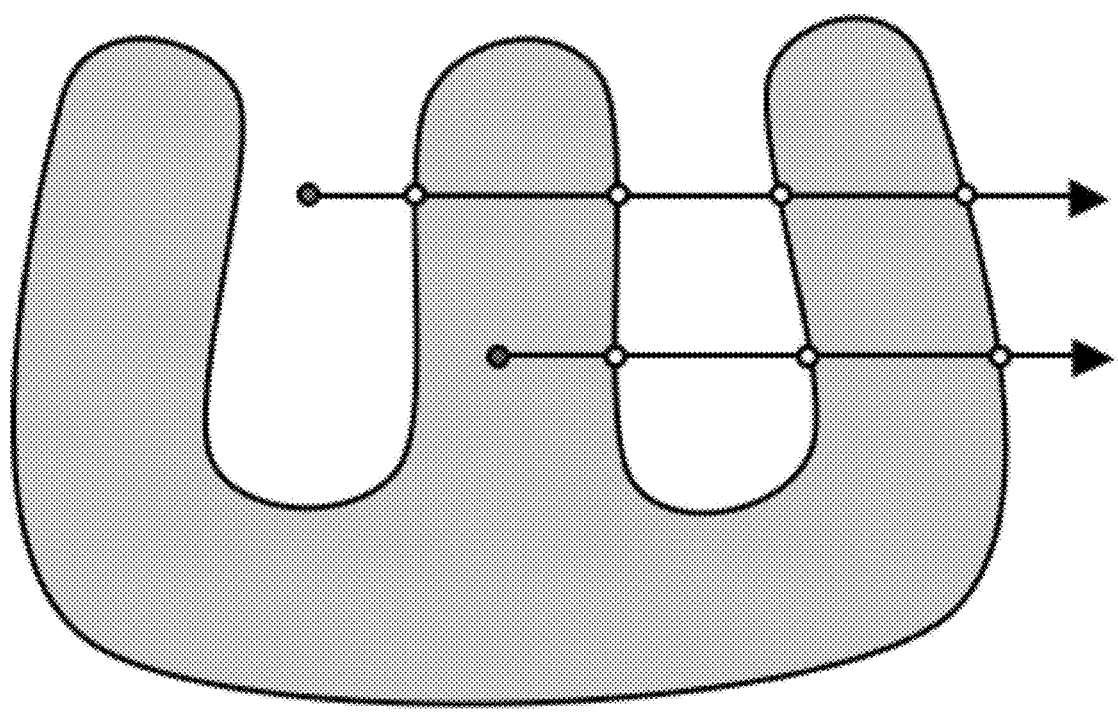
FIG. 39 illustrates one embodiment of a method of identifying the "interior" from the "exterior" in accordance with various aspects as described herein.
Figure 40:
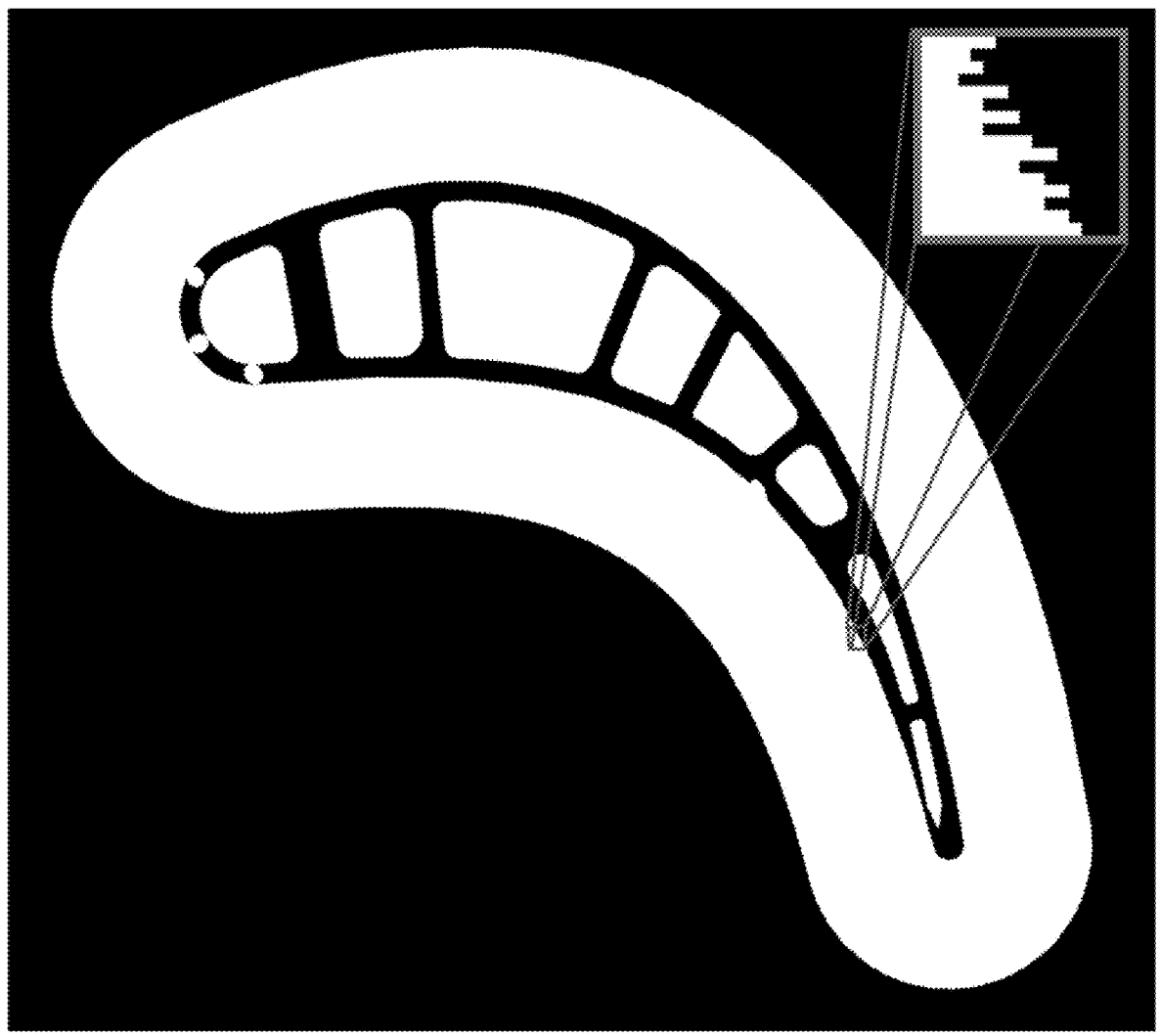
FIG. 40 is a slice image having rough edges due to floating point errors in counting a distance traveled.

FIG. 39 illustrates one embodiment of a method of identifying the "interior" from the "exterior" in accordance with various aspects as described herein. As may be clearly seen, the ray originating from the exterior point makes an even number (four) of intersections while the ray originating from the interior point makes an odd number (five). It is fairly evident that the same logic applies if the ray were to start at infinity and terminate at a point whose membership is to be determined. More importantly, it may be observed that if a ray starting at infinity were to cut across a part, its membership toggles between interior and exterior of the part every time it intersects with the part boundary. For the purposes of making the slice image, this fact may be taken advantage of. Rays starting at the left end of the bounding box may be created for each row of pixels in the image and their intersection points with each of the edges in 'edgeList' may be computed. As previously mentioned, these rays may have to be non-"osculating" for this method to work and hence the computed intersection points may be stored to the 'intersectionList' if the ray is non-tangential to the edge with which the intersection point is computed. Once the 'intersectionList' is created, an 'integerBuffer' array may be created to store the pixel color data. A boolean 'color' variable (a variable that may only take values of '0' and '1') may be created and initiated to '0' to start with (as the start point of the ray may be external to the part). The process of marching along the ray may be simulated by counting the pixels as we move from left to right in the row. The value of the 'color' variable may be toggled every time the pixel number exceeds the 'X' coordinates of one of the points in 'intersectionList'. This progression along the ray may be counted in terms of pixels and may not be counted in the absolute floating-point distance traveled along the ray with respect to size of each pixel. The size of each pixel may be a floating-point number such as 0.00066667 inches for a 1500 dpi image and counting the distance traveled with respect to this size instead of the integer pixel numbers may lead to floating point errors and may result in rough edges in the slice image, as described in FIG. 40. FIG. 40 is a slice image having rough edges due to floating point errors in counting a distance traveled. In FIG. 40, the inset shows the resulting rough edges. Such rough edges may diminish the surface quality of the part and hence may need to be avoided. Once the integer values of pixels are properly filled, the 'integerBuffer' array may then be converted to the corresponding ASCII characters to fill the 'characterBuffer' array for the image. The 'character-Buffer' array may get completely filled when this process of intersection and collecting the pixel color information is completed for all the rows of the image, at which point it may be used to make the compressed TIFF image.

Figure 41:
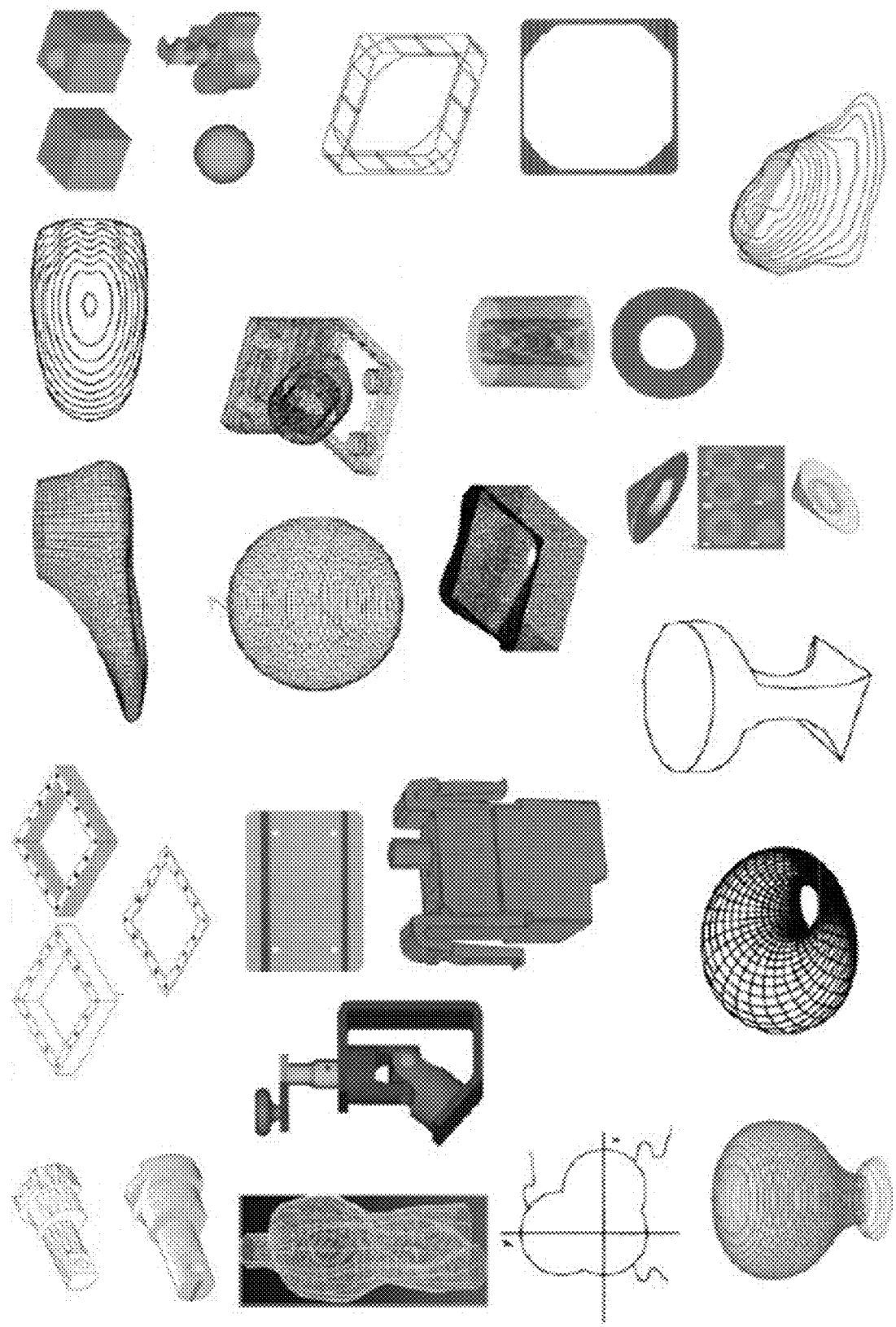
FIG. 41 illustrates test parts used in much of the previously reported work in the direct slicing literature.
Figure 42:
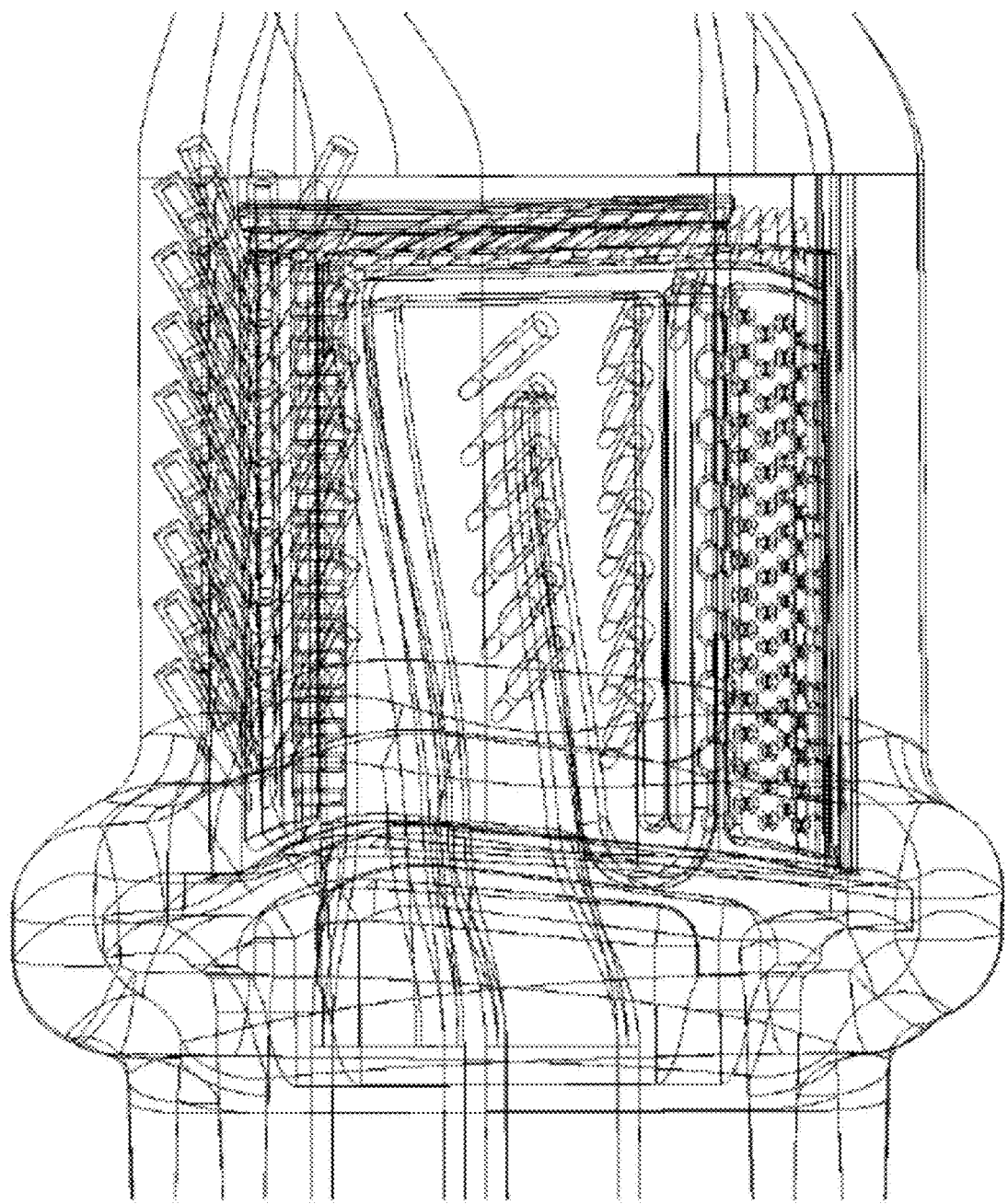
FIG. 42 shows a CAD model of a typical internally cooled HP turbine blade.

FIG. 41 illustrates test parts used in much of the previously reported work in the direct slicing literature. As may be seen, most of the test parts are single volume solids with a few that have one or two voids in them. In comparison, FIG. 42 shows a CAD model of a typical internally cooled HP turbine blade. It is deliberately shown in the wire frame view to give a better appreciation of the geometric complexity involved. Every edge in the figure represents an interface where two or more NURBS surfaces meet. Upon comparing the test parts previously shown with the HP blade mold, the order of magnitude difference in the geometric complexities involved in LAMP parts is evident. There is so much scope for errors with parts of such high complexity. Tiny gaps in the model due to CAD translations or non manifold geometry due to improperly defined surface intersections at the interfaces by the designer are very common. In order to successfully slice the model, the direct slicing algorithm described in the previous section may be implemented to be tolerant to these errors.

It was observed that errors occur in two steps of the direct slicing algorithm discussed in the previous section. The first step is slicing which involves computation of the intersection between the slice plane and the CAD object. Due to the improperly defined geometry at complex regions of the mold, in some instances the slicing operation fails to produce a wireframe intersection curve (step (c) in FIG. 10). The second step that contributes to errors is rasterization (step (d) in FIG. 10) which involves computing the intersections between rays and the wire frame intersection curve. Any gaps in the model manifest as gaps in the wire frame curve and these, in turn, manifest as stray lines in the rasterized image (refer to FIG. 28a for an illustration of these stray lines). It was observed that the errors produced in these two steps are very sensitive to a parameter known as ACIS Resolution which defines how sensitive ACIS kernel is to the inherent topological errors in the CAD model.

Figure 43A:
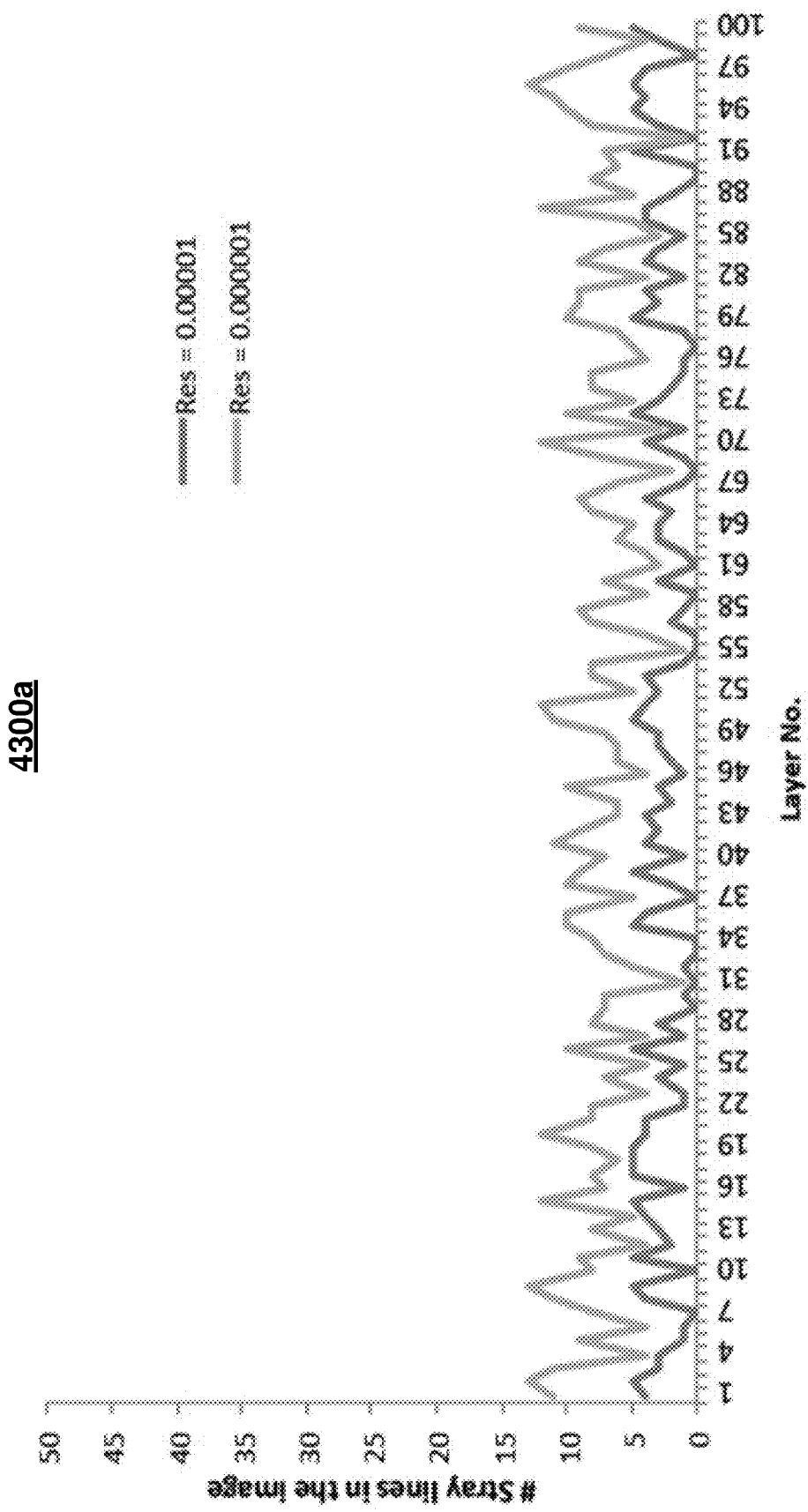
FIG. 43a provides a chart of the number of stray lines observed in each image from a stack of hundred consecutive slices produced at two different ACIS resolutions.

FIG. 43a provides a chart 4300a of the number of stray lines observed in each image from a stack of hundred consecutive slices produced at two different ACIS resolutions. It may be seen that consistently more numbers of errors are produced in each slice layer at the lower resolution (lower ACIS tolerance to topology errors) value. Not only does the ACIS Resolution parameter influence the slice image errors in rasterization, but it was also observed to influence the errors produced in the slicing step. When the slicing operation fails, in some instances it was observed that by lowering the ACIS resolution (thus making the kernel more tolerant) and re-slicing, the wire frame intersection curves may still be computed.

Keeping this fact in mind, in order to tolerantly slice the erroneous CAD geometry, two levels of error tolerance are embedded in the direct slicing algorithm. The first is in the CAD space which is aimed to alleviate the problems induced in the slicing step. If the slicing operation fails, the algorithm dynamically lowers the ACIS resolution to try and compute an intersection curve. If this fails, the slice plane location is perturbed by a small amount along the height of the part (usually by ±10 μm) and the slicing operation is conducted again at this new slice plane location with various resolutions in order to explore the possibility of successfully computing a wire frame slice. In extreme instances, if the slicing operation still fails, the corresponding images cannot be created, and these are then borrowed from the output obtained by slicing an STL representation of the same part (STL file slicing approaches are discussed in Section 2.3).

The second level of error tolerance is in the image space. As was previously discussed, having successfully computed the wire frame intersection curve, stray lines may sometimes result in the output slice images during to the rasterization step of the direct slicing process. In order to alleviate this problem, an error checking algorithm that automatically detects and corrects these stray lines with a stack of slice images as input is implemented. Note that this error checking algorithm may work on a stack of slice images irrespective of whether they are produced by the direct slicing algorithm or the several STL file slicing algorithms Hence, this second level of error tolerancing, apart from making the direct slicing algorithm error tolerant, makes all the STL file slicing algorithms error tolerant as well.

A rough estimate of the time complexity of the direct slicing algorithm and the computational times required to slice a few representative parts is given in this section. The time complexity of the algorithm may be estimated as follows: Assuming there are N surfaces in the part, for every layer in the part:

1) N surface intersections need to be computed with the slicing plane. This amounts to N operations requiring roughly constant time.

2) Next, considering the worst case scenario, for each row of pixels in the image, N ray-edge intersections need to be computed. This amounts to another Image Height*N operations.

3) Once the intersection points are computed, the proper integer pixel values need to be determined for each pixel in the slice image. These need to be later converted to character values to properly create the 1-bit TIFF image. These two operations will together amount to C*Image Height*Image Width operations where C is some constant.

So, by adding together the number of operations for each of the steps described above, we may arrive at the time complexity for the algorithm as shown below:

$$T(N) = \#Layers * \{N + \text{Image Height} * \{N + C * \text{Image Width}\}\}, \quad \text{Equation (3)}.$$

Figure 43B:
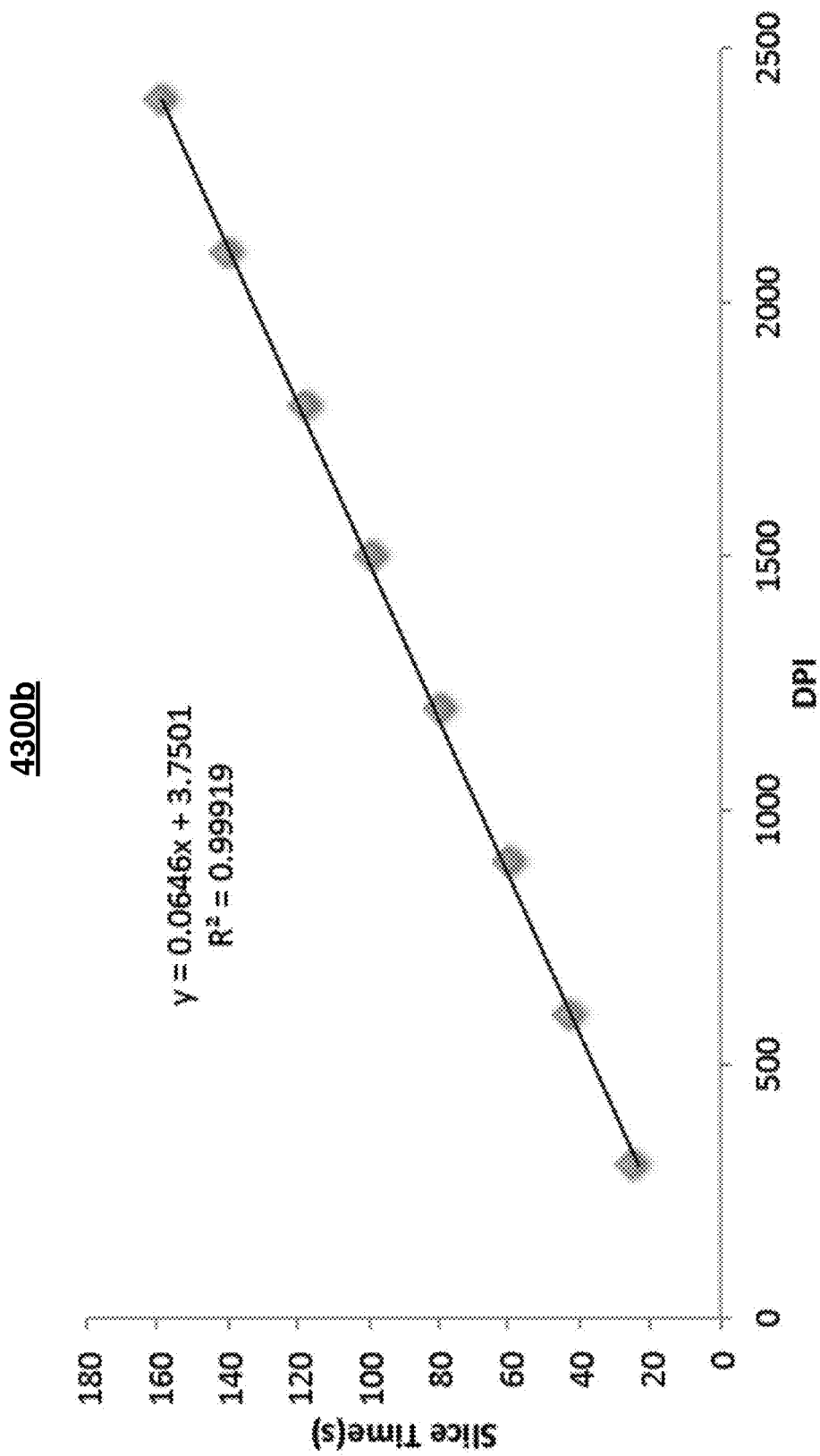
FIG. 43b provides a graph of the time to compute one slice scaling with DPI.

Where, N denotes the number of surfaces in the part and C is a constant. The computation time of the algorithm roughly scales linearly with the number of layers in the part, which may be directly proportional to the height of the part and inversely proportional to the Layer thickness, and the number of surfaces in the part. Although the expression in Equation 3 predicts the slicing time to scale quadratically with respect to the Image Height and Image Width, the number of operations are much more dependent on the image height than the width of the image. Therefore, the slicing time may roughly scaled linearly with respect to the image height and may be independent of the image width (linear in reality but with a very small slope) and therefore also scales linearly with respect to the output resolution (DPI, dots per inch) of the slice image. FIG. 43b provides a graph 4300b of the time to compute one slice scaling with DPI. For the full edged, internally cooled HP turbine blade mold shown in FIG. 42, it takes about two (2) minutes to compute each slice and about a day and a half to compute the entire stack of slice images along the length of the part.

Table 1 below provides the computational times taken to compute each slice for various output image resolutions.

| DPI | Image Width | Image Height | Slice Time(s) |
|---|---|---|---|
| 300 | 632 | 1066 | 24.963 |
| 600 | 1265 | 2132 | 42.866 |
| 900 | 1898 | 3199 | 60.388 |
| 1200 | 2531 | 4265 | 80.340 |
| 1500 | 3163 | 5332 | 100.077 |
| 1800 | 3796 | 6398 | 118.458 |
| 2100 | 4429 | 7465 | 140.901 |
| 2400 | 5062 | 8531 | 159.843 |

Since STL files are typically used in the industry and the direct slicing approach using ACIS may not handle these files, several alternate methods have been investigated.

Reconstructing SAT Files

One of the major weaknesses of the STL file format is the lack of topological information. As mentioned before, STL files are just a random collection on triangular facets with no edge or vertex connectivity information embedded in it. The basic structure of a sample STL file is shown below:

```
solid cube_corner
    facet normal 0.0 -1.0 0.0
        outer loop
            vertex 0.0 0.0 0.0
            vertex 1.0 0.0 0.0
            vertex 0.0 0.0 1.0
        endloop
    endfacet
    facet normal 0.0 0.0 -1.0
        outer loop
            vertex 0.0 0.0 0.0
            vertex 0.0 1.0 0.0
            vertex 1.0 0.0 0.0
        endloop
    endfacet
    facet normal 0.0 0.0 -1.0
        outer loop
            vertex 0.0 0.0 0.0
            vertex 0.0 0.0 1.0
            vertex 0.0 1.0 0.0
        endloop
    endfacet
    facet normal 0.577 0.577 0.577
        outer loop
            vertex 1.0 0.0 0.0
            vertex 0.0 1.0 0.0
            vertex 0.0 0.0 1.0
        endloop
    endfacet
endsolid
```

As may be seen, each of the facets and their respective vertex coordinates and normal vectors are listed successively in an arbitrary order. This poses constraints in efficiently performing several vital operations on them. First, slicing the model may become difficult and time consuming. In addition to slicing, performing error checking operations like identifying missing facets or gaps in the model, computing integral properties like mass, center of gravity, volume or the like, which are important for various process planning operations like part orientation, build area packing or the like, and manipulation of part geometry may become difficult as well. With the ultimate objective of alleviating these limitations, an algorithm may be implemented to reverse engineer a CAD file (or a SAT file) from the input STL file with all the topological information embedded in it.

Doing this may aid in using the robust APIs of ACIS to perform the slicing operations and other vital operations like error checking, calculating the integral properties, manipulation of part as previously stated, or the like. In order to reverse engineer an SAT file, the BRep (Boundary Representation) data structure of ACIS may need to be built from ground up.

Figure 44:
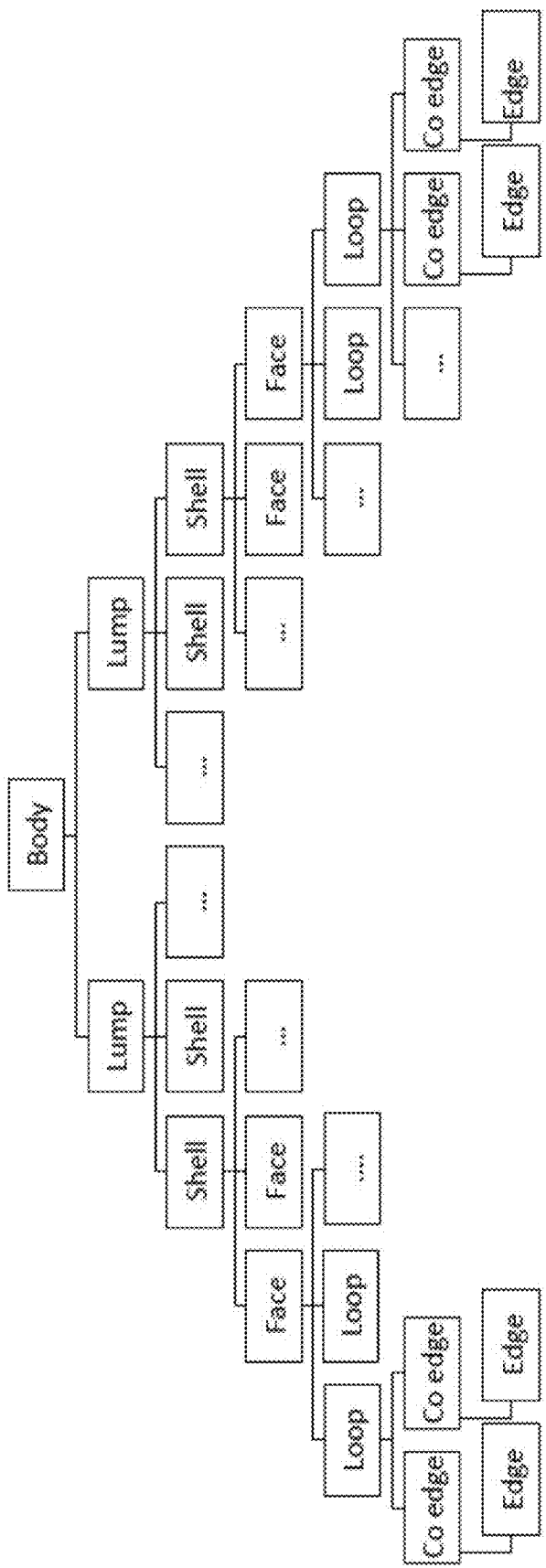
FIG. 44 shows the various elements of the BRep (Boundary Representation) data structure.

FIG. 44 shows the various elements of the BRep (Boundary Representation) data structure. The BRep (Boundary Representation) data structure may need to be created and populated. Each body in the BRep data structure may be divided into 'Lumps'. Lumps may or may not be disconnected and may be present for the reason of simplifying the geometry to make the CAD algorithms more efficient. Each Lump may include a list of disconnected closed objects called 'Shells'. Each shell may include a list of 'Faces' that bound the space defined by the shell. Each 'Face' may include a series of 'Loops'. A Loop may be a ring of end-to-end connected 'Co-edges'. A Co-edge may be a topological entity associated with every 'Edge' in the model and may be used to store edge connectivity information in the part. If two faces meet at an edge, the corresponding co-edges from the loops of each of these faces may refer to the same edge and this may be how the modeling kernel identifies adjacency information between them.

To populate the data structure and create an SAT file from a triangular mesh, the following steps may be performed:

1) For every listed facet, vertices may need to be created. Co-edges connecting these vertices may need to be created as well and may be looped in the right 'sense' such as clockwise or counter-clockwise.

2) From the face adjacency information, edges may need to be created and corresponding co-edges from the adjacent faces may need to point to the same edge.

3) Again, from the face adjacency information, all the interconnected faces may need to be grouped into shells. At the end of the grouping, each shell may have a list of all the faces that are interconnected but do not touch or intersect with any of the faces of the other shells.

4) These shells may be arbitrarily grouped into lumps and the whole body may be created from the resulting list of lumps.

To reverse engineer an SAT file, all of the topological information like vertex and edge connectivity and facet adjacency may need to be extracted from the STL file. Special data structures may need to be implemented to accomplish this.

The Corner table data structure may store the topology and connectivity information in two integer arrays. FIG. 45 illustrates a corner table data structure 4500 in accordance with various aspects described herein. In (a)-(c) of FIG. 45, the corner table data structure 4500 may be configured to include nomenclature 4500$a$ or integer arrays 4500$c$ that hold topology and connectivity information. The region around a vertex in a facet may be loosely referred to as a 'Corner'. The vertex that corresponds to that corner may be referred to as 'v(c)'. The corner opposite to the current corner 'c' may be referred to as 'o(c)'. The left and the right corners may be respectively referred to as '1($c$)' and 'r(c)'. The next and previous corners may be given by 'n(c)' and 'p(c)', respectively (assuming the vertices are listed in a counterclockwise manner). The triangle to which the current corner belongs may be referred to as 't(c)'. The two integer arrays that store the connectivity information may be the Vertex array 'V[c]' and the Opposite array 'O[c]', as shown in (a)-(c) of FIG. 45. For any given corner 'c', the corresponding vertex and opposite corner indices may be obtained from the Vertex array 'V[c]' and Opposite array 'O[c]', respectively. Once these two arrays are populated, the adjacency information may be available. For example, starting from a random corner 'c', the left triangle may be accessed by querying t(o(p(c))), the right triangle by t(o(n (c))) and the opposite triangle by t(o(c)). In order to reconstruct an SAT file, the edge connectivity information may also be required. Hence this data structure may be extended by also constructing an edge array 'E[c]'. It may store the edge index of the edge opposite to a given corner 'c'. If these three arrays are computed, then all the topological information required to reconstruct the SAT file may be recovered.

Figure 46:
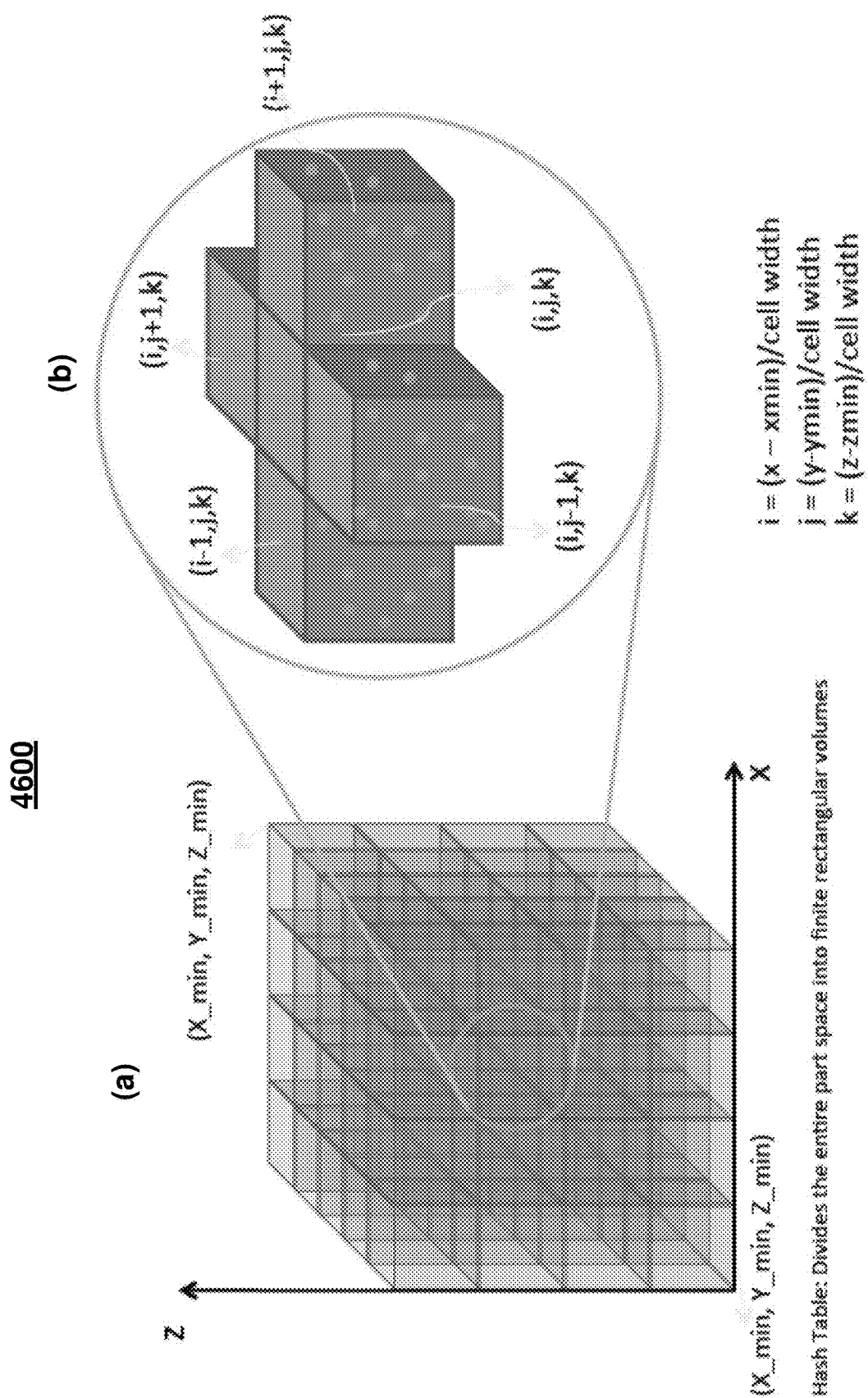
FIG. 46 shows a schematic of a cell structure used to identify redundant vertices in accordance with various aspects described herein.
Figure 47:
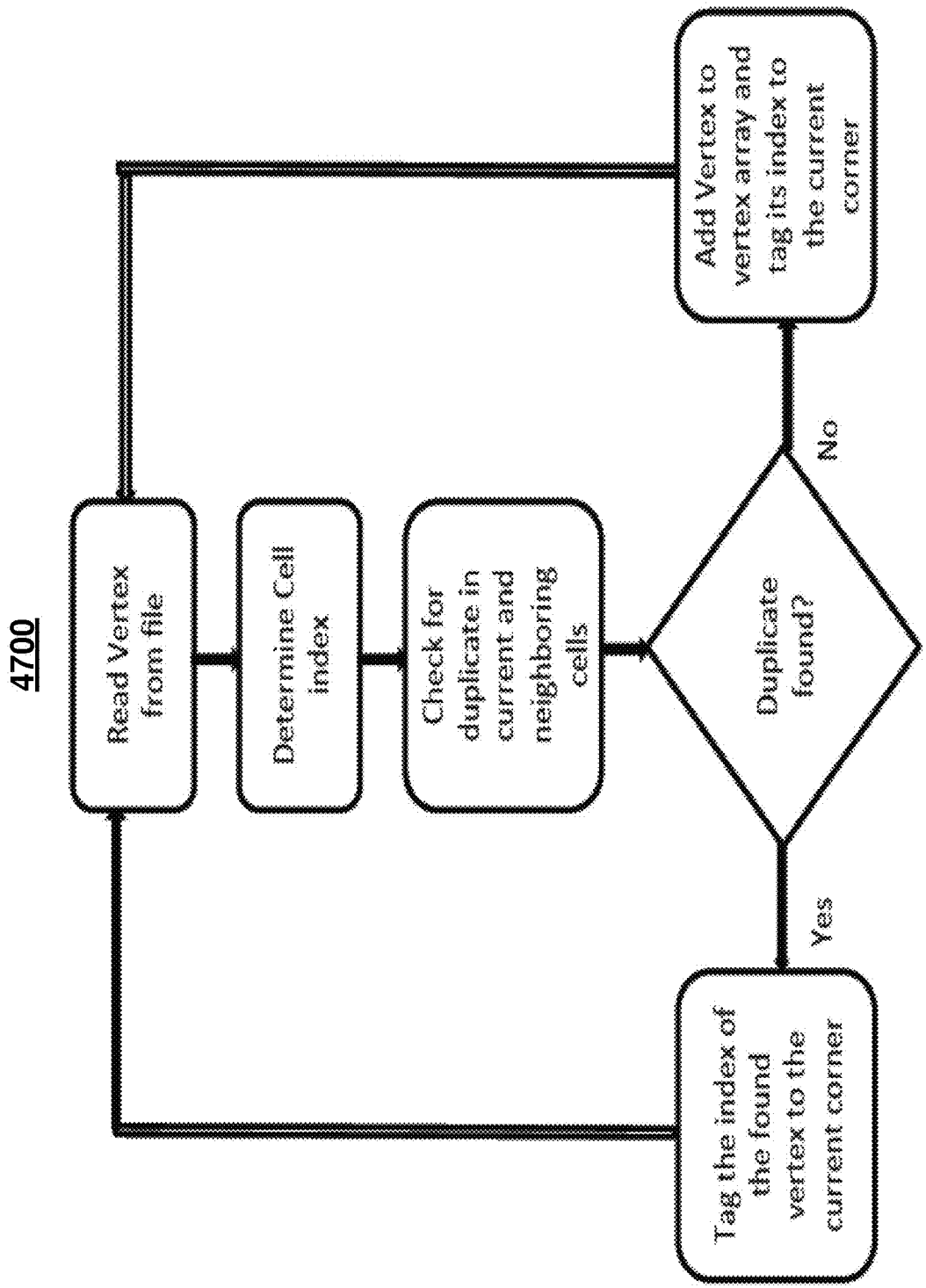
FIG. 47 is a flow chart of a method used to fill V[c] in accordance with various aspects described herein.

FIG. 46 shows a schematic of a cell structure used to identify redundant vertices in accordance with various aspects described herein. FIG. 47 is a flow chart of a method 4700 used to fill V[c] in accordance with various aspects described herein. 'V[c]' may be constructed by implementing a cell structure where the space enclosed in the bounding box of the part may be divided into discrete cells. As the facets are read from the STL file, each of their vertices may be first checked for redundancy before they are given an index or stored in V[c]. As each vertex is read, its cell number may be computed. The distance between this vertex, the vertices already present in its cell or the immediate neighboring cells may be computed. If it is less than a set tolerance value, then the vertex may be discarded or the index of the vertex closest to it may be stored in V[c]. If not, a new vertex index may be created or stored in V[c]. Continuing this process for the vertices of the facets in the STL file may result in V[c] being completed.

'O[c]' may be constructed by first identifying all the corners associated with a vertex and revolving around each vertex, marking the opposite corners. This is done by first populating a temporary data structure called 'bins'. Each node in 'bins' corresponds to a unique vertex in the mesh. For each corner 'c' in the part, the minimum vertex index among the vertex indices corresponding to the next and previous corners of 'c' is identified. The triplet of (min {V [n(c), V [p(c)]}, max {V[n(c)], V [p(c)]}, c) is stored in the min {V[n(c), V[p(c)]}$^{th}$ node of 'bins'. This is essentially grouping all the edges originating from the vertex in its corresponding node in 'bins' and the corner 'c' pointing to the edge. After doing this for every corner in the mesh, each node in 'bins' will point to all edges originating from a vertex and the corners pointing to those edges. Once 'bins' is fully populated, it is easy to check for corners pointing to the same edge originating from the same vertex. If such a pair of corners exits then each corner is marked as the opposite of the other. Doing this for all the edges in each of the nodes in 'bins', 'O[c]' may be fully populated. A pseudo code for doing this is shown in Algorithm 2.

Algorithm 2: Constructing O[c].

1: create and allocate memory for bins
2: for each corner c in the mesh do
3:     e1 ← min{V [n(c), V [p(c)]}
4:     e2 ← max{V[n(c), V[p(c)]}
5:     bins[e1] ← (e1, e2, c)
6: end for
7: for each node in bins do
8:     for any pair of triplets (e1, e2, c) and (e1', e2', c')
9:         if e1 = e1' and e2 = e2' then
10:            O(c) ← c'
11:            O(c') ← c
12:        end if
13: end for Once 'V[c]' and 'O[c]' are constructed, 'E[c]' may be easily constructed as follows. First an empty array 'E' is created and initialized to null. For every corner 'c' in the mesh, check if either or both of 'p(c)' and 'o(p(c))' are not pointing to any edge. If one of them is not pointing to an edge, assign the edge index of the edge pointed by the other. If both of them are not pointing to any edge, then create a new index for the edge corresponding to the two vertices of 'c' and 'n(c)' and store this edge index in 'E[c]' for the two corners 'n(c)' and 'o(p(c))'. Doing this for every corner in the mesh, the 'E[c]' table may be fully populated. A pseudo-code for constructing 'E[c]' is given in Algorithm 3.

Algorithm 3: Constructing E[c].

1: create and allocate memory for an array E
2: for each corner c in the mesh do
3:     E[c] ← NULL
4: end for
5: edgeIndex ← 0
6: for each corner c in the mesh do
7:     if E[p(c)] = NULL and E[o(p(c)] = NULL then
8:         create a new edge with vertices V(c) and V(n(c))
9:         E[p(c)] ← edgeIndex
10:        E[o(p(c))] ← edgeIndex
11:        edgeIndex ← edgeIndex + 1
12:    else if E[p(c)] = NULL then
13:        E[p(c)] ← E[o(p(c))]
14:    else
15:        E[o(p(c))] ← E[p(c)]
16:    end if
17: end for Having constructed V[c], O[c] and E[c], a simple function called 'swirl' may be implemented in order to identify the number of disjoint shells in the mesh. First, an array called 'Shell' with a length equal to the number of facets in the mesh is initiated and set to null. Each node in shell points to the shell number of a facet. For every corner 'c' in the mesh, if its corresponding facet 't(c)' is not assigned to a shell number in 'Shell[t(c)]' the number of shells is incremented by one and the Swirl function is called for the corner 'c'. Swirl function is a recursive function which calls itself. When it is called for a specific corner, it first sets the shell number for the facet and calls itself on the left ('l(c)') and right corners ('r(c)') of 'c'. Through this process of calling itself recursively, it tags all the interconnected facets with a shell number and this process continues until all the facets are tagged with a shell number. At the end of the routine, the number of disjoint shells in the mesh and the list of facets belonging to each shell may be identified. A pseudo code for doing this is shown in Algorithm 4.

Algorithm 4: Identifying the number of disjoint shells in a mesh using 'Swirl' function.

1: create and allocate memory for an array 'shell'
2: for each facet 't' in the mesh do
3:     shell[t] ← NULL
4: end for
5: #shells ← 0
6: for each corner 'c' in the mesh do
7:     if shell[t(c)] = NULL then
8:         swirl(c, #shells)
9:         #shells ← #shells + 1
10:    end if
11: end for
12: function swirl(c, k)
13:    if shell[t(c)] = NULL then
14:        shell[t(c)] ← k
15:        swirl(l(c), k)

Algorithm 4: Identifying the number of disjoint
shells in a mesh using 'Swirl' function.

16:   swirl(r(c), k)
17: end if
18: end function

In this way, once all the arrays 'V[c]', 'O[c]', 'E[c]' are computed and the number of disjoint shells identified, all the required topological information for reconstructing a SAT file from the STL mesh is recovered. Using this information, the SAT file may be constructed by populating the BRep data structure as previously discussed. An algorithm with these ideas has been implemented and STL files were successfully sliced with the ACIS kernel. In addition to slicing, other operations like error checking, geometry modification, calculation of integral properties like center of gravity, volume etc. have also been successfully performed.

Figure 48:
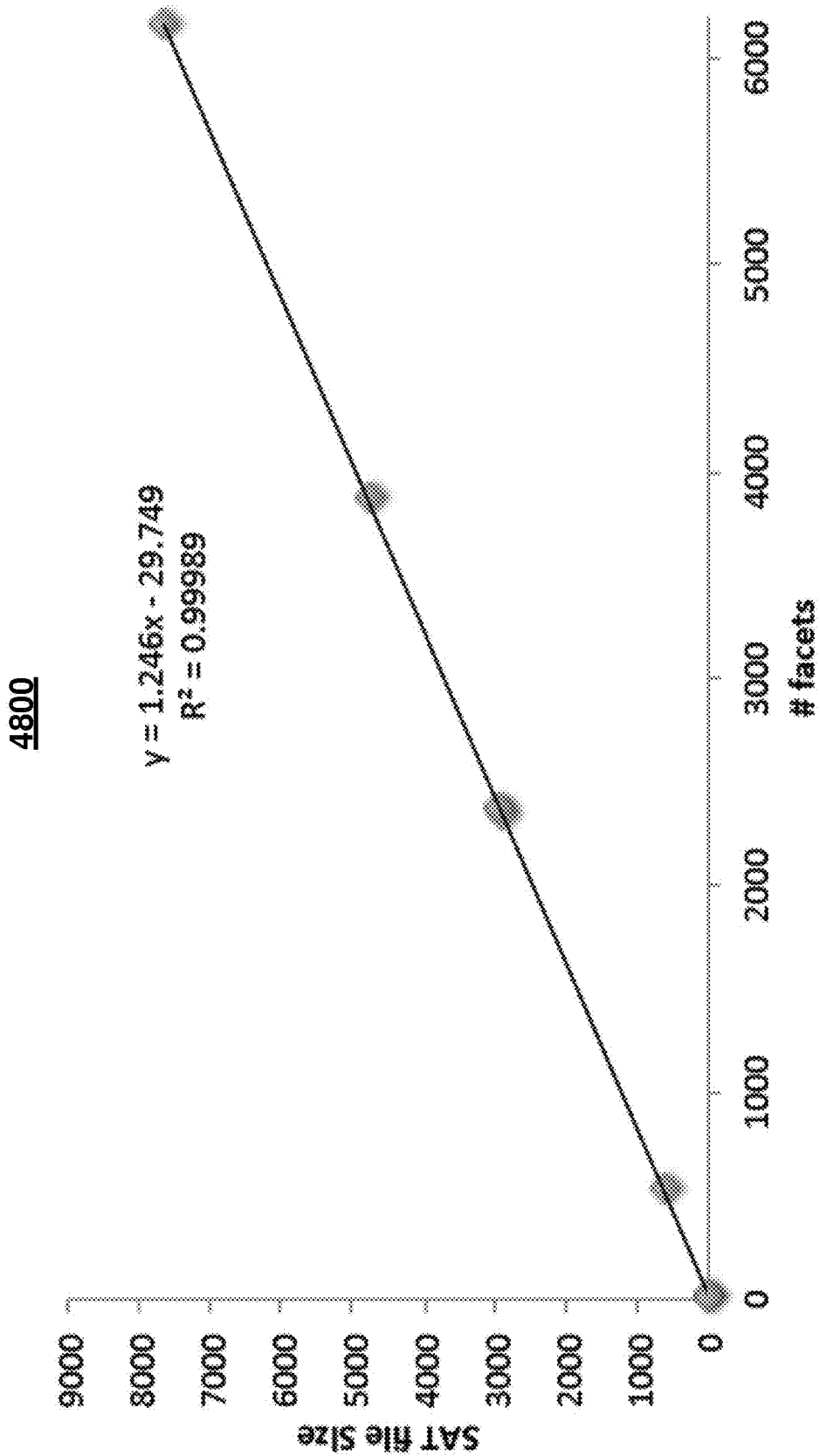
FIG. 48 provides a trend of this scaling with respect to the number of facets.

Although, the approach of recovering the topological information has several advantages as outlined before, it does have its limitations. One of the severe limitations crippling this method is the excessive size of the resulting SAT files. This is due to the fact that a number of excess entities like edges, coedges, vertices, faces etc need to be created to store the topological information in place of much fewer entities in the case of a native CAD representation. For example, if the STL file of a sphere consisting of N facets were to be reconstructed into a SAT file, it would now have N surface planar patches and several edges and vertices in place of just the one surface if it was represented in its native CAD format. Due to all of these excess entities, the SAT file size is several times larger than that for a native CAD file representing the same geometry, and this file size scales linearly with the number of faces. Table 3 below gives an estimate of the SAT file sizes generated for a few sample meshes. FIG. 48 provides a trend of this scaling with respect to the number of facets.

TABLE 3

SAT file sizes produced for a few sample STL meshes.

| # Facets | SAT File Size (KB) |
|---|---|
| 12 | 12 |
| 24 | 24 |
| 540 | 593 |
| 2376 | 2935 |
| 3872 | 4763 |
| 6162 | 7668 |

For the complex CAD model of the mold for an internally cooled turbine blade, it is imperative to have an STL mesh of upwards of 5.5 million facets. At such large facet counts, this approach may produces large file slices to work with. Hence, this approach may not be integrated into the LAMP data processing flow and instead more direct approaches to read and slice STL files have been investigated.

Owing to the huge SAT file sizes being generated using the previous approach, an algorithm for directly reading and slicing STL files without any intermediate conversions has been implemented. Since an STL file is a list of facets in random order, a major issue in efficiently slicing it is the lack of an ability to quickly identify those facets that lie in the intersection region from the rest of the facets in the file. Hence, a data structure of some kind needs to be implemented for this purpose.

FIG. 49a illustrates a method 4900a for identifying the intersecting facets at an arbitrary Z-height in accordance with various aspects as described herein. An example of a triangular mesh and slicing plane is provided, as referenced at 4901a. The slicing may be assumed to be along the z-direction without loss of generality. In order to identify the intersecting facets, first each facet's maximum and minimum z-coordinates are computed and stored in memory. For a given slicing plane, the facets whose minimum z-coordinate is lesser than the slice plane height are selected, as referenced at 4903a. Out of these selected facets, those whose maximum z-coordinate is greater than the slice plane height may be identified and retained while the rest are discarded. This way, only those facets that intersect with the given slicing plane may be isolated from the rest of the facets in the file, as referenced at 4905a.

In order to do this, a data structure consisting of linked lists is implemented. FIG. 24 shows a schematic of this data structure. It consists of a primary linked list sorted in the increasing order of z-values. Each node in this linked list consists of its specific z-value and a pointer to a secondary list that contains all facets with the same minimum z-coordinate value as the z-value of that node. Once all the facets in the given STL file are populated in this data structure, it is straightforward to implement the rest of the operations required to accomplish the steps of method 4900a.

For each slice, once the facets in the intersection region are identified, a simple parametric intersection is computed between the facets and the slice plane to yield the various edges of the intersection wire. If each of the edges of a facet are represented as a straight line in parametric form as shown in Equation 4 (where subscripts 'i' & 'j' denote two different vertices of a facet), the parameter value at the intersection between the edge and the slice plane at height 'Z' may be computed as shown in Equation 5.

$$\begin{bmatrix} x \\ y \\ z \end{bmatrix} = \begin{bmatrix} x \\ y \\ z \end{bmatrix}_i + t \left( \begin{bmatrix} x \\ y \\ z \end{bmatrix}_j - \begin{bmatrix} x \\ y \\ z \end{bmatrix}_i \right),$$ Equation (4).

$$t_Z = \frac{Z - z_i}{z_j - z_i},$$ Equation (5).

If the so computed parameter value '$t_z$' is between '0' and '1', the co-ordinates of the intersection point are computed as shown in Equation 6 and stored.

$$\begin{bmatrix} x \\ y \\ z \end{bmatrix}_{int\ Point} = \begin{bmatrix} x \\ y \\ z \end{bmatrix}_i + t_Z \left( \begin{bmatrix} x \\ y \\ z \end{bmatrix}_j - \begin{bmatrix} x \\ y \\ z \end{bmatrix}_i \right),$$ Equation (6).

Each facet yields two intersection points when it intersects with the slice plane. The other intersection point is also computed similarly and these two points together make an edge of the cross-section wire. Since the facets are listed in a random order, the wire edges are also computed in a random order. In conventional contour planning operations, these edges need to be sorted and the intersection loops need to be constructed. However, for the LAMP process, it is sufficient to generate a bitmap image of the slice. This may be directly accomplished by shooting rays for each row of pixels and computing intersection points. Then, using these points, the pixel values may be filled. In order to efficiently identify the edges that intersect with a particular ray a similar data structure like the one used for intersecting facets with a slice plane is used, except that these edges are now sorted based on their minimum y-coordinates rather than the z-coordinates. Once the edges are identified, the intersection points are computed parametrically in a similar manner as facet-plane intersections were computed. The images thus obtained may be saved in CCITT fax4 format and fed to the post-processing algorithms.

The pseudo-code for the algorithm implemented to accomplish the sequence of operations described in the previous section is shown in Algorithm 5.

---
Algorithm 5: Direct Slicing of STL files.
---
```
1: load STL file of given name
2: determine #facets in the file
3: i ← 0
4: zList ← NULL
5: for i < #facets do
6:     bufferFacet ← readFacet(i)
7:     update the max and min bounds of the part
8:     addFacet(bufferFacet, zList)
9: end for
10: using max and min bounds, compute image size and allocate memory
11: eList ← NULL
12: for each Z location along the build direction do
13:     facetsToSlice ← isolateFacets(zList, Z)
14:     crossSectionWireEdges ← slice(facetsToSlic, Z)
15:     addEdge(crossSectionWireEdges; eList)
16:     for each row of the image do
17:         Y ← ycoord value corresponding to the row
18:         intersectingEdges ← isolateEdges(eList, y)
19:         for each edge in intersectingEdges do
20:             create a horizontal ray at Y from the left edge of the bounding box
21:             compute intersection points between ray the edge
22:         end for
23:         compute integerBuffer from the intersection points
24:         compute characterBuffer from intBuffer
25:     end for
26:     use information in characterBuffer to write the slice image to disk
27: end for
```
---

To begin with, the STL file of a given name is loaded into the program. STL files may be of two types: ASCII and Binary. ASCII STL files contain all the facet information listed in plain text and may be opened in any standard text editor. Binary STL files store all the information in a binary format instead of plain text and hence may be much smaller in size. Since the typical STL meshes encountered in LAMP have very large facet counts (upwards of 5 million), the slicing algorithm has been implemented to specifically slice binary STL files.

Binary STL files begin with an 80 byte block of memory known as the header which contains any file specific information. Following the 80 byte block, there is a block of 4 bytes which contains the number of facets in an unsigned integer format. Following the first 84 bytes of memory in the file, each facet information is stored in blocks of 50 bytes. Every facet block of 50 bytes consists of 12 bytes to store the normal vector (4 each for the three direction cosines) and 36 bytes to store each of the three vertices. The rest of the 2 bytes of the 50 byte block for each facet is usually empty but may be used to store special attribute information like color in some applications.

Once the STL file is loaded into the program, the number of facets in the file is read from the 4 byte block of memory following the header and assigned to #facets. Starting from zero, for every i<#facets, the normal vector and vertex coordinate information of the corresponding facet is read using the function readFacet and stored in a temporary variable called bufferFacet. The pseudo code for the function readFacet is shown in Algorithm 6.

---
Algorithm 6: Reading a facet from binary STL file.
---
```
1: bufferFacet ← NULL
2: function readFacet(i)
3:     facetStartLocation 84 + 50 _ i
4:     bufferFacet:Nx ← readByte(facetStartLocation)
5:     bufferFacet:Ny ← readByte(facetStartLocation + 4)
6:     bufferFacet:Nz ← readByte(facetStartLocation + 8)
7:     for n := 0 to 2 do
8:         bufferFacet:V [i ]x ← readByte(facetStartLocation + 12 + 12 * n)
9:         bufferFacet:V [i ]y readByte(facetStartLocation + 12 + 12 * n + 4)
10:        bufferFacet:V [i ]z ← readByte(facetStartLocation + 12 + 12 * n + 8)
11:    end for
12:    return bufferFacet
13: end function
```
---

This function, in essence, may seek the file to the correct memory location corresponding to the $i^{th}$ facet and may read the corresponding bytes of information within each facet block of memory and may populate the temporary variable bufferFacet. Each facet i begins at the $(84+50*i)^{th}$ byte from the beginning of the file as there are eighty (80) bytes for the header, four (4) bytes for #facets and fifty (50) bytes for each of the i−1 facets before the $i^{th}$ facet. Once the facet starting location is identified and assigned to face tStartLocation, the rest of the operations may read the corresponding bytes of information using the function readByte and the x, y, z coordinates of the normal vector and each of the vertices are populated.

Figure 49B:
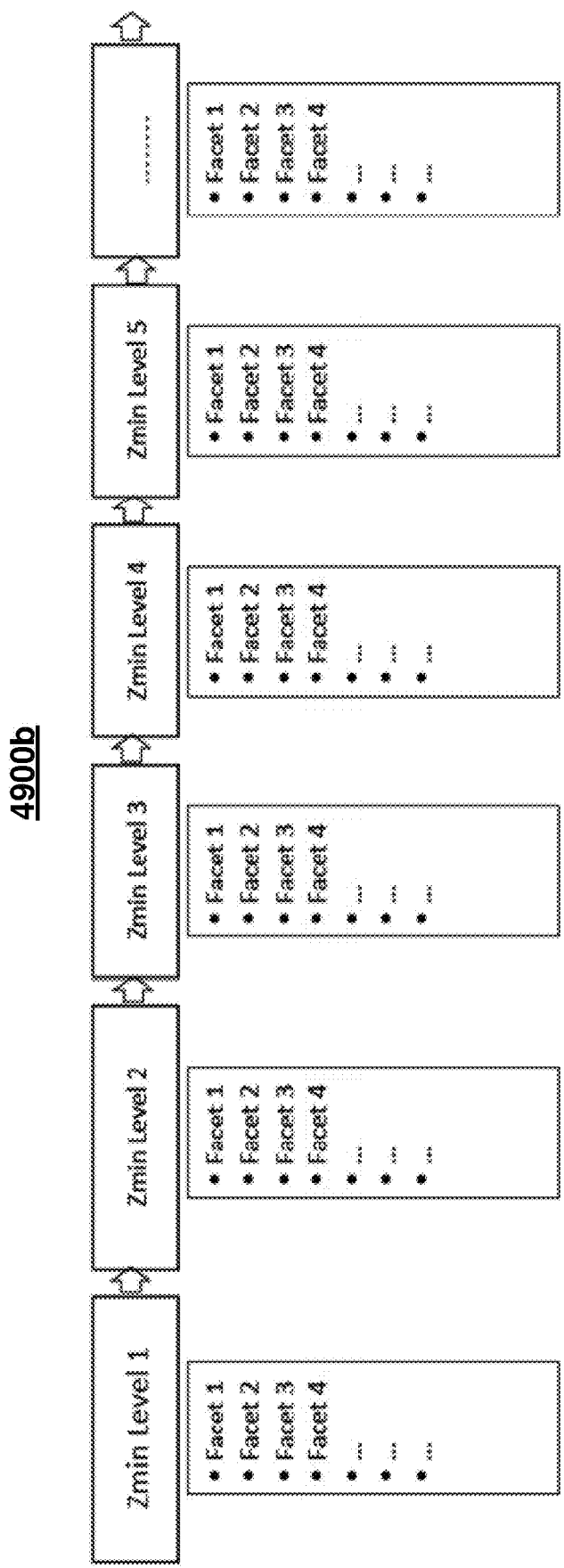
FIG. 49b illustrates a data structure used for direct slicing of STL files in accordance with various aspects as described herein.

In this manner, having read a facet from the file, the next step in Algorithm 5 may be to update the min and max bounds of the part and to populate the facet in the data structure shown in FIG. 49b. FIG. 49b illustrates a data structure used for direct slicing of STL files in accordance with various aspects as described herein. This is accomplished by passing each facet that is read from the file to the function addFacet.

The pseudo code for this function is shown in Algorithm 7.

---
Algorithm 7: Populating a facet in the Data Structure.
---
```
1: function addFacet(facet , zList)
2:     traverse through zList
3:     look for matching zList node corresponding to facet.minZ
4:     if found then
5:         add facet to the list pointed by the matching zList node
6:     else
7:         create a new node toAdd
8:         toAdd:Z ← facet:minZ
9:         toAdd:facetList ← facet
10:        add toAdd to the zList in the proper sorted location
11:    end if
12: end function
```
---

The given facet's minimum Z-coordinate value is identified and the zList is traversed to find a node whose Z value matches the minimum Z-coordinate of the facet. If such a node is found, the given facet is added to the list pointed by the node. In the event that such a node is not found, a new node variable denoted by toad is created with its Z value equal to the facet's minimum Z-coordinate and with its facet list pointing to the give facet. This new node is then added to the zList in the appropriate location so it stays sorted in the increasing order with respect to the Z values of the nodes.

With the aid of these two functions readFacet and add-Facet, by the end of the first loop in Algorithm 5, the min and max bounds of the part would be determined and the data structure of facets discussed in FIG. 49b would be populated. The next loop then makes use of the data structure thus populated in order to slice the model and output the images. For a give Z location of the slice plane, first the facets falling in the intersection zone of the plane are identified using the function isolateFacets and stored in the list facetsToSlice. The pseudo code for isolating the facets is shown in Algorithm 8.

Algorithm 8: Isolating facets in the intersection zone.

```
1: function isolateFacets(zList , Z)
2:      facetsToSlice ← NULL
3:      for each node in zList do
4:          if z value of the node is less than Z then
5:              traverse through each facet in the facet list pointed
                by the node
6:              look for facets whose maxZ > Z
7:              if such a facet found then
8:                  add facet to facetsToSlice
9:              end if
10:         else
11:             break
12:         end if
13:     end for
14: end function
```

As may be seen from the pseudo code, in order to isolate the required facets to intersect, first each node in zList is read. If the Z value corresponding to the node is less than the Z height of the slice plane, each of the facets in the facet list pointed by the node is parsed. If a facet with maximum Z value of greater than the slice plane height is found, it is added to facetsToSlice list. After each of the nodes whose Z values are less than the slice plane height have been parsed in this manner, the isolateFacets function returns back the facets collected in facetsToSlice. Having isolated the facets in the intersection zone of the slice plane, Algorithm 5 then computes the intersection of these facets with the slice plane using the function slice. These intersections are computed parametrically as described in the previous section. Having computed the intersection edges, which form the contour of the part cross-section, the next step is to generate an image from them. In order to accomplish this, rays are created for each row of the image and their intersection with the contour edges are computed. In order to compute these intersections efficiently, the edges are in turn populated in a data structure very similar to the one used for populating the facets. The edges are arranged into bins based on their minimum Y-coordinate instead of the Z-coordinate in case of the facets. This data structure for sorting edges is denoted by eList is Algorithm 5. The function addEdge is used to populate the edges in this data structure and its implementation is very similar to addFacet function previously described. After eList is populated, the process of computing intersections between the rays and the edges is the same as the one used for computing intersections between the slice plane and facets. For each ray, the intersecting edges are isolated using isolateEdges whose implementation is similar to isolateFacets. Once the intersecting edges are identified, the intersection points are computed parametrically. After the intersection points are computed, the process of creating bitmap data is performed. First, a temporary intergerBuffer array is populated and later converted to ASCII character array charBuffer which is then used to save the bitmap image.

A rough estimate of the time complexity and the time it takes to finish the slicing operations is given in this section. If N denotes the number of facets in an STL mesh, in order to populate the slicing data structure discussed in the previous sections, the following operations need to be completed for every facet read: 1) Scan through the each node in zList to identify a matching node and 2) Scan through to the end of the facet list pointed by the matching node to add the facet. Each of these two operations take, in the worst case scenario, N time steps. Since these two operations need to be performed for every facet in the file, the time complexity for populating the data structure is O(N3).

Figure 49C:
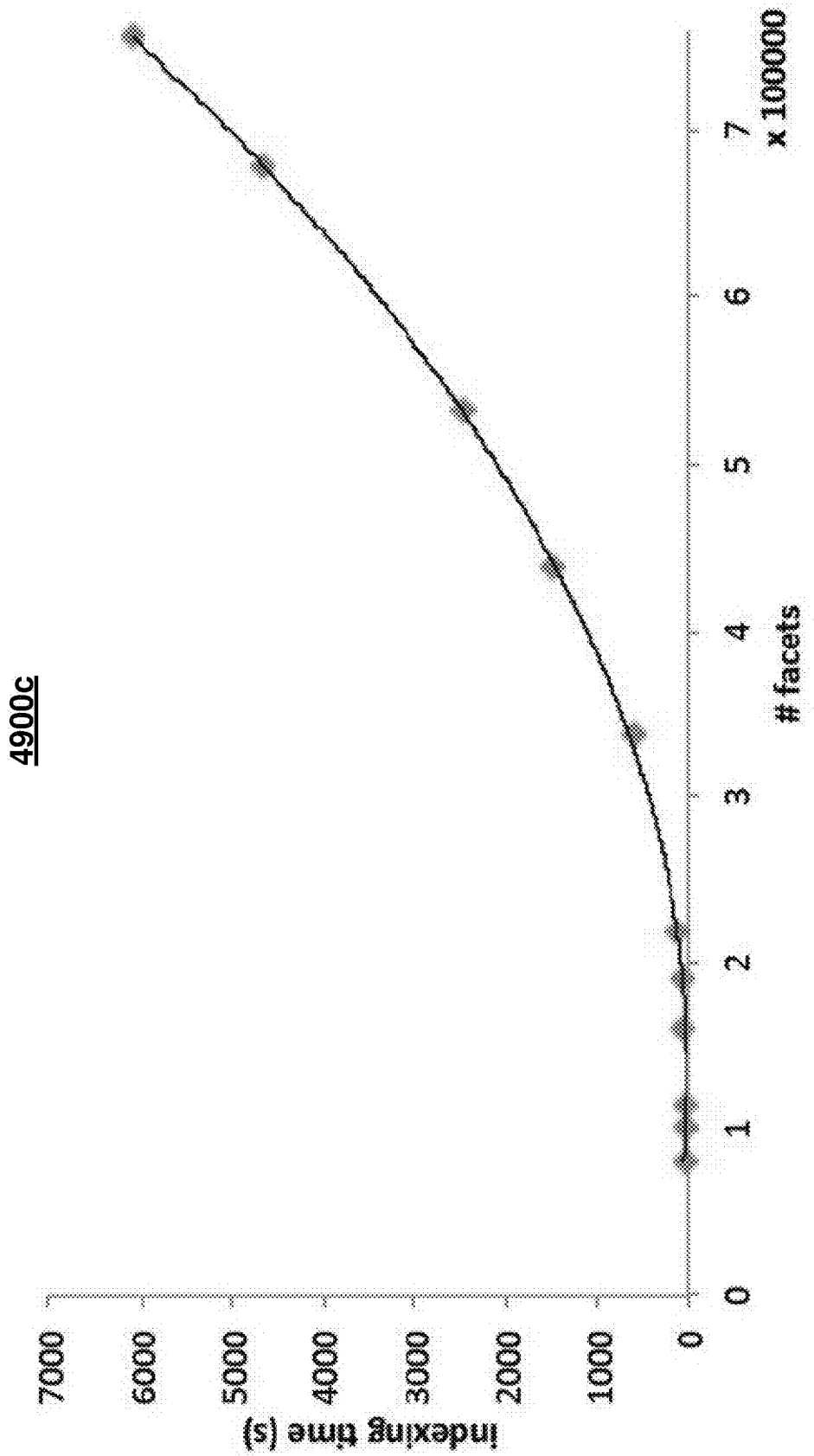
FIG. 49c illustrates computational time scaling with respect to a number of facets.

Polynomial time complexities like N3 are usually acceptable but if the N in consideration is large, the computational time becomes excessively long. A rough estimate of the computational time for slicing STL files of various mesh sizes using this algorithm is shown in Table 4. FIG. 49c illustrates computational time scaling with respect to a number of facets.

TABLE 4

Slicing time for various mesh sizes.

| Indexing Time (sec.) | Indexing Time (sec.) |
| --- | --- |
| 81080 | 11.475 |
| 102268 | 17.902 |
| 114818 | 22.356 |
| 160296 | 44.893 |
| 191172 | 68.579 |
| 219584 | 109.218 |
| 337128 | 613.151 |

As may be seen, for a file with large number of facets, the slicing time runs into several days. In the case of LAMP, because of the geometric complexity of integrally cored HP turbine blade molds, the mesh sizes of the STL files go upwards of 5.5M. For such a huge file, it takes more than 4 days to slice which is prohibitively large. Hence a new STL slicing algorithm is implemented to cut down the slicing time. Details of this algorithm and the new data structure implemented are given in the next section.

Since, for large STL meshes, it takes excessively long to populate the data structure described in the previous section, a new approach is investigated in order to cut down the slicing time. Upon close examination, it is evident that the key pieces of information in order to create the slice images, are the points of intersection of the rays with the cross-section wire edges. So instead of spending significant compute time in populating the facets in the previously described data structure, it suffices to compute and store these intersection points as each facet is read from the file. Additionally, if these facets are stored in an array structure rather than in linked lists as was previously done, data access may be much quicker as arrays have O(1) complexity for indexing and searching while linked lists which have O(N) complexity for the same (i.e, random access vs sequential access). FIG. 50 illustrates a data structure 5000 used to store these intersection points in accordance with various aspects as described herein.

Each row in the data structure represents a Z height corresponding to each slice i in the part. Each column represents a Y level corresponding to a row j of the slice image. Each location (i; j) in the data structure contains all the intersection points corresponding to the jth row of the ith slice image.

As each facet is read from the file, depending on its maximum and minimum Z extents, it is possible to determine all the slice numbers that this particular facet will contribute edges to. For each of these edges corresponding to each of these slice numbers, it is also possible to determine all the rows of the respective slice images they contribute intersection points to. Based on this information, as every facet is read, all the intersection points contributed by this facet to each of the slices are computed and stored in the corresponding locations in the data structure shown in FIG. 50. Once the intersection points contributed by all the facets in the file are computed and stored, slice images may be prepared by using a similar procedure as discussed in the previous sections.

The pseudo code for implementing this new algorithm for slicing STL files is shown in Algorithm 9. The bounding box coordinates of the part are first created, either by doing a linear scan of the whole part or by directly inputting the information in the program from the CAD model. The minimum and maximum vertices of the bounding box are denoted by (minx, min Y, minZ) and (maxX, maxY, maxZ) respectively. Next, memory for the 2D array data structure denoted by zY Matrix is allocated and initiated to NULL. As each facet f is read from the file, the range of slices that this facet f contributes edges to is computed. minLayer and maxLayer denote the layer numbers of the lowermost and uppermost slices in this range. For each slice i starting from minLayer to maxLayer, the facet is sliced at the corresponding slice height and the resulting edge is stored in a variable denoted by e. For each edge e, the range of image rows to which this edge contributes an intersection point are computed. The lowermost and uppermost rows of this range are denoted by minRow and maxRow respectively. For each row j between minRow and maxRow, the intersection point of the edge e and the ray corresponding to the row j is computed and stored in a variable denoted by intPoint. These intersections of the facet with the slice plane and the edge with the ray are computed parametrically as described in the previous section. The intPoint thus computed is populated in the $(i, j)^{th}$ cell of the 2D array zYMatrix. Once this zYMatrix is completely populated after one linear scan of all the facets in the list, the slice images may be created. For each slice image i, in order to compute the pixel information for each row j, the variables integerBuffer and characterBuffer are populated based on the intersection points retrieved from $(i, j)^{th}$ cell of zYMatrix. Once the characterBuffer array is completely filled for all rows of the slice, it may be used to write the slice image to disk.

---

Algorithm 9 Improved direct slicing of STL files.

---

1: compute bounding box of the part
2: (minX; minY; minZ) ← minimum extents of the part
3: (maxX; maxY; maxZ) ← maximum extents of the part
4: zYMatrix ← NULL
5: for each facet f in the file do
6:   bufferFacet ← readFacet(f)
7:   $minLayer \leftarrow floor\left(\frac{bufferFacet \cdot minZ - minZ}{LayerThickness}\right) + 1$
8:   $maxLayer \leftarrow floor\left(\frac{bufferFacet \cdot maxZ - maxZ}{LayerThickness}\right)$

---

Algorithm 9 Improved direct slicing of STL files.

---

9: for each slice i; i := minLayer to maxLayer do
10:   e ← sliceFacet(bufferFacet, i)
11:   $minRow \leftarrow floor\left(\frac{maxY - e \cdot maxY}{pixelSize}\right) + 1$
12:   $maxRow \leftarrow floor\left(\frac{maxY - e \cdot minY}{pixelSize}\right)$
13:   for j := minRow to maxRow do
14:     intPoint intersectEdge(e; j)
15:     zYMatrix[i ][j ] intPoint
16:   end for
17:   end for
18: end for
19: for each slice i; i := 0 to #Layers do
20:   for each row j; j := 0 to imageHeight do
21:     intPoints ← zYMatrix[i ][j ]
22:     compute integerBuffer using intPoints
23:     compute characterBuffer using integerBuffer
24:   end for
25:   use information in characterBuffer to write the slice image to disk
26: end for

---

A rough estimate of the time complexity and the computational time taken to slice STL files using this algorithm is given here. In order to index all the intersection points in the 2D matrix, it would take N*Z*Y*C operations, where N denotes the number of facets in the file, Z denotes the slice range (maxLayer−minLayer), Y denotes the row range (maxRow−minRow), and C denotes some independent constant. In the worst case scenario, Z and Y may both be equal to N and the time complexity reduces to $O(N^3)$ just like the linked list STL slicing algorithm discussed in the previous section. However, in typical scenarios, both Z and Y are much smaller than N. The constant C is also very small since an array structure is used instead of a linked list. Hence, in most typical scenarios, the algorithm behaves like it is O(N) complexity with a very small constant value and hence is much faster than the linked list algorithm discussed in the previous section. An estimate of indexing times using this 2D Matrix approach to slice typical STL files with various facet counts and the corresponding times for the linked list algorithm discussed in the previous section are shown in Table 5.

TABLE 5

Slicing time for various mesh sizes.

| # Facets | Indexing Time for Linked Lists(s) | Indexing Time for 2D Matrix |
|---|---|---|
| 81080 | 11.475 | 14.147 |
| 102268 | 17.902 | 14.197 |
| 114818 | 22.356 | 14.550 |
| 160296 | 44.893 | 15.466 |
| 191172 | 68.579 | 16.157 |
| 219584 | 109.218 | 16.895 |
| 337128 | 613.151 | 18.690 |
| 438434 | 1464.206 | 19.715 |
| 531370 | 2476.122 | 21.754 |
| 678358 | 4656.452 | 24.045 |
| 756446 | 6075.474 | 24.921 |

Figure 51:
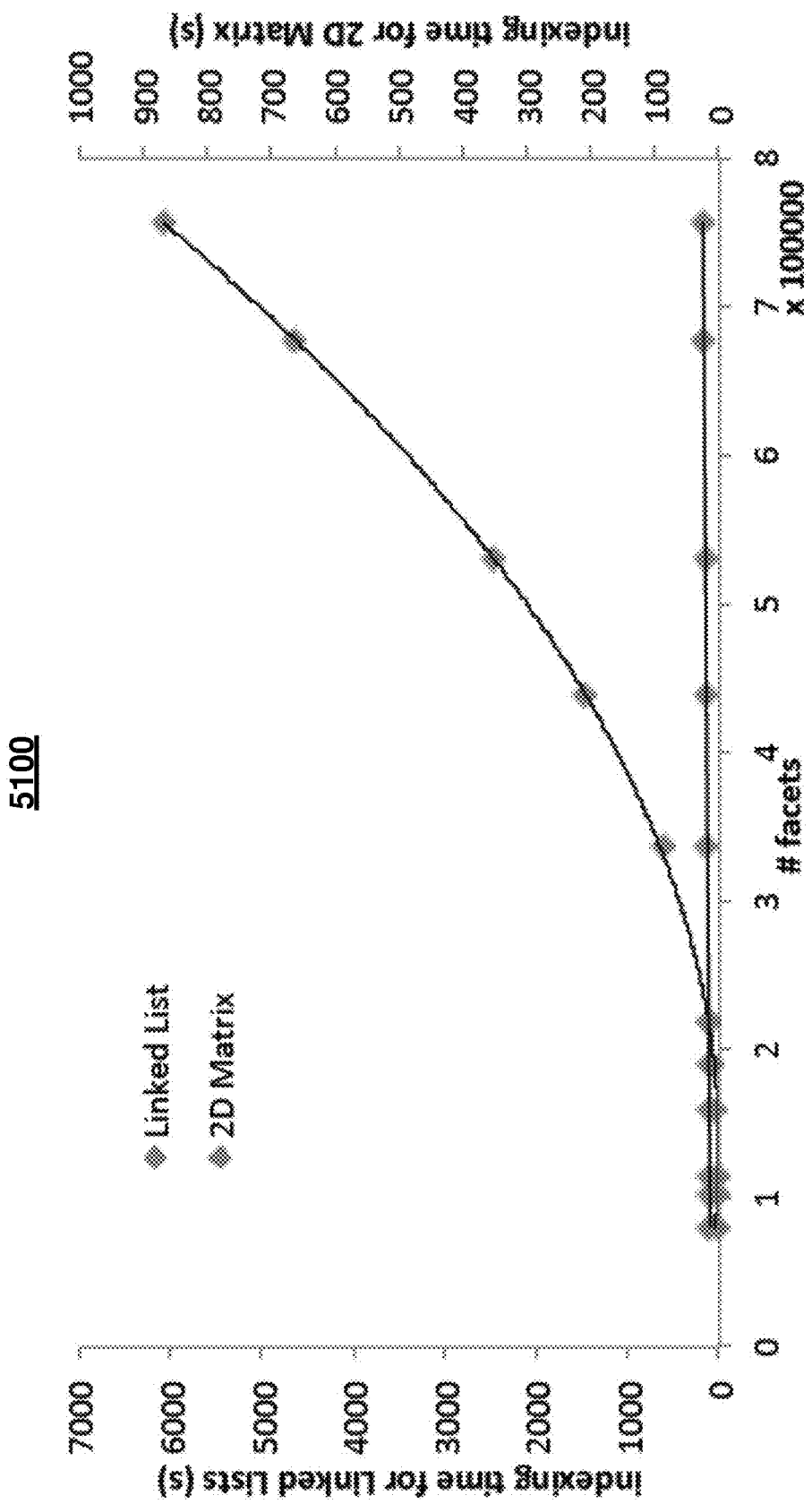
FIG. 51 illustrates slicing time scaling with respect to mesh size.

FIG. 51 illustrates slicing time scaling with respect to mesh size.

As may be seen, the savings in slicing time are substantial using this approach. It takes just 30 minutes to slice a 5.5M facet STL file versus the 4 days it to slice the same file using the linked list approach. This leads to enormous time savings in preparing build ready images for each new part design.

Although, this new approach reduces the computational time, it does have its limitations. Firstly, since the facets are just read once and discarded from memory, once the slice thickness and image resolution are set, it is impossible to change them dynamically during the execution as the facet information cannot be retrieved. In the linked list approach, since all the facets are indexed in the data structure, there is always flexibility to change the layer height and image resolution dynamically for applications like adaptive slicing. However, this shortcoming may be alleviated in other ways. Since the slicing time itself is very short, multiple stacks of slice images may be created at multiple layer thicknesses and the proper images from each of these stacks may be selected for utilizing variable layer thicknesses in applications like adaptive slicing.

Secondly, this new approach uses far more memory than the linked list approach since it stores all the intersection points of all the rays with each of the slices in the part whereas in the linked list approach, just the facets are stored in memory. As an example, for the 5.5M triangle part, the new approach takes about 2.5 gigabytes of memory versus just 300 megabytes of memory using the linked list approach. Since memory is very cheap in recent times, this limitation is not a significant hurdle. Hence, considering the pros and cons of each of the approaches of STL slicing discussed in this section, the approach in this section is the preferred method to slice extremely high resolution STL files for LAMP.

The slice images produced through STL slicing and Direct CAD Slicing in particular require further post-processing before they are ready for use in a LAMP build. The details of these various post-processing operations and algorithms are given in this section.

One of the mandatory post-processing operations that needs to be performed on the slice images is checking for errors and validity of the images. These errors are caused by gaps that creep into the model either due to errors in the CAD model or due to translation between different CAD formats. During the slicing operation, in the process of creating the slice images, rays are created for each row of the image to identify the correct pixel color values as previously described. Any ray that coincides with one of these gaps that creep into the CAD model will result in the omission of an intersection point that should have been computed in an error-free file. This omission will result in the pixel color value not toggling at the corresponding location and this will in turn manifest as a stray line in the slice image. FIG. 52 illustrates a particularly bad instance of stray line errors. Such stray lines need to detected and corrected before the images may be used for part builds on the LAMP machine. For this purpose, an error checking and correction algorithm has been implemented. The algorithm takes an erroneous slice like the one shown in (a) of FIG. 52 referenced at 5200*a* and outputs a corrected slice shown in (b) of FIG. 52 referenced at 5200*b*.

In order to identify these stray lines, the algorithm scans through each row of the image and checks for pixels that are sandwiched by pixels of an opposite color, i.e, pixels that have a different color value than the ones present on the rows immediately above and below the current row that is being searched. Once it finds such pixels, it flips their values to match the color values of the top and bottom rows to correct the stray lines. This approach works for correcting only stray lines that are 1-pixel thick but may be extended to detect lines that multiple pixels wide. The details of the extended algorithm along with the pseudo code for detecting stray lines that are multiple pixels wide is given next.

The pseudo code for the error correction operation is shown in Algorithm 10. The given stack of slice images that need to checked are first loaded into the program. As each image in read from the stack, its pixel data is first converted from ASCII representation to integer representation for easy data manipulation and stored in an integer array integerBuffer. If an intersection point was missed in the slicing operation and a stray line caused, then the last pixel of the row containing the stray line will have a white pixel on a surrounding black backdrop. This fact is exploited in identifying erroneous rows that need to be corrected. This is accomplished by checking for pixels with a color value of 1 (i.e, white) in the last column of pixels in integerBuffer. If such a white colored pixel is identified, it means that the corresponding row needs to be corrected for a stray line. Having identified the row at which a stray line occurs, the next step is to determine the width this stray line. So, having identified the row at which a stray line originates, the color values of end pixels in the rows immediately following the identified row are checked. If consecutive rows are found to have white pixel values, then the width of the stray line is more than one. The number of consecutive rows are counted and the stored in the variable width. Having identified the beginning row number and the width of a stray line, this information is then passed to the function correctRow.

---

Algorithm 10 Error Checking Algorithm.

```
 1: load the stack of images to correct
 2: for each image in the stack do
 3:      characterBuffer ← pixel data of the image
 4:      integerBuffer ← convert ASCII data in characterBuffer
to integer data
 5:      for each row j of the image do
 6:           width ← 0
 7:           if the last pixel of row j in integerBuffer = 1
(i.e. white) then
 8:                width ← width + 1
 9:                j ← j + 1
10:                while last pixel of row j in integerBuffer = 1
do
11:                     width ← width + 1
12:                     j ← j + 1
13:                end while
14:                correctedIntegerBuffer ←
correctRow(integerBuffer, j − width, width)
15:           end if
16:      end for
17:      correctedCharacterBuffer ← convert correctedIntegerBuffer
to ASCII data
18:      output the corrected image to disk using
correctedCharacterBuffer
19: end for
```

---

The pseudo code for the function correctRow is shown in Algorithm 11. It is just an extended version of the logic described previously for correcting one pixel wide stray lines. Three counters i, j and k are used in the algorithm. Counter k keeps track of the row number in the image corresponding to each row in a multi-pixel wide stray line that is being corrected. Counter i keeps track of the number of rows above a particular row in the stray line that needs to be checked for color information. Similarly, counter j keeps track of the number of rows below a particular row in the stray line that needs to be checked for color information. For each pixel in each row of the stray line, the color of the corresponding pixel in the row that is i rows above and j rows below is checked. If it is the same but different from the color of the current pixel in the row that is being corrected, the pixel value is flipped.

---

Algorithm 11 row correction function.

```
1: function correctRow(integerBuffer, row, width)
2:      for i := 1 to width do
3:          j = width − i + 1
4:          k = row + i − 1
5:          for each pixel in row k do
6:              if color i rows up = color j rows down ≠ color on current row then
7:                  flip the current pixel color
8:              end if
9:          end for
10:     end for
11: end function
```

---

For example, lets assume the beginning row number of a stray line is thirty (i.e, row=30). Lets also assume that the width of the stray line is three (i.e, width=3). Hence in this example, if we were correcting the first row in the stray line (first iteration of the loop), the color values of the pixels one row above three rows below should be checked for equality and if they are equal but different from the color value of pixels in the first row that is being corrected, then the pixel color value needs to be flipped. The counter values are correspondingly set, i.e, for the first iteration (correcting first row in the stray line), k=30 (beginning row number of the stray line), i=1 (one row above) and j=3 (three rows below). Similarly for correcting the second row in the stray line (k=31), the pixel values two rows (i=2) above and two rows below (j=2) need to be checked for color information and so on.

All of these error checking operations are based on the assumption that the collective width of these consecutive stray lines is much less than the minimum feature size in the CAD part that is to be sliced. For the blade designs that are currently being built by LAMP have minimum features sizes of about 500 microns, i.e, approximately 30 pixels in size at 1500 dpi. The widest stray lines observed in the slices were five pixels wide which is much less than the minimum feature size of 30 pixels and hence may be corrected with reasonable accuracy.

Figure 53:
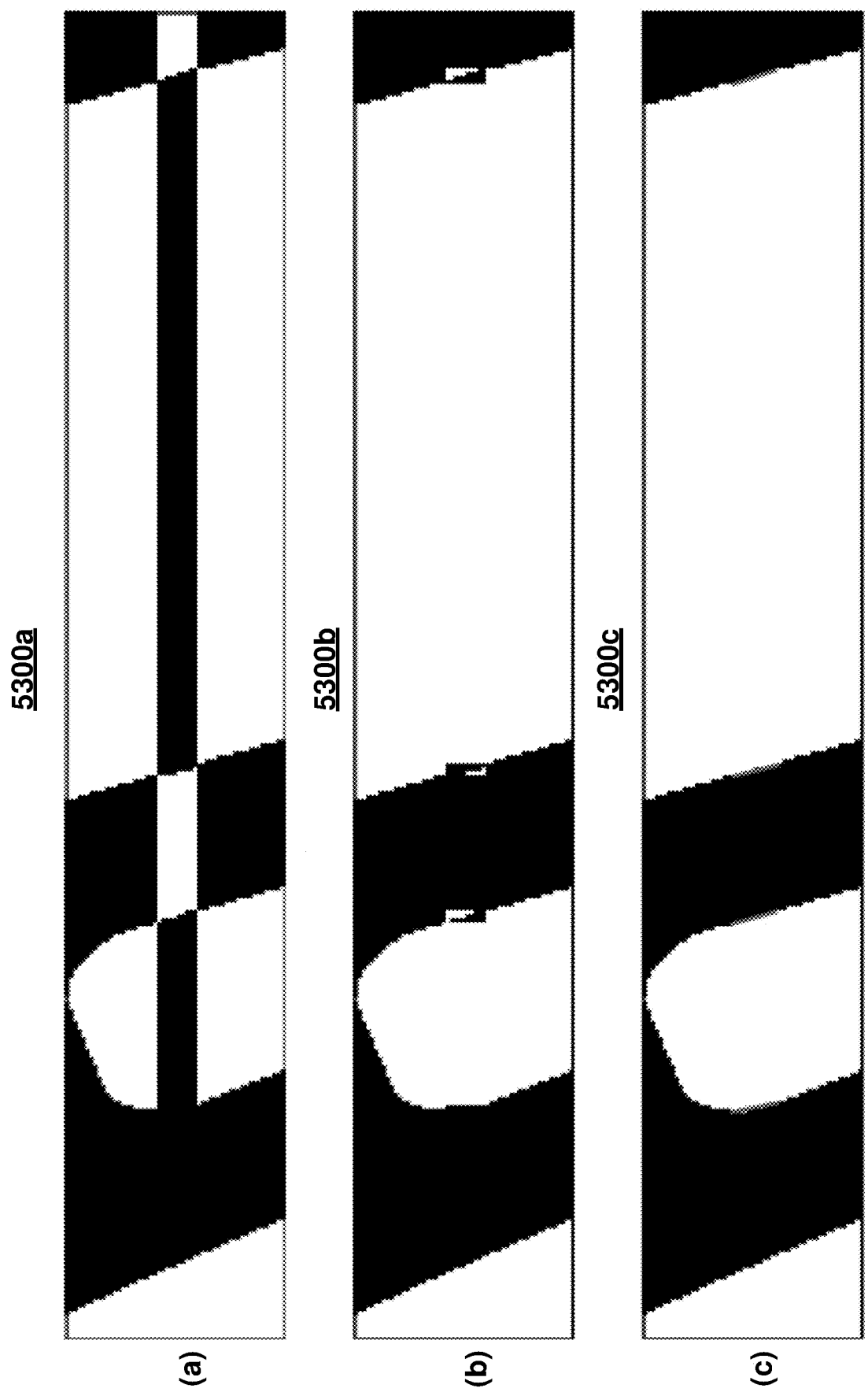
FIG. 53 illustrates a method of rectifying multi-pixel wide rows with stray lines in accordance with various aspects as described herein.

The other limitation of this algorithm is that, when the stray lines are too wide, the corrected rows do not conform to the boundaries of the part where the color toggles from black to white or vice versa. The edges of the part in the corrected rows become vertical instead of smoothly connecting with the rest of the contour. FIG. 53 illustrates a method 5300 of rectifying multi-pixel wide rows with stray lines in accordance with various aspects as described herein. This phenomenon is shown in (b) of FIG. 53 referenced at 5300b for a sample stray line shown in (a) of FIG. 53 referenced at 5300a. When the stray lines are thin (less than 5 pixels wide) the inaccuracy caused is negligible but as they get wider, it needs to be corrected for. This problem may be fixed by constructing a spline (a Hermite cubic spline with C1 continuity for example) to close the contour in a continuous way and the color toggling points in each of the rows in the stray line may be computed from the so constructed spline. This way smoothness of the edge contours may be maintained as shown in (c) of FIG. 53 referenced at 5300c while correcting stray lines that are arbitrarily wide. Although, it may correct a stray line of any arbitrary width, if the stray line is too wide (width of the stray line approaching minimum feature size in the part) then rather than passively correcting it in the image, the geometry of the original CAD part needs to be repaired for accurate slices.

In this way, the function correctRow may correct stray lines given the starting row number of the stray line in the slice image and its width. Returning back to Algorithm 10, once all the stray lines identified in the integer data of the slice image (integerBuffer) are corrected, it is then converted back to ASCII data and saved back to disk. In this way, all the slice images in the stack are checked and corrected for errors and by the end, a stack of error free images are obtained which are taken through other post processing operations as described in the following sections.

The corrected images as obtained above then need to be tiled properly on an image template for proper part placement in the build area. FIG. 54 illustrates illustrate a method 5400 of tiling in accordance with various aspects as described herein. In (a) of FIG. 54 reference at 5400a shows a typical input image to the tiling code. A mesh structure as shown in (b) of FIG. 54 reference at 5400b is used as the background on which this input slice is tiled. The mesh structure has been optimized after considerable experimentation to prevent the uncured Suspension in the empty regions from sloshing around in the build tank during recoating of a fresh layer of Suspension by the blade. The algorithm automatically computes the maximum extents of the slice image, determines the number of parts that may be built within the build area, lays them out at the correct coordinates and creates break lines along the mesh structure for easy removal of parts after the build is complete. The final build-ready images produced by the code look like the one shown in (c) of FIG. 54 reference at 5400c. The code runs through the entire stack of the slice images to produce a build-ready stack that is then fed to the LAMP machine.

Depending on the level of complexity of the CAD model, slicing and processing the stack of build images may take a substantial amount of time. For turbine mold geometry, it currently takes two days to prepare the data. Sometimes, during evaluation of various CAD designs, there arises a need to build several designs with minor differences in the features. In such cases, it would be beneficial to implement algorithms that may take a base design and implement the minor feature additions and modifications directly at the image level to generate the build images for each of the intended CAD configurations. This would save enormous amounts of time and effort as it avoids re-slicing the entire CAD model. Such algorithms are currently under development on need-by-need basis.

A detailed overview of the various data processing algorithms developed for enabling the basic functionality of the LAMP process was given in this chapter. The algorithms presented belong to two categories: slicing and post-processing. A brief summary of the work presented in this chapter is given in this section.

Owing to the geometric complexity of the parts encountered in the LAMP process, a direct slicing approach using the ACIS kernel was implemented to slice the native CAD geometry instead of the conventional STL slicing approach ubiquitously used in the additive manufacturing industry. Prior direct slicing approaches presented in the literature tout direct slicing to be the cure for all ills posed by STL files. Direct slicing is claimed to be error free and fast while STL slicing is claimed to be prone with errors and time consuming. It was shown in this chapter that this claim is only true while working with simple geometries as is the case with much of the previously reported work. When the geometries are complex, direct slicing approach produces more errors and consumes more time than STL file slicing. The direct slicing algorithm presented in this chapter is tolerant to such errors.

Although direct slicing approach is the preferred method to produce slice data for the LAMP process, STL file slicing algorithms were also implemented owing to the prevalence of this file format. Multiple approaches to slice files of this format were implemented. The STL slicing approach using POVRAY, a graphics rendering engine, was easy to implement but not accurate enough for the purposes of LAMP. An approach to reconstruct topology information from an STL mesh using an extended version of the corner table data structure was implemented. However, for complex parts like the ones built in LAMP, the SAT files sizes resulting from this method proved to be too large to handle. Therefore, a more direct approach of reading the facet data and sorting it into data structures similar to the ones reported in literature was implemented. While these data structures yielded reasonably quick slicing times for small parts, for high facet counts of the order of 5.5M that is typically required for the LAMP process, they take too long to process (4 or more days). Thus a much faster approach which bypasses the facet data sorting operation is implemented and found to reduce the processing time by several orders of magnitude (from 4 or more days to about an hour).

Following the slicing operations, the output data needs to further processed before it is ready for LAMP builds. For this purpose, several post processing like error checking, part placement and tiling, image level geometry modification etc. were implemented and the details of these were presented. In summary, the work presented in this chapter establishes the basic data processing flow required to produce successful builds using the LAMP process.

A new volume deviation based adaptive slicing method for BRep models is developed in this thesis. BRep stands for Boundary Representation, a kind of data structure widely used for storing CAD model data. The ACIS modeling kernel used for implementing the direct slicing algorithm uses the BRep format and so do many commercially available CAD softwares packages like Solidworks, Pro/Engineer, CATIA, Unigraphicx etc. The motivation for this approach and the details of the algorithm are presented in this section.

Although several adaptive slicing approaches have been presented in the literature as discussed in the previous section, there are some limitations especially in the case of adaptively slicing BRep models. The mostly widely used approach of maximum cusp height criteria for adaptive slicing works well for STL files due to the simplicity of facet data. However, it becomes extremely complicated and computationally intensive when implemented for slicing direct CAD models. For calculating the cusp height for each layer, a complex optimization scheme is implemented which involves calculating the vertical normal curvature at each point in the slice contour (which in itself needs several complicated calculations of local tangent and normal vectors) and these computations take a long time. Moreover, the approach only works for parametric surface patches like B-spline and NURBS and are hence not readily extensible to generic BRep CAD models which are defined by a mixture of parametric splines and analytic curves.

Figure 55:
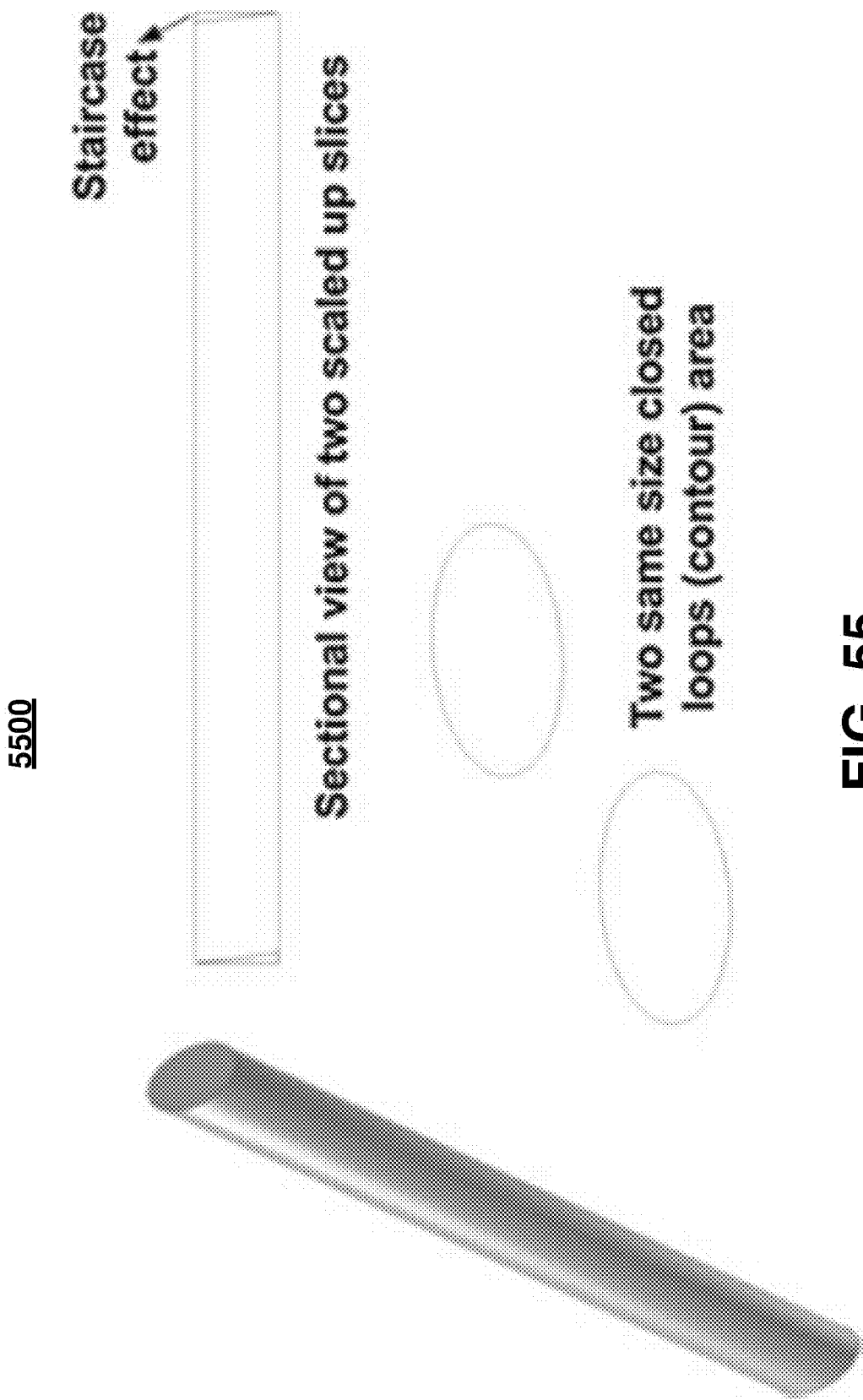
FIG. 55 illustrates the staircase effect while two created contours are same size in inner area.

Another approach presented in the literature for adaptively slicing CAD models uses an area deviation approach. This approach, while being much more simple than the cusp height approach for CAD models, is fraught with difficulties as it does not consider the local surface geometry of the part. It leads to situations where the actual geometric deviation of the additive manufactured part with respect to the original CAD geometry is not properly estimated as shown by the example in FIG. 55. FIG. 55 illustrates the staircase effect while two created contours are same size in inner area. As shown in FIG. 55, if the CAD geometry were an inclined cylinder, there would still be a staircase effect in the layered part while having slice contours of exactly the same area. In such a situation, the area deviation approach would fail to identify the geometry deviation due to staircase effect and hence layer height adaptation will not be achieved.

The other major approach presented in the literature for adaptively slicing CAD models uses a maximum bound on the surface roughness parameter Ra. This approach is also simple to implement as a closed form expression relating the layer thickness to the surface roughness Ra for determining the next layer height to be used. However, a substantial amount of empirical and statistical modeling for identifying the cured layer shape and its relation to the surface roughness parameter Ra for a given additive manufacturing technique needs to be performed.

In order to overcome these limitations and to accomplish the ultimate objective of adaptively slicing a generic BRep model with a reasonable simplicity, the volume deviation-based adaptive slicing technique has been developed and implemented.

Figure 56:
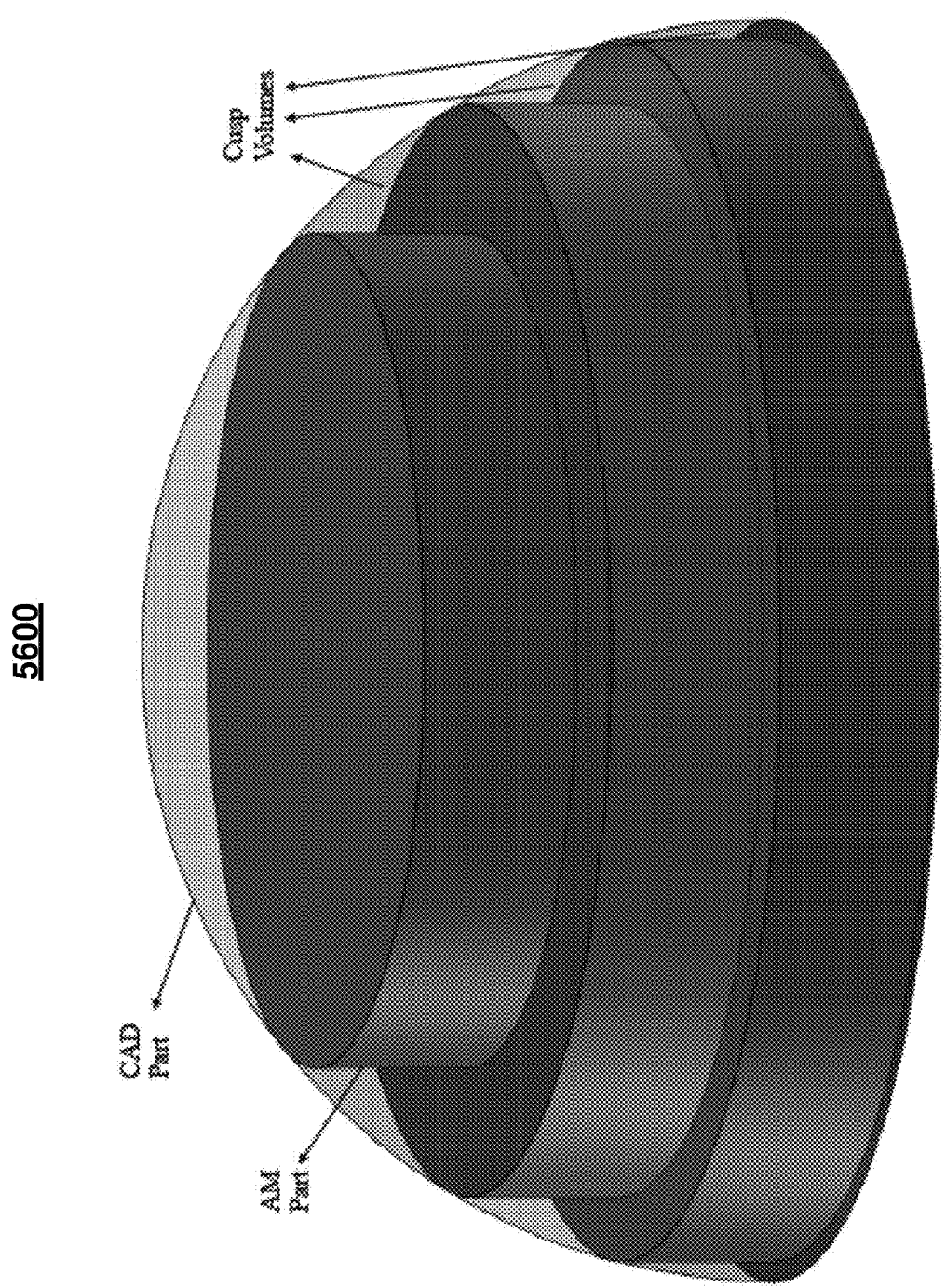
FIG. 56 illustrates a cusp volume for a hemispherical part.

In the volume deviation-based approach developed in this thesis, the entire volume of the cusp is calculated in order to use as a measure for estimating the geometric deviation of the layered part. The concept of cusp volume is illustrated in FIG. 56, where the geometric deviation between a hemispherical part and the corresponding additive manufactured part is highlighted. FIG. 56 illustrates a cusp volume for a hemispherical part. As is clear from the illustration, the geometric deviation of each 2.5D layer with the corresponding 3D layer of the part is labeled as the cusp volume.

In order to adaptively slice the part, at each slice height, the cusp volume is computed and used as a measure to determine the height of the next layer. However, the cusp volume may dramatically change over the height of a part as it is a function of the perimeter of the cross-section, layer thickness and the angle made by the local surface tangent vector with the build direction. Hence, it is not possible to use a constant cusp volume criterion for determining the layer thickness. In order to alleviate this difficulty, the cusp volume is normalized by the volume of the 3D slice of the part to give an estimate of the percentage volumetric error within each layer of the additive manufactured part as compared to the original geometry as shown in Equation 24.

$$\% \ VolumetricError = \frac{Cusp \ Volume}{3D \ Slice \ Volume},$$

An upper bound on the % VolumetricError is placed and the layer thickness at each slice height is determined so as to satisfy this upper bound criterion. At each slice height along the length of the part, the % VolumetricError is first estimated using the maximum possible layer thickness. If the computed error is less than the maximum bound, the maximum layer thickness is used. If not, the layer thickness is successively converged to a value that yields the specified maximum error using a 'bisection' scheme. If the resulting layer thickness is greater than the minimum layer thickness that may be built, then it is used as next layer height. Otherwise, the next layer height is set to the minimum layer thickness and the operation is repeated. Implementation details of this approach using ACIS kernel are given next.

The pseudo code for the adaptive slicing operation using volume deviation approach is shown in Algorithm 12. The part of the given name is first loaded into the program and all the important ACIS parameters like resolution are set. The bounding box of the part is computed next to identity its min and max extents. Slicing is started at a height just slightly above minZ. For each slice height minZ<z<maxZ, the slice contour is computed and slice image created.

---
Algorithm 12 Adaptive Slicing Algorithm.
---
1: load the given part and store in wig
2: compute bounding box and store the bounds in min and max
3: for z:= minZ to maxZ do
4:     create horizontal plane at height z
5:     compute slice by intersecting the plane with the part
6:     create image from slice
7:     z = z + layerThickness(wig, z)
8: end for
---

Once the slice image is created, the slice height of the next layer is determined by passing the part (wig) and the current slice height (z) to a function called layerThickness. The pseudo-code for this function is shown in Algorithm 13.

---
Algorithm 13 computing layer thickness.
---
1: function layerThickness(wig, z)
2:   low ← z
3:   high ← z + MAXTHICKNESS
4:   deviation = computeDeviation(wig, z, MAXTHICKNESS)
5:   thickness = MAXTHICKNESS
6:   mid = 0
7:   while deviation ≠ 0 and |deviation − MAXTHICKNESS| > TOL do
8:     $mid = \frac{high + low}{2}$
29:     thickness = mid - z
10:     if thickness > MINTHICKNESS then
11:       deviation = computeDeviation(wig; z; thickness)
12:       if deviation = 0 then
13:         break
14:       else
15:         if deviation > MAXDEVIATION then
16:           high = mid
17:         else
18:           low = mid
19:         end if
20:       end if
21:     else
22:       thickness = MINTHICKNESS
23:       break
24:     end if
25:   end while
26: end function
---

In this algorithm, three height trackers denoted by low, mid and high are used. For finding the layer thickness at height z, these three trackers are first set to z, 0 and MAXTHICKNESS (denotes the maximum layer thickness that may be built) respectively. First the % volume deviation of the part at height z is computed at the maximum allowable layer thickness. If this deviation is either non zero or greater than the maximum allowable volume deviation denoted by MAXDEVIATION, the height of the next layer is adjusted using a scheme similar to the bisection method in root finding (until the volume deviation is in the vicinity of the maximum allowable volume deviation).

So, if at MAXLAYERTHICKNESS, the volume deviation is greater than the MAXDEVIATION, the height marker mid is adjusted to its new value as shown in Equation 25:

$$mid = \frac{high + low}{2}, \qquad \text{Equation (25).}$$

The volume deviation at this new height given by mid is then computed. If it is still higher than MAXDEVIATION, then high is set to current value of mid so that in the next iteration, the volume deviation is computed at a lower height. If the volume deviation at the current value of mid is lower than the MAXDEVIATION, then low is set to the current value of mid so that in the next iteration, the volume deviation is computed at a higher z height. In this manner, through successive iterations, the value of mid converges to a z height where the volume deviation is within a tolerance range denoted by TOL in the vicinity of MAXDEVIATION. Once the value of mid has converged to a stable value, the next layer height is computed as shown in Equation 26 and returned back.

$$thickness = mid - z, \qquad \text{Equation (26).}$$

This ensures that at each slice height z the part is sliced at the maximum possible layer thickness to satisfy the volume deviation criteria in order to obtain the minimum number of slices for the part thereby reducing the total build time while also maintaining accuracy. The implementation of the function computeDeviation which is used for calculating the volume deviation of a given generic BRep part wig at a slice height z and a layer thickness (denoted by thickness) is fairly simple and easily scalable to parts of arbitrary complexity. The pseudo code of this function showing the various operations that need to be carried out for computing volume deviation is shown in Algorithm 14.

---
Algorithm 14: Computing % Volume Deviation.
---
1: function computeDeviation(wig, z, thickness)
2:   //compute 3D slice:
3:   block ← a cuboid of height equal to thickness
4:   3DSlice ← solid geometry obtained from intersection of wig and block
5:   //compute 2.5D slice:
6:   sliceP lane ← a plane created at height z + thickness
7:   contour ← intersection of wig and sliceP lane
8:   2:5DSlice ← sweep contour down by a distance equal to thickness
9:   //compute volume lost:
10:   cuspVolume1 ← subtract 2:5DSlice from 3DSlice
11:   //compute volume gained:
12:   cuspVolume2 ← subtract 3DSlice from 2:5DSlice
13:   //compute volume of 3D slice:
14:   3DVolume ← volume of 3DSlice
15:   //compute % volume deviation:
16:   $deviation \leftarrow \frac{cuspVolume1 + cuspVolume2}{3DVolume} * 100$
17:   return deviation back to the calling function
18: end function
---

First, the 3D slice geometry is computed. In order to do this, a rectangular cuboid of height equal to the given layer thickness (denoted by thickness) is created and stored in the variable named block. The 3D slice geometry may then be computed by performing a solid intersection operation in ACIS between the given part wig and the cuboid denoted by block. Next, the 2.5D slice (the geometry of each printed layer assuming rectangular walls) geometry is computed by the following steps a) creating a slice plane at height z+thickness,
b) computing the intersection of the plane with the given CAD part wig to get the 2D slice contour,
c) sweeping the 2D slice contour vertically down by a distance equal to the current layer thickness.

Figure 57:
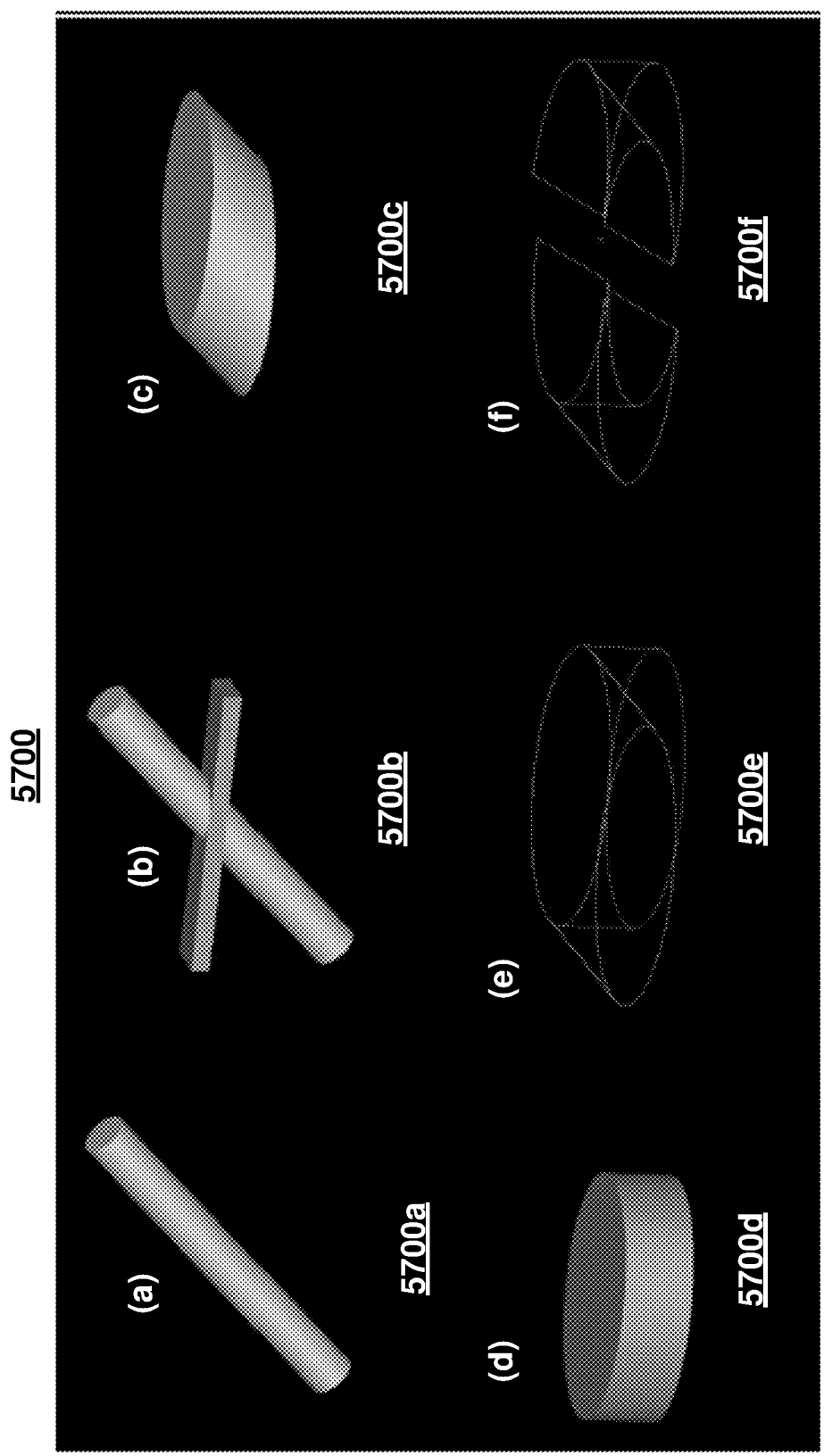
FIG. 57 illustrates each of these steps for calculating the volume deviation while slicing a sample CAD part in accordance with various aspects as described herein.

Once, the 3D and 2.5D slices are computed, the volume lost by the layered part (denoted by cuspVolume1) at the given height z and the given layer thickness thickness is determined by performing a subtraction operation in ACIS using the 3D slice as the 'blank' body and 2.5D slice as the 'tool' body and computing the volume of the resulting geometry. Similarly, the volume gained by the layered part (denoted by cuspVolume2) is determined by swapping the blank and tool bodies from the previous step and computing the volume of the resulting geometry. Finally, the % volume deviation may be computed as shown in the expression on Line 16 in Algorithm 14, where 3DVolume denotes the volume of the 3D slice. FIG. 57 illustrates each of these steps for calculating the volume deviation while slicing a sample CAD part in accordance with various aspects as described herein.

Figure 58:
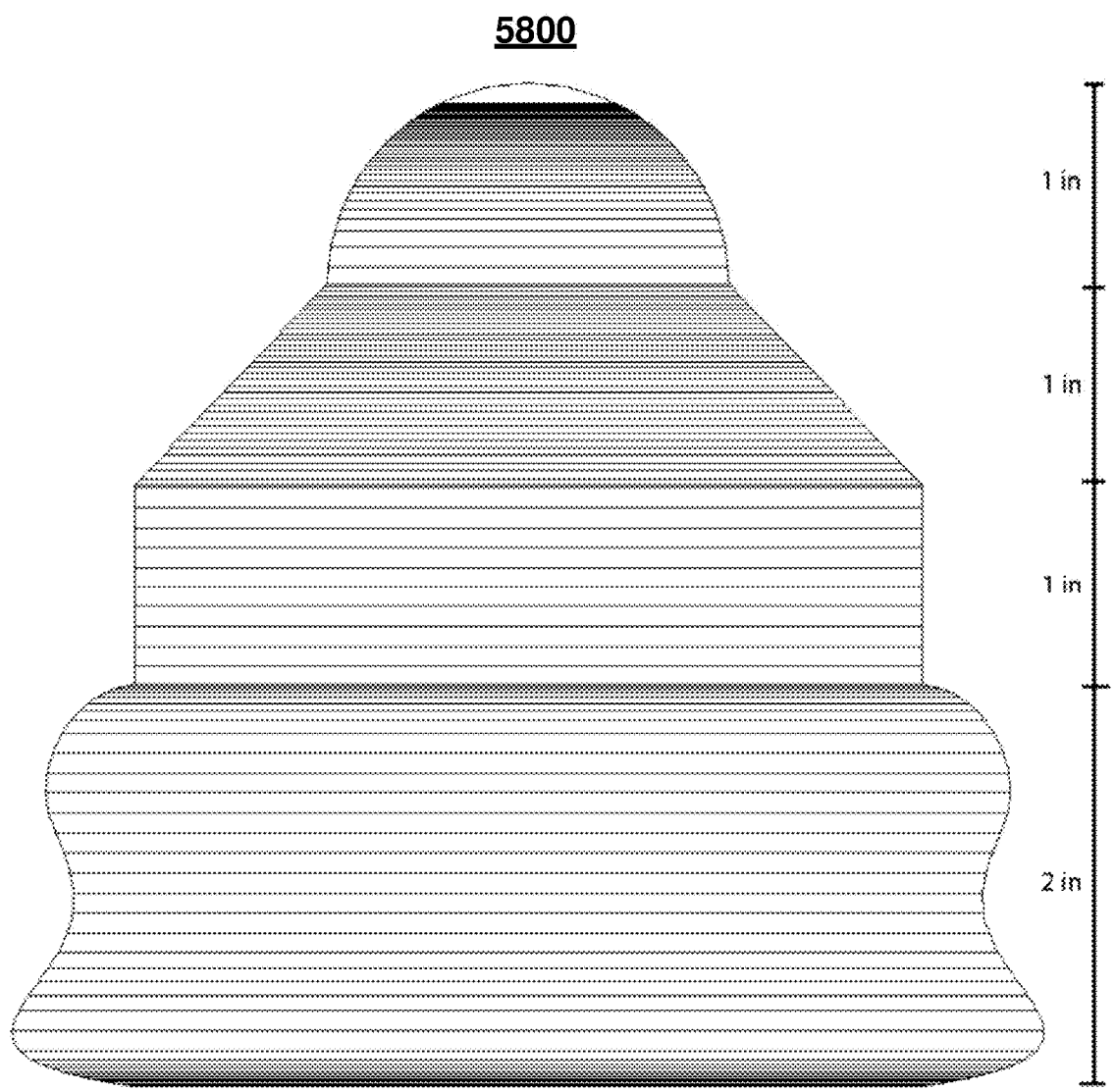
FIG. 58 is a sample CAD part adaptively sliced using the volume deviation approach.

The effect of adaptive slicing on a sample CAD part composed of three different primitives (cylinder, cone and a sphere) and a free form cross-section is shown in FIG. 58. FIG. 58 is a sample CAD part adaptively sliced using the volume deviation approach. The minimum and maximum layer thicknesses used were 0.001 inch and 0.1 inches respectively. A maximum volumetric deviation of 2% is used as the adaptive slicing criteria. The following observations may be made from FIG. 48:

(a) The maximum layer thickness of 0.1 inch is used for the region with vertical cylindrical cross-section since the volume deviation for this region is zero.

(b) A more or less constant layer thickness which is smaller than the maximum value is used for slicing the conical section. The slight variation in the layer thickness in this region is caused due to the fact that % volume deviation is a relative measure and it changes with respect to the cross-section location along the height of the part.

(c) For the spherical section, the layer thickness is varied gradually with thickness decreasing towards the top.

(d) For the free form section, the layer thickness is varied continuously, with thickness increasing or decreasing depending on the local surface complexity.

Figure 59:
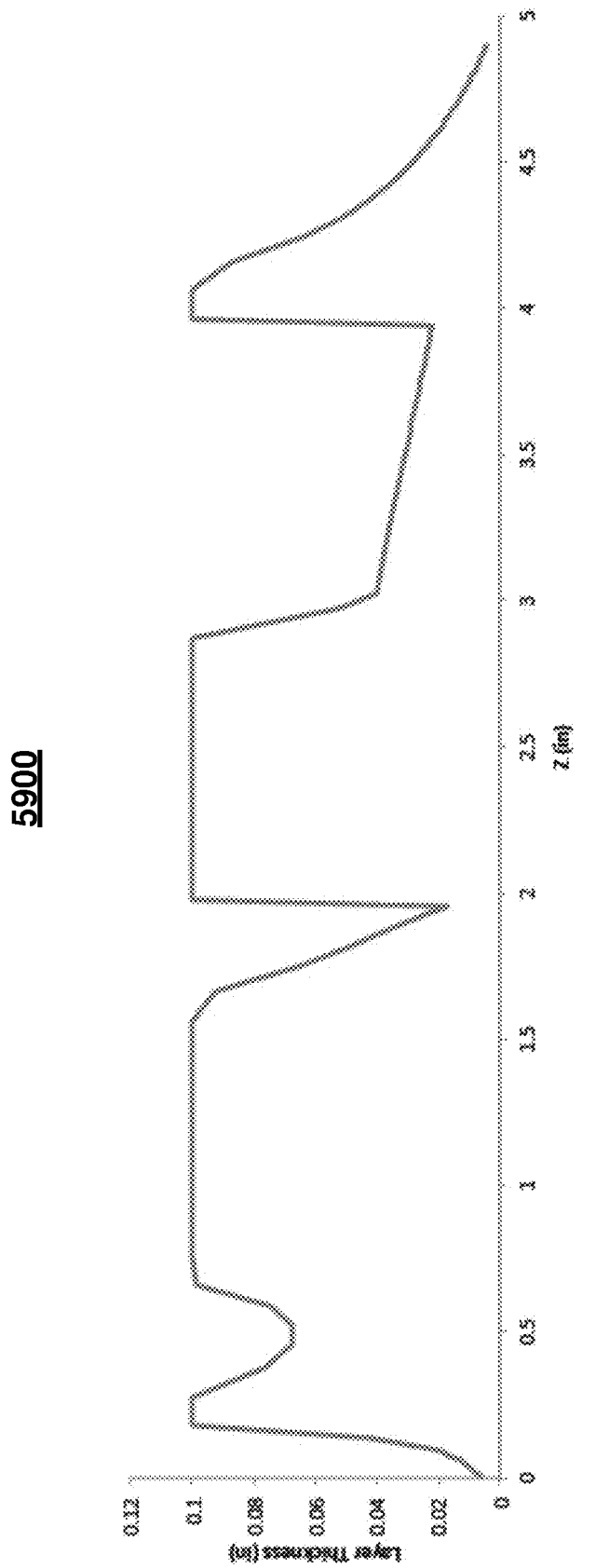
FIG. 59 provides a chart of variation of layer thickness vs. height z for sample part.

FIG. 59 provides a chart 5900 of variation of layer thickness vs. height z for sample part. FIG. 59 provides a plot of how the layer thickness varies along the height of the part to give a more clear illustration of the observations presented above. It may seen that the layer thickness ranges between the maximum and minimum thickness specified in the algorithm.

Figure 60:
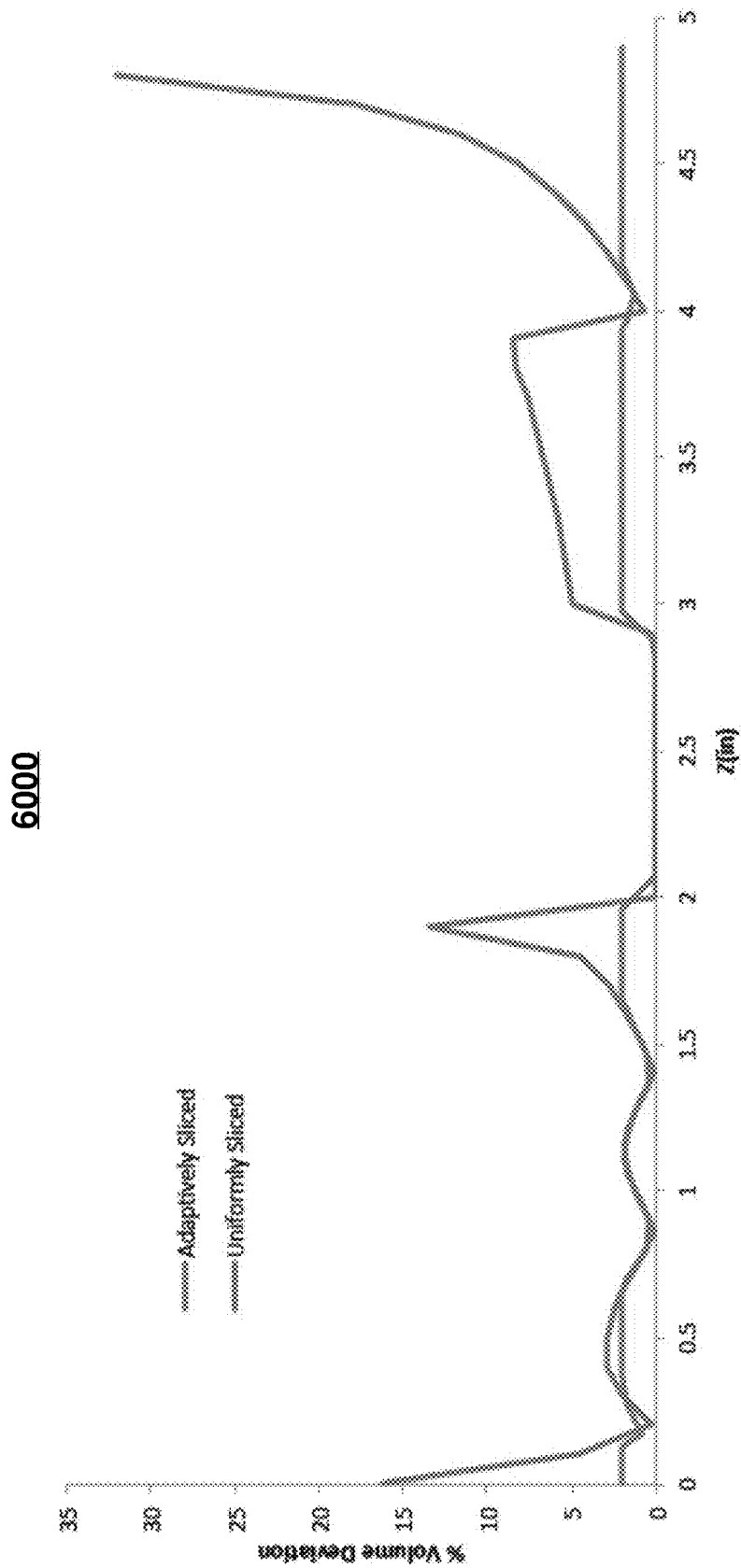
FIG. 60 provides a chart of the percentage volume deviation vs. height for sample part.
Figure 61:
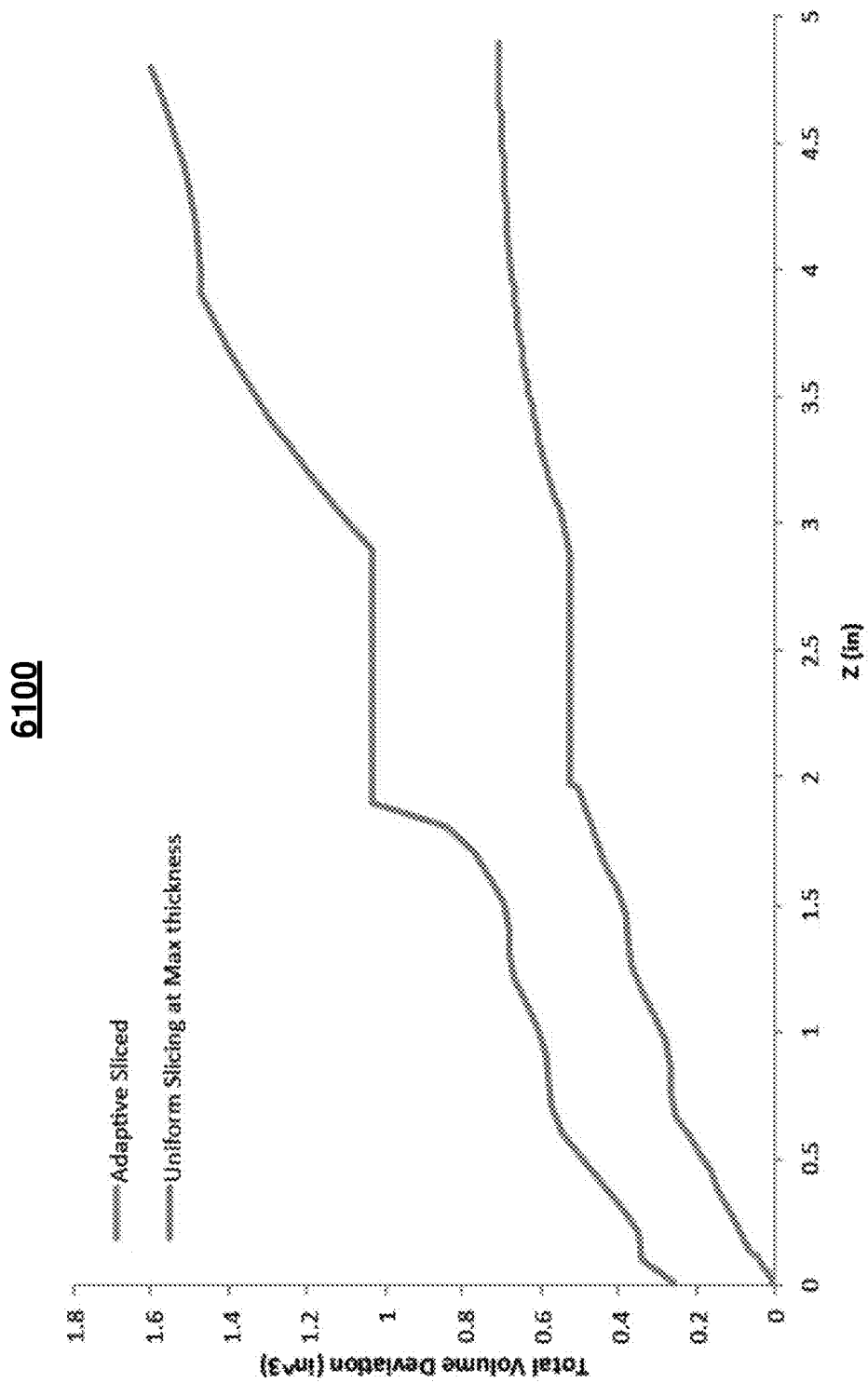
FIG. 61 provides a chart of percentage total volumetric error vs. height for sample part.

FIG. 60 provides a chart 6000 of the percentage volume deviation vs. height for sample part. FIG. 60 gives a plot of % volume deviation present in each layer along the height of the part and how this varies for the adaptively slicing as compared to uniform slicing at the maximum layer thickness. As may be clearly seen, the adaptively sliced part has a volumetric deviation of at most 2% as specified by the maximum bound in the algorithm whereas, for the uniformly sliced part, the volumetric deviation fluctuates through a wide range from 0% to nearly 35% as a function of location in the build direction. FIG. 61 provides a chart 6100 of percentage total volumetric error vs. height for sample part. FIG. 61 gives a plot showing the variation of the total absolute volume in (in3) lost or gained in the part for both the adaptive slicing and uniform slicing.

From the results shown, it is evident that this approach of using % volumetric deviation as a criterion for adaptive slicing works very well. Since it computes the full three dimensional volume of the cusp, this approach is free of the limitations of the area deviation approach for slicing BRep models.

It is to be noted that the % volumetric deviation metric is a relative measure as compared to the cusp height metric (which is an absolute one). However, as shown by the results, this approach yields satisfactory outcomes and its evident simplicity (quicker computation time as a consequence) and scalability to handle generic BRep models with more complex geometry (as compared to only parametric surface splines handled by Kulkarni and Dutta) give it the advantage. The relativeness of the volume deviation metric may be alleviated by having more designer knowledge of the parts being built (like the minimum feature sizes, maximum curvature regions etc.) while setting the parameters (minimum and maximum layer thickness ranges and the maximum volume deviation bound) in the slicing algorithm.

As future scope of this work, for the specific HP turbine blade designs intended for fabrication via LAMP, empirical studies may be performed to relate the % volumetric deviation to the absolute surface roughness parameter Ra of the fabricated parts in order to infer a more accurate parameter range for the slicing algorithm. However, for successfully fabricating adaptively sliced parts, some hardware changes need to be made in the LAMP machine as well. In its current configuration, it is not possible to change the exposure time dynamically in a build in an automated fashion (It may still be specified manually before the exposing each layer but becomes very tedious for large builds). This capability needs to be achieved in order to cure layers of arbitrary thickness. Controlling the wet layer thickness while re-coating each fresh layer is also crucial as it is dependent on phenomena like surface tension, suspension rheology etc. Once these changes are implemented, it is expected that a simple and scalable adaptive slicing algorithm like the one presented here would greatly improve the part quality.

Figure 62:
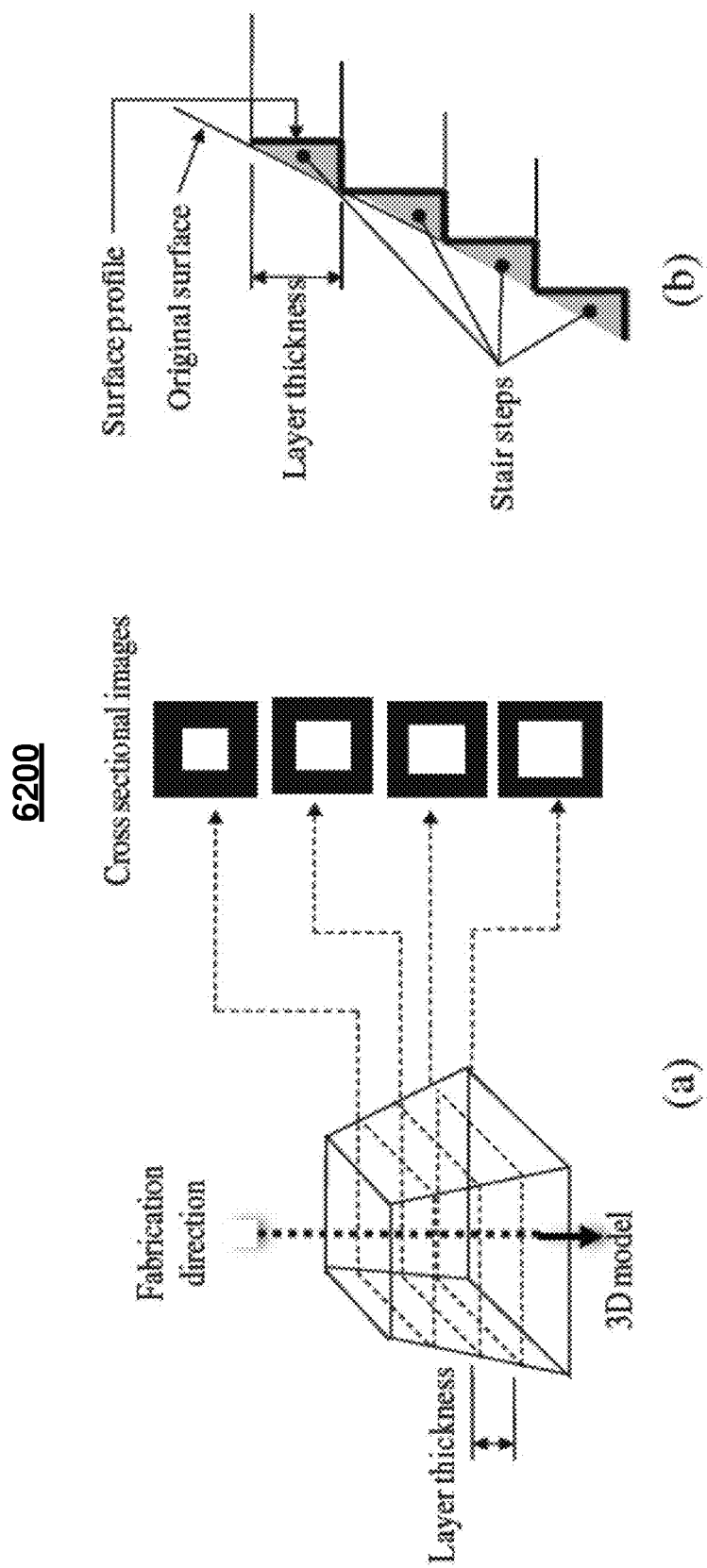
FIG. 62 illustrates stair stepping caused on downward facing surfaces while using all white build images.

The other major approach pursued herein to address the issue of stair stepping is through gray scaling and dithering. The basic idea behind using gray-scaling and dithering in LAMP is to effectively modulate the cure depth in a single exposure by using screened gray scale regions in the build images in place of using the original all white regions for the cured regions in the slice images. The stair stepping effect observed in additively manufactured parts, as discussed previously, is a result of the fact that the cured layers have 2.5D geometry with a constant depth across the entire region of exposure. For surfaces that are facing downward (i.e surfaces whose normal vectors make an angle greater than 90° and less than 270° with respect to build direction), this means that the cured layer overshoots the part geometry at the edges. This effect is illustrated in FIG. 62. FIG. 62 illustrates stair stepping caused on downward facing surfaces while using all white build images.

For a 3D CAD model shown in (a) of FIG. 62 referenced at 6200a, if all-white slice images are used to represent the exposure dose for curing each layer of a part, the resulting cured layers overshoot the actual surface profile as shown in (b) of FIG. 62 referenced at 6200b.

In order to rectify this overshooting effect, the exposure dose that the material system receives needs to be modulated locally at the edges of each exposure image (where the full cure depth leads to overshoot) to get a cured profile that represents the surface profile more accurately. Energy dose (E) is a product of the light intensity (denoted by I and has units of W/m²) and exposure time (t) as shown below:

$$E = I*t,\quad\text{Equation (27).}$$

Thus, one method of locally modulating the exposure energy dose E involves manipulating exposure time t. However, in the current LAMP equipment, there is no facility to locally manipulate the exposure times within each exposure. An alternate method for manipulating the exposure dose involves by manipulating the light intensity. Since LAMP and most other projection systems use a single light source with a fixed power output, locally manipulating the light intensity would is also very challenging. As an alternative to local manipulating the actual light intensity, gray-scaling followed by dithering is used to manipulate the effective light intensity incident upon the material.

Details of the algorithm and the methodology followed for generating gray scale images in order to modulate the cure depth within each exposure to reduce the stairstepping effect on downward facing surfaces, are presented in this section. The cure depth Cd is a function of light intensity I, resin parameters sensitivity $D_p$ and critical energy $E_c$ and exposure time t. As previously discussed, the exposure time t is held constant in this approach. Through the experimental investigations presented in the previous sections, it was determined that rest of the parameters are in turn functions of the gray scale value G. This functional dependence on gray scale value G is shown in Equation 39.

$$C_d = D_P(G)\ln\frac{I(G)t}{E_c(G)},\quad\text{Equation (39).}$$

These functional dependencies have been explicitly identified in the previous sections. Therefore, the final expanded form of the expression relating Cd and gray scale value G for HDS superfine screening resolution may be written as follows:

$$C_d = (22.1G + 193.1)\ln\frac{GI_o t}{35.6G + 101.8},\quad\text{Equation (40).}$$

where Io is the full light source intensity from an all white exposure which was measured to be 1.6 mW/cm² for the light source used in LAMP. Therefore, using the expression in Equation 40, for a given exposure time t, the gray scale value G that results in the required cure depth Cd may be computed. The details of the algorithm to identify the required cure depth Cd and thereby the required gray scale value G at each pixel in the slice image are given next.

The direct slicing algorithm may be extended to output gray scale slice images instead of the usual black and white images. The pseudo code for accomplishing this is presented in this Algorithm 15.

---

Algorithm 15: Gray Scale slice image generation.

---

1: wig ← given part
2: for each slice height z along the height of the part do
3:     //compute 3D Slice:
4:     block ← a cuboid of height equal to layerThickness
5:     3DSlice solid geometry obtained from intersection of wig and block
6:     //compute 2D Slice:

---

Algorithm 15: Gray Scale slice image generation.

---

7:     slicePlane ← plane at a height of z + layerThickness
8:     2DSlice ← contour obtained from intersection of wig and slicePlane
9:     //compute Slice Image Pixel Values:
10:    for each pixel in the slice image corresponding to the 2D slice do
11:        (x, y) ← coordinates corresponding to the pixel
12:        $C_d$ ← thickness of 3DSlice at (x, y)
13:        t ← exposure time corresponding to a cure depth equal to layerThickness
14:        G ← gray scale value solved from Equation 40 using $C_d$ and t
15:        pixelValue ← G * 255
16:    end for
17: end for

---

The given CAD model is first loaded into the program and assigned to the variable wig. For each slice height z along the height of the part, first a three dimensional slice, denoted by 3DSlice, is computed in order to identify the accurate geometry that needs to be cured. This is accomplished by creating a cuboid, denoted by block of thickness equal to the build layer thickness denoted by layerThickness and computing the intersection of it with the given part denoted by wig. Next, the 2D slice contour denoted by 2DSlice is computed at a height z+layerThickness by creating a slice plane at this height and computing its intersection with wig. Now, for each pixel in the slice image corresponding to the slice height z+layerThickness, first the corresponding coordinate values denoted by (x; y) of the pixel are identified. The required cure depth Cd that needs to be achieved is determined by computing the thickness of the 3D slice geometry at these coordinates. The exposure time t is fixed and corresponds to a cure depth equal to the full layer thickness used in the build. Using these values for Cd and t in Equation 40, the gray scale factor G may be solved for by using any of the standard root finding techniques like Newton-Raphson or Bisection method. Once the required gray scale value G at the current location is determined, the corresponding pixel value of the slice image is set to G_255 (For an 8-bit gray scale image, like the one being created in this case, a value of 255 corresponds to full white and a value of 0 corresponds to full black). In this manner, the gray scale values for each of the pixels in the slice image are determined and the slice image is created.

Figure 63:
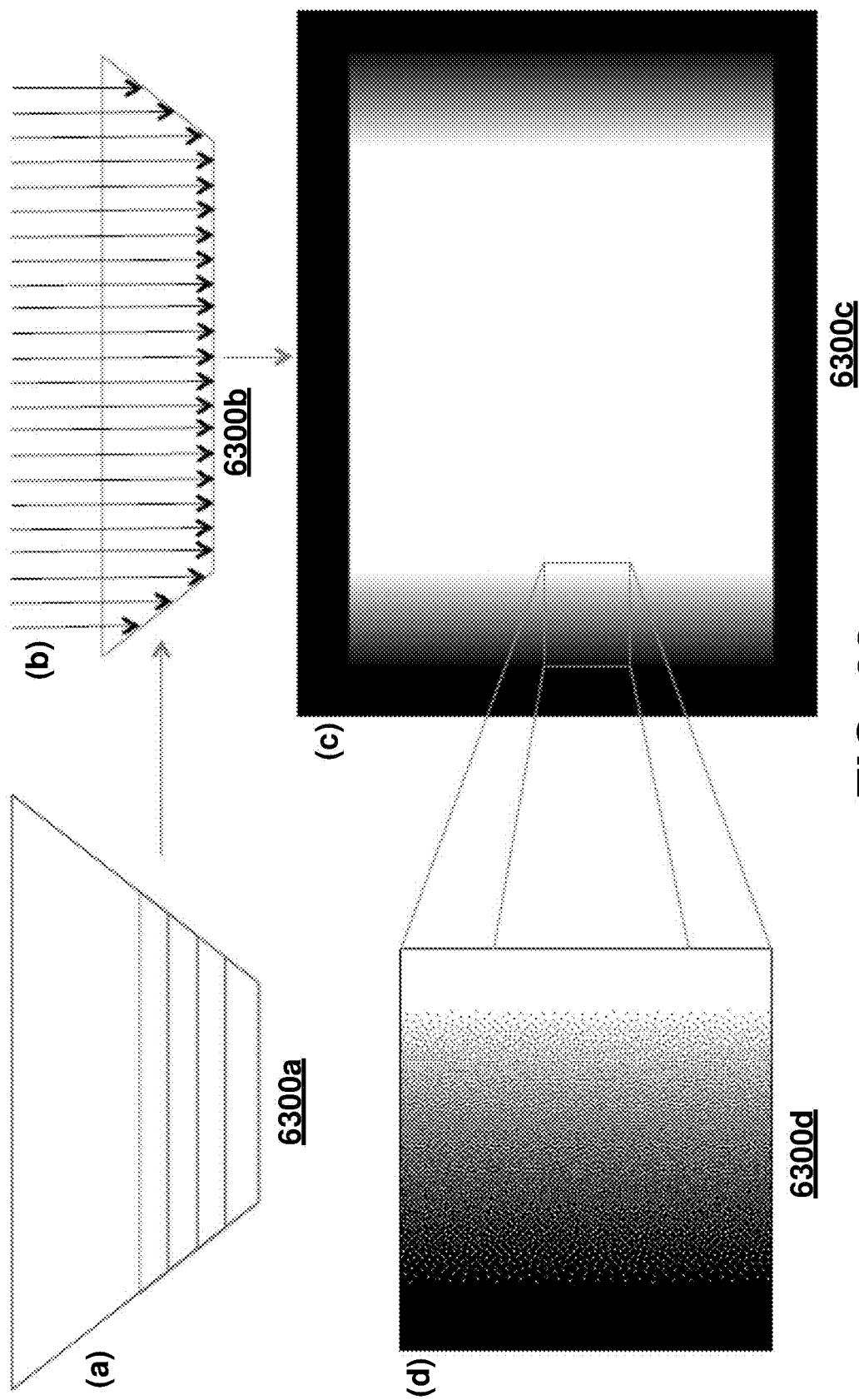
FIG. 63 illustrates a method for producing a gray scale image in accordance with various aspects described herein.

FIG. 63 illustrates a method 6300 for producing a gray scale image in accordance with various aspects described herein. (a) of FIG. 63 referenced at 6300a shows the sample part used for computing gray scale slice images. (b) of FIG. 63 referenced at 6300b shows the process of identifying the required cure depth corresponding to each pixel of the slice image. From the cured depth determined by this process of ray intersections with the 3D slice, the gray scale value required at each pixel value may in turn be computed from the cure depth model established in Equation 40. The gray scale slice image obtained from this process is shown in (c) of FIG. 63 referenced at 6300c. (d) of FIG. 63 referenced at 6300d shows a zoomed in view of the dithered gray scale region obtained by dithering the gray scale slice image.

Figure 64:
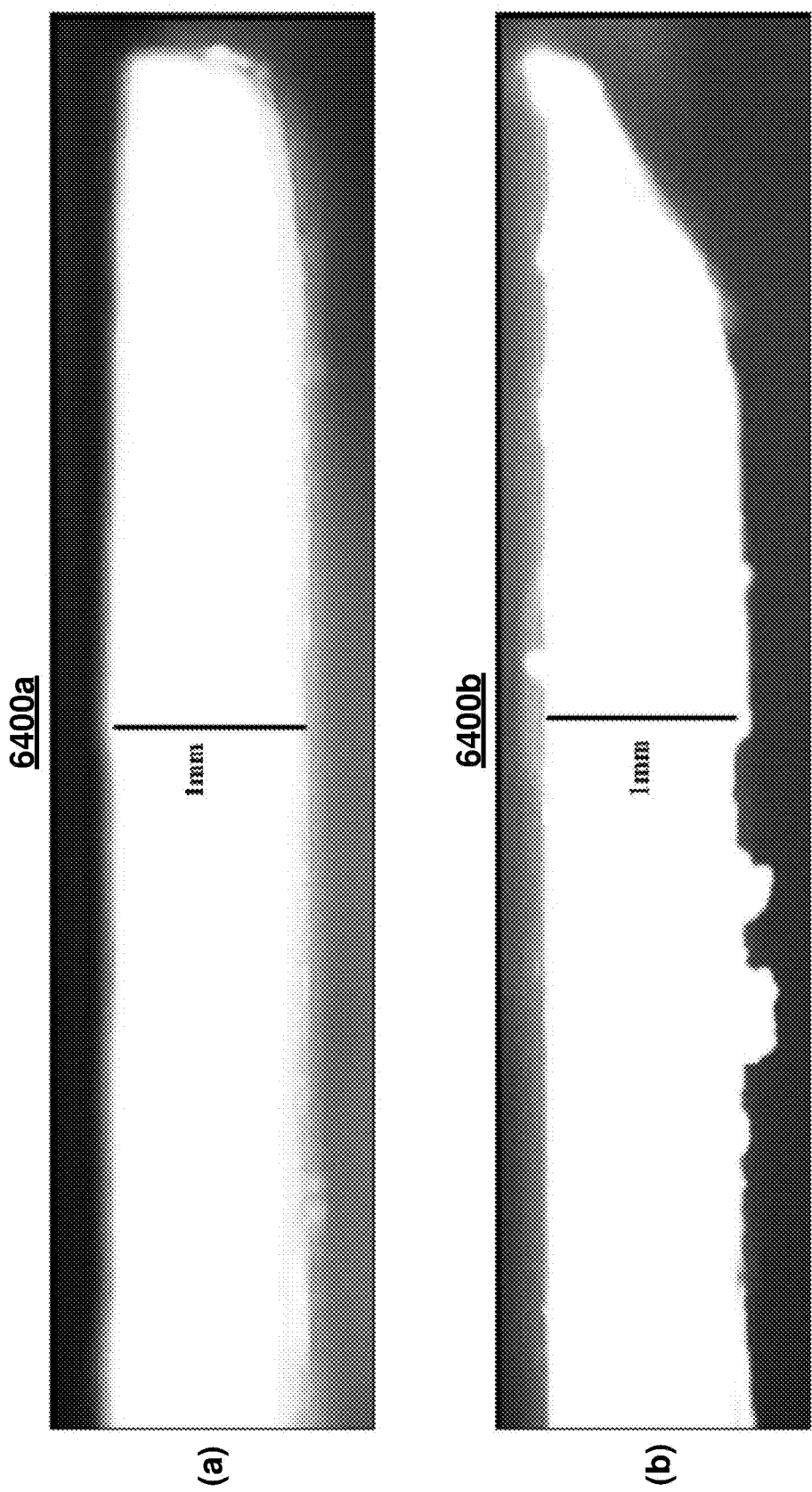
FIG. 64 illustrates gray scale exposure results.

For the sample part shown in (a) of FIG. 63 referenced at 6300a, one sample layer is cured for demonstration of the concept. FIG. 64 illustrates gray scale exposure results. (a) of FIG. 64 referenced at 6400a shows the cured profile obtained with an all white exposure. As expected, the profile is more or less 2.5 D cross-sectional. The cured profile of the same layer now exposed with the gray scale slice image obtained using the process discussed in the previous section is shown in (a) of FIG. 64 referenced at 6400a. As may be seen, the cured profile obtained with the gray scale exposure is very close to the actual 3D slice geometry of each layer for the sample part shown in (a) of FIG. 64 referenced at 6400a.

These single layer cured profiles serve as a proof of concept. Multilayer parts may easily be built using this exposure technique to yield smooth downward facing surfaces. Moreover, since the cure profile may now be accurately controlled, higher layer thicknesses may be used in builds without any compromise on part accuracy and surface smoothness thereby potentially reducing build times as well.

As discussed in the previous section, the cure width Cw obtained is a result of the complex interaction of several parameters which is very difficult to model accurately. Hence, in order to understand the cure depth behavior of LAMP suspensions, a simple experimental study is proposed. From experience, four important parameters are singled out for studying their specific effects on cure width Cw. They are:
 (a) Feature size,
 (b) Peak light intensity,
 (c) UV absorber concentration, and
 (d) Photoinitiator (PI) concentration.

Figure 65:
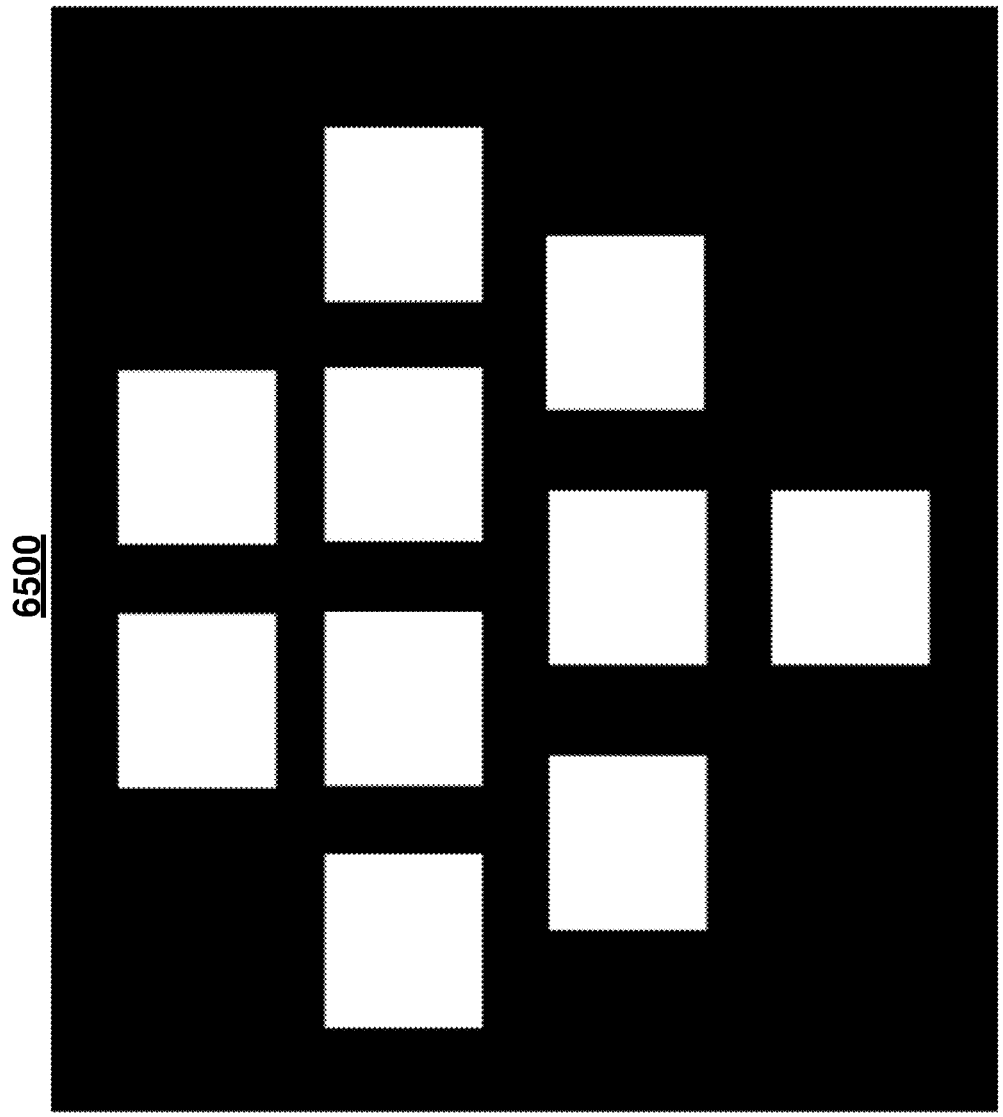
FIG. 65 illustrates a sample exposure image with a known constant square length with ten different tiles.
Figure 66:
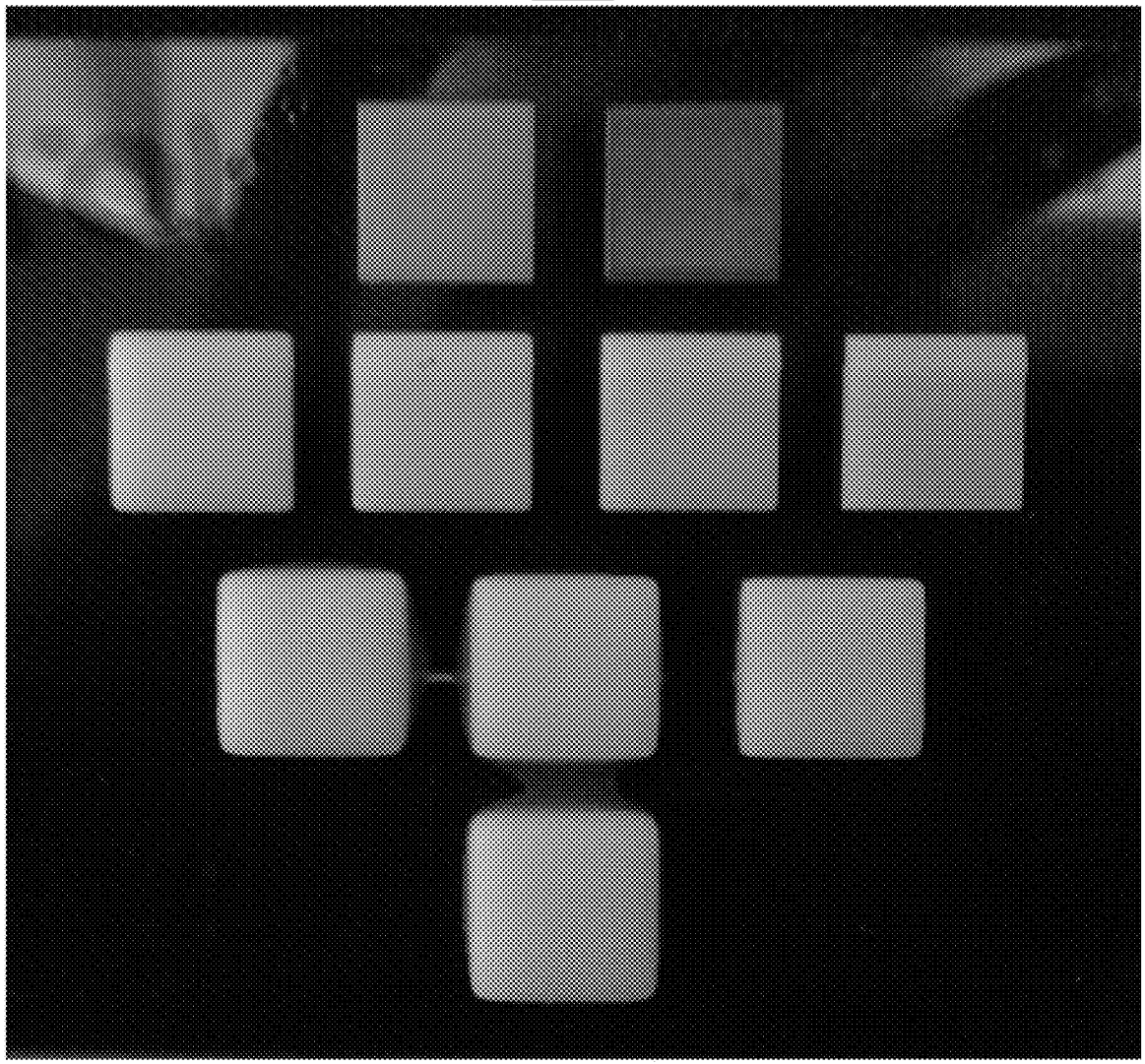
FIG. 66 illustrates cured squares obtained by exposing the image in FIG. 65.

Discrete values for each of the parameters were identified and the cure width characteristics at each of these parameters are determined experimentally. Cure widths were determined by exposing squares of known length over a glass slide and by measuring the deviation of the cured square lengths obtained. FIG. 65 illustrates a sample exposure image with a known constant square length with ten different tiles. FIG. 66 illustrates cured squares obtained by exposing the image in FIG. 65. FIG. 65 shows a sample image with known squares that is used for exposure and FIG. 66 shows an image of the corresponding cured layers obtained.

It is to be noted that each tile in the exposure image in FIG. 65 is exposed at a different exposure dose and hence the resulting square lengths obtained in the cured square tiles shown in FIG. 66 are different. The corresponding cure widths Cw at each of the exposure doses is computed as follows:

$$C_w = \frac{l_{cured} - l_o}{2},\qquad \text{Equation (60).}$$

where lcured is the square length obtained after curing each tile, and lo is the nominal square length in the exposure Image. In this manner, at discrete values of each of the parameters (a), (b), (c), and (d), the cure width trends with respect to the energy dose are identified. Critical energy dose and sensitivities for cure width Cw analogous to Ec and Dp for the case of cure depth Cd are introduced. For the sake of clarity, from here on, a different notation is used for identifying the critical energy doses and sensitivities corresponding to cure depth and cure width respectively. The critical energy dose corresponding to cure depth Cd is denoted from here on by Ed c and the sensitivity for cure depth is denoted by Dd p. Similarly, the critical energy dose and sensitivity for cure width Cw are represented by Ew c and Dw p respectively. The extra superscripts 'd' and 'w' are added to the usual parameters Ec and Dp where 'd' denotes depth and 'w' denotes width.

A new parameter known as broadening depth Bd is introduced, which gives the maximum cure depth that may be achieved before the layers begin to cure in the width direction. It is determined by computing the cure depth obtained at an energy dose equal to the cure width critical energy dose Ew c at which lateral curing just begins to occur as shown in Equation 61.

$$B_d = D_P^d \ln\frac{E_c^w}{E_c^d},\qquad \text{Equation (61).}$$

This is a good measure for characterizing the side-scatter induced cure width broadening of each composition. Ideally, the composition should be optimized for maximum broadening depth in order to get deep cured parts with good layer-to-layer bonding and minimal excess side scattering.

The parameters introduced here to analyze the cure width characteristics of the material system for LAMP are analogous to ones for characterizing the line widths of the LAMP suspension. However, it will be shown that the results obtained here deviate from the 'quasi-Beer-Lambert' law introduced in her thesis. These differences may be attributed to following:
 1) differences in the exposure set up used,
 2) difference in the curing times used,
 3) difference in the method by which cure widths Cw are calculated.

The results obtained from the experimental investigations using the methodologydescribed in this section are given next.

Three scenarios may present the need for support structures in typical additive manufacturing processes. These are re-listed here for the sake of clarity:
 (a) Surfaces with large overhang.
 (b) Surfaces or geometries that result in floating Islands.
 (c) Geometries with the potential to topple over.

As previously mentioned, the degree to which each of these scenarios necessitate supports changes with each additive manufacturing process. For example, selective laser sintering (SLS) does not need any special supports for either of the scenarios since there is always a bed of unsintered powder acting as support. Fused deposition modeling (FDM) on the other hand, requires supports for all of these scenarios since material is only deposited in the region enclosed by the part geometry and the rest of the build volume is empty unlike in the case of SLS. For the stereolithography (SLA) process, the need for supports lies somewhere in between the spectrum of these two extremes. Since the build volume in SLA consists of a viscous resin, in some instances (based on the part geometry), the buoyancy force offered by the viscous medium suffices to support the parts from toppling over, thereby eliminating the need for supports in this scenario.

Figure 110:
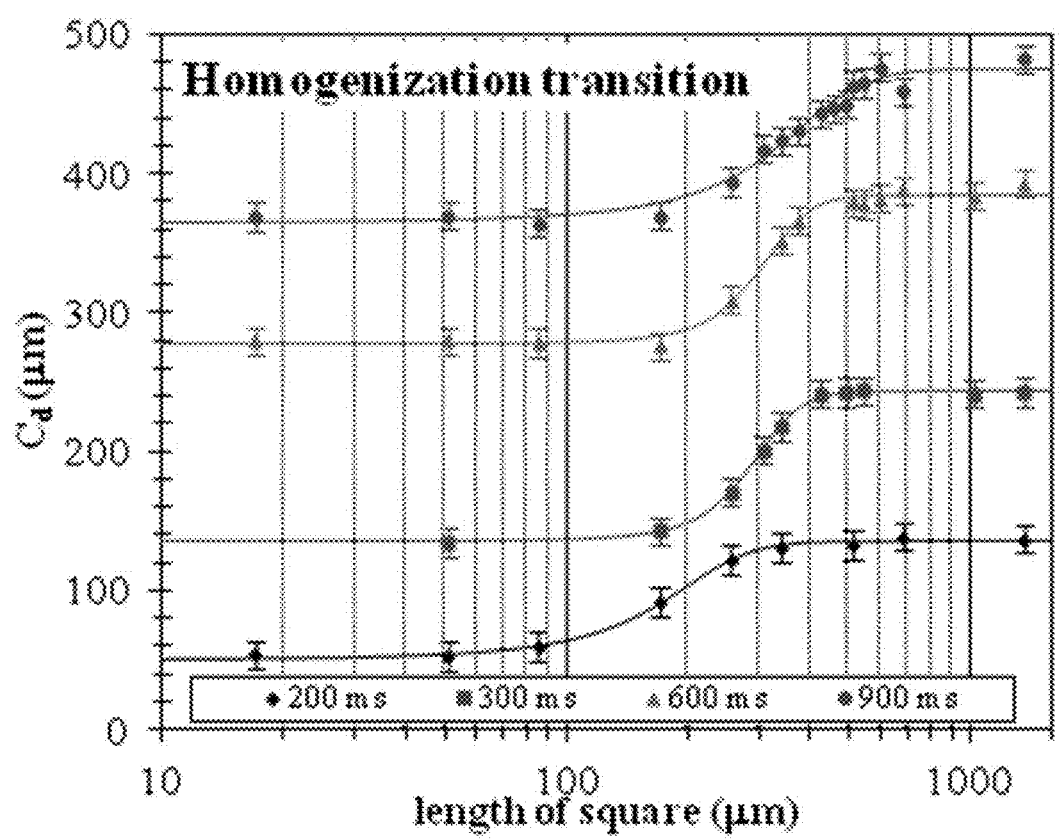
FIG. 110 provides a chart illustrating homogenous transition of a PCMS resulting from a checkerboard exposure pattern.

From the previous discussion it is clear that, although some common scenarios that necessitate support structures exist, the degree to which they impose the need for supports varies with respect to the additive manufacturing process in consideration. The need for supports with respect to each of these scenarios specific to the LAMP process is discussed in this section. The LAMP process, as previously discussed, aims to build ceramic molds for the casting of high-pressure turbine blades. Hence the need for supports in the LAMP process specific to the needs of the geometries that arise in HP turbine blade molds is considered. FIG. 110 illustrates the features found in a representative HP turbine blade mold.

All the geometric features observed in the figure are intended for the cooling of internal and external surfaces of the blade. Some prominent features like the leading edge, trailing edge, film cooling pins (cool the leading edge and mid chord portion of the external surface of the blade), mid-chord serpentine (creates a serpentine passage for internal air flow in the mid chord region), leading edge cavity (supplies cooling air to the leading edge film cooling pins), tip cap (creates an air cavity for cooling the top edge of the blade), pin fins (cool the narrow cross-section of the trailing edge) are annotated. While building such a complex geometry, each of the three scenarios demanding support structures are encountered and the means by which they may be handled in LAMP is presented next.

Figure 67:
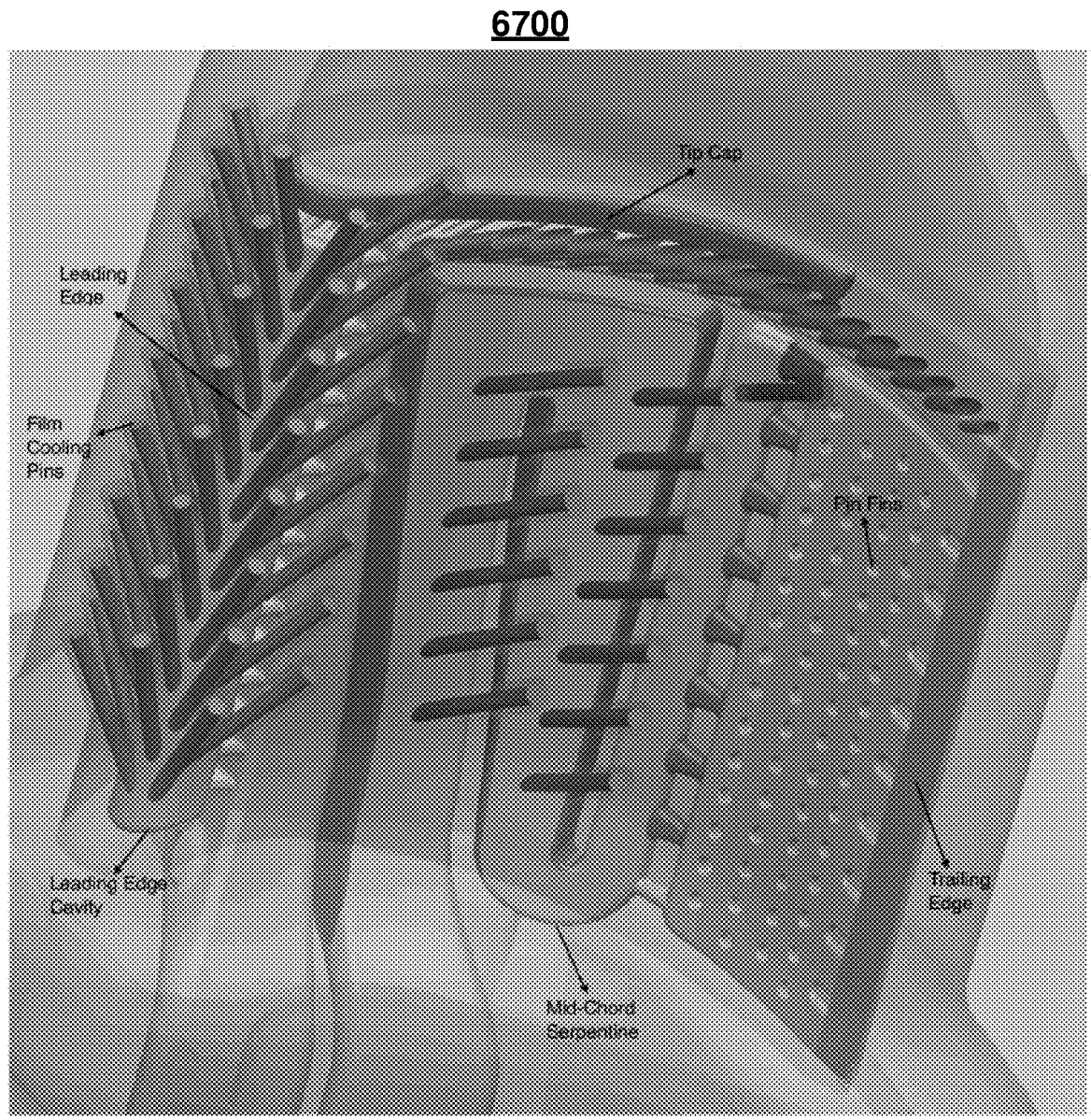
FIG. 67 shows the native orientation of the blade mold.
Figure 68:
FIG. 68 illustrates a build orientation that reduces overhangs observed in the original orientation.

While building the complex geometry of the HP turbine blade molds, several overhangs do occur. FIG. 67 shows the native orientation of the blade mold. When built in this orientation, features that define the tip cap of the blade cause very large overhangs leading to a failure of the build. However, from previous experience, for the typical HP blade geometries, an orientation may be found which minimizes these overhangs thereby resulting in successful builds. Such an orientation is shown in FIG. 68, which enables the tip cap features which were previously causing build failure to grow more gradually from their root at the trailing edge. FIG. 68 illustrates a build orientation that reduces overhangs observed in the original orientation.

Thus, for the kind of geometries encountered in the LAMP process, the problem of adding supports to overhanging structures is not so crucial and a build orientation may be found that will result in tolerable overhangs that will lead to successful part builds. This is ideal because any additional support structure added would be totally internal to the built part and impossible to remove. This leads to additional unintended features in the cast blades which will alter the cooling characteristics of the intended design. However, if in the future, a blade geometry is encountered which does not have any viable orientation that yields tolerable overhangs, then this support scenario needs to be addressed.

Figure 69:
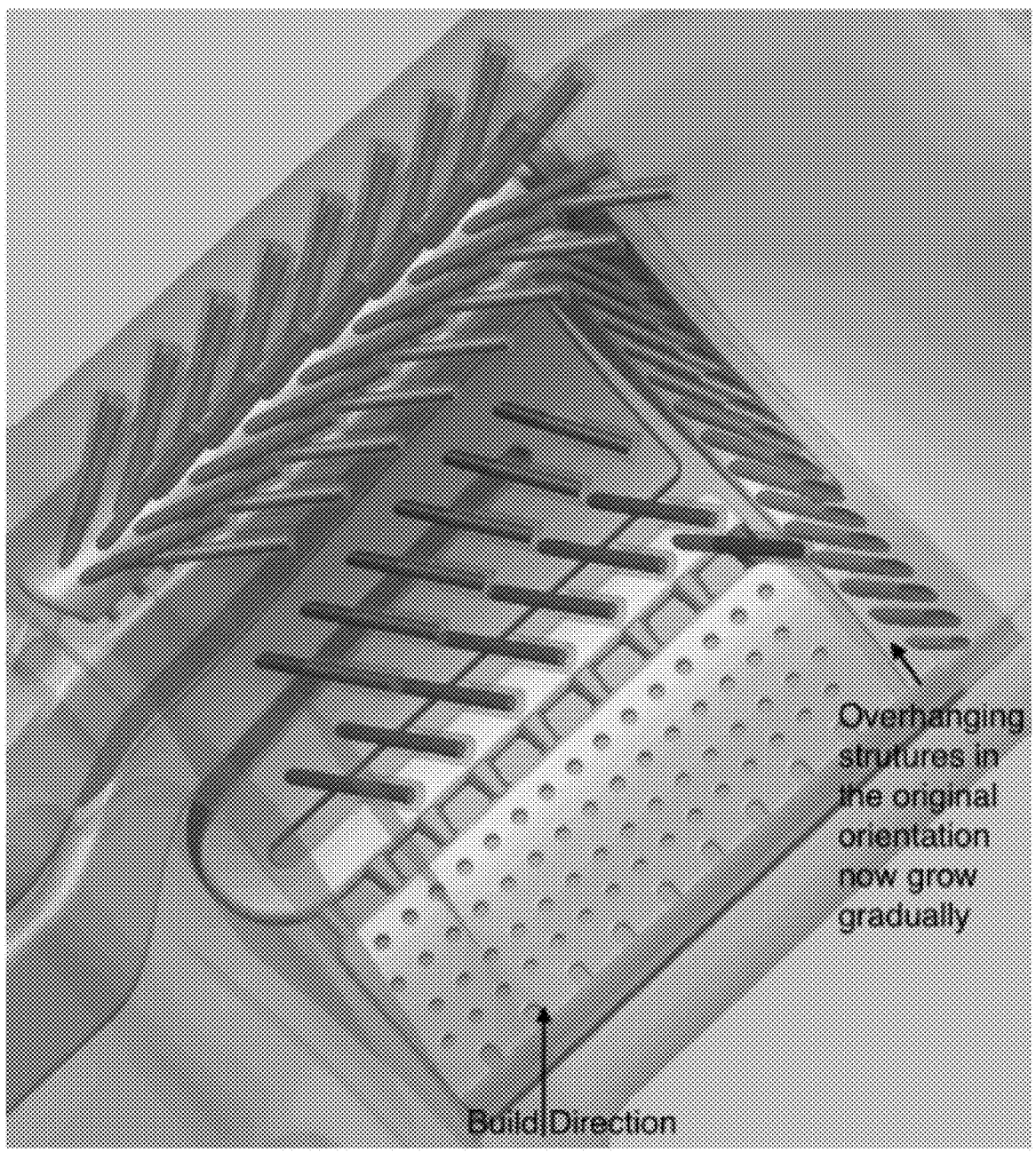
FIG. 69 illustrates a build orientation that reduces overhangs observed in the original orientation.
Figure 70:
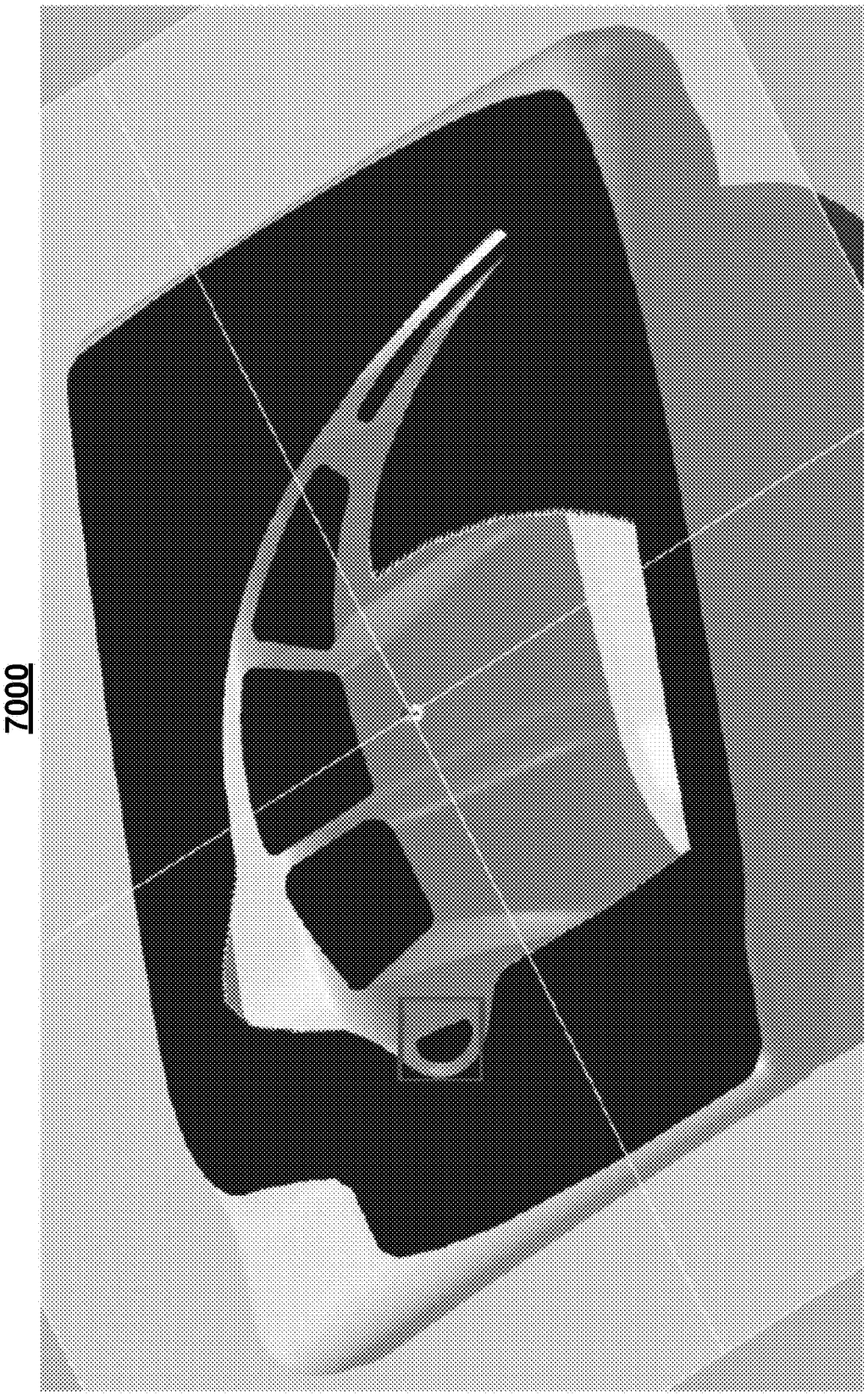
FIG. 70 illustrates a cross-section of the part as the base of the leading edge cavity is being built.

The issue of floating islands while building complex geometries like turbine molds using the LAMP process is a significant one. In most simple geometries, an orientation may be found which does not result in any floating islands. However, for the parts with the kind of complexity shown in FIG. 67, it is not typically possible to find any occurrence that will eliminate the formation of floating islands. Even in the orientation that was shown in FIG. 69, which minimizes overhanging structures, floating islands form when the bases of the mid-chord serpentine and the leading edge cavity begin to form. FIG. 69 illustrates a build orientation that reduces overhangs observed in the original orientation. FIG. 70 illustrates a cross-section of the part as the base of the leading edge cavity is being built. The feature highlighted by the box clearly does not have any previously built feature supporting it.

When such unsupported features are cured, since there is no feature beneath it to adhere to, the shrinkage stresses have a greater effect on the feature and it curls up. Also, the re-coating process imparts significant shear stresses on the layers as it sweeps through the build area. As the blade sweeps over with a layer of viscous ceramic loaded suspension underneath it, a boundary layer is formed which imparts drag forces on the platform. The suspension was observed to be non-Newtonian but ignoring this fact, a rough estimate of the shear forces may be made. The viscosity of the slurry in the velocity ranges of the re-coating process was measured to be in the 400-450 centi poise range. The re-coating blade travels a distance of 26 cm in 6 seconds and is at height of 200_m above the build platform. At this speed and viscosity, assuming Newtonian behavior and a linear velocity profile, the shear stresses imparted on the part will be of the order of 100 Pa. Due to such high shear forces and the curling up effect of unsupported features due to shrinkage stresses, any unsupported features formed will be swept away by the re-coating arm causing the build to fail.

Hence support structures are necessary for any geometries that produce floating islands during a build, in order to obtain successful parts. However, as discussed previously, all of the geometric features, supports or otherwise are enclosed within the outer shell of an integrally-cored mold and removing these supports post-build is impossible. This results in additional unintended features in the cast blades which might adversely impact the designed cooling performance of the molds. This issue of floating islands is probably the only limitation potentially preventing the LAMP process from building blade designs of any arbitrary complexity.

However, it must be noted that the current blades are designed for manufacture through conventional investment casting process capabilities and constraints. As the LAMP process enters into full production and the castability of the parts produced through the process is successfully demonstrated, there is immense scope for advanced mold design specific to this technology. The work presented in this thesis is a first step towards this goal of design for manufacturing specific to the needs of the LAMP process.

The final scenario that requires supports is the case of part toppling over due to its own weight as the part is being built. In the case of the LAMP process, requirements of supports of this kind is quite weak. The parts are attached to the build platform quite rigidly with the help of a mesh structure. The parts are built with a conformal scaffold surrounding them. Therefore, as the parts are built, there is scaffolding all around in the build volume thus eliminating the possibility of the parts toppling over due to gravitational moments.

Thus, in retrospect, of all the scenarios requiring support structures, only the scenario resulting in floating islands poses a serious threat for part failures in the case of LAMP process and therefore needs to be addressed further. Details on the methodology followed for algorithmically identifying the geometries that result in floating islands from input CAD models and the methodology for creating support structures are given next.

In order to optimally position support structures, first there needs to be a method of algorithmically identifying the geometries which result in these floating islands during a part build. The details of such an algorithm developed for the purpose of identifying floating islands for a part being built in a given direction is given in this section. ACIS kernel was again used for implementing the algorithm and hence it works directly on CAD models. The pseudo code for this procedure is shown in Algorithm 16.

---

Algorithm 16 Identifying Floating Islands.

1: wig ← the given CAD part
2: layerThickness ← layer thickness used in the build
3: $(X_{min}, Y_{min}, Z_{min})$ ← compute minimum extents of the part
4: $(X_{max}, Y_{max}, Z_{max})$ ← compute maximum extents of the part

| Algorithm 16 Identifying Floating Islands. |
| --- |
| 5:   for each Z location along the height of the part do |
| 6:       //compute slice at height Z |
| 7:       $(X_{bmin}, Y_{bmin}, Z_{bmin})_1 \leftarrow (X_{min}, Y_{min}, Z - \text{layerThickness})$ |
| 8:       $(X_{bmax}, Y_{bmax}, Z_{bmax})_1 \leftarrow (X_{max}, Y_{max}, Z)$ |
| 9:       block1 ← a cuboid created with extents specified by (Xbmin; Ybmin;Zbmin)1 & (Xbmax; Ybmax;Zbmax)1 |
| 10:      3DSlice1 ← geometry obtained form the intersection of wig and block1 |
| 11:      //compute slice at height Z + layerThickness |
| 12:      $(X_{bmin}, Y_{bmin}, Z_{bmin})_2 \leftarrow (X_{min}, Y_{min}, Z)$ |
| 13:      $(X_{bmax}, Y_{bmax}, Z_{bmax})_2 (X_{max}, Y_{max}, Z + \text{layerThickness})$ |
| 14:      block2 a cuboid created with extents specified by $(X_{bmin}, Y_{bmin}, Z_{bmin})_2$ & $(X_{bmax}, Y_{bmax}, Z_{bmax})_2$ |
| 15:      3DSlice2 ← geometry obtained from the intersection of wig and block1 |
| 16:      //check for floating islands in 3DSlice2 |
| 17:      for each disconnected lump i in 3DSlice2 do |
| 18:          for each disconnected lump j in 3Dslice1 do |
| 19:              check for intersection between lumps i & j |
| 20:          end for |
| 21:          if no intersections found then |
| 22:              lump i in 3DSlice2 is a floating island |
| 23:          end if |
| 24:      end for |
| 25: end for |

The given part is first loaded into the algorithm and its minimum and maximum extents are computed. At each Z location along the height of the part, a cuboid denoted by block1 with a cross-sectional area equal to the cross-sectional area of the bounding box of the part and a thickness equal to layer thickness is created. A solid body intersection is computed between the part denoted by wig and block1 to yield a three dimensional slice denoted by 3DSlice1 at height Z of the part. Similarly, a three dimensional slice denoted by 3DSlice2 at height Z+layerThickness is computed. At the height corresponding to the floating island illustrated in FIG. 70, the two slices computed using the previous steps are illustrated in FIG. 71. (a) and (b) of FIG. 71 illustrate 3D slices of successive layers at the location corresponding to the floating island shown in FIG. 70. For illustrative purposes, slices separated by a few layers are shown and hence the apparent large overhangs. For successive slices, the overhang will be very small but so is the floating feature generated and hence it will be difficult to perceive.

Although, in the Figure, the slices look two dimensional because of very thin layer thickness (100_m), they are in fact three dimensional because of the way they were created. Each of the disconnected solid regions in these slices are stored as a lump in the ACIS data structure. In order to determine if there are any floating islands in the second slice, each of the lumps of this slice is checked for intersection with each of the lumps of the first slice. If there exists a lump in the second slice, which does not intersect with any of the lumps in the first slice, it is classified as a floating island and support structures need to be created. By repeating this sequence of operations for every successive pair of slices along the length of the part, all the features that lead to floating islands during a part build may be identified. This operation may be repeated for different orientations of the part, and the orientation that yields the minimum number of floating islands may be selected. The details of the algorithm to generate supports for the floating islands identified using this approach is presented next.

In most of the previous work presented, supports were generated only along the build direction which either extend all the way down to the base of build platform or until the next immediate geometric feature. This approach does not work for LAMP as all of the supports will be completely encapsulated by the shell and thus cannot be removed. Hence, creating long slender supports all the way to the base will completely disrupt the intended cooling designs. Instead, the approach presented here, tries to connect the identified floating island to the immediate surrounding geometry with minimal support length to have minimal impact on the intended design. Note that, the geometries that these support structures connect to need not be directly underneath the floating island along the build direction unlike the previous approaches presented. The pseudo code for such an approach is shown in Algorithm 17.

| Algorithm 17 Support Structure Generation. |
| --- |
| 1: origin ← centroid of the floating island that needs to be supported |
| 2: maxTiltAngle ← maximum tilt angle with which a support may be built |
| 3: maxCurvature ← maximum curvature allowed at the point of contact |
| 4: n ← the number of orientations user wants to output |
| 5: r ← nominal radius of the support |
| 6: candidateOrientationList ← discrete orientations within the "cone" underneath origin |
| 7: for each orientation i in candidateOrientationsList do |
| 8:     shoot a ray from origin to the surrounding geometry of the part |
| 9:     check for smoothness of the surface at the point of intersection with the ray |
| 10:    curvature ← local surface curvature at intersection point |
| 11:    if surface is smooth and curvature < maxCurvature then |

| Algorithm 17 Support Structure Generation. |
|---|
| 12:          support:direction ← orientation i |
| 13:          support:length ← length of the ray in this direction |
| 14:          list ← support |
| 15:     end if |
| 16: end for |
| 17: sort the identified support orientations in list w.r.t length in ascending order |
| 18: for i:= 1 to n do |
| 19:      retrieve $i^{th}$ orientation from the sorted orientations in list |
| 20:      sweep a circle of radius r from origin along the ray in orientation i |
| 21:      output the part |
| 22: end for |

The algorithm takes in four parameters as input as follows:

(1) The centroid of the floating island at which supports need to be generated denoted by origin.

(2) The maximum tilt at which supports may be built denoted by maxTiltAngle.

(3) The number of potential orientations that the user wants to output denoted by n.

(4) The nominal radius of the supports as specified by the user denoted by r.

First, a list of possible candidate orientations along which a support may be built is created by discretizing the "cone" underneath origin with a vertex angle equal to maxTiltAngle. For each of these candidate orientations, rays originating from origin are generated and their intersections with the part geometry is computed. At each of these points of intersection, the smoothness of the surface is measured. If local surface curvature is high, there is a good possibility that it corresponds to a cooling feature and this orientation is abandoned. Likewise, if the intersection point is near to the boundary of two or more surfaces and the adjoining surfaces do not maintain continuity, this orientation is abandoned as well as it was observed from experience that shrinkage stresses accumulate at such corners and cause the supports or other slender structures to fail. After eliminating orientations that connect to non smooth surfaces in this manner, the rest of orientations are stored as potential directions for support propagation. The lengths of the rays originating from origin in each of these potential directions are computed and the list of potential orientations is then sorted in the ascending order w.r.t their lengths. For the first n orientations in the sorted list, cylindrical supports with radius r are created by sweeping a circular cross-section along the ray until it connects to the part.

Figure 72:
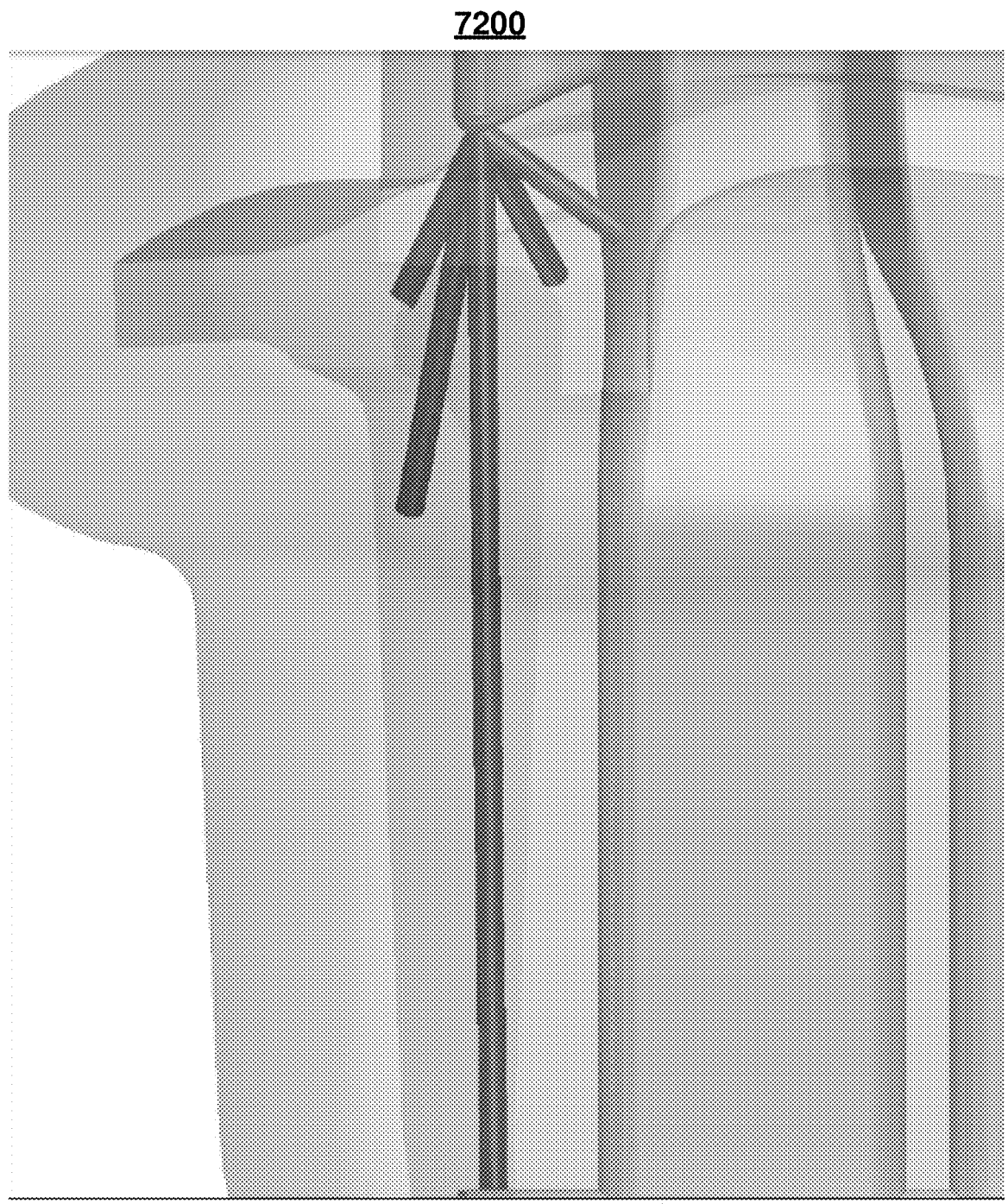
FIG. 72 illustrates various supports generated on the sample HP blade shown in FIG. 67 using this method.

FIG. 72 illustrates various supports generated on the sample HP blade shown in FIG. 67 using this method. As may be seen, of the various candidate orientations, many of the orientations are discarded because they either intersect the surface at regions of high curvature or are very long. The support structure highlighted in green is the one that is preferred as it is the shortest and also intersects the part at a low curvature region.

In many of the instances experienced in parts of the form shown in FIG. 67, the features that lead to floating islands grow continuously (i.e, grow from a small area floating region to a larger feature) and hence from past experience it is known that only one support of the type highlighted in green in FIG. 72 is enough. FIG. 72 illustrates supports generated by the algorithm. However, when the features abruptly result in large floating islands, this algorithm may easily be extended for producing multiple supports. For supporting large floating features, an additional parameter that indicates the maximum amount of overhang a particular support feature of a given size may support needs to be incorporated in to the algorithm. Based on this parameter, the area of the large floating island may be sub divided into smaller regions and the procedure may be applied for each of the smaller regions with an additional constraint to produce non intersecting supports.

As was previously noted, any support structures incorporated into the mold to yield successful LAMP builds are completely encapsulated within a conformal shell. Hence there is no way to remove these structures from the mold post build and this will in turn result in additional unintended features in the cast blades. Although this is a limitation of the LAMP process, it must be noted that the current blades were designed with the conventional manufacturing techniques in view and hence there is immense scope for design for manufacturing specific to the needs of the LAMP process. In order to demonstrate this, the performance analysis of the design resulted by the incorporation of a sample support structure like the one highlighted in FIG. 72 is given in this section. Intuitively, the addition of a support feature like that will reroute some of the cooling air from the mid chord serpentine channel to the leading edge cavity. In doing so, it might not only deprive some of the upper impingement cooling holes but also stymie the lower most impingement jets at the leading edge. Also, because of the cooling air rerouting, there might not be enough mass flow left in the mid chord serpentine to cool all the other features like the tip cap etc. it supplies cooling air to. Hence in order to investigate this, the flow and thermal analysis of this support feature was performed. The details of these simulations and the results obtained will be discussed below.

Figure 73:
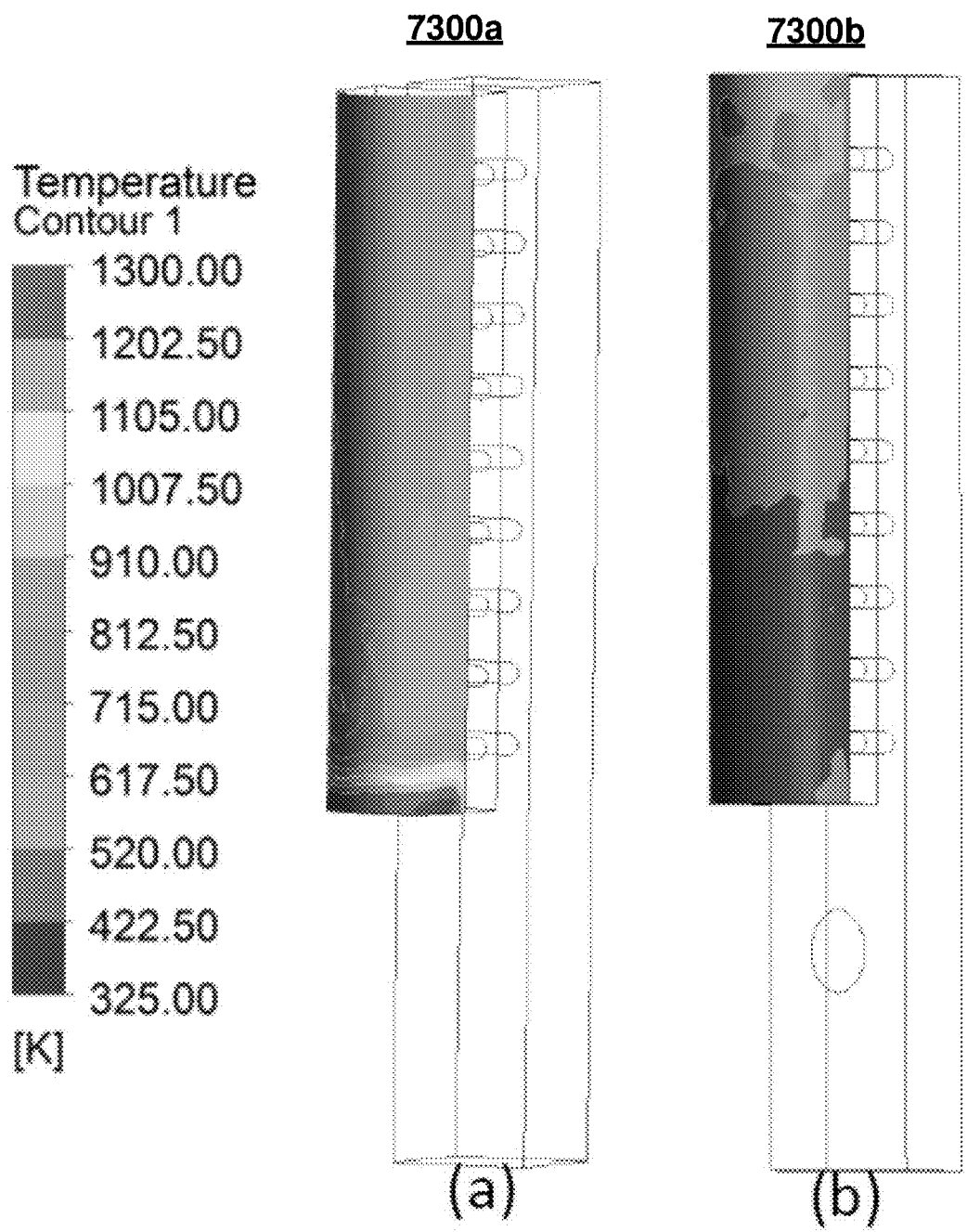
FIG. 73 illustrates a temperature profile obtained on the internal wall of a leading edge with and without a support structure.
Figure 74:
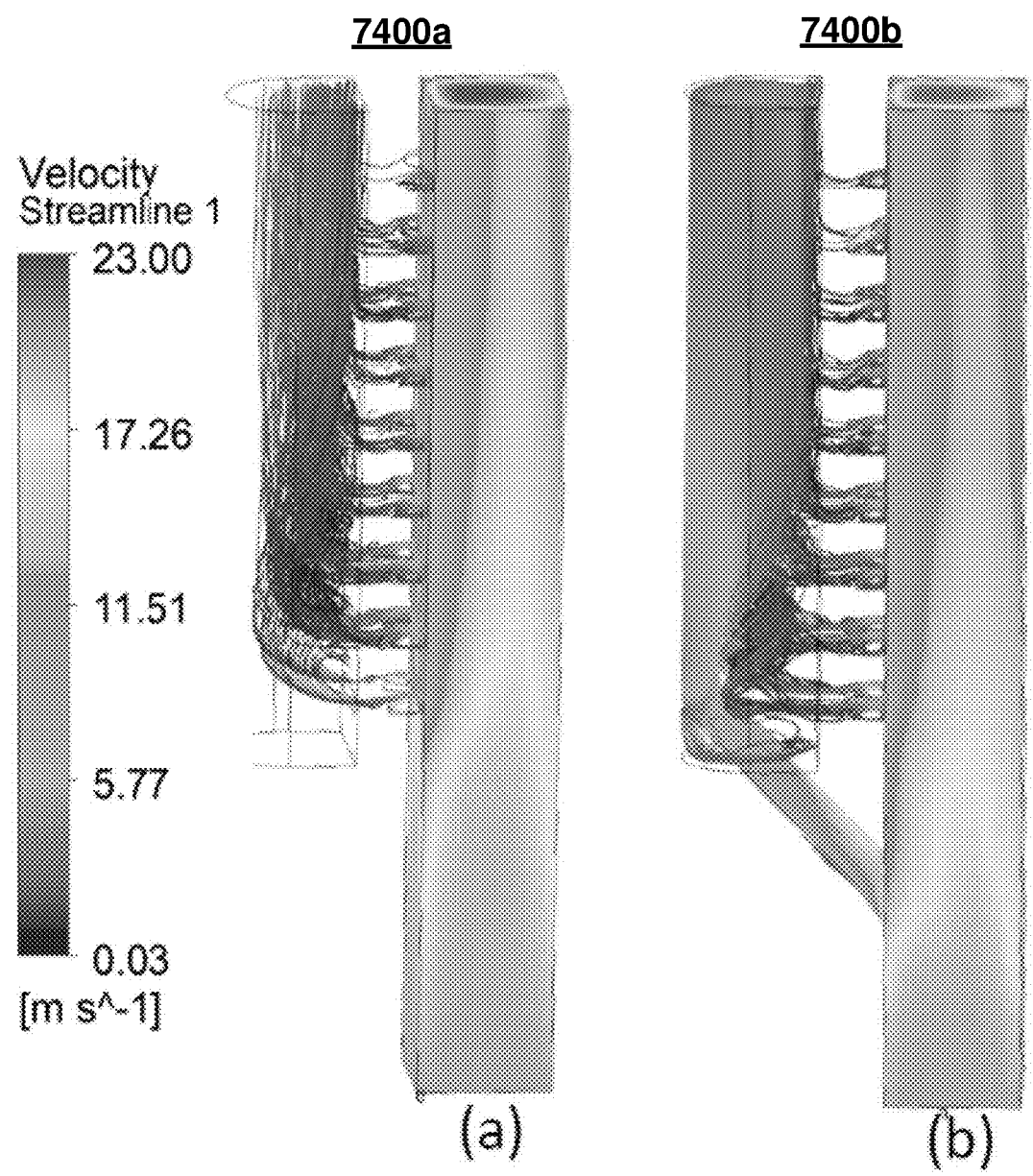
FIG. 74 illustrates velocity streamlines in internal cavities.

In order to simply the meshing process and reduce computational times, the geometry was simplified to a representative but more amenable one. A constant representative heat flux boundary condition of 25 MW/m$^2$ was applied to the leading edge wall. A constant velocity of 20 m/s was applied as the input flow condition at the base of the serpentine channel with a turbulence intensity of 5%. The simulation was carried out to solve the reynolds averaged navier stokes equations and the thermal equation for the each of the cases corresponding to the native and modified (with support added) geometry. FIG. 73 illustrates a temperature profile obtained on the internal wall of a leading edge with and without a support structure. It may be clearly seen that, unlike what was expected, the temperature profile in the case of the support added is much lower than the case without a support. There is a hot spot at the lower region of the leading edge for the case without a support and the addition of a support reduces the peak temperature occurring on the leading edge wall significantly. FIG. 74 illustrates velocity streamlines in an internal cavities. It may be seen that in the case without the support, the flow streams from the lower most impingement jets are unable to reach bottom most region of the leading edge cavity wall which is not the case for the supported geometry. It may also be seen that, unlike what was intuitively expected, the support structure does not stymie the flow of the lower impingement may be clearly seen that, unlike what was expected, the temperature profile in the case of the support added is much lower than the case without a support. There is a hot spot at the lower region of the leading edge for the case without a support and the addition of a support reduces the peak temperature occurring on the leading edge wall significantly. (a) and (b) of FIG. 74 show the velocity streamlines of the flow to give a better understanding of temperature results obtained. It may be seen that in the case without the support, the flow streams from the lower most impingement jets are unable to reach bottom most region of the leading edge cavity wall which is not the case for the supported geometry. It may also be seen that, unlike what was intuitively expected, the support structure does not stymie the flow of the lower impingement jets and neither does it starve any of the upper impingement jets from cooling air.

Instead it increases the mass flow from the very bottom of the leading edge cavity thereby providing better cooling overall. Also, unlike what was initially expected, the addition of the support structure does not significantly reduce the mass flow in the serpentine passage which in turn might adversely affect the cooling of other features like the tip cap. The mass flow rate difference at the exit of the serpentine channel for the two cases was found to be very small (0.145 gm/s without support versus 0.137 gm/s with support) and is not expected to lead to any adverse heating of blade regions elsewhere.

Thus, in this instance it is alright to incorporate this support feature. Of course, in a real world situation, much further analysis will be done to completely understand the effects of the addition of a new feature like this. The main intent for this analysis was to give a better appreciation of the immense scope that exists for multi functional support design (multi functional in the sense that it not only aids in successful LAMP builds but also improves blade cooling) specific to the needs of the LAMP process.

Large Area Maskless Photopolymerization (LAMP) is a disruptive additive manufacturing technology that has been developed for fabricating ceramic molds for investment casting of high pressure turbine blades. The work presented herein addressed the digital data processing and computational needs of the LAMP process. Several data processing algorithms like direct slicing, STL slicing, post-processing algorithms like error checking, part placement and tiling etc. that enable the LAMP process were presented. Several computational schemes to improve the part quality like adaptive slicing, gray scaling, and cure width studies for image compensation were also discussed. Moreover, CAD data pre-processing algorithms, especially the identification of unsupported features and the generation of internal support structures suitable for the fabrication of integrally-cored molds using LAMP process were also presented. Finally, some novel cooling schemes that are not currently manufacturable but provide improved performance over the conventional schemes are presented. Such schemes may be fabricated using the LAMP process thus providing a glimpse of the potential for LAMP technology to disrupt the state-of-the-art in the investment casting of HP turbine blades. A summary of the unique contributions made in this thesis and the scope for future research along these lines is given in this chapter.

A summary of the unique contributions made herein are listed here: (a) An error-tolerant direct slicing algorithm was presented using the ACIS kernel. While previous direct slicing approaches using the ACIS kernel were reported in literature, they all propose direct slicing as a cure for all the ills inherent in STL slicing. They claim that direct slicing will be free of errors unlike in the case of STL slicing. It was observed in this thesis that this not necessarily true. Direct slicing is free of errors only when the given geometry is simple. When the geometries are complex like the ones typically found in HP turbine blades, the CAD parts are prone to errors from two sources: 1) modeling errors on the part of the designer and 2) due to CAD translations required for direct slicing. The direct slicing algorithm presented in this thesis is tolerant to such errors and is able to produce error-free slices.

(b) For STL slicing, two novel approaches were presented: 1) A new way for reconstructing the topology information of STL meshes by extending the corner table data structure is presented. Using this topology information, STL meshes were converted to CAD files thus aiding in error correction, geometric property (volume, center of mass etc.) evaluation and modification of these meshes. 2) An extremely fast STL file slicing algorithm was implemented. Previous STL slicing algorithms reported in the literature use some sort of facet grouping strategy before they may be sliced. It was shown that this only works as long as the input mesh sizes are small. When the mesh sizes get very large (of the order of 5-6 Million facets for turbine blade molds), these approaches take exceedingly long (of the order of 4 days) to process and slice the meshes. The approach presented in this thesis bypasses the facet grouping strategy completely thereby leading to several orders of magnitude improvement in processing time (from days to just minutes).

(c) A complete post-processing work flow including error checking, part layout and tiling, image level geometry modification, data compression etc. that is based on image data was presented. Most of the previously reported approaches work with vector data obtained from the slices.

(d) A new volume deviation based adaptive slicing approach for CAD files was presented. Previous approaches presented for adaptive slicing of CAD files include determining the layer thickness based on cusp height or area deviation approach. It was pointed out in this thesis that both of these approaches have their limitations. While cusp height is an absolute criterion and a good approach for STL files, implementing this on CAD parts involves large numbers of complex calculations at each slice location, making it difficult to scale for complex parts. Area deviation on the other hand does not take the surface geometry into consideration thus seriously limiting its capability.

(e) A novel gray-scaling approach was presented to reduce the stair stepping effect on surfaces whose normal vectors point downward towards the base of the build. Previous gray scaling approaches reported in the literature either have not investigated or reported the effects of gray scaling on the curing characteristics of the material. Moreover, the material system used in the LAMP process is loaded with a high volume percentage of ceramic particles thereby making it radically different from the material systems reported in the literature for gray scale studies. The thesis work done by a previous member of the Direct Digital Manufacturing lab involving the characterization of the effects of gray scale on the curing characteristics was incorporated into the data processing algorithms to generate gray scale images that reduce the stair stepping effects on surfaces with downward pointing normal vectors.

(f) Studies to understand the side curing behavior of the LAMP suspension were conducted and some surprising conclusions were presented. It was observed that the side curing was a function of feature size in the LAMP process. Any feature smaller than about 500 pixels exhibits a different side curing behavior that is dependent on its size. It was also observed that the cure width varies linearly with respect to energy dose in the LAMP process unlike the \quasi-Beer-Lambert" hypothesis reported in a previous study. These differences were attributed to the differences in the exposure set up and the means by which the cure width data was computed. Studies showing the variation of cure width with respect to light intensity, photoinitiator, and uv absorber concentrations were also presented.

(g) An algorithm for identifying floating islands in CAD files and generating support structures specific to the needs of the LAMP process was presented. Previous approaches mostly worked on STL meshes and they all produced straight supports aligned with the build direction that grow either from the base or from the geometry directly underneath the floating island. These approaches cannot be applied in LAMP for the fabrication of integrally-cored turbine blade molds as it is impossible to remove them post build. Hence a new approach wherein the floating islands were connected to immediate surrounding geometries is presented. The potential for design for manufacturing specific to LAMP was also discussed by means of evaluating the cooling performance of an illustrative support structure.

(h) Finally, novel cooling schemes that are currently impossible to fabricate using conventional manufacturing methods were presented. A few novel film cooling schemes have been analyzed using CFD and thermal analysis techniques and their improvements over conventional simple schemes were presented. This work gives a better appreciation of the potential LAMP offers in opening up new doors of design opportunities for building next-generation turbine blade designs.

Figure 75:
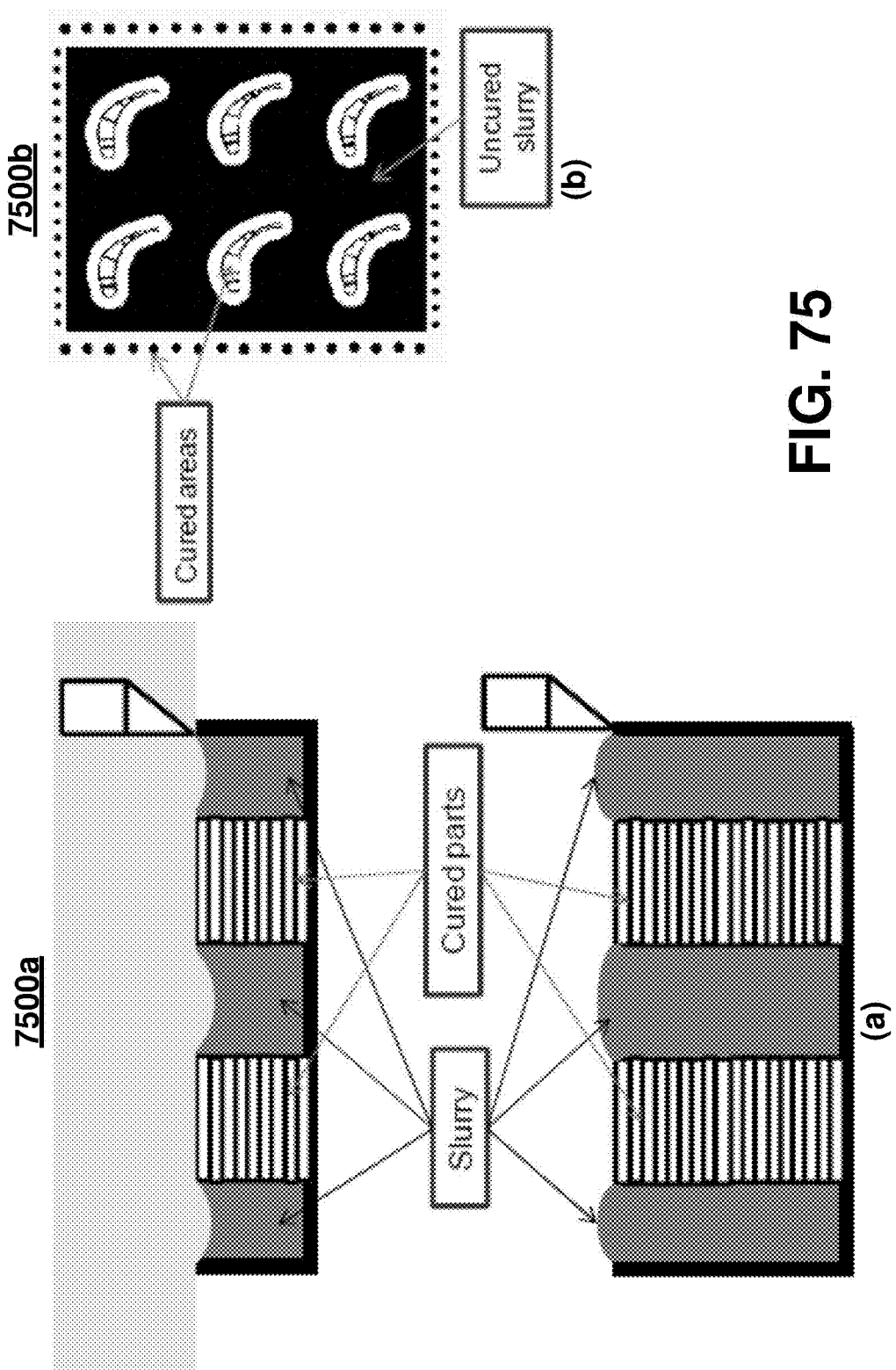
FIG. 75 illustrates a loss of build precision using a material recoating system having a single-edge recoater.

FIG. 75 illustrates a loss of build precision using a material recoating system having a single-edge recoater. In (a) and (b) of FIG. 75, the material recoating system having a single-edge recoater may cause starvation or doming, which may result in loss of build precision. In one example, for the first about ten to about twenty layers, a blade may have removed too much slurry and may form a crator shape in the slurry area around a mold. Further, after about forty to about fifty layers, a dome shape of slurry may be formed surrounding the mold parts. This doming problem may get worse as, for instance, more layers are added, which may cause a build of a part to fail.

Figure 76:
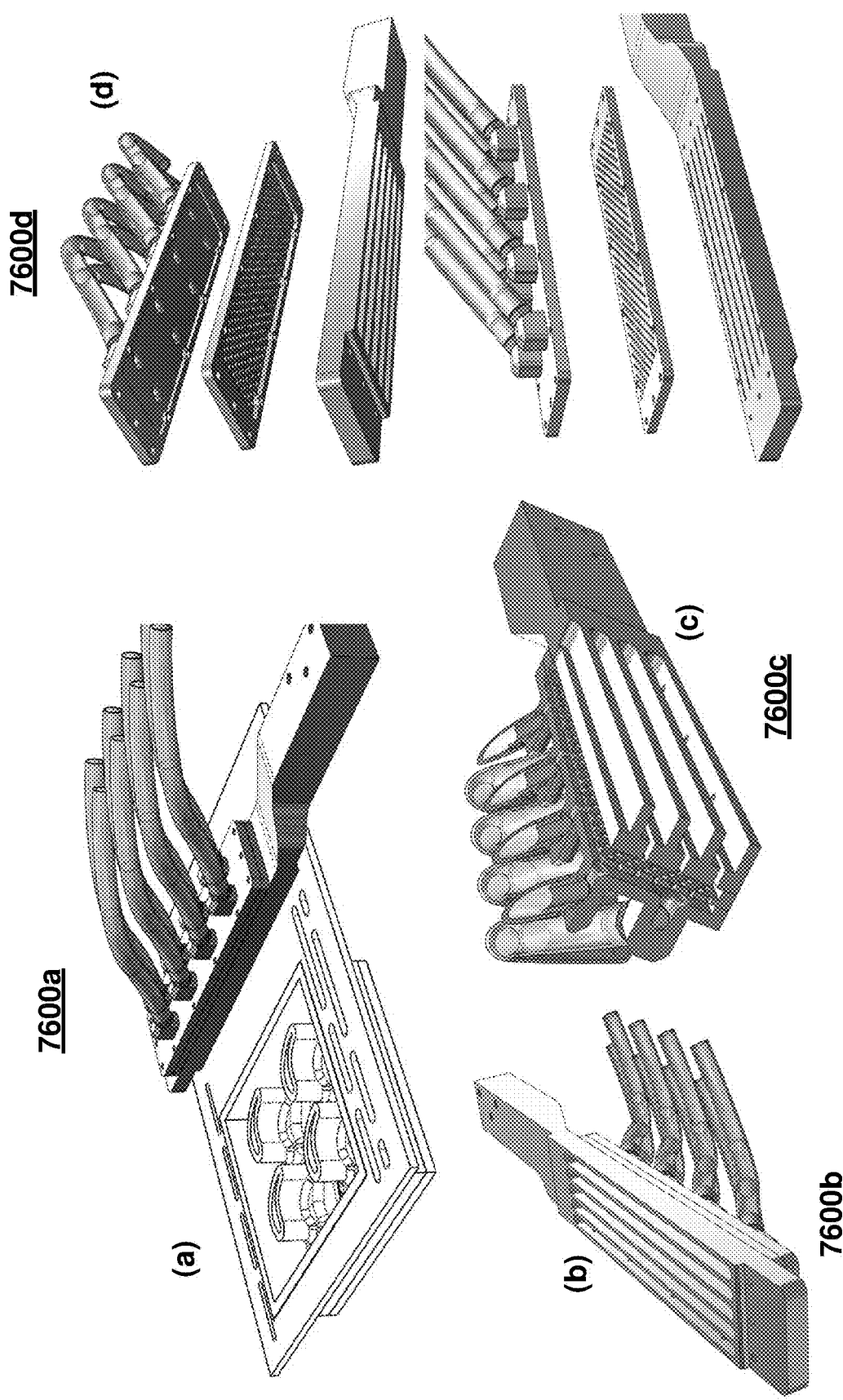
FIG. 76 illustrates one embodiment of a material recoating system having a multiblade recoater in accordance with various aspects described herein.

FIG. 76 illustrates one embodiment of a material recoating system 7600 having a multiblade recoater in accordance with various aspects described herein. The system 7600 may be configured as described in (a)-(d) of FIG. 76. Further, the system 7600a-7600d may be configured to address the starvation and doming issues described in (a) and (b) of FIG. 75, which may increase build precision of a part.

Figure 77:
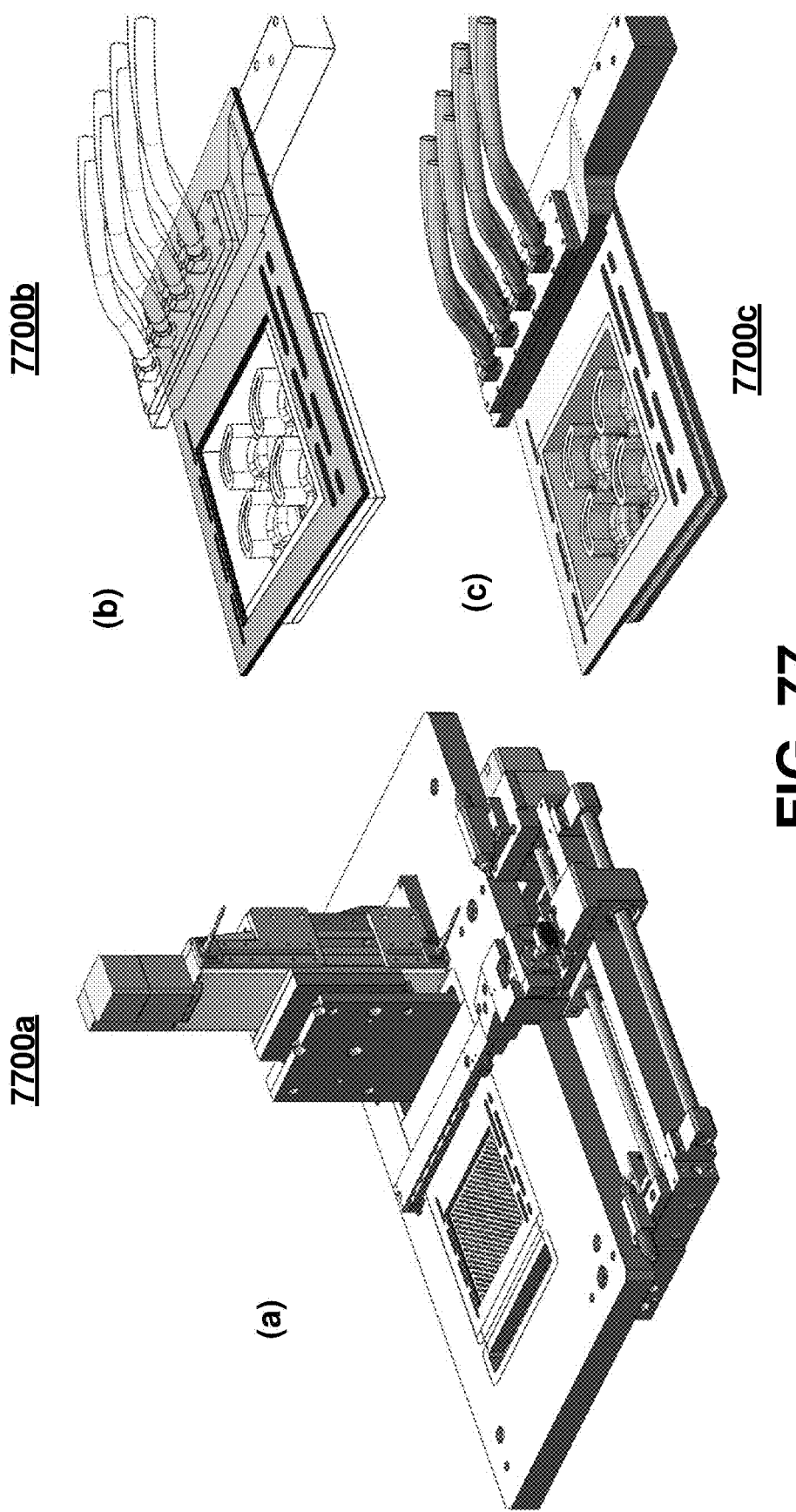
FIG. 77 illustrates one embodiment of a screen printing-style inking window pane in accordance with various aspects described herein.
Figure 78B:
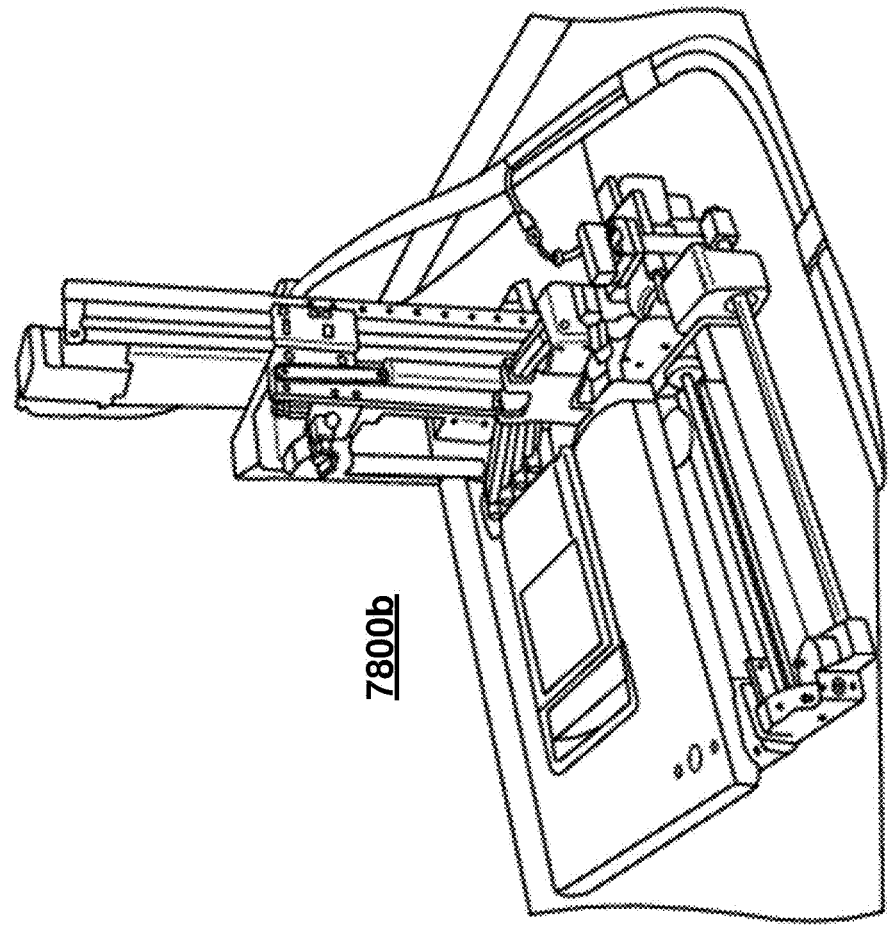
FIGS. 78a-78f illustrate one embodiment of a LAMP machine in accordance with various aspects as described herein.
Figure 78A:
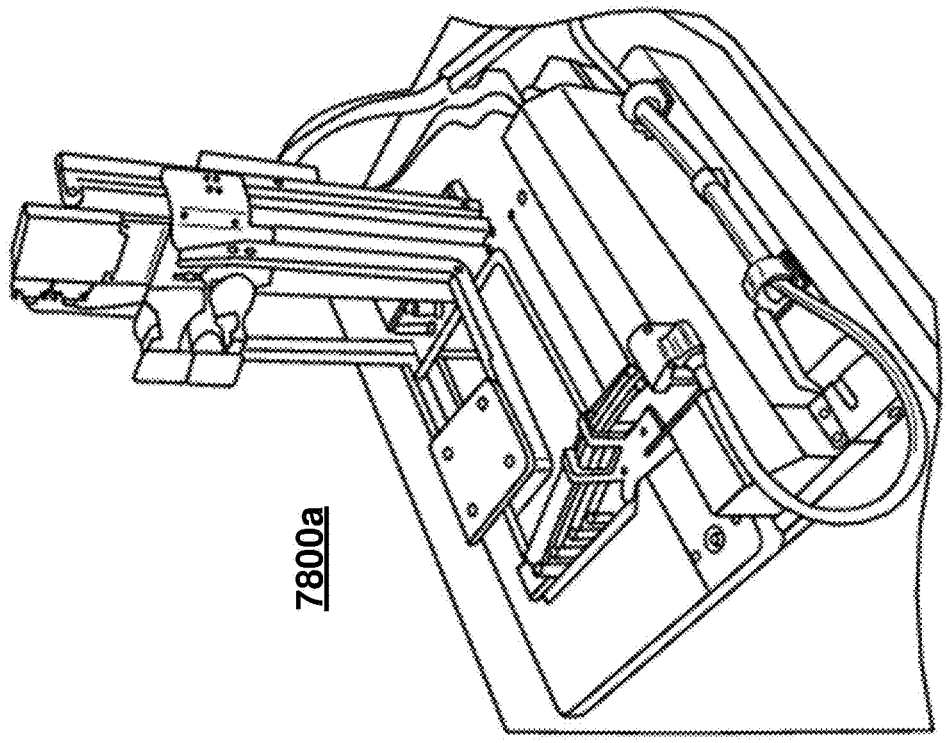
Figure 78D:
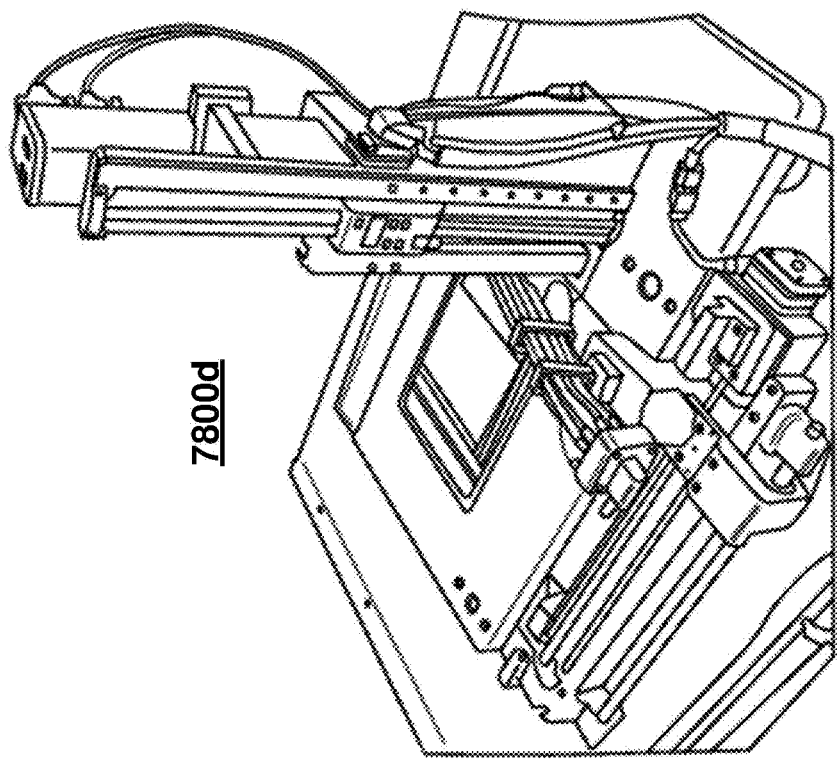
Figure 78C:
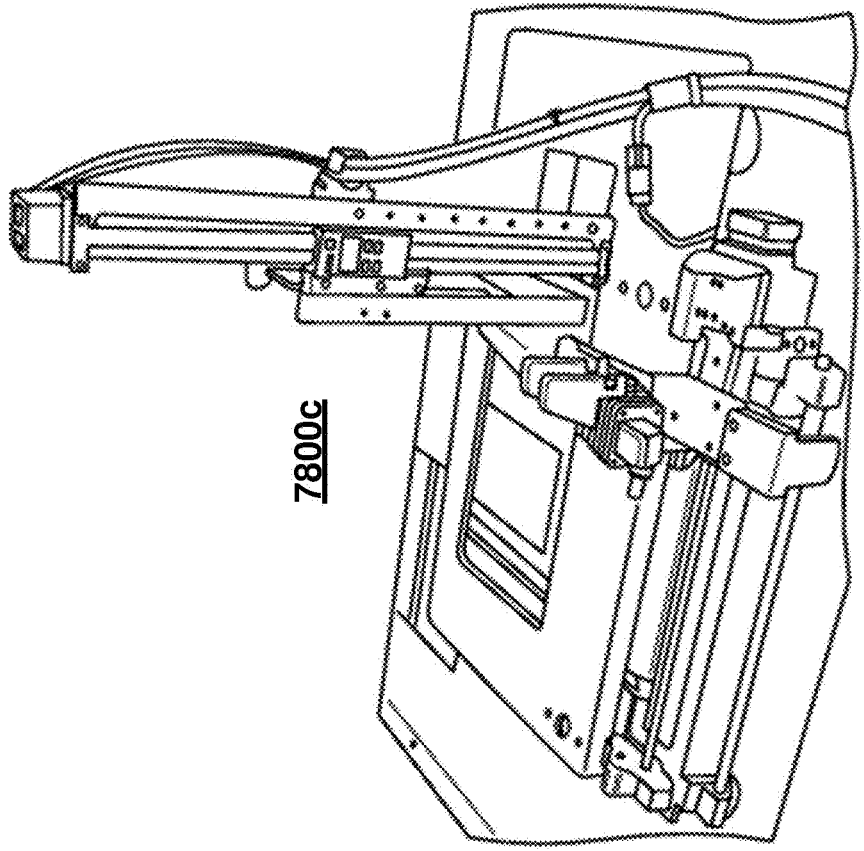
Figure 78E:
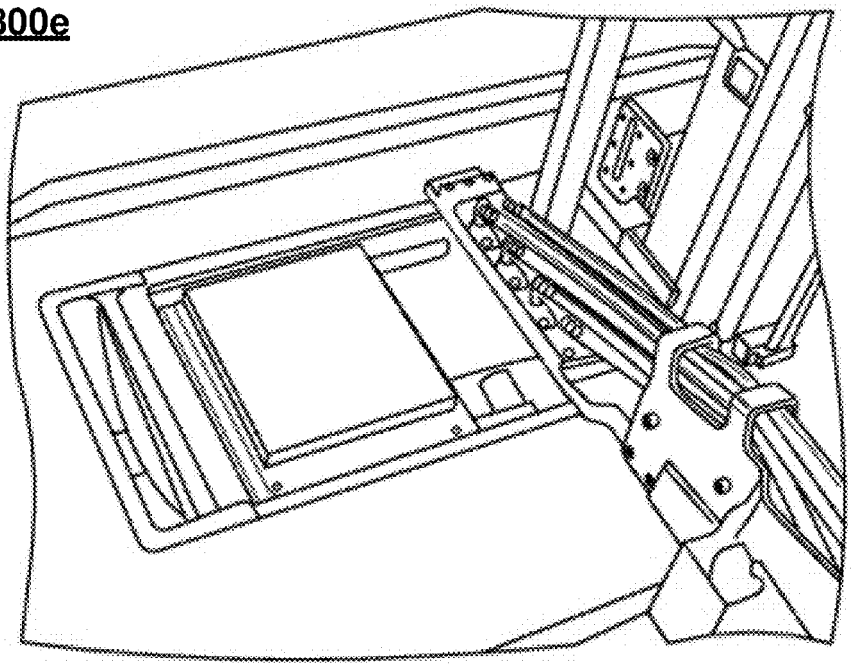
Figure 78F:
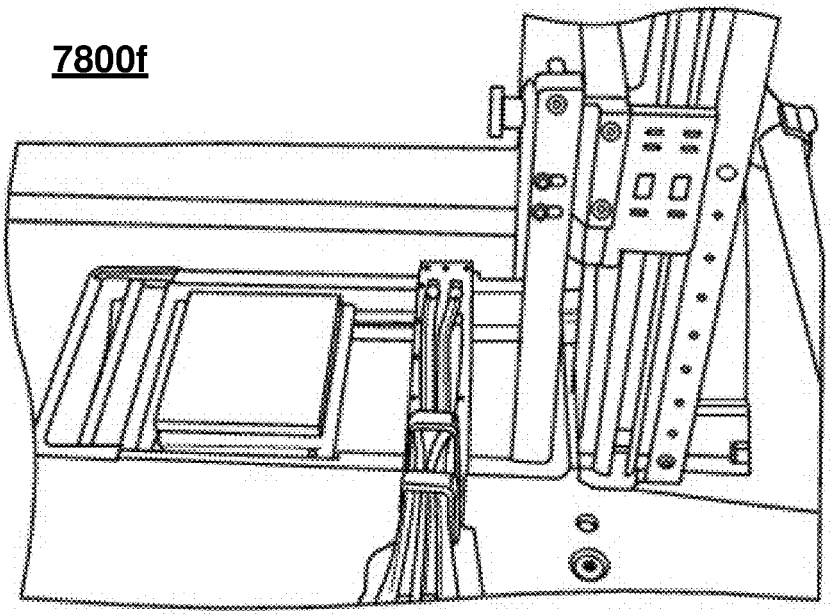

FIG. 77 illustrate one embodiment of a screen printing-style inking window pane in accordance with various aspects described herein. The screen printing-style inking window pane 7700a-7700c may be configured as described in (a)-(c) of FIG. 77.

FIGS. 78a-78f illustrate one embodiment of a LAMP machine in accordance with various aspects as described herein.

Figure 79:
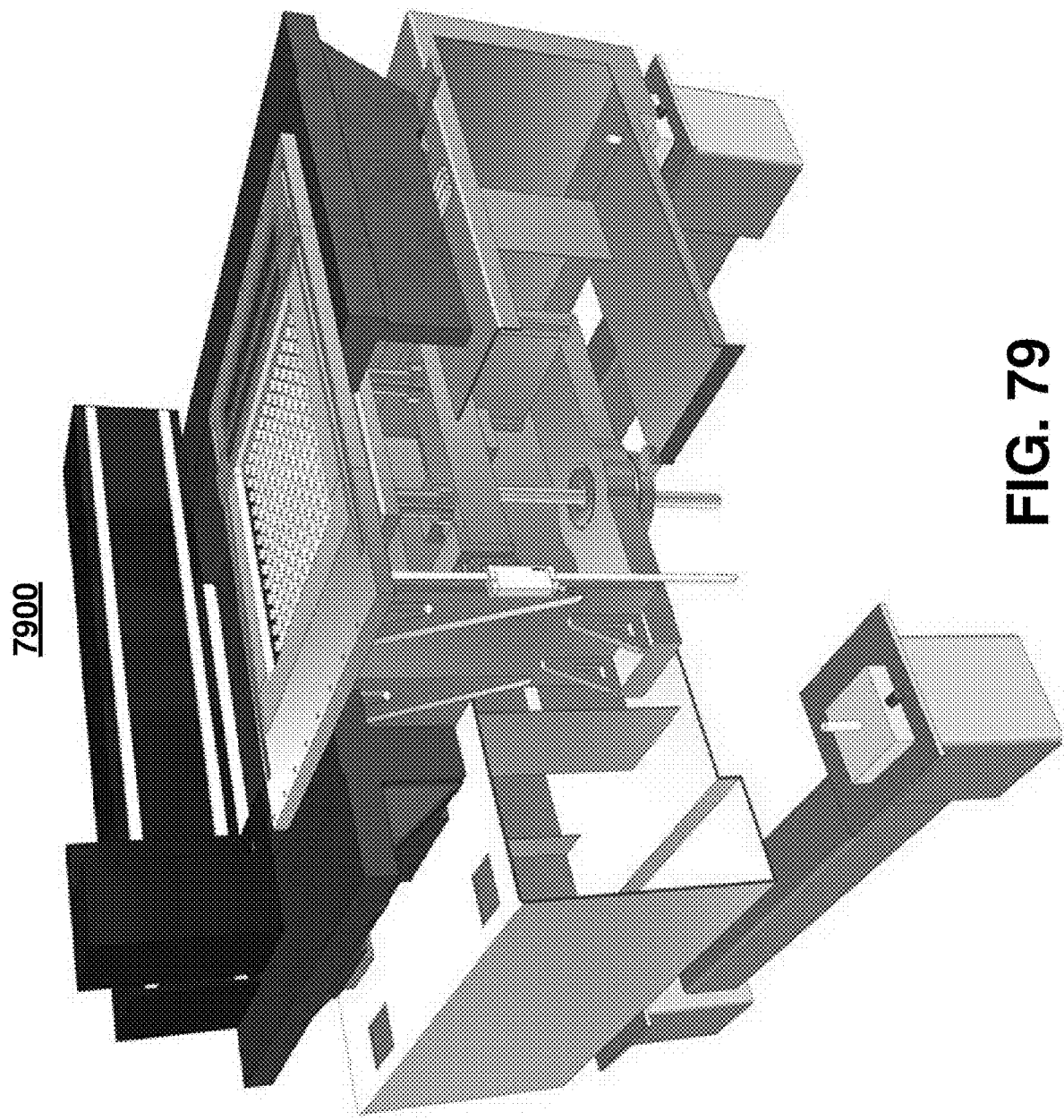
FIG. 79 illustrates one embodiment of a LAMP machine in accordance with various aspects described herein.

FIG. 79 illustrates one embodiment of a LAMP machine 7900 in accordance with various aspects described herein.

Figure 80:
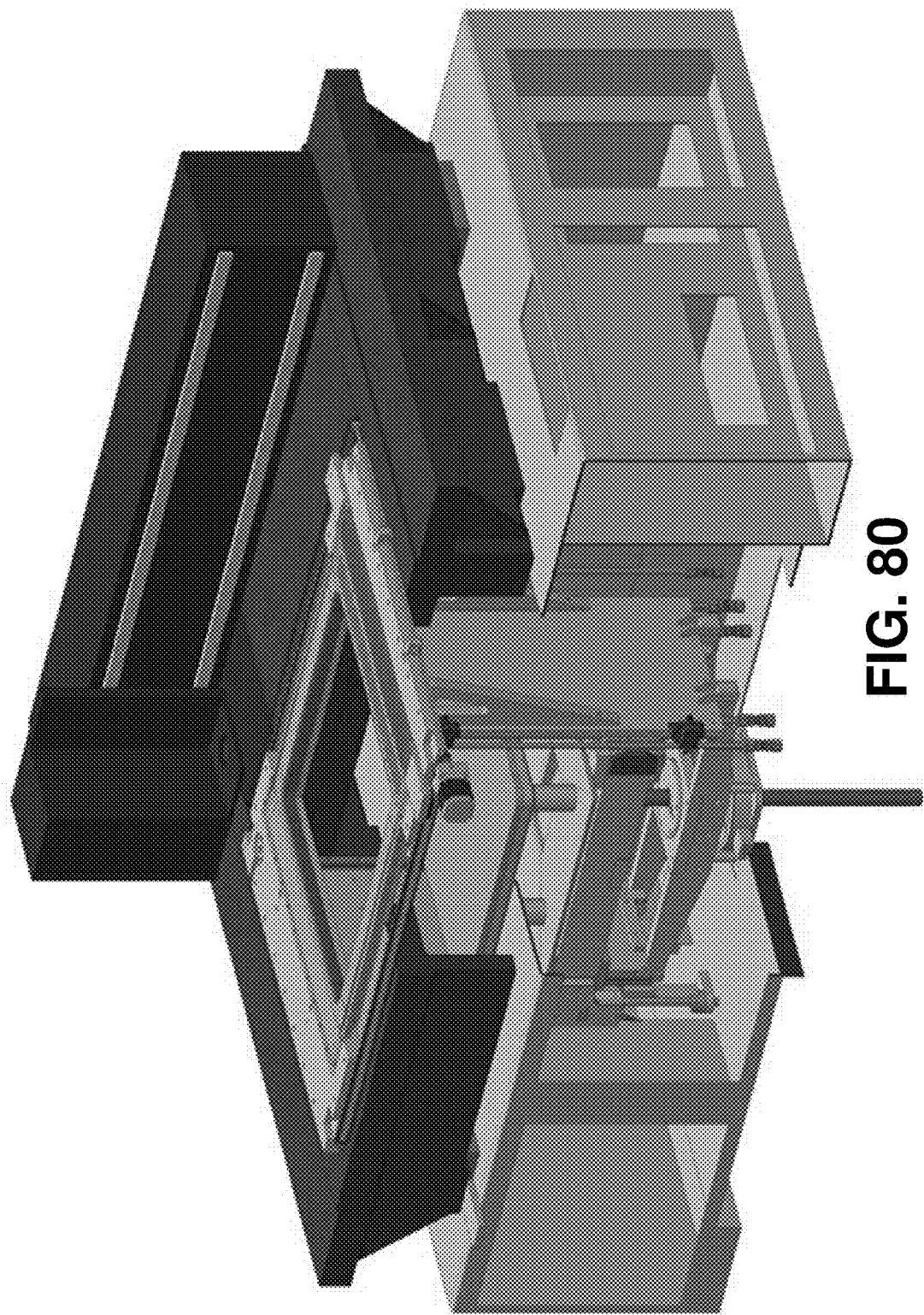
FIG. 80 illustrates one embodiment of a LAMP machine in accordance with various aspects described herein.

FIG. 80 illustrates one embodiment of a LAMP machine 8000 in accordance with various aspects described herein.

Figure 81:
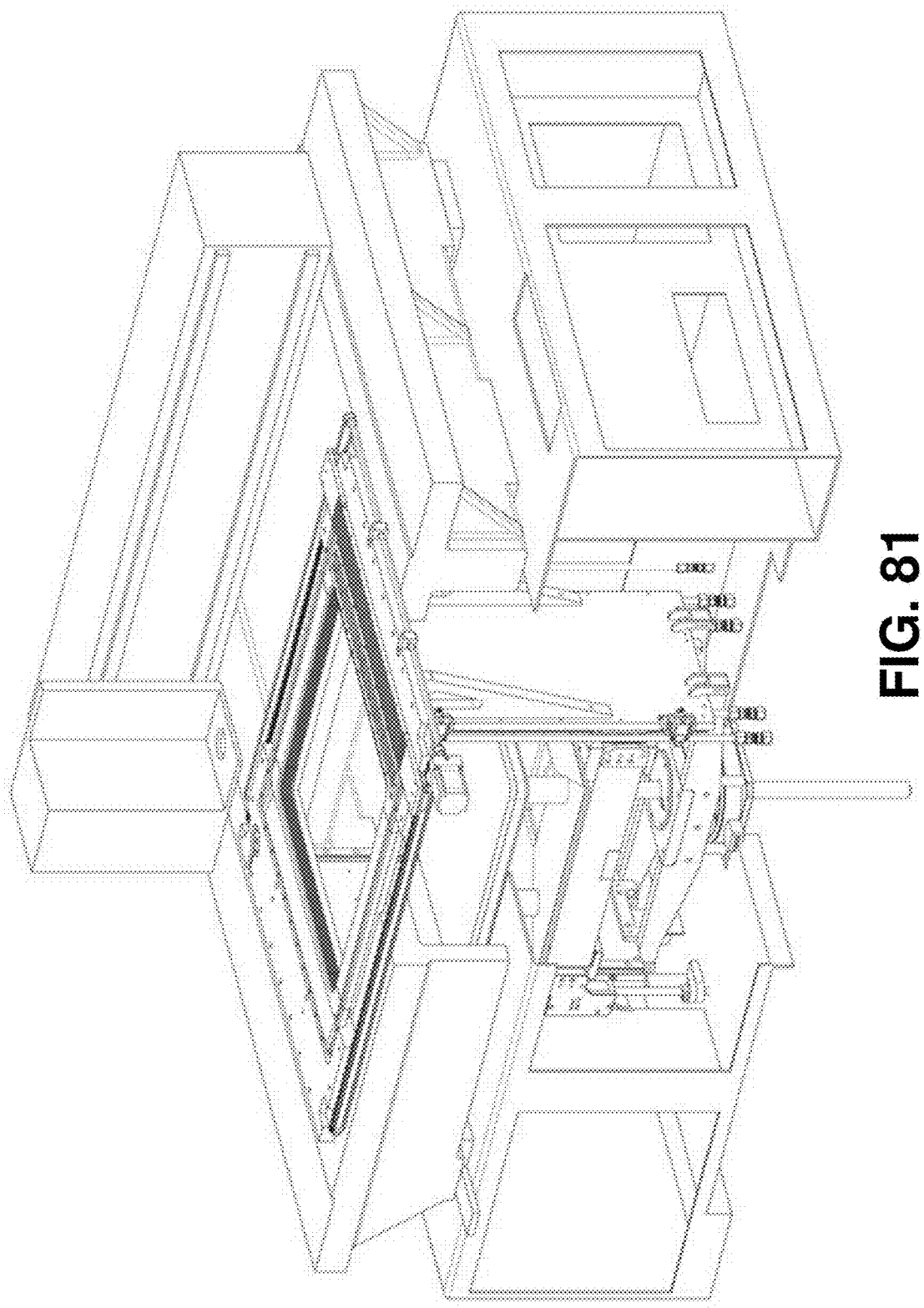
FIG. 81 illustrates one embodiment of a LAMP machine in accordance with various aspects described herein.

FIG. 81 illustrates one embodiment of a LAMP machine 8100 in accordance with various aspects described herein.

Figure 82:
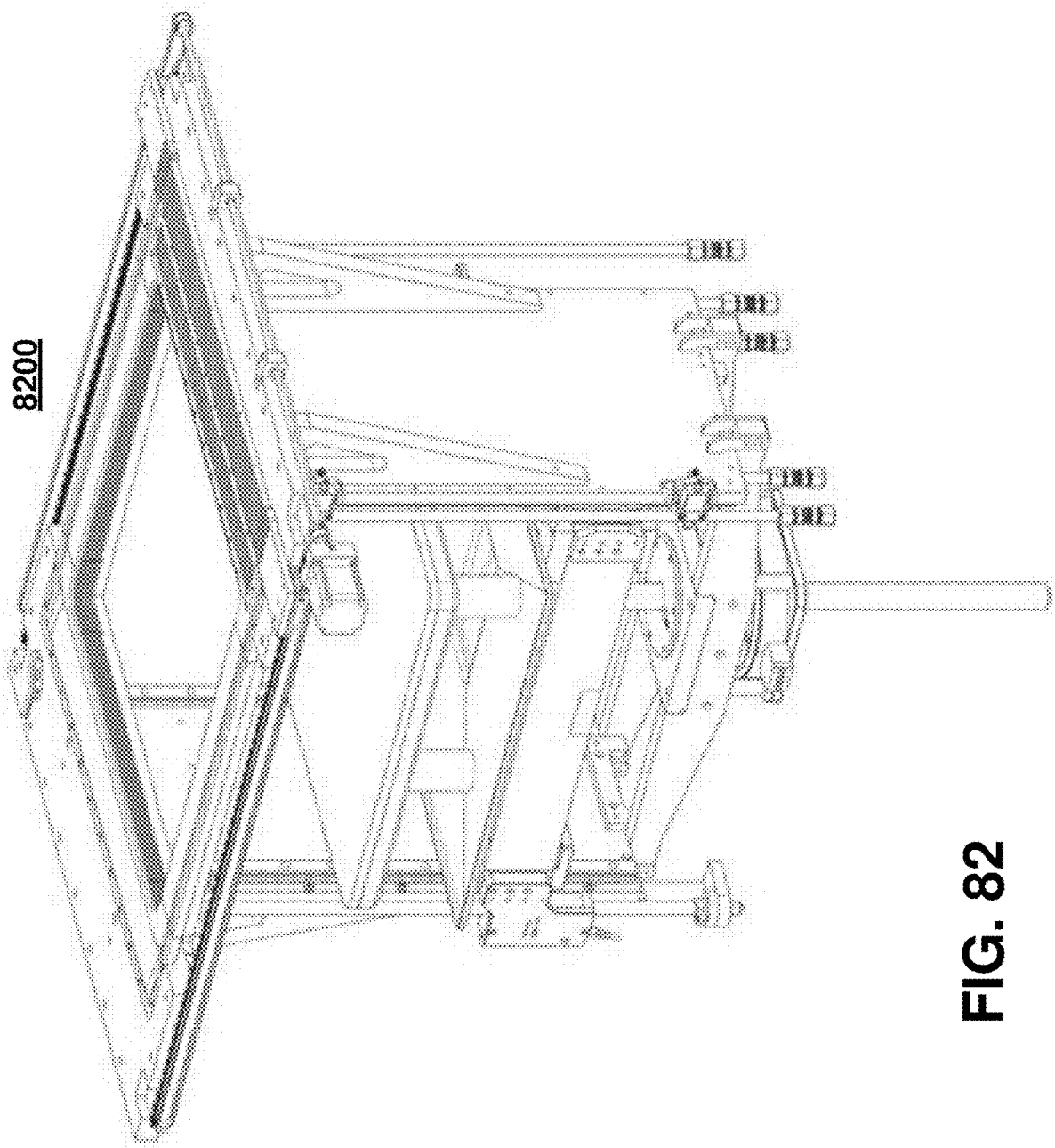
FIG. 82 illustrates one embodiment of a LAMP machine material build platform in accordance with various aspects described herein.

FIG. 82 illustrates one embodiment of a LAMP machine material build platform 8200 in accordance with various aspects described herein.

Figure 83:
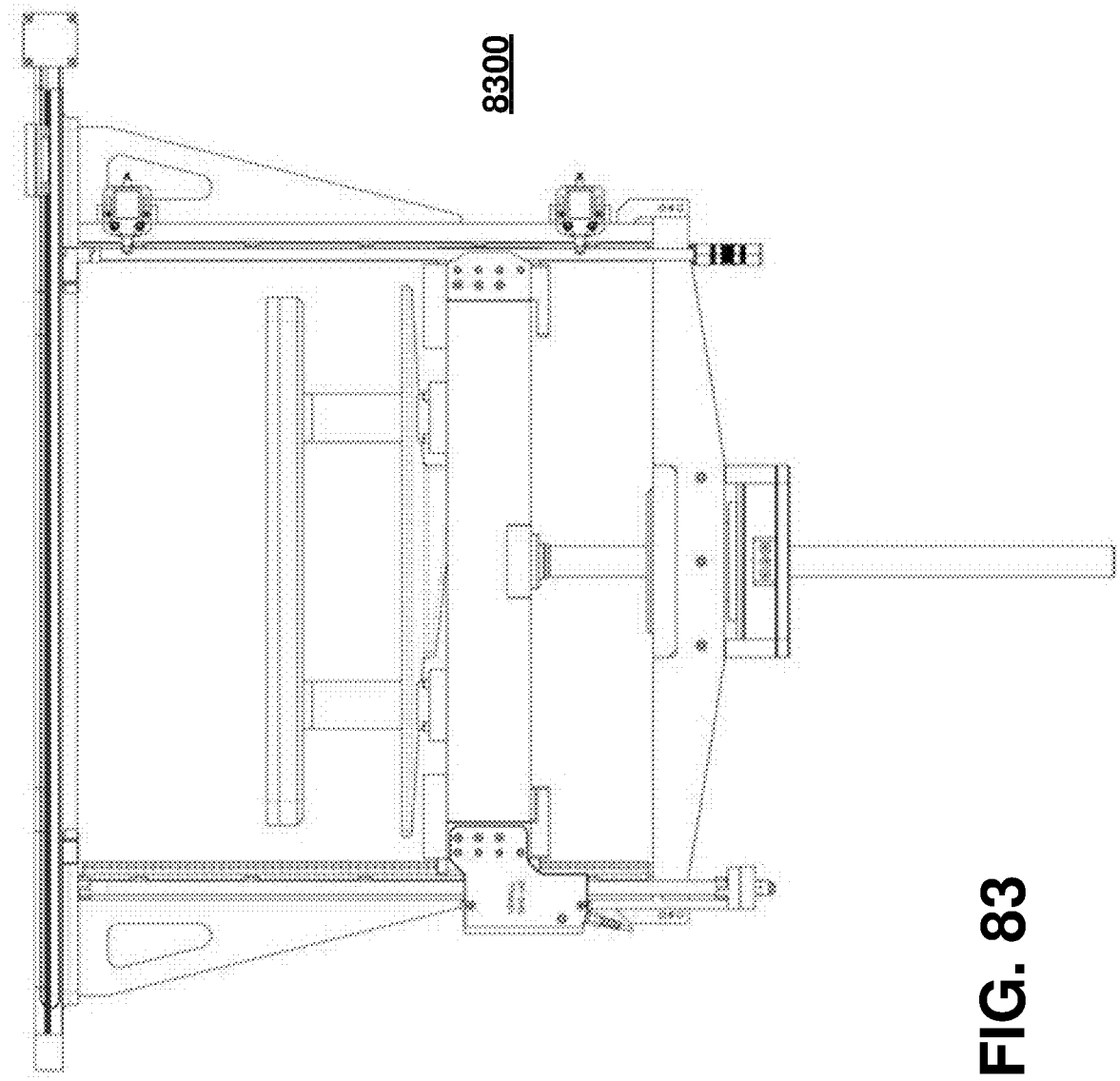
FIG. 83 illustrates one embodiment of a LAMP machine material build platform in accordance with various aspects described herein.

FIG. 83 illustrates one embodiment of a LAMP machine material build platform 8300 in accordance with various aspects described herein.

Figure 84:
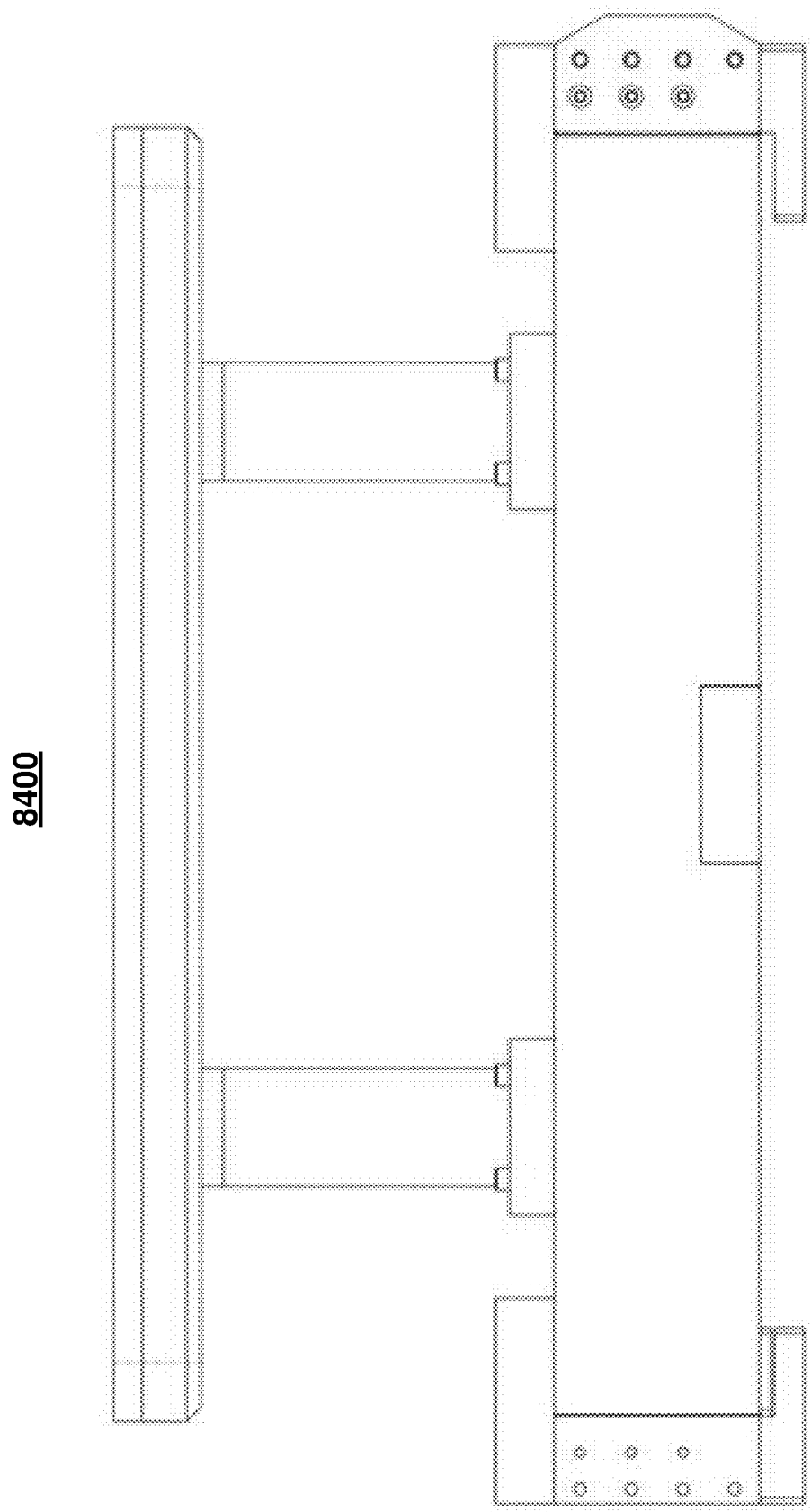
FIG. 84 illustrates one embodiment of a LAMP machine material build platform substrate and substrate mount in accordance with various aspects described herein.

FIG. 84 illustrates one embodiment of a LAMP machine material build platform substrate and substrate mount 8400 in accordance with various aspects described herein.

Figure 85:
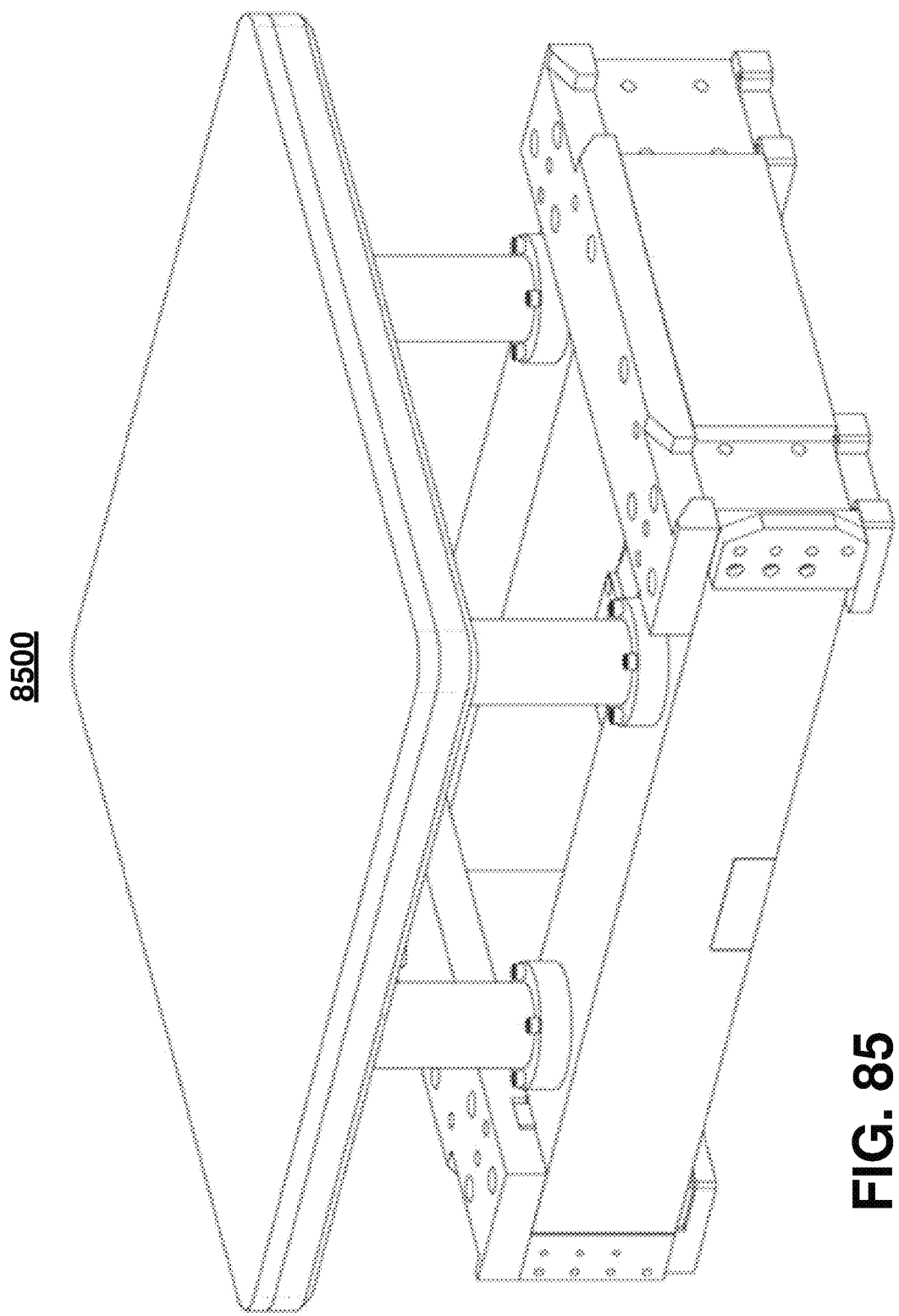
FIG. 85 illustrates one embodiment of a LAMP machine material build platform substrate and substrate mount in accordance with various aspects described herein.

FIG. 85 illustrates one embodiment of a LAMP machine material build platform substrate and substrate mount 8500 in accordance with various aspects described herein.

Figure 86:
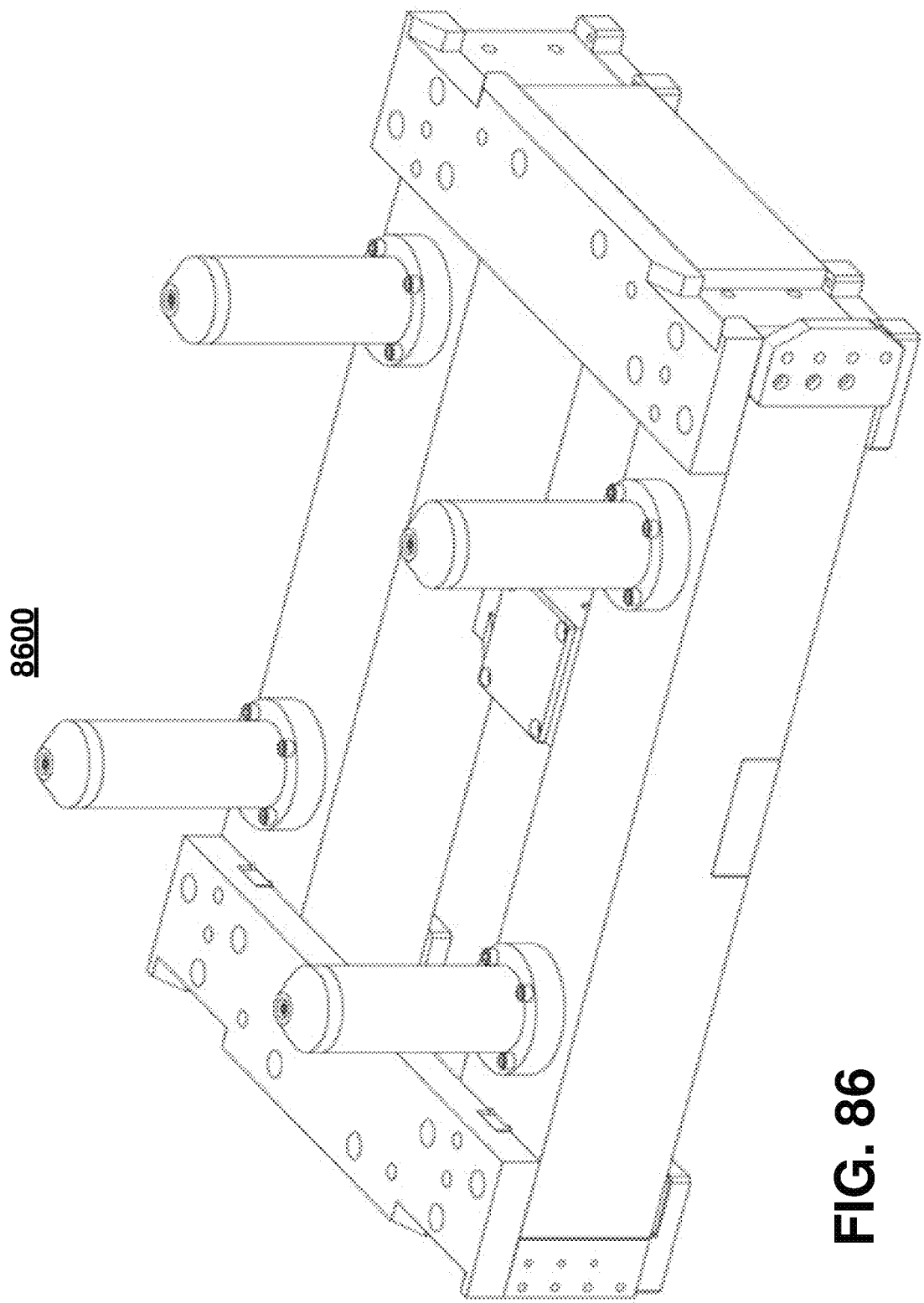
FIG. 86 illustrates one embodiment of a LAMP machine material build platform substrate and substrate mount in accordance with various aspects described herein.

FIG. 86 illustrates one embodiment of a LAMP machine material build platform substrate and substrate mount 8600 in accordance with various aspects described herein.

Figure 87:
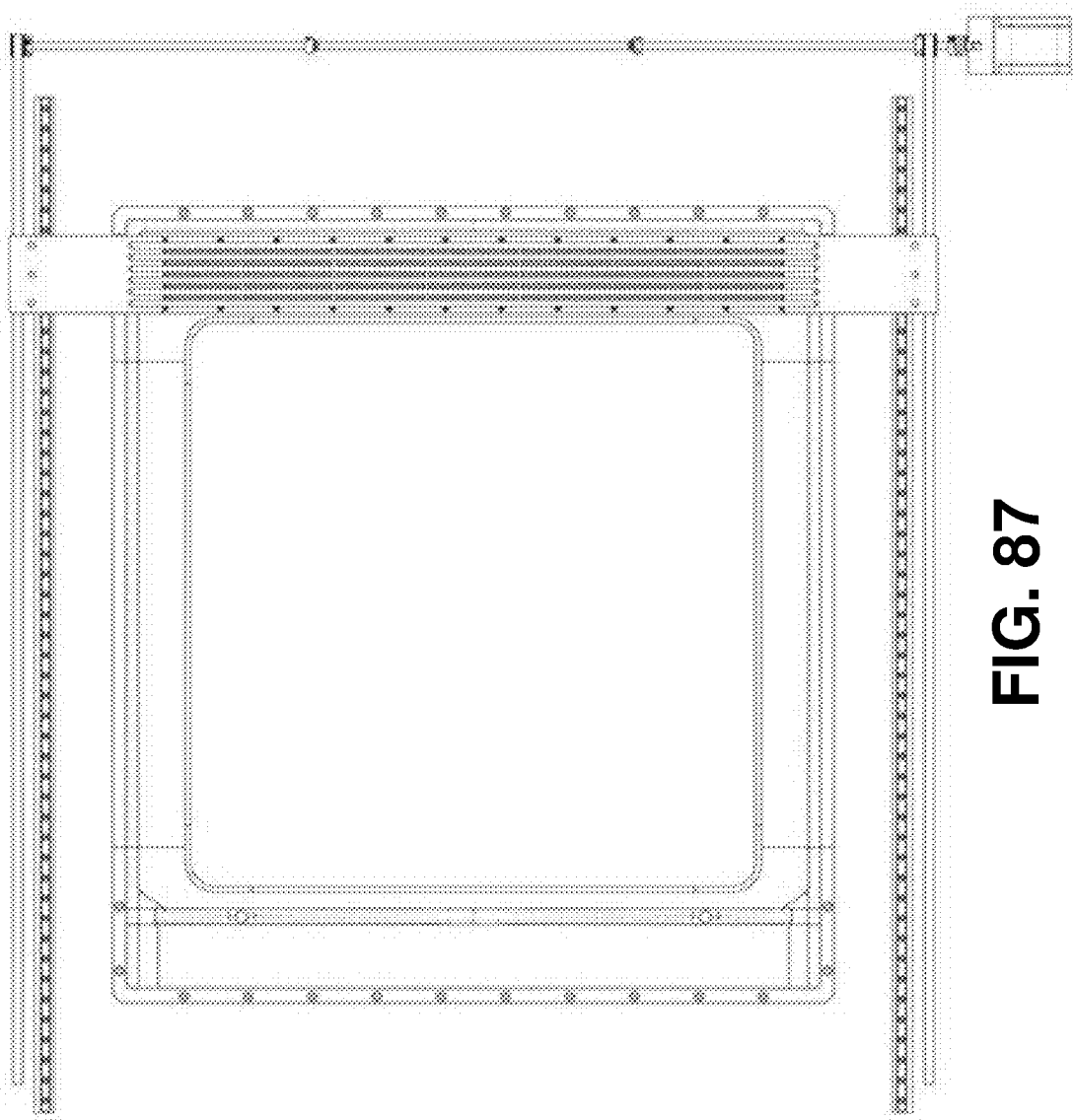
FIG. 87 illustrates one embodiment of a LAMP machine material recoating system in accordance with various aspects described herein.

FIG. 87 illustrates one embodiment of a LAMP machine material recoating system 8700 in accordance with various aspects described herein.

Figure 88:
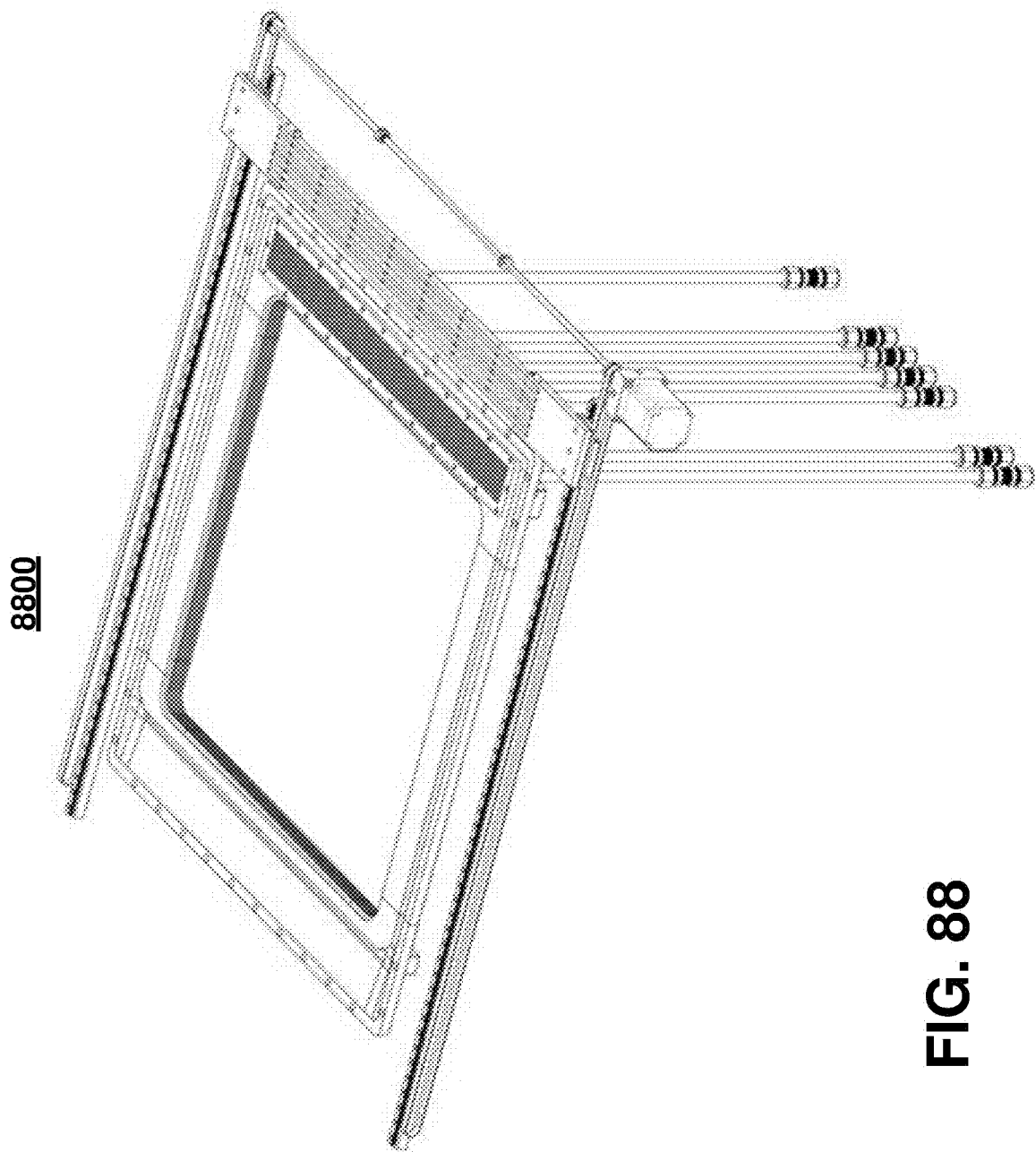
FIG. 88 illustrates one embodiment of a LAMP machine material build platform seal system and material recoating system in accordance with various aspects described herein.

FIG. 88 illustrates one embodiment of a LAMP machine material build platform seal system and material recoating system 8800 in accordance with various aspects described herein.

Figure 89:
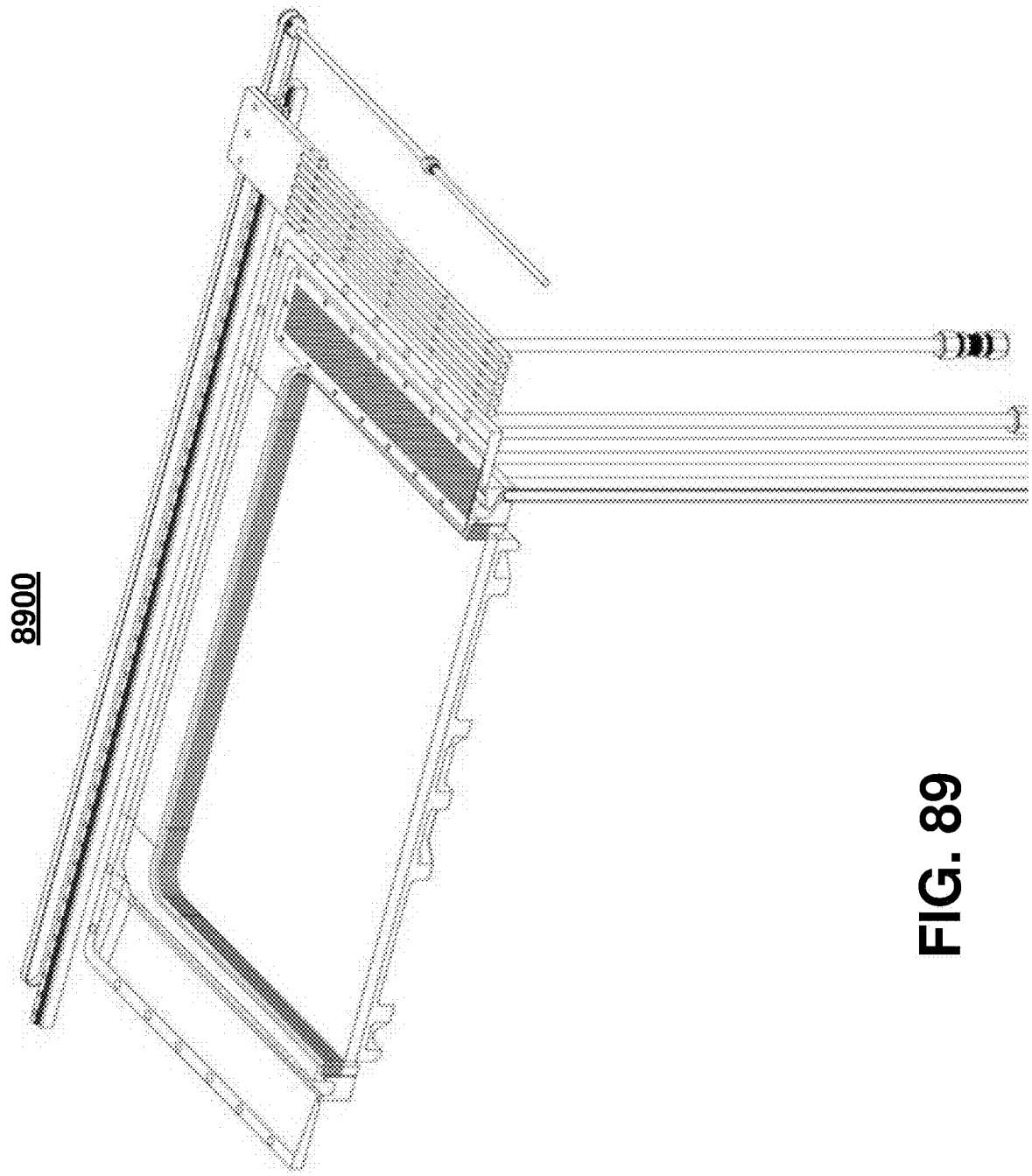
FIG. 89 illustrates one embodiment of a LAMP machine material build platform seal system and material recoating system in accordance with various aspects described herein.

FIG. 89 illustrates one embodiment of a LAMP machine material build platform seal system and material recoating system 8900 in accordance with various aspects described herein.

Figure 90:
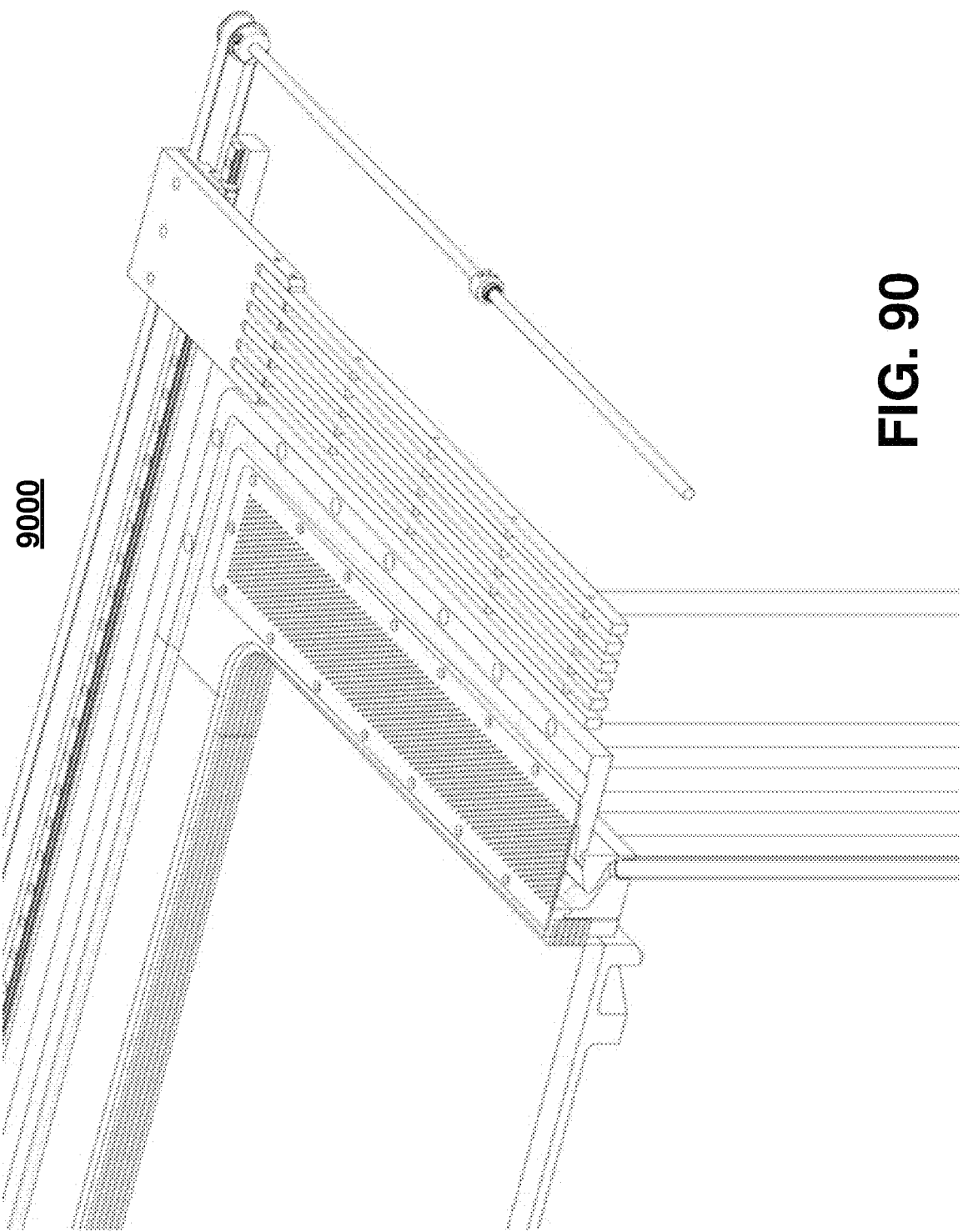
FIG. 90 illustrates one embodiment of a LAMP machine material build platform seal system and material recoating system in accordance with various aspects described herein.

FIG. 90 illustrates one embodiment of a LAMP machine material build platform seal system and material recoating system 9000 in accordance with various aspects described herein.

Figure 91:
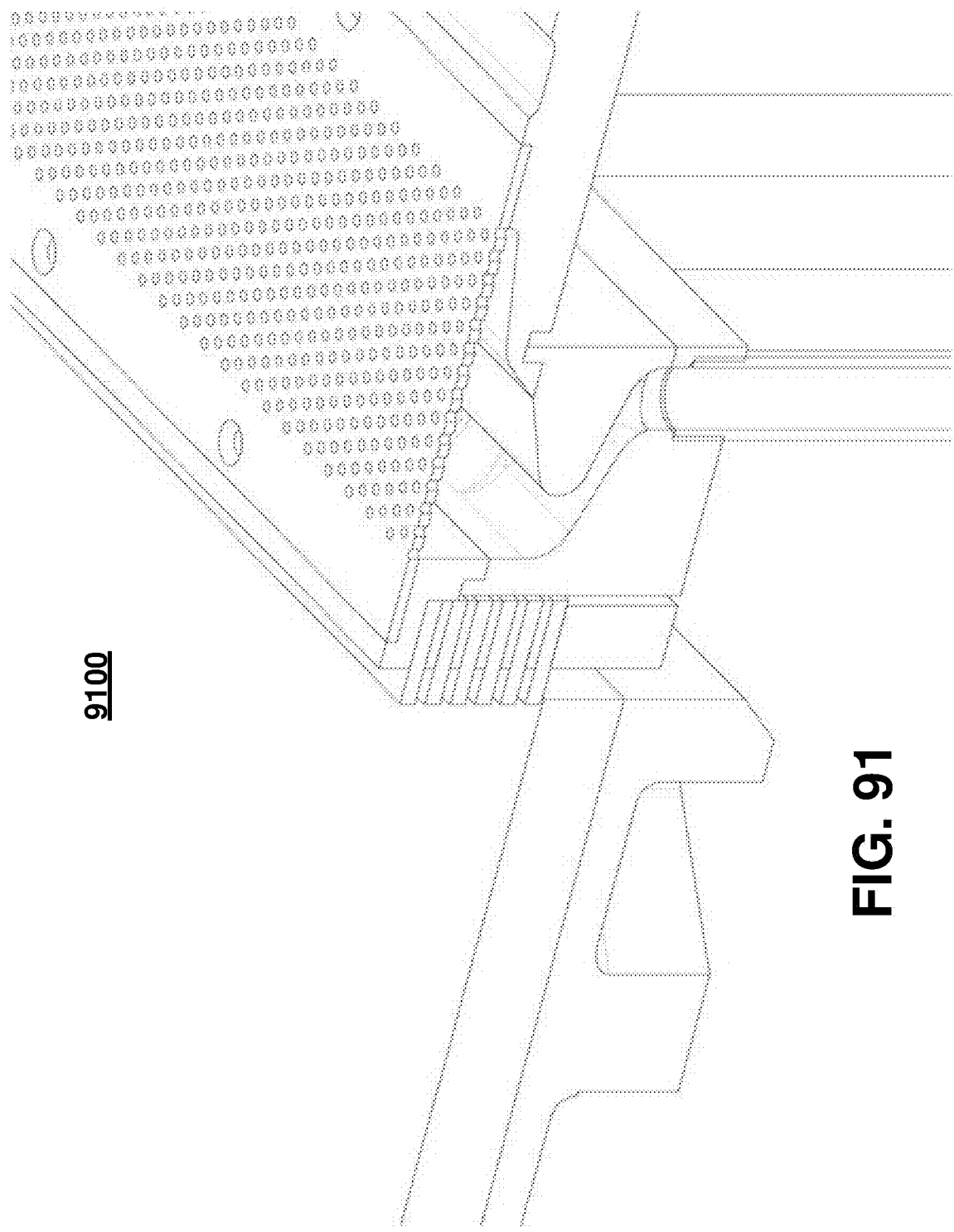
FIG. 91 illustrates one embodiment of a LAMP machine material build platform seal system and material recoating system supply reservoir in accordance with various aspects described herein.

FIG. 91 illustrates one embodiment of a LAMP machine material build platform seal system and material recoating system supply reservoir 9100 in accordance with various aspects described herein.

Figure 92:
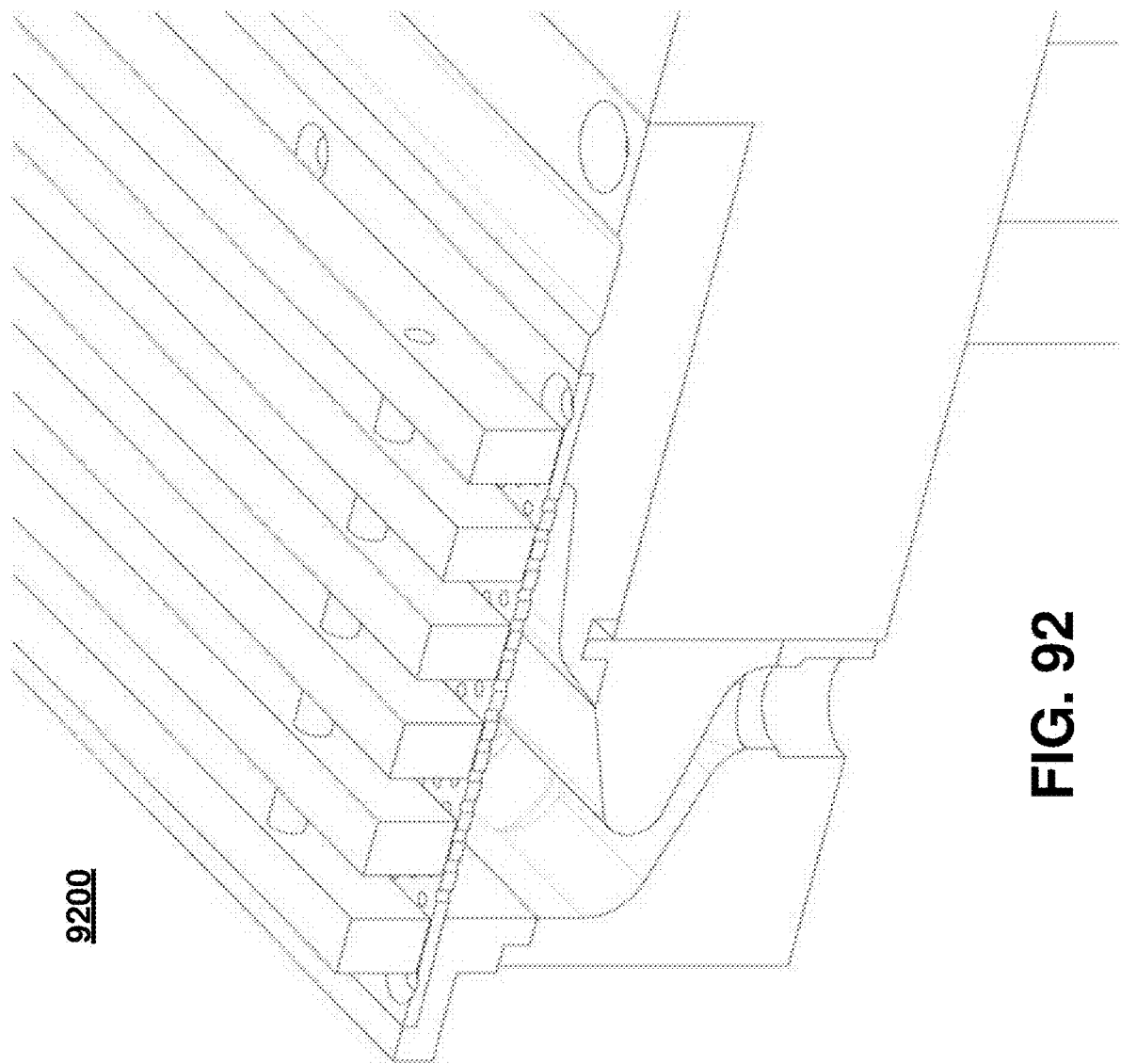
FIG. 92 illustrates one embodiment of a LAMP machine material recoating system supply reservoir and recoater in accordance with various aspects described herein.

FIG. 92 illustrates one embodiment of a LAMP machine material recoating system supply reservoir and recoater 9200 in accordance with various aspects described herein.

Figure 93:
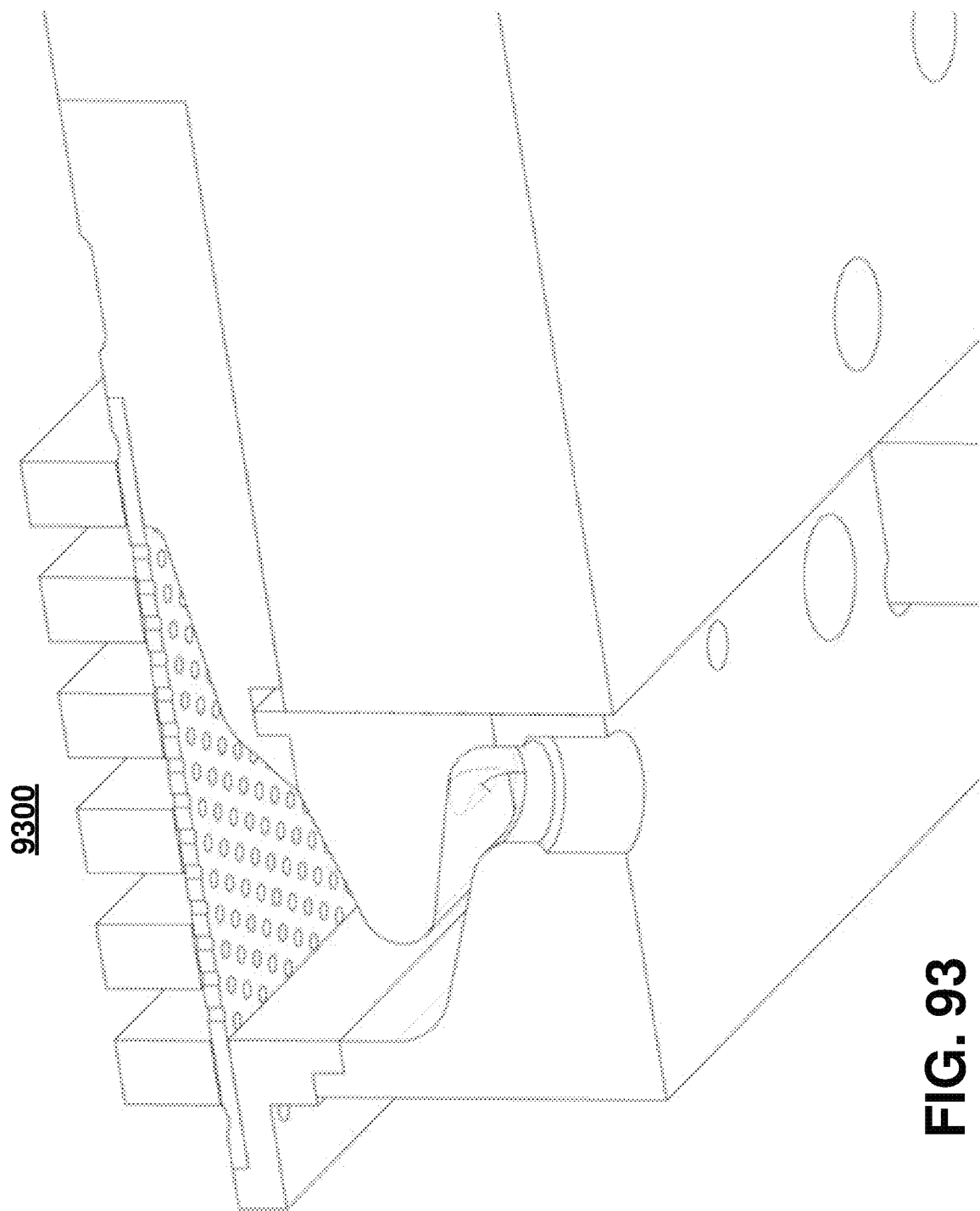
FIG. 93 illustrates one embodiment of a LAMP machine material recoating system supply reservoir and recoater in accordance with various aspects described herein.

FIG. 93 illustrates one embodiment of a LAMP machine material recoating system supply reservoir and recoater 9300 in accordance with various aspects described herein.

Figure 94:
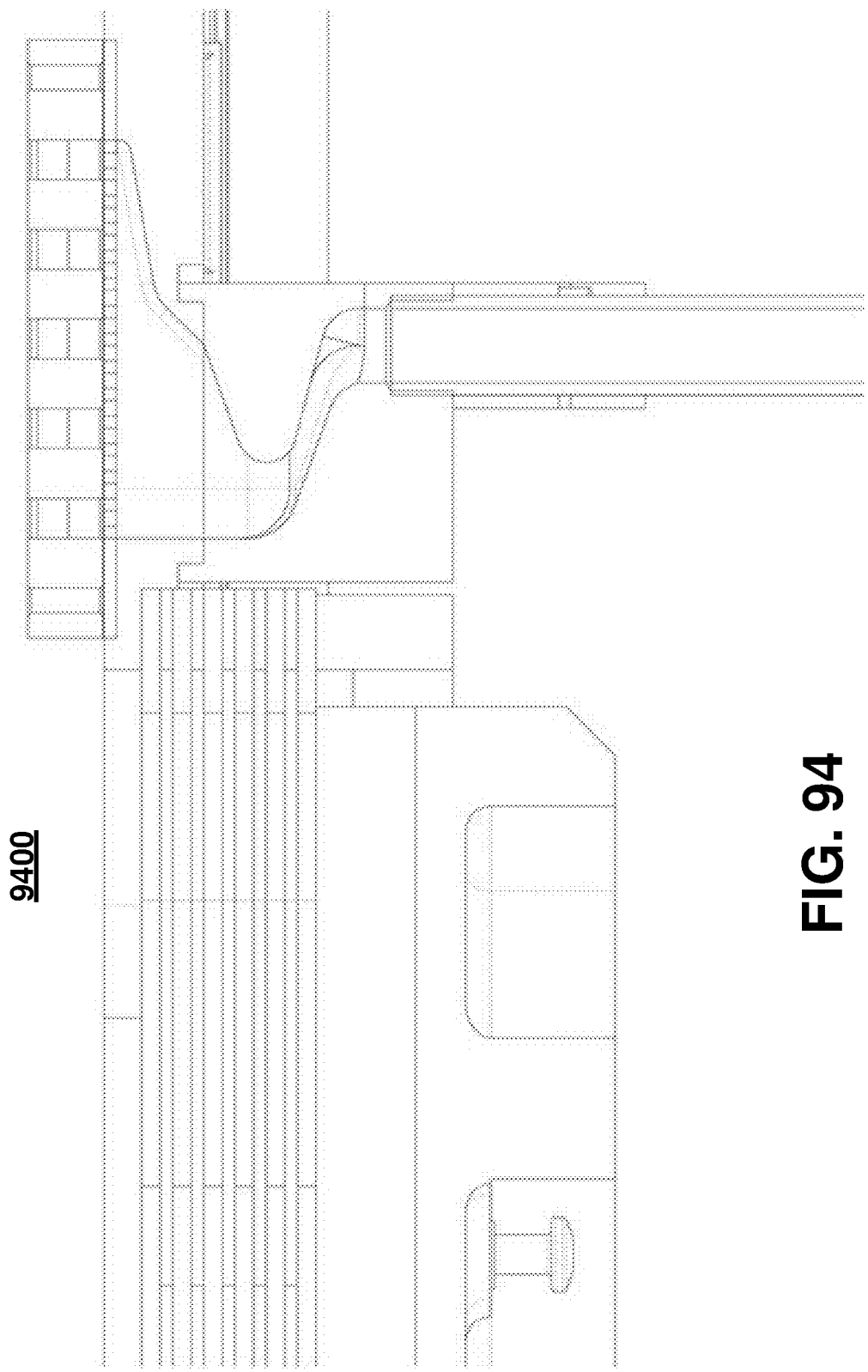
FIG. 94 illustrates one embodiment of a LAMP machine material build platform seal, material recoating system supply reservoir and recoater in accordance with various aspects described herein.

FIG. 94 illustrates one embodiment of a LAMP machine material build platform seal, material recoating system supply reservoir and recoater 9400 in accordance with various aspects described herein.

Figure 95A:
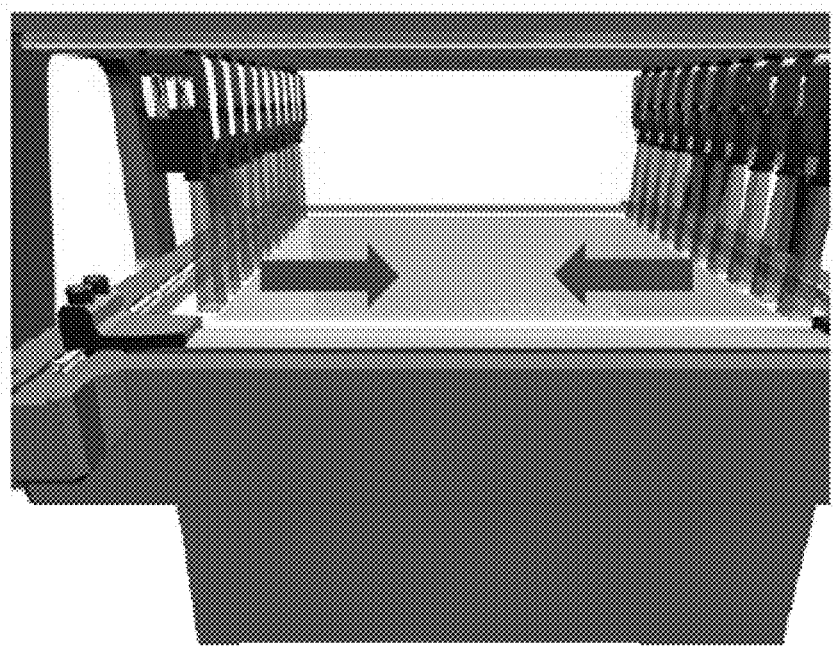
FIGS. 95a-95c illustrate an embodiment for employing a series of imaging heads that move concurrently across the surface of a resin in accordance with various aspects as described herein.
Figure 95B:
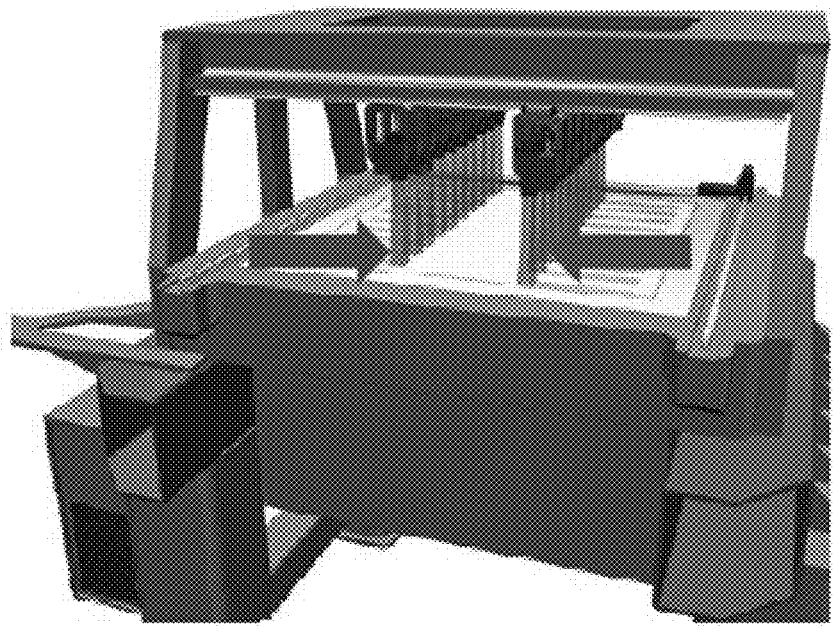
Figure 95C:
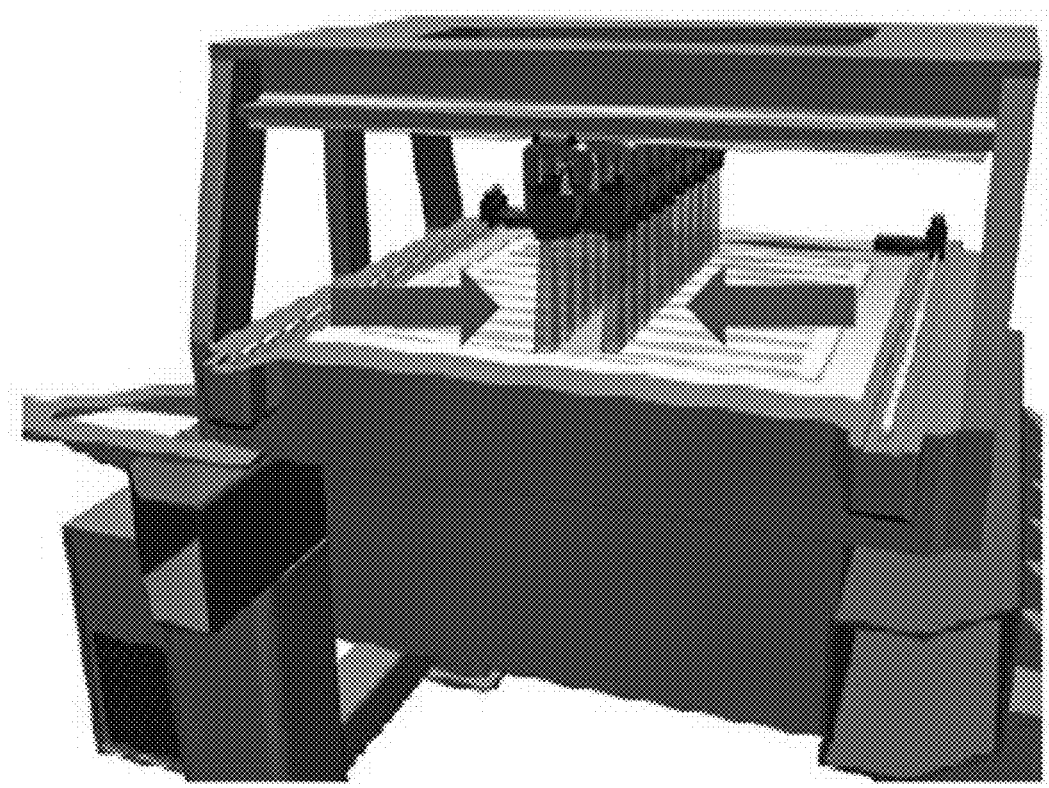

FIGS. 95a-95c illustrate an embodiment for employing a series of imaging heads that move concurrently across the surface of a resin in accordance with various aspects as described herein. ULTRA-LAMP employs a series of imaging heads as shown in FIGS. 95a-95c that may image the surface of the photocurable resin by concurrently moving over the photocurable resin's surface while exposing and curing patterns in the resin. FIG. 95a demonstrates the ULTRA-LAMP in two staggered rows of image projection units. As shown by the arrows in the Figures, the projection units may sweep across the resin in opposite directions. The entire surface of the resin may be thus patterned in a single pass, providing an increase in throughput of about 10× over current LAMP technology (which uses a serpentine scan of a single imaging head over the resin's surface.)

Figure 96:
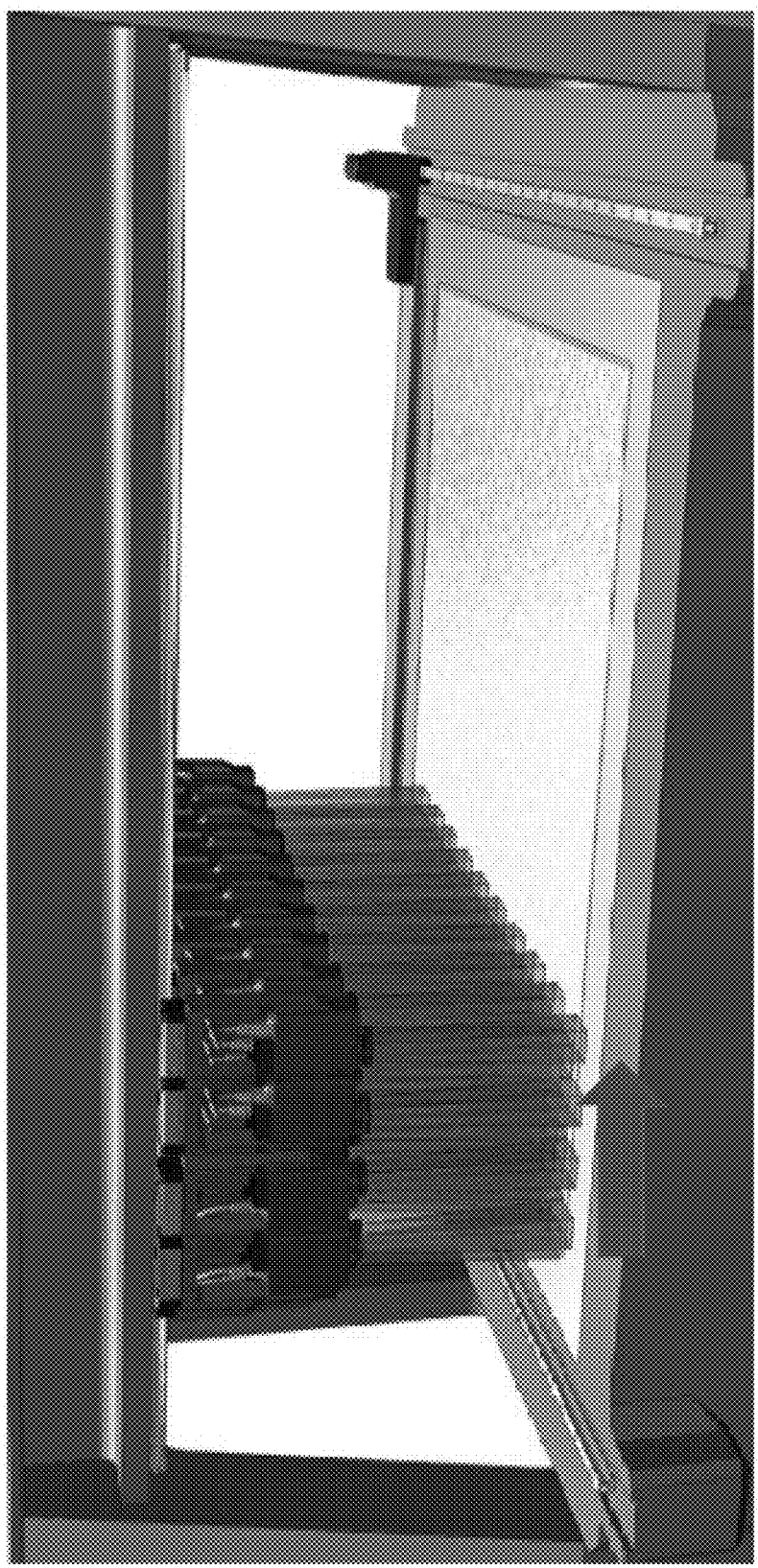
FIG. 96 illustrates an embodiment of for employing a two dimensional array of imaging heads to simultaneously pattern the surface of the resin in accordance with various aspects as described herein.

FIG. 96 illustrates an embodiment of for employing a two dimensional array of imaging heads to simultaneously pattern the surface of the resin in accordance with various aspects as described herein. In FIG. 96, the technology may be applied in a FLASH-LAMP concept. FLASH-LAMP is illustrated in FIG. 96. FLASH-LAMP may use a two-dimensional array of projectors, all simultaneously projecting portions of a larger image but at high resolution. The entire area of the photocurable resin may be thus patterned in a single flash, or a few flashes with small indexing movements of the array between flashes to cover areas of the resin not exposed in the previous flash. FLASH-LAMP may increase photoexposure throughput dramatically by up to 50× over current LAMP technology.

Figure 97:
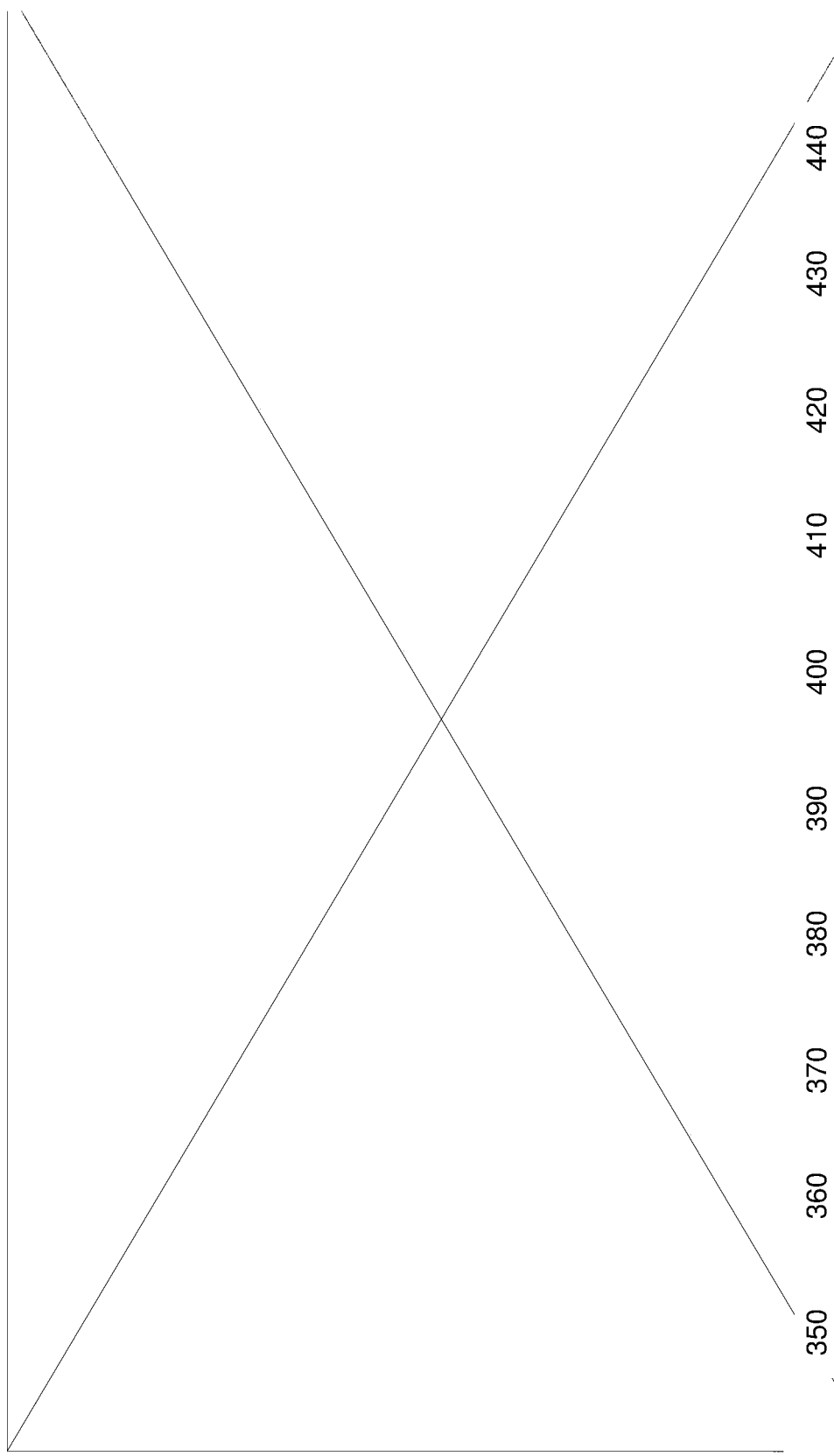
FIG. 97 provides a graph of the emission spectrum of a light source used in an embodiment of LAMP.

The light source used in LAMP may be a high pressure mercury vapor lamp. The emission spectrum of the light source is shown in FIG. 97. There are three distinct regions of emission from the light source, which are the I-line at 365 nm, H-line at 404.7 nm and G-line at 435.8 nm. For this light source the G-line is the strongest spectral feature, followed by the H-line and I-line, respectively. It is important to note that the primary peak utilized for photopolymerization is the I-line, since the photoinitiator utilized exhibits negligible absorption for the longer wavelengths.

Figure 98:
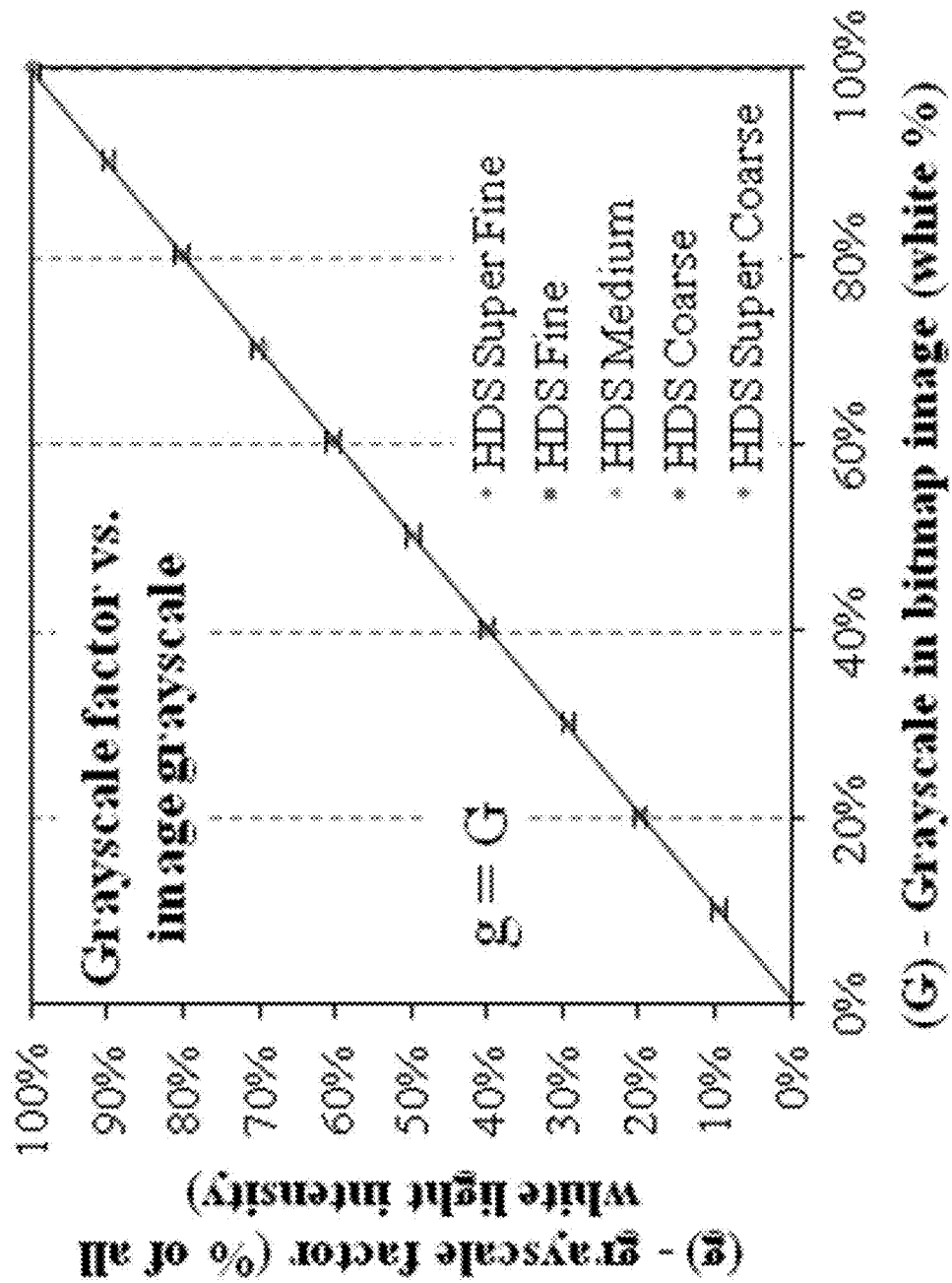
FIG. 98 provides a comparison of the grayscale factor resulting from a screened grayscale image at different screening resolutions.

Previous investigations conducted on grayscale exposures propose that the light intensity incident on the surface is effectively reduced. This may be characterized by a "grayscale factor," g, which relates the averaged grayscale light intensity to the "all white" light intensity and may be described by equation 3.1.

$$g = \frac{I_{gr}}{I_o} \quad 3.1$$

Where $I_{gr}$ is the averaged light intensity incident on the PCMS resulting from a half-toned grayscale exposure, and $I_o$ is the light intensity resulting from a full exposure, where every pixel on the DMD is turned to the on position. Intuitively, the grayscale factor could be assumed as being equal to the grayscale value of the image, i.e. the percentage of white pixels in the designed image, G, and independent of the pixel distribution. This assumption was tested and the results are shown in FIG. 98.

The grayscale factor was determined using a photodetector provided by the supplier of the optical scanning system. First, the current from a full projection was measured, which corresponds to the total light power delivered to the photodetector. The exposure area was held constant throughout the experiment to give a direct relationship to the light intensity. Next, the current resulting from projected grayscale images at different screening resolutions and grayscale values was measured. The screening process was accomplished using Harlequin RIP by Global Graphics, details may be found elsewhere. The screening technique used was Harlequin Dispersive Screening (HDS), which is a proprietary screening technique. Screening resolutions were varied from HDS super fine to HDS super coarse; here HDS super fine has the highest screening resolution (1×1 pixel half-tone cells) and HDS has the lowest screening resolution (4×4 half-tone cells). The grayscale factor was determined by dividing the grayscale current by the full exposure current. The error associated with this measurement technique was determined to be ±1%. Results show the validity of the assumption that the grayscale factor, g, is equivalent to the grayscale of the projected image, G. From FIG. 98, the slope and intercept of the linear fit were found to be 1.004 and −0.003, respectively. Considering the error in the experimental procedure, it is reasonable to assume a slope of −1 and intercept of −0. From this experiment, it may be concluded that the average grayscale light intensity incident on the surface of the PCMS, $I_{gr}$, may be equal to the all white light intensity multiplied by the grayscale value of the projected image, G. This result is summarized by equations 3.2 and 3.3.

$$g = G \quad 3.2$$

$$I_{gr} = I_o G \quad 3.3$$

In addition, to the averaged effects of grayscale exposure, it is also important to consider the "true" distribution of light intensity projected onto the PCMS. This was accomplished through the use of a charge-coupled device (CCD) BeamGage® Laser Beam Measurement system supplied by Ophir-Spiricon to measure the light intensity distribution. The spectral range of this profilometer is 190-1320 nm with ±1% linearity with power. The size of each pixel in the CCD is 4.4 µm, which enabled sub-pixel level measurement of the SLM light output. The profilometer provides information about the optical profile in counts per second per pixel, which is analogous to light intensity. With this setup, the light intensity distribution may be determined. However, due to the lack of a calibration system, the actual magnitude of the light intensity at each individual pixel cannot be directly determined. This limitation may be overcome by measuring all optical profiles under identical conditions and camera settings to enable the determination of trends in the light intensity distribution of different pixel patterns.

FIGS. 99A-99F shows the light intensity distribution at the focal plane resulting from one pixel of the DMD being projected. The top panel shows the light intensity plotted in the x-y plane, which is parallel with the PCMS surface, where reds correspond to high light intensity and blues correspond to low light intensity. Previous reports have described the intensity distribution for a single pixel as Gaussian.

$$I(x, y) = I_o e^{-\frac{(x^2 + y^2)}{r^2}} \quad 3.4$$

where $I_o$ is the peak light intensity and r is the Gaussian radius.

Figures 99C, 99D:
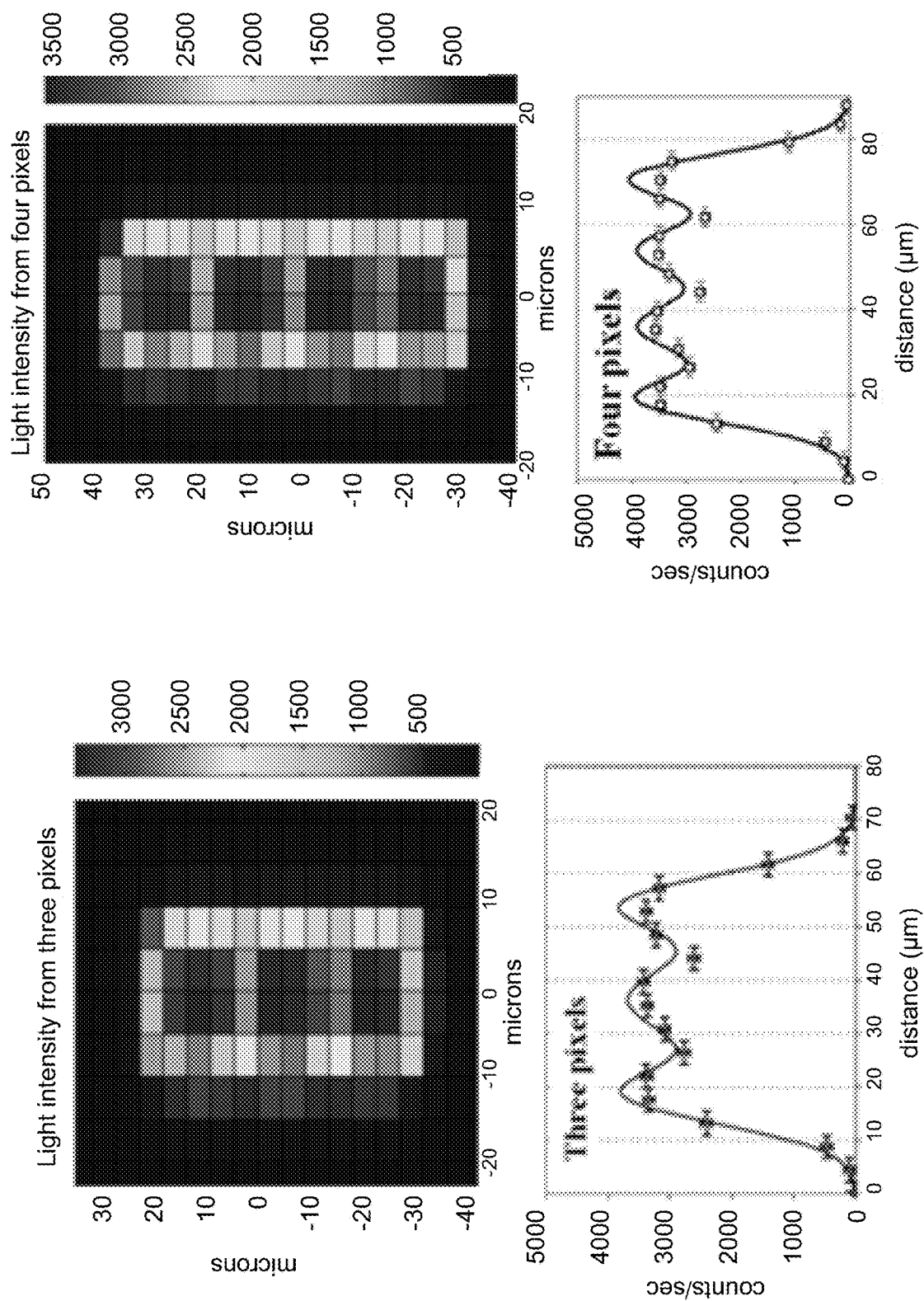

The bottom panel of FIG. 99A shows a plot of the cross-sectional profile of the projected pixel. The curve fit shown in the profile was obtained through a two-dimensional Gaussian regression. From this regression, the Gaussian radius was determined to be ~8.3 µm, which is consistent with a pixel resolution of 17 µm. The maximum measured value of intensity for a single pixel exposure was 3601 counts/px-sec. The statistical error from the measurement was determined to be ±85 counts/px-sec and the horizontal error bars show the dimensions of the CCD for which the data points were averaged. In order to better understand the light intensity distributions resulting from SLM projections, additional pixel patterns were investigated. FIGS. 99B-F show the intensity distributions and profiles of 2, 3, 4, 5 and 10 pixel lines, respectively. Sun et al. also suggest that projections of additional pixels may be treated as the sum of Gaussian intensity distributions. Therefore, each distribution was regressed as a summation of 2, 3, 4, 5, and 10 two-dimensional Gaussian distributions, respectively. The averaged Gaussian radius from all the projections investigated was 8.6 µm with a standard deviation of 1 µm. However, additional trends are observed that a superposition of Gaussian distributions with a constant radius could not describe. In FIG. 99F, trends in the valleys may be seen, where a minimum is reached in the center of the 10 pixel line, which may be attributed to diffraction. This indicates that a more detailed optical analysis is required. However, conventional techniques for modeling cure depth in stereolithography use the peak intensity of the laser to predict the cure depth. Therefore, for this study it is sufficient to assess the trends in peak intensity resulting from the various intensity distributions. From these experiments, it may be seen that the peak intensity remains constant with each of the lines investigated. The maximum intensity measured from the 10 pixel line was 3683 counts/px-sec, which shows an increase of only ~2% from that for a single pixel projection.

Figure 100:
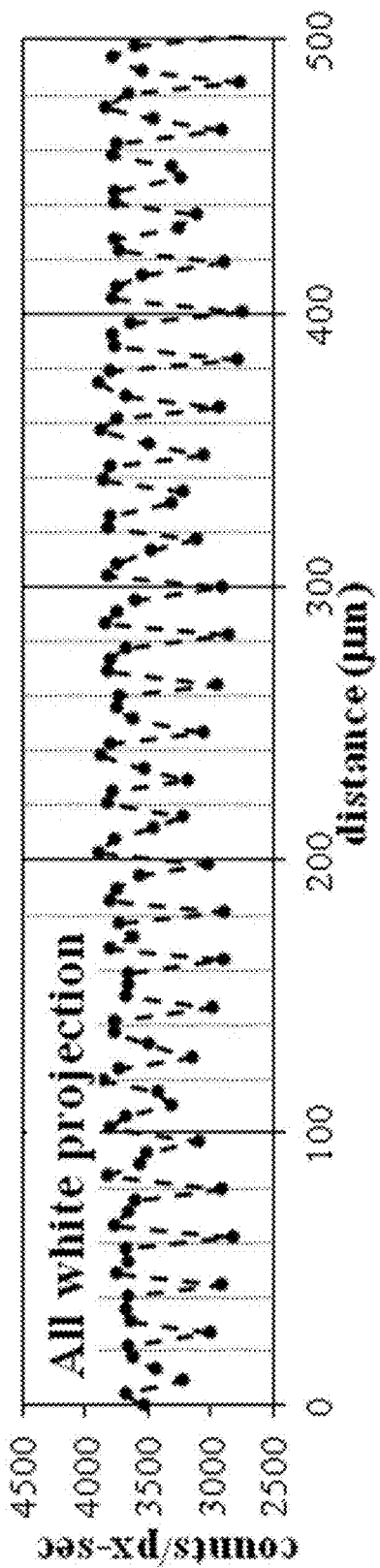
FIG. 100 illustrates a light intensity distribution resulting from an all white projection.

The above results suggest that the pixel distribution may have little effect on the peak light intensity. In an effort to verify this, all the pixels of the SLM were projected. A profile of this exposure is shown in FIG. 100. The maximum intensity was found to be 3959 counts/px-sec, which indicates that the peak light intensity for single pixel exposure decreases only ~10% from that for a flood exposure. Additionally, FIG. 100 shows the underlying complexity of the optical projection which is being neglected due to its negligible influence on the peak intensities. A periodic distribution in the intensity of the valleys is observed, which has a period of ~220 µm and may be a result of diffraction.

Figure 101:
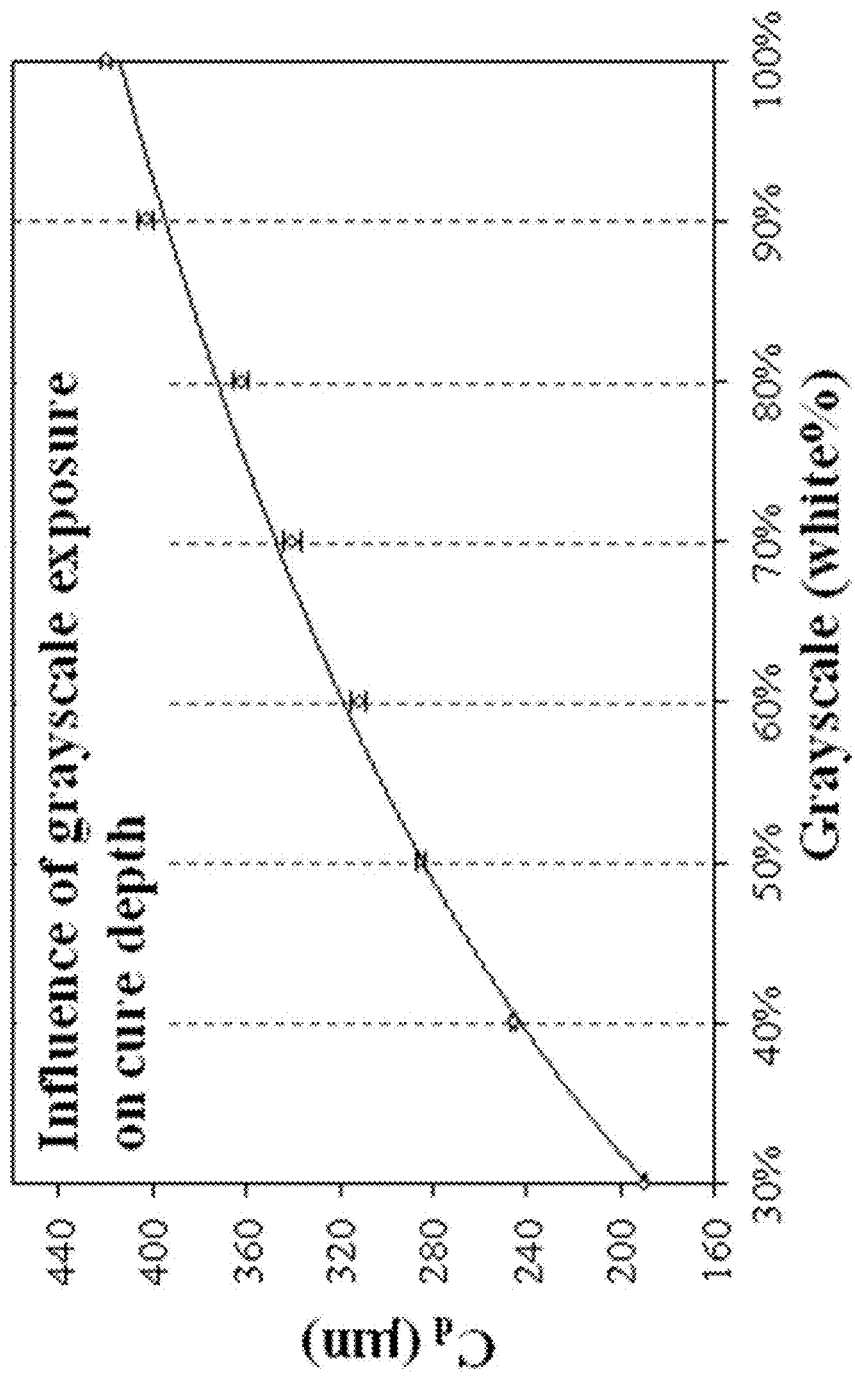
FIG. 101 provides a chart of cure depth measurements at a fixed exposure time and screening resolution as the grayscale was varied from 30% to 90% white.

When considering grayscale exposure, the material system could cure according to the local, averaged or an intermediate light intensity incident to the surface. Above, it was shown that the distribution of projected pixels does not significantly alter the maximum incident light intensity. Therefore, if the cure depth resulting from grayscale exposure is similar to the cure depth resulting from an all white exposure, then it may be concluded that the PCMS cures according to the local light intensity. However, if the cure depth resulting from grayscale exposure is lower than the cure depth of an all white exposure, then the curing behavior of the PCMS may be modeled as an effective light intensity reduction. To investigate the response to grayscale exposure, cure depth measurements were conducted at a fixed exposure time and screening resolution and the grayscale was varied from 30% to 90% white. The exposure time used was 600 ms and the screening resolution was HDS super fine. The resulting films were homogenously smooth with no evidence of the pixel distribution utilized in the grayscale exposure. The cure depth measurements in FIG. 101 clearly show that in addition to the homogeneity of the films produced from grayscale exposure, the cure depth decreases with a decrease in grayscale. This indicates that the light intensity has been effectively smoothed and reduced. From the findings in FIG. 101, it may be hypothesized that grayscale exposure causes the PCMS to cure as though the light intensity was reduced in proportion to the graysc ale value of the projected image. The validity and the limits of this hypothesis are the focus of the following discussion.

Figure 102:
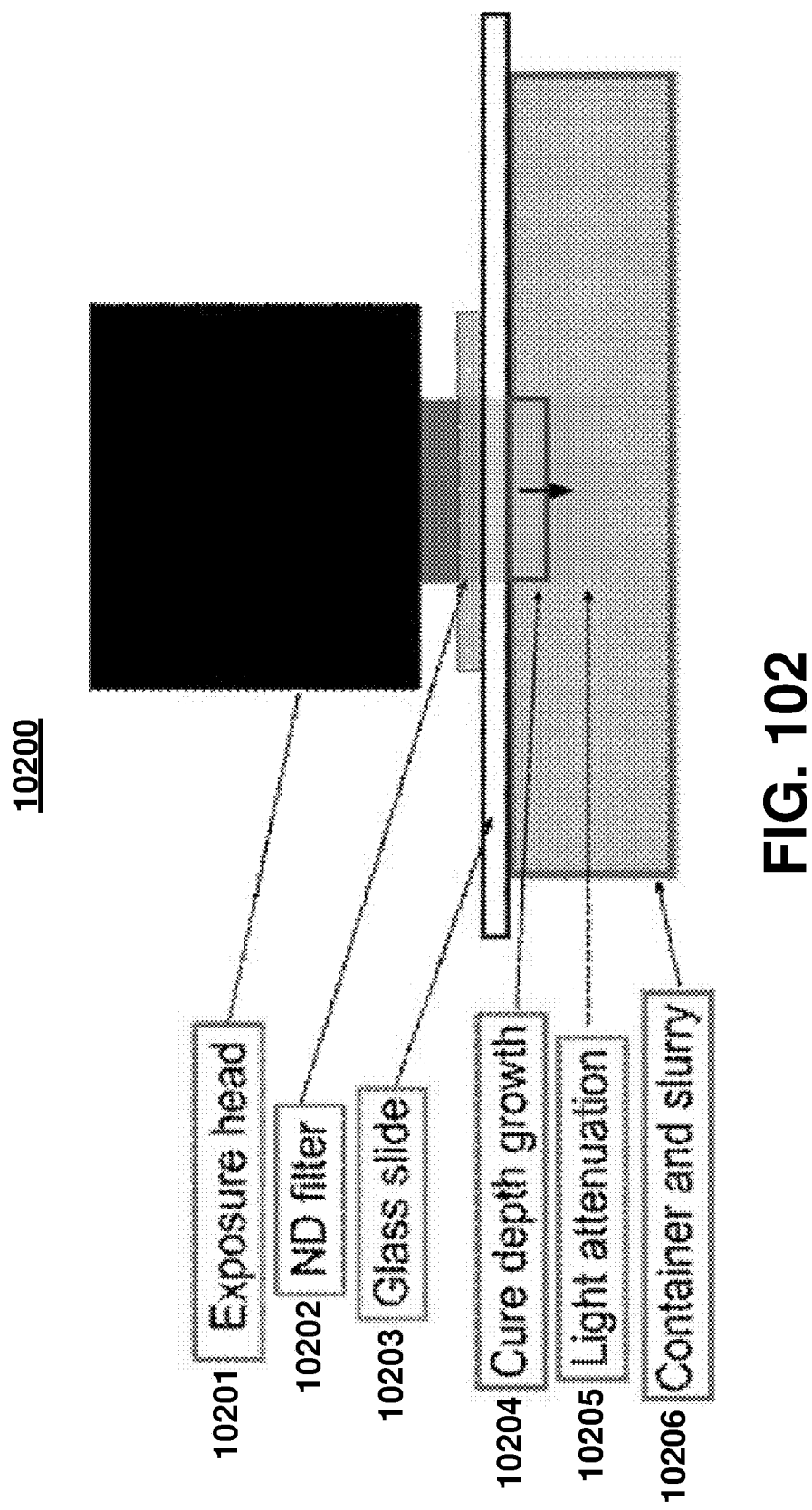
FIG. 102 illustrates a schematic for cure depth measurements with the incorporation of neutral density filters to determine the curing characteristics at different light intensities.

Reports by Atencia et al. suggest that grayscale exposure with a sufficiently high screening resolution results in an effective reduction in intensity which corresponds to the grayscale of the projected image. In order to relate the curing behavior to a grayscale light intensity, the effect of altering the "true" light intensity on the curing parameters may be determined. This may be accomplished through the use of UV neutral density (ND) filters, which act to uniformly attenuate light intensity over a specified range of wavelength. UV-VIS ND filters of a nominal optical density (OD) of 0.3 and 0.5 were purchased from Edmund Optics to uniformly attenuate wavelengths from 200 nm to 700 nm. The transmission of the filters was measured using a technique similar to that used for determining the grayscale factor. First, an all white image was projected onto the photodetector and the resulting current was measured. Next, the ND filters 10202 were placed between the light source and the photodetector, and the current from an attenuated all white projection was measured. The ratio of these two current measurements provides the transmission for each filter. The percent transmitted for the 0.3 and 0.5 OD filters measured were 56% and 32%, which corresponds to a light intensity of 896 mW/cm$^2$ and 512 mW/cm$^2$, respectively as compared to 1.6 W/cm$^2$ for unfiltered light. To expose the PCMS to a reduced light intensity, the ND filter 10202 was placed on top of the glass slide 10203 as shown in FIG. 102.

Figure 103:
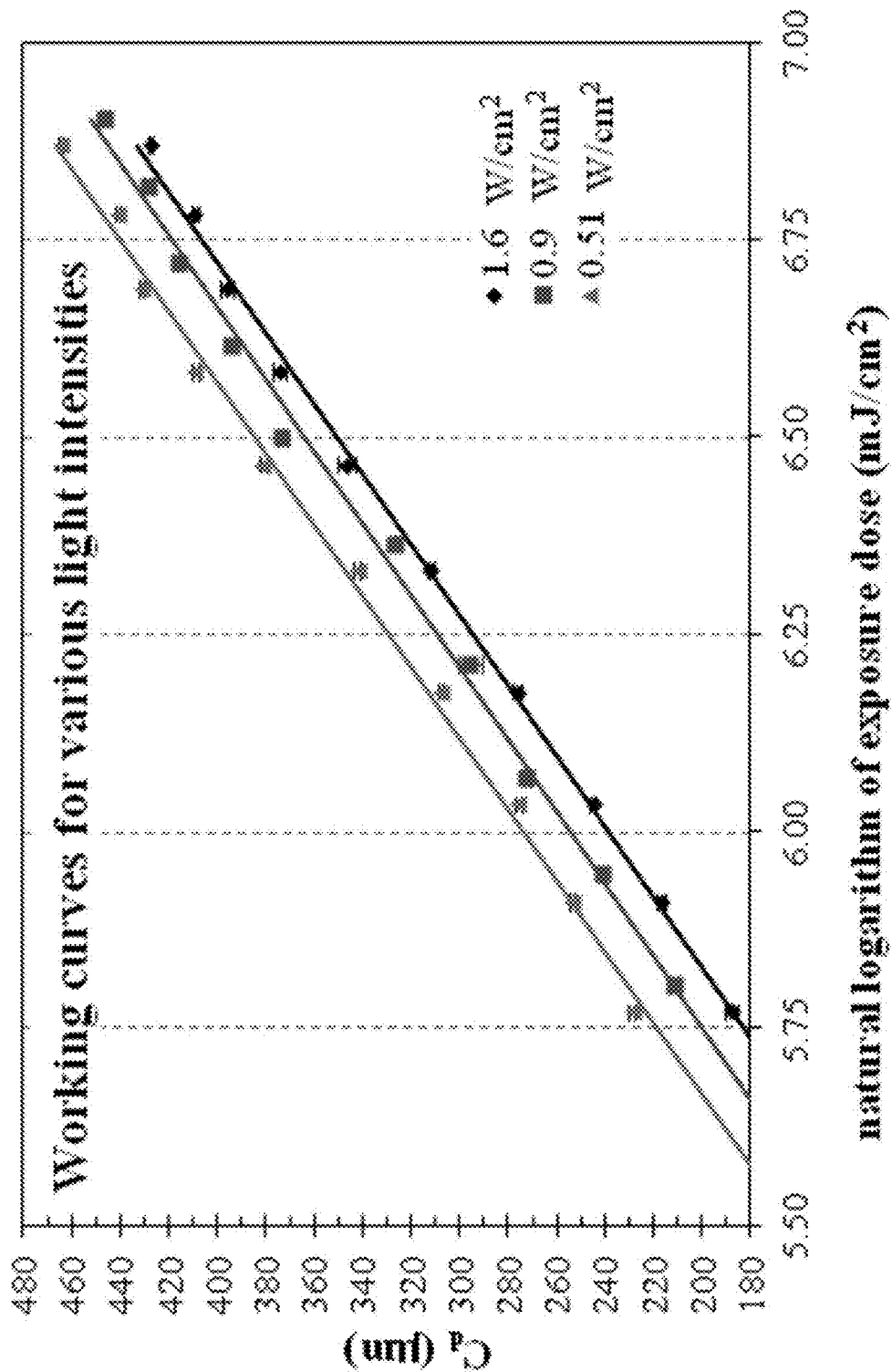
FIG. 103 provides a chart of working curves of a PCMS with exposure to different light intensities.

Cure depth measurements were conducted for each of the different light intensities at multiple exposure times to develop working curves. The exposure times were selected to investigate a consistent range of energy dose for the different light intensities. FIG. 103 shows the resulting working curves. The working curve resulting from an unfiltered light intensity of 1.6 W/cm$^2$ is also shown for comparison. It may be seen that the cure depth for a constant energy dose increases when the light intensity decreases. As a result, the cure depth from the highest source of light intensity resulted in the lowest cure depth. Consequently, the critical energy decreases with a decrease in light intensity. While at first counterintuitive, it should be noted that for a constant energy dose, the exposure time increase for a lower intensity, i.e. there is more time for photopolymerization to proceed. From FIG. 103, it may also be seen that the slopes resulting from each light intensity curve remain constant, which indicates that the resin sensitivity has little dependence on light intensity under these exposure conditions.

Figures 104A, 104B:
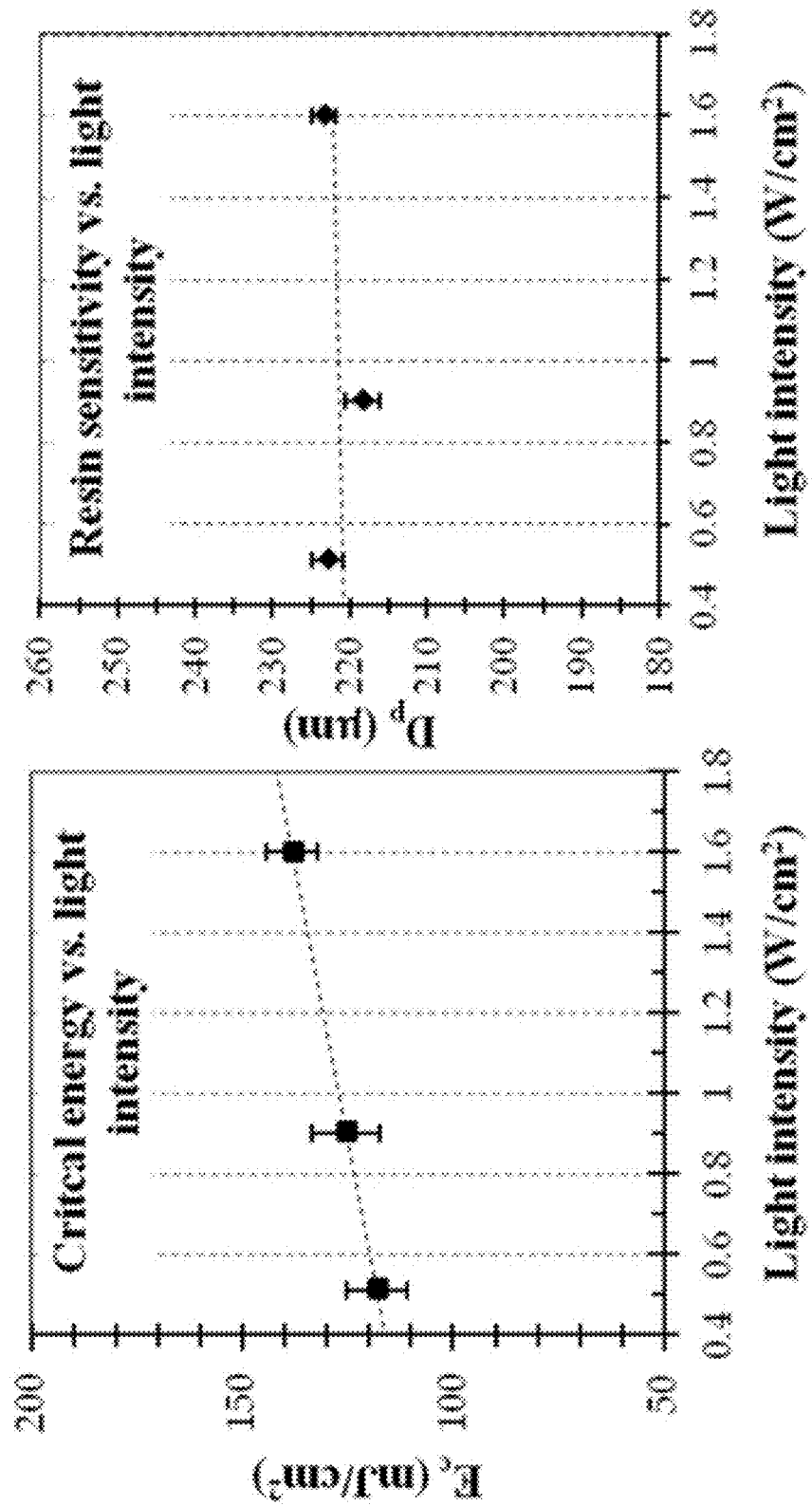
FIGS. 104a and 104b illustrate a summary of the dependence of the critical energy and resin sensitivity on light intensity.

FIGS. 104a and 104b show a summary of the dependence of the critical energy and resin sensitivity on light intensity. The linear regression of the critical energy, shown in FIG. 104a, resulted in the following empirical relationship.

$$E_c = 18.31 \cdot I + 109 \quad\quad 4.1$$

Where $E_c$ is in ulnits of mJ/cm$^2$, I is in units of W/cm$^2$ and the slope is in units of ms. From this regression, $R^2$ was determined to be 0.999. This indicates that the critical energy has a strong linear dependence with light intensity. Neither the Jacobs' equation (eq 2.9) nor the inhibitor equation (eq. 2.12) predicts this behavior. Rather, both models assume that the curing parameters are constant for a given material system and independent of how the energy is delivered to the material system. Results from a linear regression of the resin sensitivity, shown in FIG. 104b, show a near horizontal slope, indicating that the resin sensitivity is relatively independent of light intensity, which follows the Jacobs equation.

Figure 105:
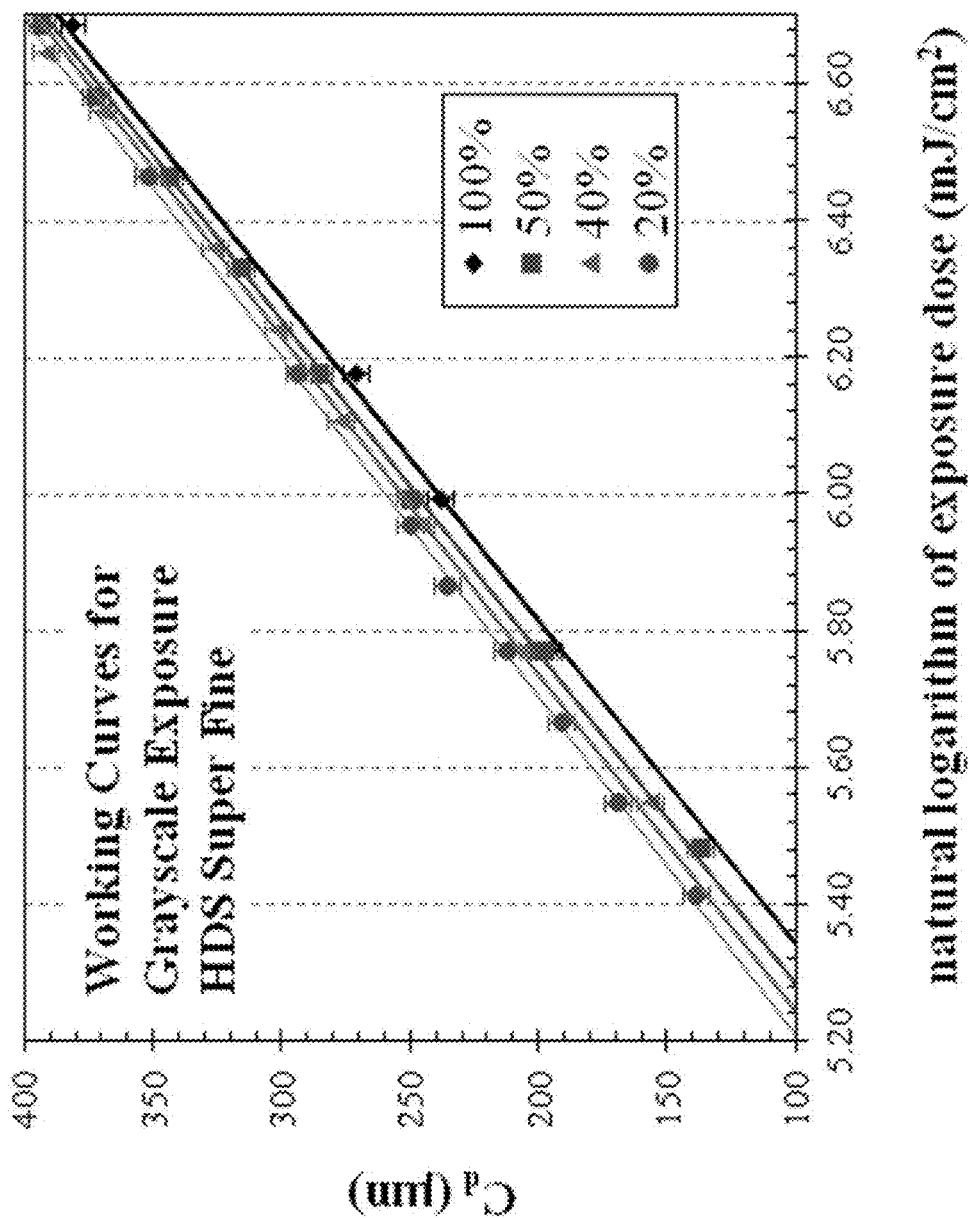
FIG. 105 provides a chart of working curves for various grayscale values and screening resolutions.

For grayscale exposure to be equivalent to an effective reduction in light intensity proportional to the grayscale value of the projected image, trends observed with grayscale exposure may be similar to trends observed with true light intensity reduction, i.e. the critical energy should have a strong linear dependence with the grayscale factor and the resin sensitivity should be relatively independent of the grayscale factor. One method for evaluating the validity of the light intensity reduction hypothesis is to assume that the hypothesis is true and compare the behavior of the curing parameters resulting from grayscale exposure to the behavior observed for a true reduction in light intensity. If the behaviors are similar, then the light intensity reduction model may be used to predict the curing characteristics of grayscale exposure. To test this hypothesis, numerous grayscale exposure cure depth experiments were conducted. Grayscale images from about 20% to about 90% white were designed at five different screening resolutions: HDS super fine, fine, medium, coarse and super coarse. Working curves for each of the grayscale values and screening resolutions were developed by measuring the cure depth at different exposure times. The range of energy dose investigated under the light intensity reduction hypothesis for each grayscale exposure was 320 mJ/cm² to 1920 mJ/cm². FIG. 105 shows a sample of the working curves resulting from grayscales of 50%, 40%, and 20% white and with HDS super fine screening.

From FIG. 105, trends similar to a true reduction in light intensity may be seen. As the grayscale decreases, so does the critical energy. This is evidenced by a shift in the x-intercept and an increase in cure depth resulting from an equivalent energy dose. However, it may be noted that the resin sensitivity also shows a slight decrease with a decrease in grayscale, which deviates from the light intensity reduction hypothesis. This is evidenced by a decrease in the slope with a decrease in grayscale. These results suggest that the critical energy resulting from grayscale exposure may behave in a manner similar to a true reduction in light intensity. However, additional phenomena may affect the resin sensitivity since its trends deviates from a true light intensity reduction.

Figure 106:
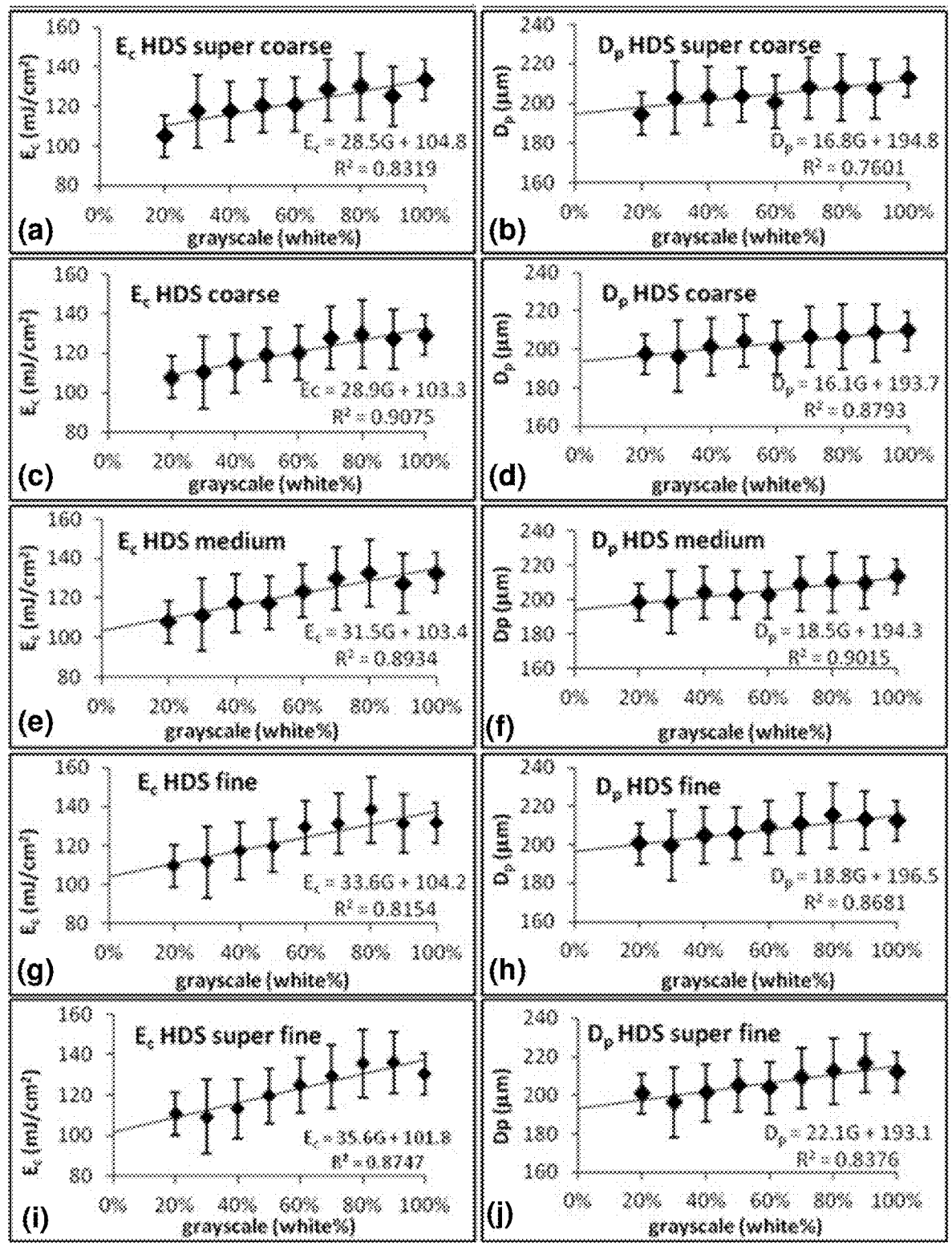
FIG. 106 provides a summary of the critical energy and resin sensitivity for various grayscale values and screening resolutions.

Through the continued investigation of grayscale exposures, it was found that the curing parameters showed similar trends for each screening resolution investigated. This is shown in FIG. 106. Films of uniform thickness were produced for all the HDS screening resolutions investigated. At each grayscale value, similar values for the critical energy and resin sensitivity were obtained regardless of the screening resolution. This indicates that the PCMS may behave in a similar manner for a range of screening resolutions and that the intensity reduction assumption is valid for each screening resolution. (a)-(j) of FIG. 106 quantify the trends observed in FIG. 105. It may be seen that a linear regression of the critical energy accurately describes the variation with grayscale, which is evidenced by the high $R^2$ values. This indicates that the critical energy for grayscale exposure at different screening resolutions varies in a manner similar to its variation with uniform light intensity. Additionally, a linear regression of non-horizontal slope accurately described the resin sensitivity, which deviates from the trends observed for varying light intensity. Since the trends in resin sensitivity and critical energy are within the error determined for each screening resolution, the results may be combined to obtain a better regression of the trends in curing parameters, which may help provide a better understanding of the curing characteristics when homogenous films are produced from grayscale exposure.

Figure 107B:
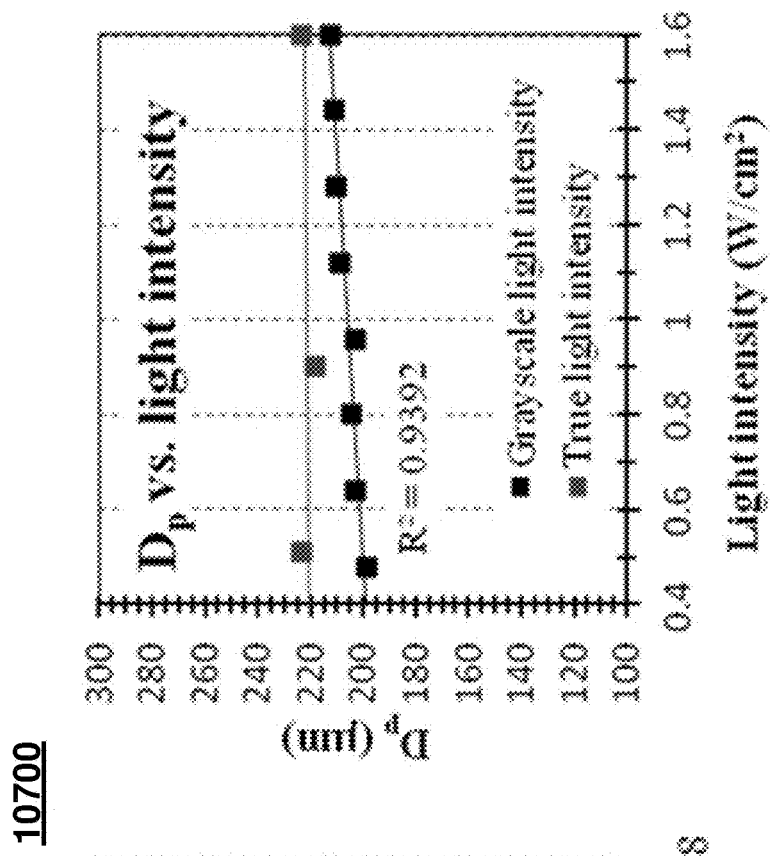
FIGS. 107a and 107b provide a graph summarizing the influence of light intensity on curing characteristics resulting from homogenous grayscale exposure.
Figure 107A:
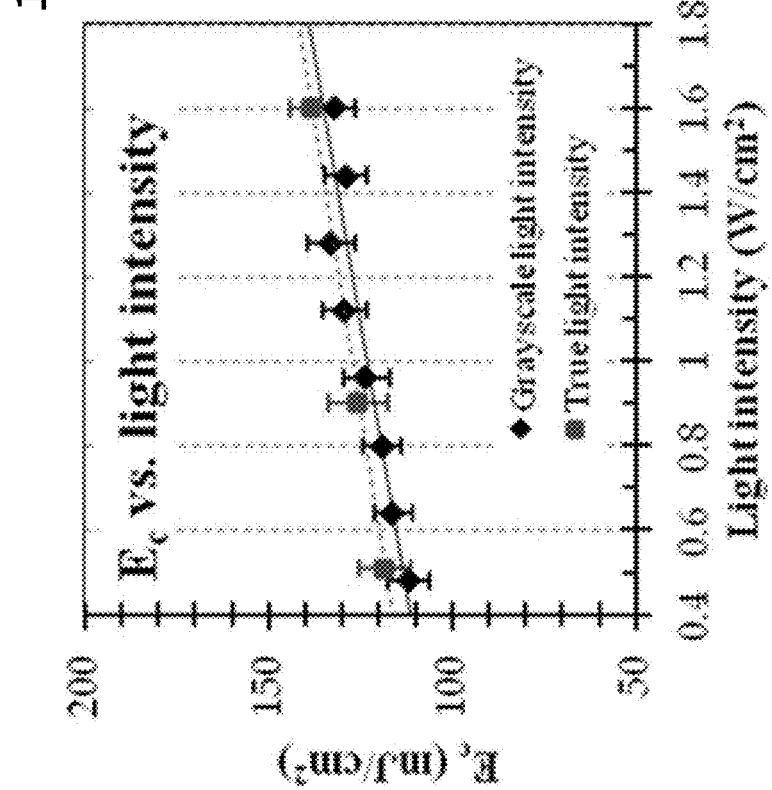

The trends in curing parameters from homogenous grayscale exposure are shown in FIGS. 107a and 107b. In these figures, the image grayscale was converted to its effective intensity in order to compare the results with the critical energies obtained from a true reduction in light intensity. Both the critical energies from grayscale exposure and true intensity measurements were plotted. From FIGS. 107a and 107b, it may be seen that the grayscale exposure critical energies are within the error of the critical energies obtained from true intensity measurements. This shows that the critical energy resulting from grayscale exposure behaves as a true reduction in light intensity. The regression obtained for the influence of grayscale exposure on the critical energy was:

$$E_c=19.6*I+103.7 \qquad 4.2$$

Here, I was obtained by multiplying the all white light intensity by the grayscale of the image. The $R^2$ value obtained for this regression was 0.92, which indicates that the regression is a good fit of the data. Also, it may be noted that the slope with light intensity varies by only 1.3 mJ/W and the critical energy at zero light intensity varies by only 5.3 mJ/cm², which is within the average confidence interval of 5.6 mJ/cm² obtained during the grayscale exposure measurements. In addition to $E_c$, the resin sensitivity also shows a strong linear dependence on light intensity.

$$D_p=11.3*I+194.8 \qquad 4.3$$

From this regression, $R^2$ was determined to be 0.94, which shows that the regression is an adequate representation of the influence of grayscale light intensity on the resin sensitivity.

In the present grayscale investigation, only the screening resolutions resulting in a homogenous film have been considered. However, intuitively if sufficiently large collections of exposed and unexposed pixels are projected onto the PCMS, film homogeneity will be lost and regions of cure depth with all white exposure will develop accompanied with regions of uncured resin. To date, few reports have characterized the cure depth within the homogenous transition. However, the homogenous transition is a region of interest in the investigation of methods to mitigate polymerization shrinkage stress. Reports by Ganahl show that for a given material system, there exist optimal dimensions of line width and line spacing to reduce the stress in a photopolymerized film. It may also be noted that the films generated by Ganahl were not uniform, nor were cured regions completely isolated from each other. Rather, the film contained regions of a larger cure depth connected by regions of partially cured resin with a lower cure depth. This corresponds to the homogenous transition, which corresponds to dimensions of exposed and unexposed regions for which the material system cannot create distinct regions of cured polymer separated by distinct regions of uncured monomer. This spatial modulation of the degree of conversion reduced shrinkage stress in the material system investigated by Ganahl, which indicates that it may reduce shrinkage stress in the PCMS used in LAMP.

In order to incorporate features containing dimensions within the homogenous transition in multilayer builds, the cure depth must be predicted to ensure proper binding to the previous layer. The investigation of the homogenous transition was accomplished through the selection of one grayscale value. Also, the screening technique was converted to a well-defined pattern in order to easily extract dimensional information. The pattern chosen was a "checkerboard," which is shown in FIG. 108.

The checkerboard pattern consists of alternating squares of exposed and unexposed regions. To investigate the influence of screening resolution, the length of the square primitive was successively increased. The range of square lengths investigated was from about 1 pixel to about 80 pixels, which corresponds to about 17 µm to about 1360 µm. Each checkerboard pattern has an image grayscale value of 50%. However, as the screening resolution decreases, the image visually appears less gray and more as a pattern of distinct black and white squares. Similarly, as the screening resolution decreases, the light intensity reduction assumption of grayscale exposure breaks down.

Figure 109:
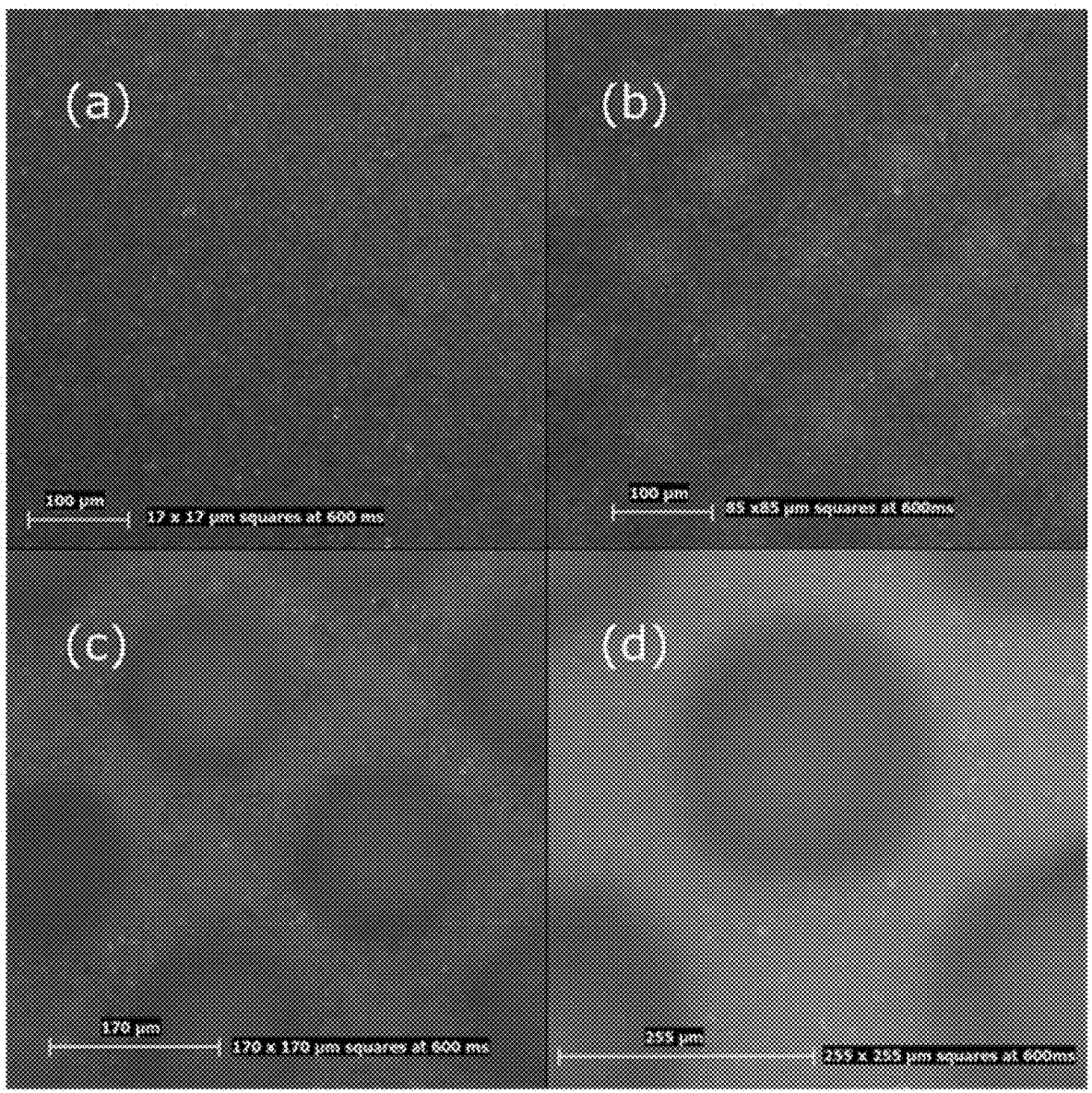
FIG. 109 shows images of checkerboard exposure at 600 ms with various square lengths to illustrate a homogenous transition.

Images in FIG. 109 show the homogenous transition for a 600 ms exposure. It may be seen in (a) of FIG. 109 that a checkerboard exposure with a square length of 17 µm results in a film with uniform thickness. However, when the square length reaches 85 µm in (b) of FIG. 109, inhomogeneities in the film thickness are observed. This represents the onset of the homogenous transition. (c) and (d) of FIG. 109 depict the continued deviation from homogeneity for square lengths of 170 µm and 255 µm. As the homogenous transition progresses, the cure depth of the exposed regions increases and that of the unexposed regions decreases.

When characterizing the effect of the homogenous transition on the cure depth, it may be seen in FIG. 110 that the homogenous transition separates two regions of constant and homogenous cure depth. The region with lower cure depth occurs when square length of the checkerboard exposure pattern is small, which corresponds to grayscale exposure. The region with a higher constant cure depth is from an all white exposure. These two regions are separated by the homogenous transition where the cure depth increases as the square length of the checkerboard increases for a given exposure time. One interesting aspect of the results shown in FIG. 110 is the shifting of the homogenous transition to the right with an increase in exposure time. The center of the sigmoid regression increases with an increase in exposure time to larger square lengths. The center of the 200 ms exposure time was at a square length of about 172 µm, while the center of the 900 ms exposure was at a square length of about 330 µm. From these cure depth measurements, it was observed that the average square length range of the homogenous transition was from about 100 µm to 450 µm.

Figure 111:
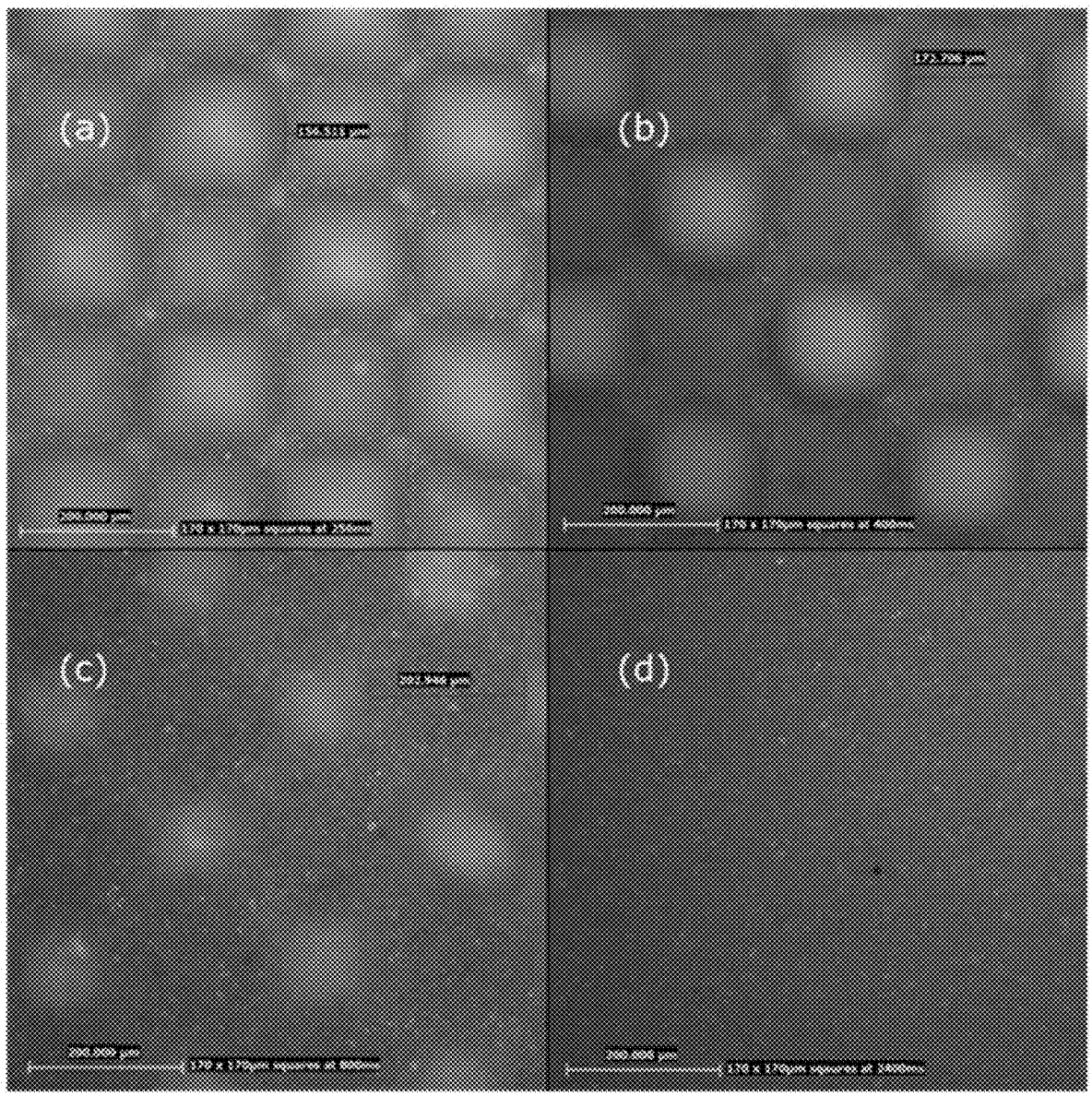
FIG. 111 shows images of a checkerboard exposure at 170µm square length with various exposure times to illustrate the time dependence of the homogenous transition.

This time dependent aspect of the homogenous transition is further demonstrated in FIG. 111, which shows a checkerboard exposure with a square length of about 170 µm. At an exposure time of 250 ms, it is clear that the film is not homogenous. The side length was measured to be 156 µm. As the exposure time increases, the side length increases to 173 µm at 400 ms, and 203 µm at 800 ms. However, at a sufficiently high exposure time of 2400 ms, a homogenous film of uniform thickness is developed.

These results show the dimensional and exposure time limits for the grayscale intensity assumption as well as the limits for an all white intensity assumption. For the cure depth to increase with a constant exposure time, the effective intensity must also increase. As a result, the intensity within the homogenous transition is not well defined and depends on the separation length as well as the size of exposed regions. Consequently, the Jacobs equation cannot directly be used because the light intensity cannot be determined. However, in order to obtain a predictive cure depth model, the Jacobs equation may be modified to ignore the light intensity and consider only the exposure time, which is shown in equations 4.4-4.7.

$$E = I * t \qquad 4.4$$

$$E_c = I * t_c \qquad 4.5$$

$$C_d = D_p \ln \frac{E}{E_c} = D_p \ln \frac{I * t}{I * t_c} \qquad 4.6$$

$$C_d = D_p \ln \frac{t}{t_c} \qquad 4.7$$

Figure 112:
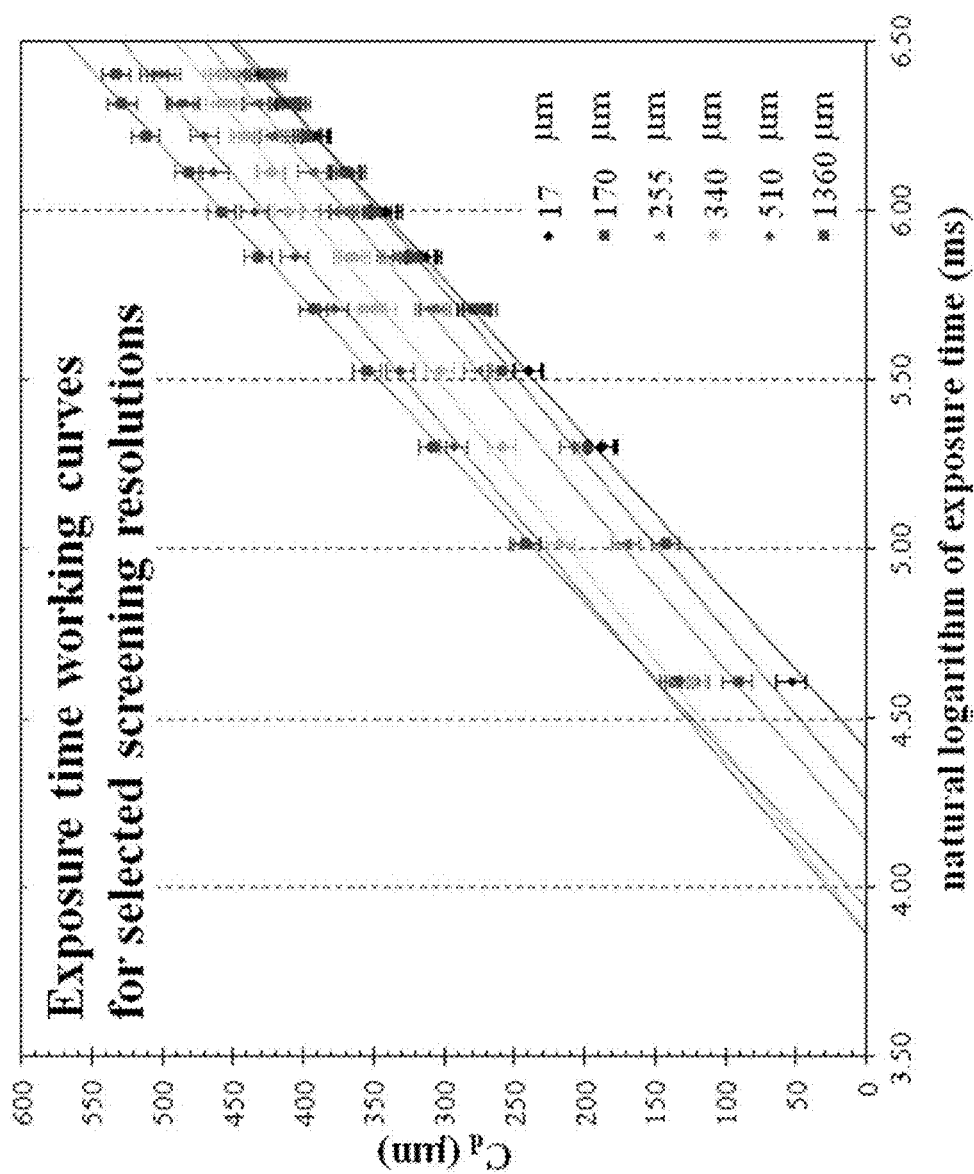
FIG. 112 provides a chart of exposure time working curves for selected screening resolutions.

Here, $D_p$ is equivalent to the resin sensitivity in the unmodified Jacobs equation, t is the exposure time, to is the critical exposure time, and I is the maximum effective light intensity. This equation may be applicable to the light source used. However, it may accurately predict the cure depth, which allows the implementation of exposure patterns within the homogenous transition in LAMP. The critical exposure time, $t_c$, may be determined by the same method use to determine $E_c$. Exposure time working curves of selected checkerboard square lengths are shown in FIG. 112. From these results, it may be seen that as the square length of the checkerboard pattern increases, the slopes (resin sensitivity) first decrease, reach a minimum and then increase. A similar pattern is also demonstrated in the x-intercepts (critical exposure time). Both minimums in the resin sensitivity and the critical exposure time occur at a similar checkerboard pattern.

Figures 113A, 113B:
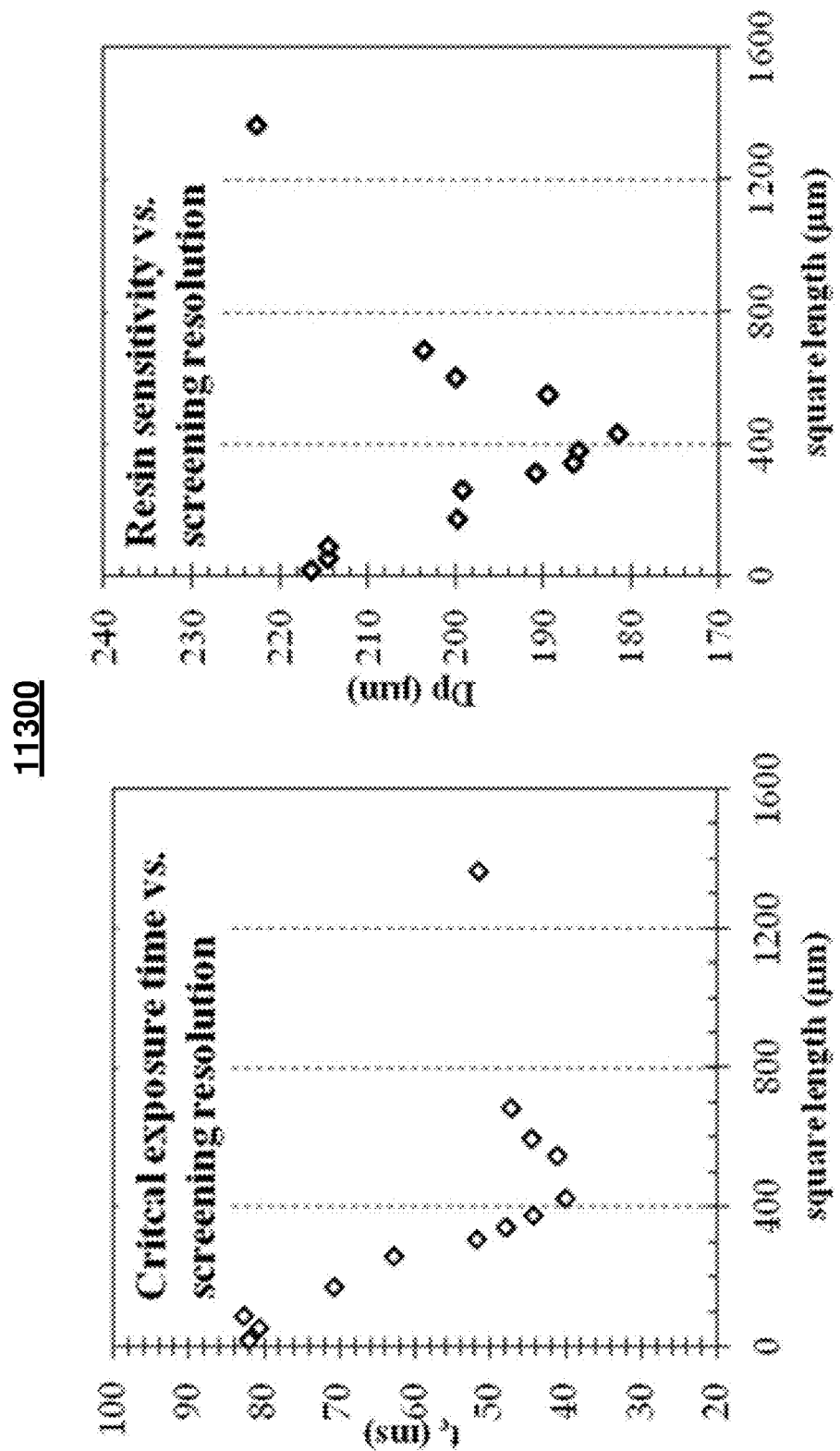
FIGS. 113a and 113b provide a chart summarizing the trends in the critical exposure time and resin sensitivity at screening resolutions within the homogenous transition.

These phenomena are investigated further in FIGS. 113a and 113b where a summary of the curing parameters obtained within the homogenous transition are provided. When the square length is about 85 µm and lower, the curing parameters are constant, indicating that grayscale light intensity assumptions may be made. Also, when the square length is about 1360 µm and greater, the curing parameters reach all white intensity values and a full intensity assumption may be made to accurately predict the cure depth. It may be seen that within the transition from grayscale exposure to all white exposure a minimum exists in both the critical exposure time and resin sensitivity at a square length of 425 µm. It is interesting to note that at this screening resolution, curing will begin sooner than an all white exposure. However, due to the minimum in resin sensitivity, the cure depth growth rate is much slower than an all white exposure.

Two factors may influence the cure depth resulting from projected grayscale images. These are the grayscale value of the image and the screening resolution used to convert the image to a distribution of black and white pixels. Based on these results, three distinct exposure types emerge: all white exposure, homogenous transition exposure, and grayscale exposure A standard method for predicting the cure depth is dependent on the total energy dose and is independent of light intensity. However, results described in previous discussions above distinctly contradict this assessment for a reduction in uniform light intensity as well as grayscale light intensity. In the case of uniform light intensity reduction, it was determined that the manner in which the energy is delivered to the PCMS effects the critical energy, wherein increasing light intensity increases the critical energy. This effect was also observed with grayscale exposures and as a result, concepts used to predict and explain the critical energy variation with uniform light intensity can also be used to predict the critical energy variation with grayscale light intensity. Recently, the light intensity dependence of the critical energy has been recognized and models have been developed in an effort to describe this phenomena. When the intensity of light incident on the PCMS is increased, the rate of initiation of primary radicals is directly affected, which is shown in Equation 2.2. If the light intensity is increased, more primary radicals are generated for polymerization. A higher rate of initiation will increase the rate of polymer chain propagation.

$$R_p = k_p [M] \left( \frac{R_i}{2k_t} \right)^{\frac{1}{2}} \qquad 5.1$$

Where $k_p$ and $k_t$ are the rate constants of propagation and termination, which are considered material properties independent of the initiation rate. Therefore, the variation in cure depth with light intensity can be considered a result of competition between initiation, propagation and termination reaction rates. This concept was the basis for a simplified radical depletion model developed by Halloran et al. Conceptually, if the radical initiation rate is high due to a high light intensity and compared to $k_p$, an excess of free radicals will arise in the PCMS and the potential for radical depletion reactions such as recombination, trapping and de-excitation will increase. As a result, a portion of the generated radicals will not contribute to polymerization. Therefore, at higher light intensities, more photons (higher energy dose) are required to develop an equivalent cure depth. These concepts can be expressed by Equation 5.2.

$$E_c(I) = E_{c,DE} + E_{c,excess} \qquad 5.2$$

Where $E_{c,DE}$ is the "dose equivalent" critical energy, which corresponds to the range of light intensities where the critical energy is constant and independent of light intensity and $E_{c,excess}(I)$ is the increase in critical energy resulting from exposure to light intensities greater than the dose equivalent intensity range. The dose equivalent critical energy can be predicted by the inhibitor exhaustion model in Equation 2.12. Since HDDA is a fast reacting monomer, it was found that at low light intensities, the PCMS shows dose equivalence. This is expressed by Equation 5.3 and in Equation 5.4 an expression for a minimum light intensity was proposed.

$$E_c = E_{c,DE}\left(1 + \frac{I}{I_{min}}\right) \qquad 5.3$$

$$I_{min} = k_p[M]fh\nu \qquad 5.4$$

Where $I_{min}$ is the transition light intensity for describing dose equivalence, $k_p$ is the propagation rate constant, [M] is the monomer concentration, f is a proportionality factor, h is Planck's constant and $\nu$ is the frequency of the incident light. If the light intensity is lower than $I_{min}$ the system behaves independent of light intensity and if the light intensity is greater than $I_{min}$ the system depends on the light intensity. The change in critical energy with light intensity was proposed to be described by Equation 5.5.

$$\frac{\delta E_c}{\delta I} = (1 - \Phi)\left(\frac{\gamma_{INH}c_{INH} + \gamma_A c_A}{\Omega f k_p [M]\varepsilon_p}\right)\left(\frac{1}{c_p}\right) \qquad .5$$

Where $\gamma_{INH}$ and $\gamma_A$ is the effectiveness of the inhibitors and absorbers, $c_{INH}$ and $c_A$ are the concentrations of inhibitors and absorbers, and f is a proportionality factor. From this equation, it is predicted that the change in critical energy will be inversely proportional to photoinitiator concentration and directly proportional to inhibitor and absorber concentration. However, for a selected formulation, the change in critical energy is expected to be linear. The linear trends found for the critical energy with grayscale and uniform light intensity suggest that this model can be used to predict the dependence of critical energy on light intensity. However, it should be noted that the predicted values deviate from the measured values. Values for the change in critical energy with light intensity presented by Halloran et al. were between 0.08 mJ/mW and 0.1 mJ/mW, which contrast with the values of 0.02 mJ/mW obtained in this study shown in Equation 4.2. This indicates that there may be additional effects contributing to the light intensity dependence of the critical energy. Some additional factors which could be considered are the variation in the range of investigated exposure dose and the use of different light sources. The cure depths measured as described in previous discussions above were at higher energy doses than those used by Halloran et al. Therefore, differences may have developed due to the different stages of photopolymerization. At low exposure dose, the PCMS is in the initiation phase whereas at a higher dose, polymerization is in the propagation and termination stages. As a result, factors such as reduced mobility of propagating chains may influence the dependence on light intensity. The use of different light sources may alter the efficiency of initiation of primary radicals. A light source with a lower efficiency of initiating primary radicals may decrease radical depletion reactions and result in less variation with light intensity.

When investigating the influence of true light intensity variation on the resin sensitivity, it was found to behave independently of light intensity, which is consistent with Halloran's results. However, it can be seen in figures described above that grayscale exposure produces a variation in resin sensitivity, where the resin sensitivity decreases with a decrease in grayscale light intensity. This shows that while the critical energy can be treated as a function of true reduction in light intensity, the resin sensitivity may not. Due to the complexity associated with light scattering in highly loaded ceramic suspensions, numerical simulations may be required to fully investigate this phenomenon. However, a potential explanation for this effect may be found in the differences of the exposure technique. When a uniformly distributed light intensity is projected onto the PCMS, absorption can only develop vertically. This is contrasted with grayscale exposure, where incident light intensity is not uniform. As a result of scattering, absorption may be distributed both with depth and width. When the percentage of white pixels is high in the projected image, most of the absorption is with depth. However, as the grayscale value decreases, the percentage of regions with lateral absorption increases. This increase in lateral absorption may reduce the vertical absorption. Since the working curve measures only the cure depth, the determination of resin sensitivity is of vertical absorption. This may be the basis for scattering effects producing a dependence of resin sensitivity on the grayscale value of the projected image.

When the screening resolution of a grayscale image projected onto the PCMS is within the homogenous transition, neither the grayscale light intensity nor the all white light intensity can accurately predict the resulting cure depth. When considering exposure features within this length scale, it is important to consider how grayscale exposure may develop from fully exposed regions separated by unexposed regions. In discussions above, it was shown that the peak intensity from a one pixel projection is ~90% of the peak intensity resulting from an all white projection where every pixel of the DMD was switched on. Similarly, the peak intensity resulting from the checkerboard exposure pattern was measured and it was verified to have peak light intensities within ~90% of the fully projected intensity as well.

As a result, the prediction of the cure depth from grayscale exposure deviates from the common method for predicting the cure depth in stereolithography, which uses the peak intensity of the laser beam to predict the depth of cure. In contrast, grayscale exposure cures according to the grayscale value of the projected image, which corresponds to the average light intensity incident to the PCMS. When the screening resolution enters the homogenous transition, the PCMS begins to deviate from this averaging effect. This indicates that the PCMS has some critical dimension for which the light intensity is distributed or averaged. Conceptually, it may be interpreted that the material system has its own "pixel," where the power input to the "pixel" divided by its area is the resultant light intensity that causes curing in the PCMS. It can be hypothesized that for scattering systems, the dimensions of the material system's pixel are determined by the scattering length. Due to ceramic particle loading, light may be scattered instead of being absorbed by the photoinitiator. As a result, the light intensity is spread laterally to unexposed regions. To predict the scattering length and subsequent lateral resolution of the PCMS, the resin sensitivity equation can be considered, which is shown in Equation 2.11 and can be rearranged to solve for scattering length.

$$l_{sc}\left(\frac{1}{D_p} - (1-\Phi)(c_P\varepsilon_P + c_A\varepsilon_A)\right)^{-1} \qquad .6$$

Figure 114:
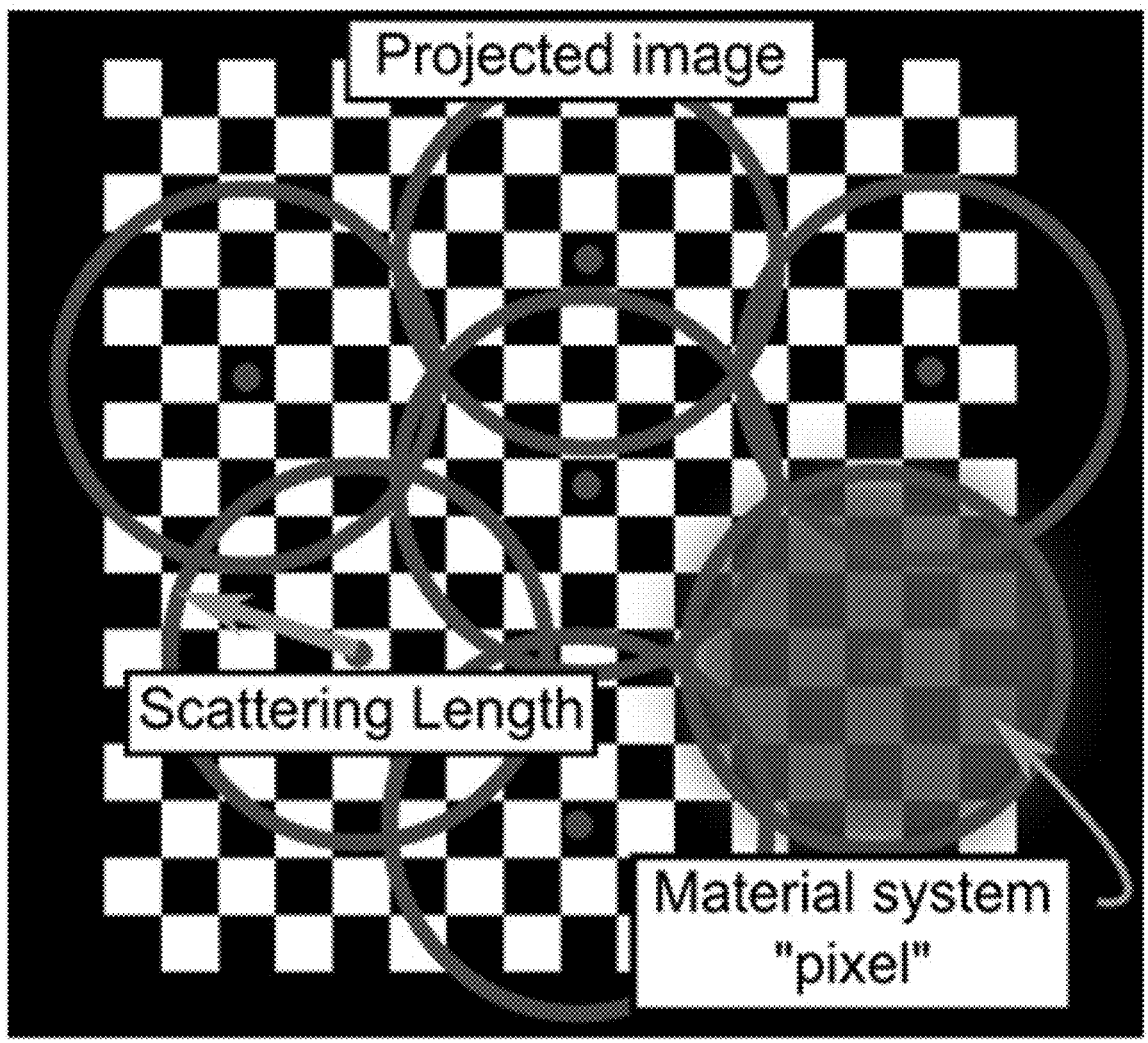
FIG. 114 illustrates a schematic of material system resolution, where the projected pattern has features finer than the "pixel" of the material system, which can be defined by the scattering length.
Figure 115A:
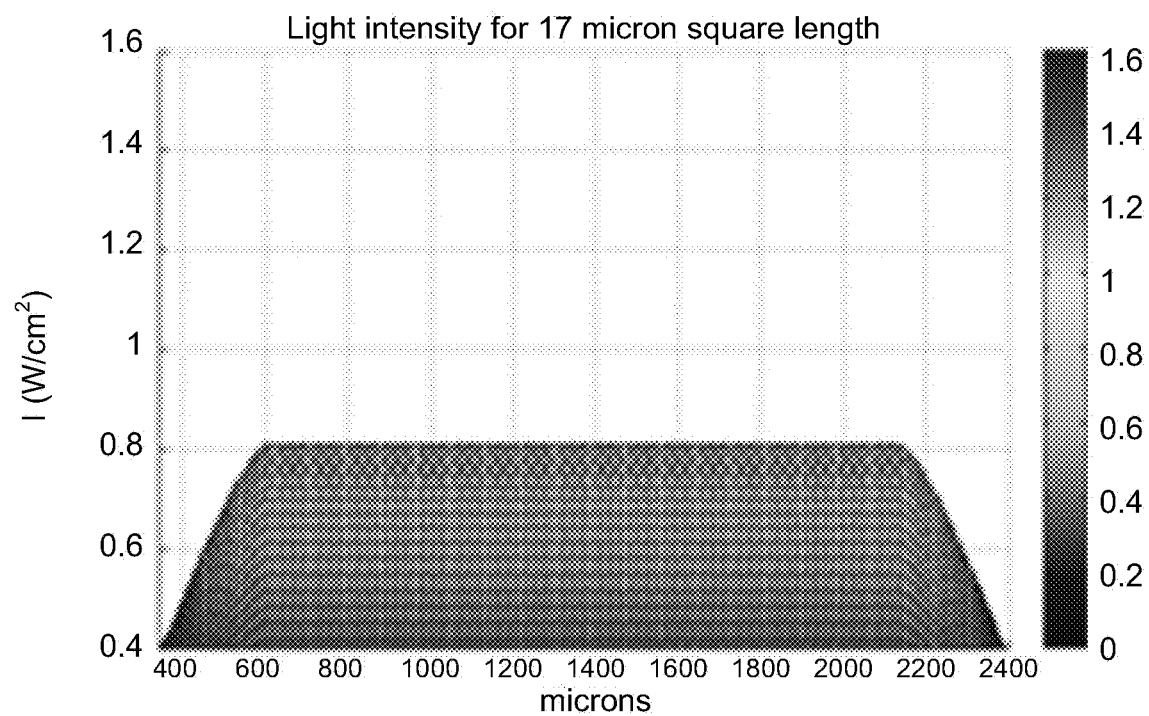
FIGS. 115A-115D illustrate simulated light intensity distribution experienced by the PCMS for selected checkerboard screening resolutions.
Figure 115B:
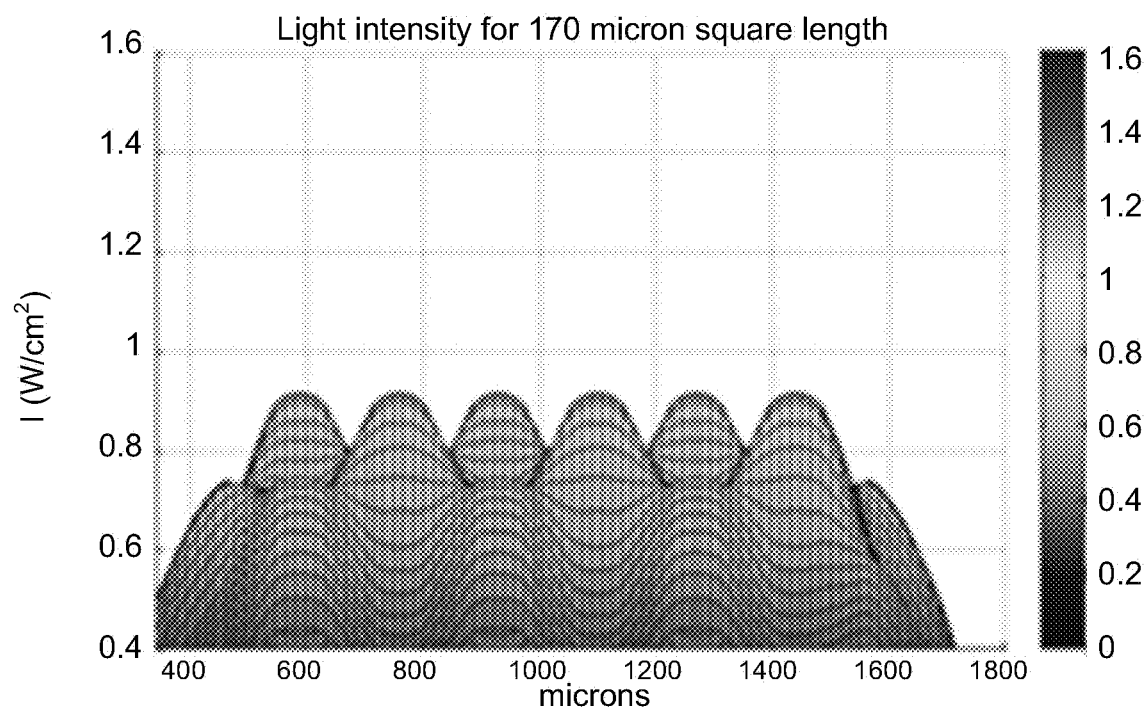
Figure 115C:
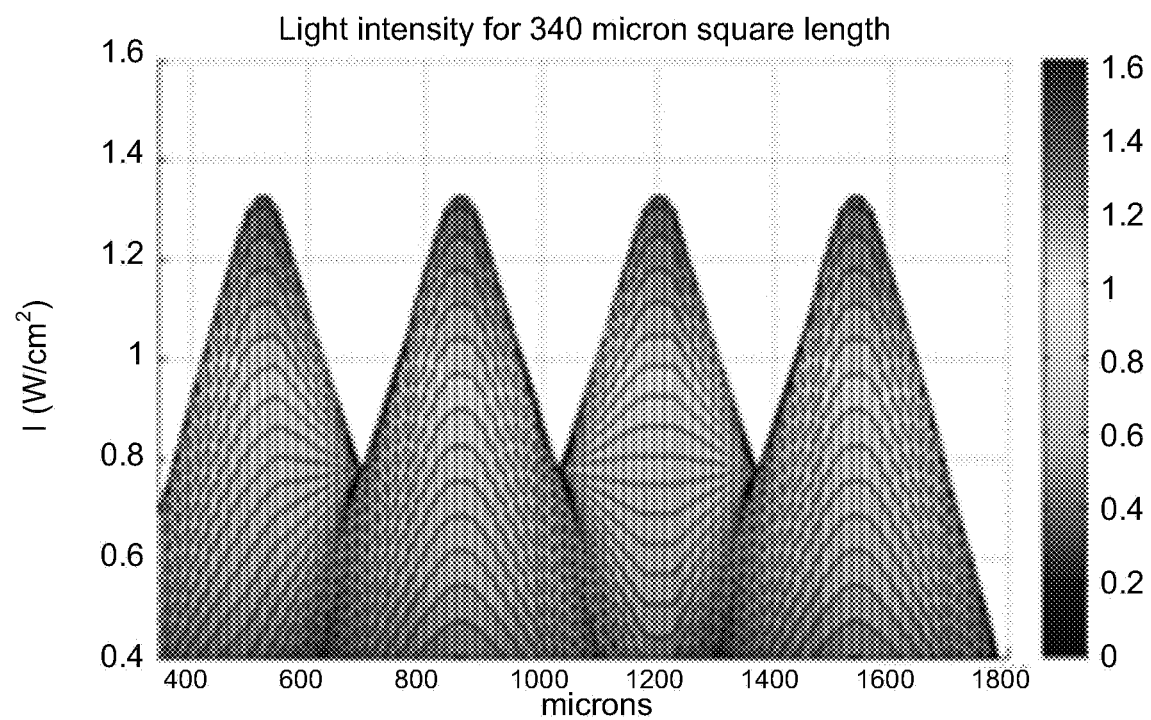
Figure 115D:
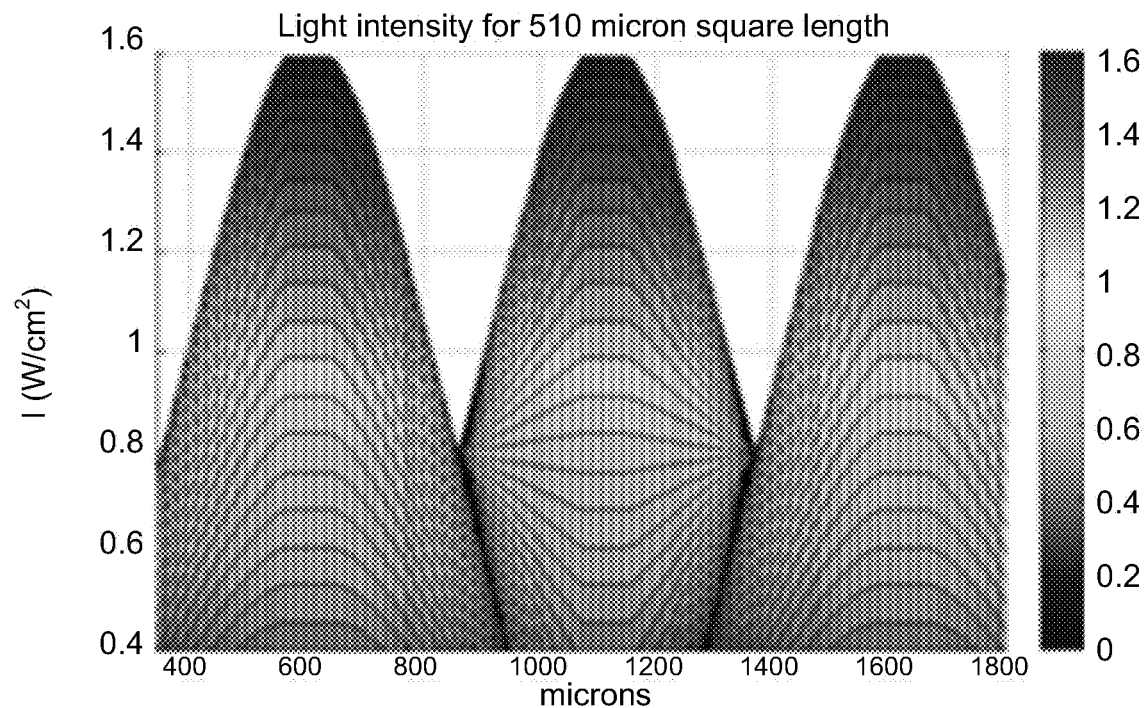

This equation enables the prediction of the light intensity for which the PCMS cures for any length scale. FIG. 114 shows a schematic for how the light intensity within the PCMS can be predicted by the "scattering length pixelation model." In this model, the PCMS resolution is defined as the scattering length, which translates into the radius of the PCMS "pixel." The light intensity input into this pixel is averaged over the pixel area to obtain an effective light intensity at the pixel's center. Then the pixel's center is translated an incremental distance from the previous location and the intensity is averaged over the scattering length pixel area for the new center. This process is repeated over the entire exposure area and acts to smooth out the light intensity by increasing the light intensity in unexposed regions and decreasing the light intensity in exposed regions.

In order to properly predict the light intensity, the correct resin sensitivity is be selected to determine the proper scattering length. During homogenous transition exposure the resin sensitivity varies with the length of the square length in the checkerboard pattern. This variation may be described by the same mechanisms proposed to explain the decrease in resin sensitivity observed in grayscale exposure. As the separation between exposed regions increases from grayscale exposure, more absorption is permitted to occur laterally due to scattering, which results in a decrease in $D_p$. However, as the pixel distribution approaches near all white exposure, lateral absorption is reduced, and the vertical absorption increases to the all white exposure resin sensitivity. Therefore, to predict the cure depth within homogenous transition exposure, the resin sensitivity values for each particular screening resolution are used.

In addition to selecting the proper resin sensitivity input for Equation 5.6, the molar extinction coefficients should be known. Estimates of these values can be obtained from the literature. A summary of the parameters used to predict the light intensity distribution for various screening resolutions are shown in the tables below. The pixel averaging technique shown in FIG. 114 was used to predict the light intensity distribution experienced by the PCMS resulting from homogenous transition exposure.

TABLE

Summary of the properties used in the calculation of scattering length based on equation 5.6.
Material properties used for predicting the scattering length

| | | | |
|---|---|---|---|
| $\varepsilon_P$ | 80 | (L/mol-cm) | [43] |
| $\varepsilon_A$ | 2300 | | |
| $c_P$ | 0.102 | (mol/L) | Chapter 2 |

TABLE-continued

| | | |
|---|---|---|
| $c_A$ | 0.002 | |
| $\Phi$ | .55 | vol % |

Scattering length for investigated checkerboard screening resolutions

| Square length (µm) | $D_p$ (µm) | $l_{sc}$ (µm) |
|---|---|---|
| 17 | 216.6 | 247 |
| 170 | 199.9 | 226 |
| 340 | 186.6 | 209 |
| 510 | 200.8 | 227 |

Results from these simulations are shown for selected checkerboard screening resolutions of 17 µm, 170 µm, 340 µm, and 510 µm in FIGS. 115A-115D. Initially, when the square length of the checkerboard image is small, the result is a uniform reduction in light intensity at the grayscale value of the projected image, which for the checkerboard exposure pattern is 50%. As the square length of the checkerboard pattern increases the light intensity increases in the exposed regions and decreases in the unexposed regions. Once the square length is sufficiently large the light intensity reaches the all white exposure intensity.

From FIGS. 115A-115D, it can be seen that when the square length approaches 510 µm, the peak light intensity reaches the all white exposure intensity. This simulated result has a strong experimental validation, which was shown in figures previously described above where the cure depth plateaus with an increasing square length. This is a result of reaching the peak all white light intensity. While light scattering in a highly loaded ceramic suspension is complicated, this scattering length pixelation model indicates that it may provide an accurate estimate of the scattered light intensity distribution incident on the PCMS.

Figure 116:
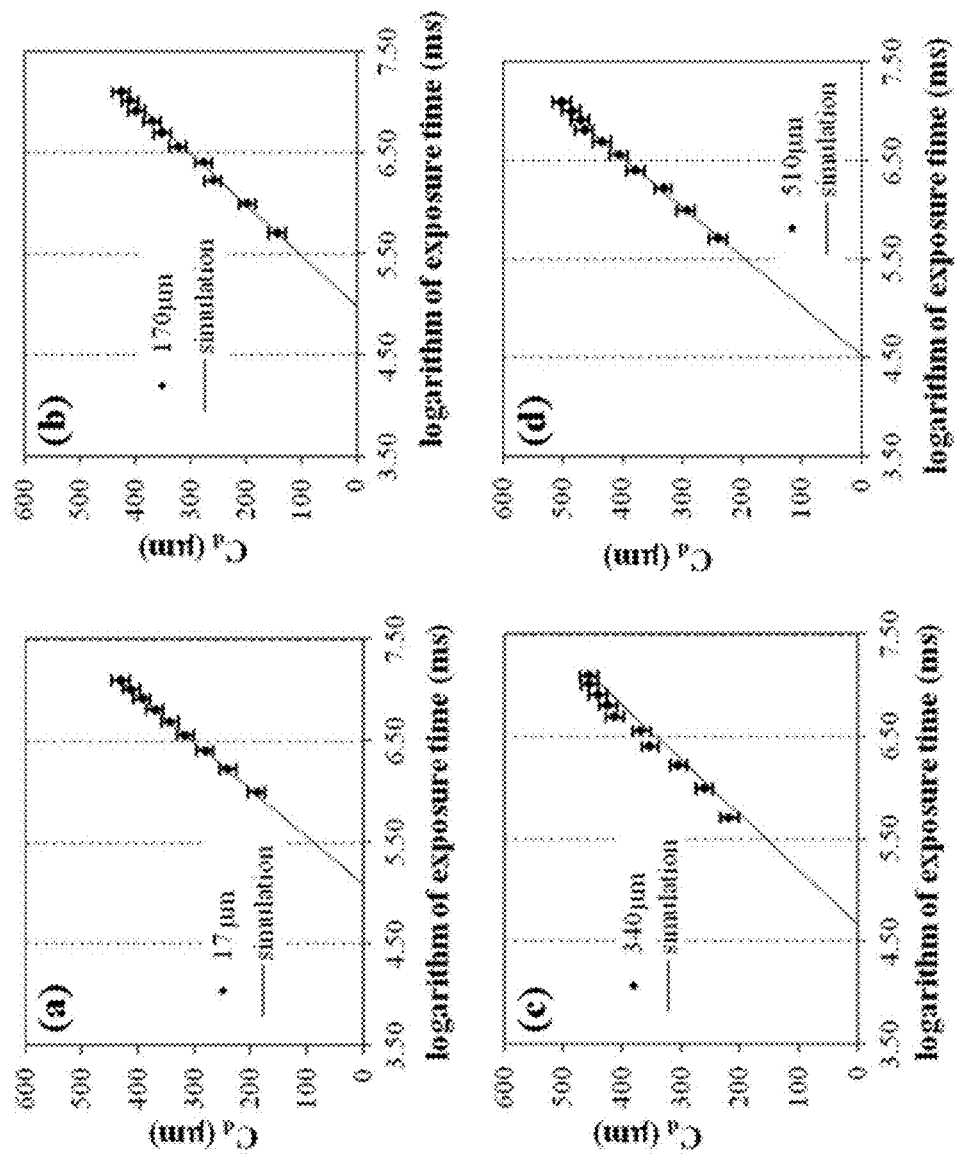
FIG. 116 provides charts comparing experimental cure depth measurements with the scattering length pixel model for predicting the light intensity for grayscale and homogenous transition exposure.

When considering experimental cure depth measurements, the cure depth will be determined by the maximum thickness of the cured sample, which will result from the maximum incident light intensity experienced by the PCMS. From the simulations in FIGS. 115A-115D, the maximum light intensity was determined and the cure depth is predicted by Equation 5.7 as follows $$C_{d,max} = D_{p,sr}\ln\frac{I_{max}}{E_c} \qquad 5.7$$

Where $D_{p,sr}$ is the resin sensitivity for the selected screening resolution, $E_c(I)$ is the intensity dependent critical energy shown in Equation 4.2, $I_{max}$ is the maximum light intensity obtained from the simulations, and t is the exposure time. Results from these simulations are compared with the experimental working curves in (a)-(d) in FIG. 116. It can be seen that the scattering length pixel model accurately predicts the maximum light intensity. The $R^2$ values obtained from these simulations ranged from 0.89 to 0.99. Due to these high $R^2$ values, this indicates that the scattering length pixelation model accurately simplifies the complex phenomena of light scattering in ceramic loaded suspensions. In addition, this model introduces new length scales which can be used in LAMP to fabricate features within the homogenous transition. However, a possible limitation of the model may be the need to determine the effective resin sensitivity for the target screening resolution. This possible limitation may be overcome by the development of a method to approximate the resin sensitivity or scattering length within the homogenous transition.

In addition to homogenous transition exposure transforming the light intensity experienced by the PCMS, it was also shown in figures previously described above that the homogenous transition is dependent on exposure time. This can be attributed to cure width growth. While the light intensity distribution experienced by the PCMS can be assumed to be independent of exposure time, the cure width from regions of high light intensity will grow into regions of lower light intensity, which can be described by an adapted Jacobs' cure width equation, which is shown in Equation 5.8.

$$C_w = B\sqrt{\ln\frac{I_{max}t}{E_c(I)}} \qquad 5.8$$

Where $C_w$ is the cure width and B is the diameter of the PCMS pixel, which is $B=2l_{sc}$. As the exposure time increases, eventually the cure width will overlap with the cure width from an adjacent projected region. Consequently, screening resolutions within the homogenous transition at low exposure times may be homogenous layers with uniform thickness at high exposure times. This is demonstrated in figures described above for a square length of 170 µm.

Mechanisms of grayscale and homogenous transition exposure were described, and the causes for the variation of the curing parameters with grayscale light intensity were investigated. It was concluded that the critical energy behaves equivalently to trends for variation in uniform light intensity, which may be adequately predicted by the radical depletion model presented by Halloran. The critical energy was found to vary linearly with light intensity which is predicted in the radical depletion model. However, the magnitude of the variation was not accurately predicted, which may be related to differences in the energy dose range investigated as well as differences in the light source. The resin sensitivity was found to decrease with a decrease in grayscale light intensity, which deviates from the behavior for uniform light intensity variation. This was proposed to be related to the differences in the exposure method, where the screening technique used in grayscale exposure enables lateral scattering and subsequent absorption, which may reduce vertical absorption measured by cure depth working curves. In discussions above, the mechanisms behind homogenous transition exposure were described and the "scattering length pixelation model" was proposed to predict the light intensity experienced by the PCMS during homogenous transition exposure. The model treats the scattering length as the critical resolution of the material system, where the light intensity of the "pixel center" is obtained by the total incident power within the scattering length divided by the scattering length area. The effectiveness of the model was assessed at selected checkerboard exposure patterns and it was found to predict the cure depth to a high level of accuracy. The time dependence of the homogenous transition was discussed and it was proposed to be related to the cure width where the diameter of the exposure is twice the scattering length.

In some embodiments, LAMP may be used to fabricate unsupported geometries and to reduce defects which arise during BBO due to internal stresses resulting from polymerization shrinkage stress. Discussed below are trends observed in the degree of conversion due to grayscale exposure, wherein the effect of grayscale exposure and screening resolution are presented and compared to an all white exposure. All discussed is a framework for utilizing grayscale exposure to fabricate unsupported features. The effectiveness of generating grayscale support structures (GSS) is also presented and the results are discussed. A framework for reducing defects in LAMP using grayscale exposure is discussed and the effectiveness of this framework is presented and the influence of grayscale on other types of defects is discussed.

In some embodiments, it may be desirable to develop a cure depth model for the incorporation of grayscale exposure in LAMP. It may enable, for example, the prediction of exposure dose or exposure time to generate the desired cure depth to ensure adhesion to the previous layer. However, the cure depth model provides no information on the degree of polymerization, which is useful for making decisions regarding which grayscales are appropriate to address the challenges facing LAMP. FTIR measurements, on the other hand, may provide information about the degree of monomer conversion, which is directly related to the degree of polymerization. For the fabrication of unsupported geometries, for example, grayscale exposure may be applied to the surrounding regions in order to provide a GSS, where a particular degree of conversion will correspond to an appropriate support structure. Additionally, volumetric shrinkage and shrinkage stress information may be obtained from degree of conversion and rate of conversion measurements.

When considering the influence of grayscale exposure on the degree of conversion, two factors may play an important role in modulating the degree of conversion between an all white exposure, i.e., (1) the grayscale value and (2) the screening resolution of the projected image.

First, the influence of homogenous grayscale exposure may be investigated. The degree of conversion may then be calculated from the resulting FTIR spectra according to equation 2.13. The grayscale values investigated were 20%, 40%, 60% and 80%. Also, the degree of conversion for an all white, 100% exposure was investigated to serve as a reference. The degree of conversion was measured for each grayscale value at various exposure times so as to maintain a constant range of energy dose. Results of the degree of conversion measurements are shown in FIGS. 117a and 117b. Reports by Ogliari, et al., show that the degree of conversion measurements may be regressed by Hill's three parameter nonlinear regression with $R^2$ values of 0.99.[1] Likewise, each grayscale exposure was regressed to Hill's equation and $R^2$ values greater than 0.98 were obtained. As a result, these curves may be used to gain an understanding of the trends and rates of polymerization.

[1] F. A. Ogliari, C. Ely, G. S. Lima, M. C. M. Conde, C. L. Petzhold, F. F. Demarco, and E. Piva, "Onium salt reduces the inhibitory polymerization effect from an organic solvent in a model dental adhesive resin," *Journal of Biomedical Materials Research Part B: Applied Biomaterials*, vol. 86B, pp. 113-118, 2008.

Photopolymerization may be described in three phases, which are initiation, propagation and termination.[2] These stages are observed in FIG. 117. Initially, at low exposure times, the degree of conversion slowly increases, which is due primarily to the limited mobility of initiated radical species. After initiation, the monomer is rapidly converted to increase the molecular weight and form a cross-linked polymer network, which occurs during the propagation stage. The termination stage experiences autodeceleration, where chain propagation becomes diffusion controlled and the mobility of propagating radical chains is reduced. In the use on multifunctional acrylates such as HDDA, this prevents the final conversion from reaching 100%. As shown, the degree of conversion plateaus at approximately 82%. This indicates that residual monomer is retained in the PCMS.

[2] C. Decker, "Photoinitiated crosslinking polymerisation," *Progress in Polymer Science*, vol. 21, pp. 593-650, 1996.

From FIGS. 117a and 117b, it may be seen that grayscale exposure prolongs the initiation and propagation stages. This may be seen from a lower degree of conversion for a lower grayscale at a given exposure dose when the exposure time is lower than 2000 ms. However, grayscale exposure does not change the final conversion of the polymer; rather, grayscale primarily affects the rates of polymerization. This is shown in the bottom panel of FIGS. 117a and 117b, where the derivatives of the regressed models are plotted. As shown, as the grayscale value decreases, so does the maximum rate of monomer conversion.

Additionally, the maximum rate of polymerization is delayed to higher exposure times, with the exception of 80%, which occurs at an exposure time similar to 100% white. This indicates that an 80% grayscale exposure does not significantly modulate the degree of conversion from an all white exposure. However, when the grayscale value is lower than 80% white, the reduction in polymerization rate is increased. Additionally, it should be noted that the maximum rate of polymerization is shifted to higher exposure times for grayscale values of 60% or less.

In addition to considering grayscales within the homogenous region, it is also necessary to characterize the degree of conversion resulting from grayscale exposure within the homogenous transition, which is shown in FIG. 118. To characterize the effect of the homogenous transition on the degree of conversion, an exposure time of 600 ms and a grayscale value of 50% white were examined. The checkerboard pattern was used as the screening technique and the square length of the primitives was varied from 17 μm to 1360 μm. It may be seen that there exists a minimum in the degree of conversion as the square lengths increase through the homogenous transition, which follows a similar trend to that seen in the resin sensitivity in FIGS. 113a and 113b.

Results from the dependence of the degree of conversion on the screening resolution may be separated into three regions: (1) grayscale exposure, (2) homogenous transition exposure, and (3) all white exposure. Within the grayscale exposure region, the degree of conversion is found to be constant. A constant degree of conversion is obtained since any screening resolution with dimensions smaller than the scattering length acts to effectively reduce the light intensity to the grayscale of the projected image. When the square length is within the homogenous transition, on the other hand, the degree of conversion drastically decreases. This is anomalous behavior, since the homogenous transition is a result of grayscale light intensity increasing to all white light intensity.

Because of this behavior of the homogenous transition, it was expected that the degree of conversion would also increase with the transition from grayscale exposure to all white exposure. However, while the light intensity is increasing in the exposed regions of the checkerboard pattern, the light intensity is decreasing in the unexposed regions. Consequently, residual and partially polymerized monomer becomes trapped between the exposed regions within the film.

It is important to note that FTIR-ATR provides an averaged spectrum of the conditions of the investigated surface. Therefore, the average degree of conversion decreases upon entering the homogenous transition from the grayscale exposure region. However, the actual state of the investigated layer consists of regions with high and low degree of conversion, which corresponds to the exposed and unexposed regions, respectively. As the square lengths increase and exit the homogenous transition the degree of conversion increases and exceeds the degree of conversion obtained from grayscale exposure.

This gradual increase in degree of conversion is related to the increased ability to remove residual monomer from the unexposed holes in the film. As the square length continues to increase, the degree of conversion eventually reaches a constant value. This region corresponds to the all white exposure region and the degree of conversion measured for this region is consistent with the degree of conversion measured for the 100% white exposure sample shown in FIGS. 117a and 117b.

When considering grayscale exposure as a technique for constructing GSS in LAMP, three aspects may be considered: (1) the GSS is preferably strong enough to survive material recoating, (2) the GSS is preferably rigid enough to maintain the spatial location and geometry of the unsupported feature, and (3) the GSS should be easily removed by development with an appropriate solvent, for example, after completion of the build.

Each of these aspects may be related to the degree of conversion. As the degree of conversion increases, both the viscosity and hardness increase.[3] For the grayscale layer to survive material recoating, for example, the degree of conversion is preferably sufficiently high—i.e., the viscosity and hardness should reach a predetermined value—to prevent the partially polymerized region from being removed or shifted from the intended location. Similarly, the degree of conversion should reach a predetermined value to ensure accuracy of the target feature. However, to contrast the requirements of a sufficiently high degree of conversion, the viscosity and hardness are preferably low enough to be easily removed after completion of the build to fabricate only the intended feature. The result of these two competing requirements is a target window for the degree of conversion for the successful fabrication of GSS. Additionally, it is possible that the degree of conversion required to survive material recoating may be higher than the degree of conversion which provides an easy removal of the GSS after the fabrication is complete.

[3] F. Jack L, "Correlation between hardness and degree of conversion during the setting reaction of unfilled dental restorative resins," *Dental Materials*, vol. 1, pp. 11-14, 1985; R. P. Slopek, "In-situ Monitoring of the Mechanical Properties during the photopolymerization of acrylate resins using particle tracking microrheology," Ph.D. Thesis, Chemical and Biomolecular Engineering, Georgia Institute of Technology, Atlanta, 2008.

Typically, but not always, a constant exposure time is used in LAMP for photopolymerizing individual layers throughout an entire build, which may be determined by calculating the exposure time required to produce a cure depth of approximately 135 μm-155 μm (depending on the polymer used). A cure depth larger than the layer thickness may be used to ensure proper adhesion to the previous layer. These exposure times typically range from approximately 120 ms to 180 ms, again based on the material formulation and age of the light source.

As a result, this provides an exposure time range for which the cure depth and degree of conversion from grayscale exposure may be considered. Both the cure depth model and degree of conversion measurements may be used to determine the appropriate range of grayscale values to investigate for GSS fabrication. If the critical energy dose for a selected grayscale value is greater than the grayscale energy dose, then no curing will occur, which indicates that this grayscale is not appropriate for GSS. However, if grayscale exposure produces a suitable cure depth (e.g., 100 µm or greater), then the GSS may be not be easily removed after the build is complete. Based on this rationale, the appropriate grayscale range for GSS may be estimated. In some embodiments, the range may be between approximately 46% and 82% by incorporating equations 4.2 and 4.3 into Jacobs' equation.

$$C_d = D_p(I) \ln \frac{E}{E_c(I)} \quad 6.1$$

$$C_d = (11.3 * I_o * g + 194.8) \ln \frac{I_o * g * t}{19.6 * I * g + 103.7} \quad 6.2$$

In addition to considering the cure depth equation, the degree of conversion may also aid in the selection of an appropriate grayscale for GSS. From FIGS. 117a and 117b it may be seen that at an exposure time of ~170 ms, the degree of conversion is ~14%. As a result, the grayscale used should preferably produce a degree of conversion lower than that of the all white exposure. Grayscale values near 80%, for example, produce a degree of conversion similar to that for an all white exposure, which tends to indicate that an 80% grayscale value will produce mechanical properties similar to an all white exposure during a build. Consequently, a graysc ale value of 80% is likely not appropriate for GSS.

From FIGS. 117a and 117b it may be seen that grayscale values of 60% and below produce a degree of conversion notably lower (~5%) than an all white exposure. Based on these findings accompanied with cure depth predictions, the range of grayscales appropriate for GSS fabrication in LAMP may be predicted. In some embodiments, the range may be between approximately 46% and 60%.

It should be noted that a degree of conversion of 14% is below the gel point, which is defined as the degree of conversion where the maximum rate of polymerization is reached.[4] This indicates that when a layer is first exposed to UV light in LAMP, the viscosity and modulus are low compared to the completed airfoil mold. The maximum rate of polymerization for an all white exposure was shown to occur at ~27%±2%, which is consistent with the literature. Since the green body molds resulting from LAMP retain accurate geometries, this indicates that much of the photopolymerization occurs after the first exposure via "print-through." Kambly, for example, reports that print-through may propagate up to 4 to 6 layers beneath the exposed surface.[5] When considering the fabrication of GSS, techniques may be developed to reduce incremental curing from print-through in order to maintain the degree of conversion at or below the gel point.

[4] K. C. Wu and J. W. Halloran, "Photopolymerization monitoring of ceramic stereolithography resins by FTIR methods," *Journal of Materials Science*, vol. 40, pp. 71-76, 2005.

[5] K. Kambly, "Characterization of Curing Kinetics and Photopolymerization Shrinkage in Ceramic-Loaded Photocurable Resins for Large Area Maskless Photopolymerization," M.S. Thesis, Mechanical Engineering, Georgia Institute of Technology, Atlanta, 2009.

In addition to selecting the grayscale values appropriate for GSS, a proper screening resolution may also be chosen, i.e. to determine if the exposure technique should be a grayscale exposure or within the homogenous transition. The rationale behind fabricating GSS is to uniformly increase the viscosity of the region surrounding the unsupported feature. Therefore, it is appropriate to select a screening resolution within the grayscale exposure region, as the homogenous transition does not tend to produce uniform layers. Therefore, the screening resolution used for all investigations of GSS was HDS super fine to guarantee grayscale exposure.

To evaluate the effectiveness of GSS in LAMP, a challenge component was designed. The side and front views of the challenge component are shown in (a) of FIG. 119, where the build direction is from the bottom up and the white regions correspond to areas to be solidified by UV exposure. The test component consists of a base, side wall, overhang and an unsupported square column. As the build progresses there will eventually be an unsupported feature for which the effectiveness of GSS may be assessed. The unsupported feature was a square column which has a square side length of 1360 µm and column height of 3 mm. The column was separated from the base by a distance of 1 mm, the side wall by 3.06 mm and the unsupported structure connects to the part through an overhang.

Overhanging structures present a challenge for LAMP. However, embodiments of the present invention relate to systems suitable for manufacturing unsupported features. Therefore, when the build reached the overhanging structure, additional exposures were conducted to ensure the overhang would not obstruct the assessment of GSS for unsupported features. (b) of FIG. 119 shows the first method employed for GSS. In this GSS, one grayscale level is selected for each layer and grayscale exposure surrounds the entire column. The grayscale exposure region connects to the base, side wall overhang, and unsupported feature.

Results from the first trial are shown in FIG. 120. Based on the prediction from the cure depth equation and degree of conversion measurements, the grayscale values investigated were 50%, 54%, 56%, 58% and 62% at a screening resolution of HDS super fine. The build parameters, such as material recoating speed and exposure time were set to 30 mm/s and 170 ms, respectively. From these results, an "all or nothing" behavior was observed. For this trial, grayscale values of 50% and 54% were unable to fabricate any component of the unsupported column. However, when the grayscale value was increased to 56%, nearly all the grayscale region polymerized to a degree of conversion which could not be easily removed. This trend continued to the 58% white grayscale value, where it may be seen that an even larger amount of GSS remained well adhered to both the side wall and the unsupported feature. For the grayscale value of 62%, the GSS is nearly a solid block.

This result demonstrates good agreement with the predictions based on the degree of conversion measurements. A grayscale value of 60% was predicted to be the upper limit for GSS and it may be seen that a grayscale value of 62% may have mechanical properties too similar to the test component. This "all or nothing" behavior may be related to print-through and material recoating speed. A grayscale value of 54% for these build parameters, however, was not viscous enough to adhere to the previous layer and survive recoating.

As a result, the GSS became an unsupported feature in the following layer and was accordingly removed during recoating. This indicates that the GSS must be successful for each layer. When grayscale values of 56% and greater were used, the GSS was strong enough to survive the material recoating process. Each additional layer induced incremental polymerization in the previous layers due to print-through. Since, the degree of conversion from a single layer is below the gel point, the PCMS is within the autoacceleration stage of polymerization. This causes the degree of conversion to rapidly increase with minimal energy dose. As a result, the degree of conversion within the GSS approaches a value similar to an all white exposure.

Reports by Xia and Fang demonstrate similar behavior in their investigation of GSS for projection microstereolithography.[6] In their test component, the GSS was bonded to the test component. However, the GSS was able to be removed through a piranha solution, which preferentially etched the partially polymerized support structure at a faster rate than the test component. In light of these findings, selective etching was investigated for the challenge component with a GSS of 56% to determine if this technique was suitable for LAMP. Two solvents appropriate for LAMP were tested, which were acetone and 3D101. Etching was conducted through sonication at room temperature for one hour.

[6] C. G. Xia and N. Fang, "Fully three-dimensional microfabrication with a grayscale polymeric self-sacrificial structure," *Journal of Micromechanics and Microengineering*, vol. 19, November 2009.

Results from the etching investigation are shown in FIG. 121. The test component in (a) of FIG. 121 shows the condition and dimensions of the component prior to etching. Individual components were used for each etching experiment. (b) and (c) of FIG. 121 show the condition of the component after etching with acetone and 3D101, respectively. From these results, it may be seen that neither of the two etching techniques completely removed the GSS. In each case, the GSS remained bonded to the side wall and a significant portion of GSS surrounded the unsupported column. However, while portions of the GSS were etched, so was a proportional amount of the test component. It was found that as much as 1.25 mm of the test component was etched from ultrasonic cleaning with either acetone or 3D101. This shows that print-through may increase the degree of conversion in the GSS similar to that of the test component. As a result, the GSS could not be selectively etched. Rather, both the GSS and test component were etched at a similar rate.

Important observations may be made from these initial GSS investigations. First, it may be seen that the GSS formed at grayscale values of 56% possessed a degree of conversion too high to be easily removed and the GSS could not be differentiated from the test component. Consequently, a lower grayscale is needed to generate a GSS with a lower degree of conversion. Second, a GSS could not be formed for grayscale values lower than 56%. From this result, it may be interpreted that the ideal grayscale for fabricating support structures is between approximately 54% and 56%. Alternatively, it could be interpreted that the degree of conversion for easy removal after fabrication is below the minimum degree of conversion required to survive material recoating for the given build parameters. Third, during etching much of the GSS remained bonded to the sidewall.

In consideration of these observations, three improvements to the fabrication of GSS may be made. First, the recoating speed may be reduced from 30 mm/s to 10 mm/s and the exposure time may be increased from 170 ms to 218 ms. A lower recoating speed may act to lower the minimum degree of conversion required to survive material recoating. Increasing the exposure time, on the other hand, enables a larger difference in the degree of conversion between grayscale exposure and all white exposure.

Second, embodiments of the present invention may also comprise a novel technique of alternating grayscale values between successive layers was developed to minimize print-through in the GSS. This technique is depicted in (c) of FIG. 119. The technique consists of alternating the grayscale values between successive layers from a high grayscale value to a low grayscale value. For instance, consider the GSS of 56% presented in (a)-(f) of FIG. 120. The high degree of conversion generated from print-through could be reduced by reducing the grayscale of every other layer within the GSS.

When the degree of conversion is below the gel point, due to autoacceleration, for example, a lower degree of conversion has a lower corresponding polymerization rate, which is demonstrated in FIGS. 117*a* and 117*b*. As a result, the lower degree of conversion may act as a barrier to mediate incremental polymerization throughout the fabrication of GSS. In addition to developing this system and method for print-through reduction, the connection of the GSS to the side wall may be removed to increase the surface area which may be developed after completion of the build. The gap separation between the GSS and the side wall may be set to approximately 1 mm, and 2 mm of GSS may be used to surround the column in all directions.

Results from these modifications are shown in FIG. 122. For this experiment in alternating grayscale, the low grayscale value was held constant at 50% and the high grayscale value was investigated at 52% (b), 53% (c), 54% (d), and 56% (e). In addition, to the alternating GSS, a constant GSS of 50% is also shown in (a). The first row shows the test components before developing with 3D101. It may be seen that the GSS appears much less viscous than GSS formed in the first trial shown in (a)-(f) of FIG. 119. The second row shows the test component after rinsing with a water jet using 3D101, which is a typical technique used to remove residual monomer. It may be seen that removal of the GSS reveals the successful fabrication of the grayscale supported test component.

The success may be largely attributed to reducing the recoating rate, which reduces the minimum degree of conversion required to survive the recoating process. (a) of FIG. 122 shows that a GSS of 50% may fabricate an unsupported column. This shows that alternating GSS are not necessary to fabricate unsupported features. Rather, the critical parameter was the material recoating speed. However, it is demonstrated that alternating grayscale exposure within the GSS is an effective method for fabricating unsupported geometries as well. The advantage of alternating GSS is the mitigation of "all or nothing" behavior.

FIG. 122 shows that alternating grayscale GSS expands the range of grayscale that may be used to fabricate the unsupported column. This is evidenced by (e) of FIG. 122, where an alternating GSS of 50% and 56% was used. Previously, a GSS with the use of a single grayscale value at 56% was unable to be easily removed due to significant print-through. However, inserting a grayscale value of 50% every other layer within the GSS enabled the successful fabrication of the unsupported feature and easy removal of the GSS with standard development techniques. This shows the ability of alternating grayscale to mitigate residual curing from print-through. This aspect increases the reliability of fabricating unsupported geometries and may allow for more variation in build parameters.

One aspect of the test component which should be noted is that the height of the column. The column height was designed to be 3 mm, yet for each GSS, the height of the column was ~3.5 mm. This may be related to print-through causing curing up to 5 layers beneath the column. When an all white exposure is projected on the layer above a grayscale exposure, the susceptibility of print-through is increased due to a higher light intensity. Grayscale exposure consumes many of the inhibitor species typically present in unexposed monomer. As a result, any additional exposure dose goes directly to polymerization, which causes the column to be longer than the design value.

In order to produce more accurate unsupported features, an additional design revision to the GSS may be performed, which may be seen in (d) of FIG. 119. In this design, grayscale exposure is removed from directly underneath the unsupported feature. This design feature attempts to mitigate print-through, since the inhibitors in the PCMS must be consumed before curing may occur. As a result, the probability of developing additional thickness beneath the exposed layer is reduced, which could result in a more accurately built test component.

Results from a print-through mediated alternating GSS are shown in FIG. 123. The test component shown was fabricated with alternating grayscale values of 50% and 70%. (a) and (b) of FIG. 123 depict the GSS before development and the unsupported column which appears after development, respectively.

The difference between alternating grayscale values for the print-through mediated GSS are more disparate than the typical alternating GSS, which may be related to the volume reduction of the grayscale support. From this result, a larger gap between the base and the unsupported feature may be seen, which results in a higher accuracy in the build direction. The column height was measured to be 3.2 mm. This indicates that print-through develops additional thickness corresponding to two layers beneath the column in the absence of grayscale support directly beneath the column (i.e., as opposed to 5 layers when grayscale is beneath the column).

It may also be noted that more shifting occurred during the fabrication of the column, which resulted in a variable cross-section through the length of the grayscale supported column. In addition, it may be seen that some roughness in the base layer developed due to print-through from the higher alternating grayscale value. These effects may be further reduced by increasing the dimensions of the surrounding grayscale. This may enable a smaller difference in the alternating grayscales, for example, and the high grayscale used could be reduced, which would eliminate bonding to the base layer. A lager volume of GSS surrounding the column may also prevent shifting during material recoating.

The results of grayscale exposure for the fabrication of unsupported geometries in LAMP are discussed above showing that grayscale support structures may be used to fabricate unsupported geometries and may be easily removed after completion of part fabrication using standard development techniques. Techniques used in microstereolithography, such as selective etching, however, are not particularly applicable for GSS in LAMP. However, with the incorporation of novel GSS designs, such as alternating grayscale and print-through mediation, reliable and accurate unsupported features may be obtained.

Additionally, the GSS may be easily removed after part completion without mechanical methods, which is important for applications to LAMP. Many of the unsupported geometries encountered in airfoil molds are within the internal features of the mold. This technique of grayscale support structures holds promise for successfully fabricating unsupported features within airfoil molds and thus expanding the versatility of LAMP.

When an airfoil mold is successfully fabricated with LAMP, very few cracks are observed in the green bodies. As a result, the majority of defects generated during LAMP occur during binder burnout and sintering. BBO is a sensitive process of removing the structural component to form a fragile ceramic powder component ready for sintering. Some defects which may be generated during BBO are spalling, cracking, blisters, and voids. To reduce these defects, the material composition may be be carefully considered and heating rates should be sufficiently low. Additionally, it is important to remove substantially all of the binder before sintering to higher temperatures. Mitigation of defects during binder burnout and sintering has been the focus of many studies and the results indicate that polymerization shrinkage may be a primary contributing factor.

Reports by Bae and Halloran investigated the formation of cracks during BBO and sintering in ceramic stereolithography, where dependence on hatch spacing and retracted hatch were investigated.[7] From these results, it was found that a larger retracted hatch produced more cracks. This was attributed to residual uncured monomer near the surface of the mold. The mechanism associated with this observation was thermal initiation of radical species inducing polymerization of the uncured monomer, which caused shrinkage and sites for defect propagation. Interestingly, little dependence on hatch spacing could be associated to the observed horizontal and vertical cracks.

[7] C.-J. Bae, "INTEGRALLY CORED CERAMIC INVESTMENT CASTING MOLD FABRICATED BY CERAMIC STEREOLITHOGRAPHY," PhD, Materials Science and Engineering, University of Michigan, 2008.

In LAMP, a uniform light intensity exposure is applied to a large area, which causes anomalous defects to form during BBO. One of these behaviors is "fissures," which is shown in FIG. 124. While large-scale defects that prevent functionality of the mold for casting are not present in green bodies, fissure precursors may be seen, which are shown in (a) of FIG. 124. Fissures formed during BBO are straight and parallel with the LAMP layers. Additionally, a periodicity of every 4, 6 and 8 layers is observed throughout the airfoil mold.

The origin of these fissures with temperature was reported and evidence of these features may be seen at temperatures as low as 148° C. with cracks first appearing at 220° C. Interestingly, this corresponds to the temperature range where the ketone initiator undergoes thermal decomposition to form radicals, which may polymerize residual uncured monomer within the mold. It may also be noted that significant weight loss does not occur until 300° C. This indicates that the resulting fissures are not due to pyrolysis.

(b) of FIG. 124 shows the state of the mold after heating to 193° C. From this image it appears that the fissures are formed during BBO, yet before significant weight loss has occurred, corresponding to the potential fissure precursors observed in the green body, which is confirmed in (c) of FIG. 124. For closer inspection, (d) of FIG. 124 shows an expanded view of a typical fissure with a 6 layer period.

These observations provide a strong indication that the observed fissures are a result of polymerization shrinkage and the stress resulting thereof. During exposure of a single layer, the degree of conversion will vary with depth. Consequently, a large gradient in degree of conversion could exist at the interface of adjacent layers. When the green body mold reaches temperatures sufficient to decompose the ketone initiators, regions of lower degree of conversion polymerize and shrink away from the adjacent layers. This effect is observed in (d) of FIG. 124 by the lines between each layer.

In addition to polymerization shrinkage, it is also important to consider polymerization shrinkage stress. From (a) of FIG. 124 it may be seen that periodic fissure precursors exists in the green body mold and BBO propagates the pre-existing defect. These fissures may be related to shrinkage stress. In LAMP, two main aspects contribute to stress development from shrinkage: (1) single layer shrinkage stress and (2) multiple layer shrinkage stress. Schematics of these two mechanisms are shown in (a) and (b) of FIG. 125.

When UV light is exposed to the PCMS, an incremental depth is polymerized and undergoes shrinkage. As the exposure progresses, an additional incremental element is polymerized. If there are no boundary conditions applied, the linear contraction from polymerization shrinkage in the second incremental element will induce a curvature away from the light source. This effect is demonstrated in (a) of FIG. 125 and has been observed experimentally in FIG. 126. However, in LAMP, a boundary condition is placed on the layer to remain flat. As a result stress is generated between adjacent layers.

The second mechanism of stress generation develops with the exposure of multiple layers, which is shown in (b) of FIG. 125. When an additional layer of PCMS is exposed to UV light, the linear contraction interacts with the preceding layer. If no boundary conditions are applied, curvature develops towards the light source. Multiple layer shrinkage stress will continue to develop deeper into the build due to print-through. It is interesting to note that print-through in LAMP may penetrate approximately 6 layers, which is quite similar to the periodicity observed in the fissures. It may be hypothesized, therefore, that the fissures are the result of a stress relaxation from the accumulation of shrinkage stress across multiple layers due to print-through.

In order to test this hypothesis, methods to reduce polymerization shrinkage and polymerization shrinkage stress through grayscale were investigated. Polymerization shrinkage has been directly related to the degree of conversion, where a high degree of conversion corresponds to a large volumetric shrinkage.[8] Therefore, it could be concluded that to reduce the negative effects of polymerization, the degree of conversion must be kept low. However, during BBO uncured and partially cured monomer may potentially polymerize due to thermal decomposition of the photoinitiator generating free radicals for polymerization, and due to the nature of BBO, volumetric changes should be minimized to reduce defects. In addition, a high degree of conversion is necessary to ensure accuracy of the airfoil mold dimensions. Due to these considerations, reducing the degree of conversion may not be a viable method for mitigating potential shrinkage related defects resulting from BBO and sintering. Consequently, mitigation of shrinkage defects is preferably addressed through a novel technique to obtain a high degree of conversion, while mitigating volumetric shrinkage. As discussed below, this may be accomplished through exploitation of exposure patterns within the homogenous transition.

[8] D. C. Watts, "Reaction kinetics and mechanics in photo-polymerised networks," *Dental Materials*, vol. 21, pp. 27-35, 2005.

When the exposure pattern projected onto the surface of the PCMS is within the homogenous transition, the average degree of conversion may decrease by more than 50% when compared to an all white exposure, as shown in FIG. 118. This indicates that the net mitigation of volumetric shrinkage may also be greater than 50%. When exposure patterns are within the homogenous transition, uncured or partially cured monomer is retained within the layer, which has been shown to reduce volumetric shrinkage stress through monomer migration.[9] With the prospect of homogenous transition exposure mitigating the net effect of volumetric shrinkage and reducing shrinkage stress, this shows promise for reducing defects in the green body mold. Since the origin of fissures and delamination generally depends on the state of the green body mold, reducing defects in the green body may reduce these types of defects during BBO and sintering.

[9] P. D. Ganahl, "Structured illumination as a processing method for controlling photopolymerized coating characteristics," Ph.D. Thesis, Chemical and Biochemical Engineering, University of Iowa, 2007.

To investigate the effectiveness of this technique for mitigating these types of defects, a test component was designed. The test component was a hollow cylinder, which is shown in (a) and (c) of FIG. 127. The outer diameter of the cylinder was set to 22 mm with a thickness of 3 mm and height of 24 mm to simulate nominal dimensions used in airfoil molds. The hollow cylinders were fabricated with all white exposure and with three screening resolutions within the homogenous transition. The screening techniques utilized were checkerboard patterns with square lengths of 170 µm, 255 µm and 425 µm, which correspond to screening resolutions near grayscale exposure, in the middle of the homogenous transition, and near all white exposure, respectively. For each screening resolution, the layers were exposed in a staggered pattern so that the exposed region was unexposed in the following layer and vice versa, which is shown in (b) and (d) of FIG. 127.

The exposure times selected to ensure proper bonding between layers were 278 ms, 274 ms and 274 ms for square lengths of 170 µm, 255 µm, 425 µm, respectively. Four samples for each screening resolution were examined to obtain a statistical information and four all white cylinders were fabricated with an exposure time of 170 ms to serve as a reference. After fabrication, each mold was developed with 3D101. Following development, the test cylinders were subjected to BBO and sintering, where the heating schedule is shown in Table 6.1. After sintering was complete, the mold was cooled to room temperature in one hour.

TABLE 0.1

Heating schedule for binder burnout and sintering

| heating rate (° C./min) | peak temperature (° C.) | holding time (hours) |
|---|---|---|
| 5 | 260 | 0 |
| 3 | 300 | 0 |
| 0.5 | 350 | 2 |
| 0.5 | 475 | 0 |
| 3 | 600 | 0 |
| 12.5 | 1350 | 2 |

FIG. 128 shows the result from fabrication of a test cylinder with all white exposure. The image in (a) of 128 shows the green body mold illuminated to enhance the detection of defects. The mold contained a smooth surface, but distinct defects were present in the green body. (b) of FIG. 128 shows an expanded view of a section of the surface with enhanced contrast to demonstrate the fissure precursor. It may be seen that a similar periodicity to the mold shown in (a) of FIG. 124 develops in the all white test cylinder. This indicates a high probability that fissures will develop during BBO. In addition to the fissure precursors, a defect related to "shuffle" may be seen, which is related to the serpentine path traversed in LAMP during large area exposure. From these defects in the green body, it may be expected that fissures will develop in the regions shown in (b) of FIG. 128 and the shuffle defect will become more apparent during BBO and sintering due to thermally initiated polymerization and subsequent shrinkage.

This expectation is verified in FIG. 129, which shows numerous horizontal defects resulting from BBO and sintering of the all white exposure test cylinder. The brightness from these fissures is higher compared to those in the green body, which indicate a larger defect. In this sample there were 4 horizontal defects which propagated throughout the circumference of the cylinder accompanied with many localized fissures. It may be seen that fissures occur throughout the height of the test cylinder, where the severity of the defect varies, yet the spacing remains constant. (b) of FIG. 128 shows the regular spacing of 4, 6, or 8 layers.

The results from (a) and (b) of FIG. 129 show that fissures occur in the test cylinder during BBO and sintering, which was predicted from the existence of fissure precursors in the green body. Therefore, comparisons may be made regarding the effectiveness of homogenous transition exposure for reducing or enhancing these defects. FIG. 130 shows the green body molds for cylinders fabricated with checkerboard exposure at square lengths of 170 µm (a), 255 µm (b), and 425 µm (c). In each screening resolution the surface roughness increased compared to the all white cylinder. In addition, spalling is observed and portions of the outer surface were removed during development. These effects result due to the limited connectivity of the cured portions within the cylinder and the lack of a smooth outer surface. However, no fissure precursors could be discerned from the captured images. This indicates that fissures should not develop during BBO and sintering.

In addition to the absence of fissure precursors in the green bodies, the absence of a shuffle pattern defect may also be noted. By observing the expanded views and enhancing the contrast, it may be seen that vertical lines appear on the cylinder surfaces, which could lead to the formation of vertical defects during BBO and sintering. The vertical features resulting from a square length of 170 µm appear less straight, when compared to cylinder with a square length of 255 µm and 425 µm, and are irregularly spaced. For the square lengths in (b) and (c) of FIG. 130, the spacing is substantially constant and the lines are straight and parallel to the build direction. Also, it may be seen that the spacing between vertical lines is larger and with higher contrast for a square length of 425 µm compared to a square length of 255 µm. The length of the spacing was found to be equivalent to the square length utilized in the exposure method, which indicates that the lines are a characteristic of the exposure technique.

These observations from the green body cylinders show promise for mitigating fissures and shuffle defects since their precursors were not observed. However, the exposure pattern introduced vertical lines and an uneven surface into the green bodies, which could cause the formation of other defects apart from fissures and shuffle. FIG. 131 shows the effects of BBO and sintering on the test cylinders fabricated using a staggered checkerboard exposure with square length of 170 µm (a), 255 µm (b), and 425 µm (c).

Each screening resolution clearly has notably fewer long range horizontal fissures. (a) of FIG. 131 shows greatest number of long range horizontal fissures. However, these were the primary horizontal defects observed, in contrast to the all white exposure in which numerous horizontal defects of smaller length were observed. When examining the screening resolution with a square length of 255 µm and 425 µm, no long range horizontal defects were observed.

Further inspection of the cylinder with a square length of 425 µm shows that short range fissures may have developed. For both 170 µm and 425 µm square length screening resolution, the film is approaching homogeneity. In the case of 170 µm square length, the layer is near a homogenous grayscale exposure and for a 425 µm square length, the layer is near a homogenous all white exposure. From this consideration, a 455 µm may have mitigated features most efficiently due to its location in the center of the homogenous transition. These results indicate that a proper selection of homogenous transition exposure may be a viable technique for reducing fissures and delamination. For the examined screening resolution, a square length of 255 µm performed most efficiently at reducing all types of defects including fissures.

When considering the other defects, it may be seen that while the shuffle defect was not observed in the green body cylinders, the defect develops in each investigated screening resolution. However, the intensity of the light projecting for the shuffle defect is less than the intensity seen in the all white cylinders and the feature is more poorly defined. As a result, homogenous transition exposure did not eliminate the shuffle defect, but may have reduced it effects, which could be attributed to local shrinkage. Another effect which was not detected in the green test cylinder is shown in the expanded views of FIG. 131. In the green cylinders with alternating checkerboard exposure, "continuous" vertical lines were observed. However, a transformation to "dotted" lines occurred as a result of BBO and sintering. This effect may be attributed to polymerization shrinkage resulting from thermal initiation of radicals and polymerization prior to pyrolysis. As a result, homogenous transition exposure may have converted the large scale fissures seen in all white exposure to isolated "micro-fissures," which prevented the accumulation of shrinkage to produce larger defects.

Due to the vertical ordering of these micro-fissures, stress relaxation may occur vertically. Investigations into vertical cracks are shown in FIG. 132 which sshow test cylinders where significant vertical cracks developed for each exposure technique. The largest vertical cracks occurred for screening resolutions with a square length of 455 µm ((d) of FIG. 132) where vertical cracks acted to split the test cylinder in 2 of the 4 investigated samples at that screening resolution. Checkerboard patterns with square lengths 170 µm ((b) of FIG. 132) also resulted in long range cracks. For this sample it appears that a horizontal defect prevented further propagation of the vertical crack. For the all white exposure cylinder many horizontal fissures occupied the sample, which is shown in (a) of FIG. 132. As a result, large scale vertical cracks were reduced and the sample contained many small vertical cracks. (c) of FIG. 132 showed the least vertical cracks (both large and small scale), which corresponds to a checkerboard exposure with a square length of 255 µm.

What is claimed is:
1. A system for additive manufacturing, comprising:
   a container for holding a photosensitive medium adapted to change states upon exposure to a light source;
   an optical imaging system, configured to move above the container holding the photosensitive medium, and having the light source; and
   a control system configured to:
      slice a digital model of a three-dimensional object into a slice having a cross section;

generate a build cross section by filling a two-dimensional image with one or more copies of the cross section;

add to the build cross section a conformal regular lattice having a repeating structure to fill space in the build cross section around the one or more copies of the cross section; and control movement of the optical imaging system above the container to cure a portion of the photosensitive medium corresponding to the build cross section including the conformal lattice to produce both a layer of a three-dimensional object and a portion of the conformal lattice.

2. The system of claim 1, wherein the control system is further configured to:

slice the digital model into a plurality of slices, each slice having a respective cross section; and generate the build cross section by filling the two-dimensional image with one or more copies of a first cross section selected from the group of the respective cross sections of the plurality of slices.

3. The system of claim 1, wherein the control system is further configured to add, to the build cross section, a break line through the conformal lattice.

4. The system of claim 1, wherein the control system is further configured to add to the build cross section a tank wall to a perimeter of the two-dimensional image.

5. The system of claim 1, wherein the control system is further configured to add to the build cross section a conformal wall spaced around the one or more copies of the cross section and conforming to a shape of the cross section.

6. The system of claim 1, wherein the two-dimensional image has a predetermined size corresponding to a size of the container, and the control system is configured to:

generate the build cross section by filling the two-dimensional image having the predetermined size with a plurality of copies of the cross section; and add to the build cross section by adding to the build cross section a conformal lattice to fill space in the build cross section between the plurality of copies of the cross section.

7. The system of claim 6, wherein the control system is further configured to add to the build cross section a plurality of break lines through the plurality of copies of the cross section.

8. The system of claim 6, wherein the control system is further configured to add to the build cross section a plurality of conformal walls spaced around the plurality of copies of the cross section, and the conformal lattice spans between the plurality of conformal walls.

9. The system of claim 5, wherein curing the conformal wall spaced around the cured cross section forms a moat between the wall and the object.

10. The system of claim 8, wherein curing the plurality of conformal walls spaced around the cured cross sections forms a plurality of moats between the plurality of conformal walls and the objects.

* * * * *